US012648293B2

(12) United States Patent
Lee et al.

(10) Patent No.: US 12,648,293 B2
(45) Date of Patent: Jun. 2, 2026

(54) LIGHT-EMITTING DEVICE AND ELECTRONIC APPARATUS INCLUDING THE SAME

(71) Applicant: Samsung Electronics Co., Ltd., Suwon-si (KR)

(72) Inventors: Sunghun Lee, Suwon-si (KR); Byungjoon Kang, Suwon-si (KR); Seungyeon Kwak, Suwon-si (KR); Sungmin Kim, Suwon-si (KR); Hyungjun Kim, Suwon-si (KR); Minhan Lee, Suwon-si (KR); Hongsoo Lee, Suwon-si (KR); Kyuyoung Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 389 days.

(21) Appl. No.: 18/390,377

(22) Filed: Dec. 20, 2023

(65) Prior Publication Data

US 2024/0251583 A1 Jul. 25, 2024

(30) Foreign Application Priority Data

Dec. 30, 2022 (KR) ........................ 10-2022-0191045

(51) Int. Cl.
*H10K 50/12* (2023.01)
*C09K 11/06* (2006.01)
(Continued)

(52) U.S. Cl.
CPC ............ *H10K 50/121* (2023.02); *C09K 11/06* (2013.01); *H10K 50/16* (2023.02); *H10K 85/342* (2023.02);
(Continued)

(58) Field of Classification Search
None
See application file for complete search history.

(56) References Cited

U.S. PATENT DOCUMENTS 8,431,243 B2 4/2013 Kwong et al.
9,064,822 B2 6/2015 Park et al.
(Continued)

FOREIGN PATENT DOCUMENTS

EP 2465912 A1 6/2012
KR 20210025503 A 3/2021
(Continued)

OTHER PUBLICATIONS

English Abstract of KR 10-2024-0107292.
Extended European Search Report dated May 7, 2024, issued in corresponding EP Patent Application No. 23218974.6, 7 pp.

*Primary Examiner* — Anthony Ho
(74) *Attorney, Agent, or Firm* — CANTOR COLBURN LLP

(57) ABSTRACT

A light-emitting device and an electronic apparatus including the light-emitting device. The light-emitting device includes a first electrode, a second electrode, and an interlayer arranged between the first electrode and the second electrode, the interlayer includes an emission layer, the emission layer includes one or more m1 hosts, a sensitizer, and a fluorescent emitter, where m1 is an integer of 1 or more, and when m1 is 2 or more, the two or more hosts are each different from the other, the one or more m1 hosts, the sensitizer, and the fluorescent emitter are different from each other, and Expression 1 is satisfied.

$$0\ \text{debye} \leq |PDM(S) - PDM(H)| \leq 3\ \text{debye} \qquad \text{Expression 1}$$

(Continued)

Expression 1 is the same as described in the present specification.

20 Claims, 4 Drawing Sheets

(51) Int. Cl.

| | |
|---|---|
| ***H10K 50/16*** | (2023.01) |
| ***H10K 85/30*** | (2023.01) |
| ***H10K 85/60*** | (2023.01) |
| *H10K 101/00* | (2023.01) |
| *H10K 101/10* | (2023.01) |

(52) U.S. Cl.
CPC ....... *H10K 85/346* (2023.02); *H10K 85/6572* (2023.02); *H10K 85/658* (2023.02); *H10K 2101/10* (2023.02); *H10K 2101/90* (2023.02)

(56) References Cited

U.S. PATENT DOCUMENTS

| | | | |
|---|---|---|---|
| 9,685,617 | B2 | 6/2017 | Beers et al. |
| 2015/0228697 | A1 | 8/2015 | Liu et al. |
| 2015/0318506 | A1 | 11/2015 | Zhou et al. |
| 2016/0093814 | A1 | 3/2016 | Hwang et al. |
| 2018/0374409 | A1 | 12/2018 | Lee et al. |
| 2019/0006608 | A1 | 1/2019 | Koo et al. |
| 2019/0157354 | A1 | 5/2019 | Lee et al. |
| 2020/0006676 | A1 | 1/2020 | Kwak et al. |
| 2020/0212319 | A1 | 7/2020 | Choi et al. |
| 2020/0295288 | A1 | 9/2020 | Fusella et al. |
| 2020/0308209 | A1 | 10/2020 | Yoon et al. |
| 2021/0066622 | A1 | 3/2021 | Fleetham et al. |
| 2021/0083205 | A1 | 3/2021 | Hwang et al. |
| 2021/0104691 | A1 | 4/2021 | Lee et al. |
| 2021/0328157 | A1 | 10/2021 | Lee et al. |
| 2022/0158096 | A1 | 5/2022 | Fleetham et al. |
| 2022/0402952 | A1 | 12/2022 | Kwak et al. |
| 2023/0025356 | A1 | 1/2023 | Lee et al. |
| 2023/0050840 | A1 | 2/2023 | Yi et al. |
| 2023/0054166 | A1 | 2/2023 | Lee et al. |
| 2023/0105127 | A1 | 4/2023 | Kwak et al. |

FOREIGN PATENT DOCUMENTS

| | | | |
|---|---|---|---|
| KR | 20210128268 | A | 10/2021 |
| KR | 20220007543 | A | 1/2022 |
| KR | 20220068169 | A | 5/2022 |
| KR | 20240107292 | A | 7/2024 |
| WO | 2021015177 | A1 | 1/2021 |
| WO | 2021149510 | A1 | 7/2021 |

LIGHT-EMITTING DEVICE AND ELECTRONIC APPARATUS INCLUDING THE SAME

CROSS-REFERENCE TO RELATED APPLICATION

This application claims priority to Korean Patent Application No. 10-2022-0191045, filed on Dec. 30, 2022, in the Korean Intellectual Property Office, and all benefits accruing therefrom under 35 U.S.C. § 119, the disclosure of which in its entirety is herein incorporated by reference herein.

BACKGROUND

1. Field

The disclosure relates to a light-emitting device and an electronic apparatus including the light-emitting device.

2. Description of the Related Art

Organic light-emitting devices are self-emissive devices that may have improved characteristics in terms of viewing angles, response time, luminance, driving voltage, and response speed, and provide full-color images.

An organic light-emitting device includes an anode, a cathode, and an interlayer arranged between the anode and the cathode and including an emission layer. A hole transport region may be arranged between the anode and the emission layer, and an electron transport region may be arranged between the emission layer and the cathode. Holes provided from the anode move toward the emission layer through the hole transport region, and electrons provided from the cathode move toward the emission layer through the electron transport region. The holes and the electrons recombine in the emission layer to produce excitons. The excitons may transition from an excited state to a ground state, resulting in light emission.

SUMMARY

Provided is a light-emitting device having excellent characteristics in terms of luminescence efficiency, lifespan, and/or roll-off ratio, and an electronic apparatus including the light-emitting device.

Additional aspects will be set forth in part in the description which follows and, in part, will be apparent from the description, or may be learned by practice of the presented embodiments of the disclosure.

According to an aspect of the disclosure, a light-emitting device includes a first electrode, a second electrode, and an interlayer arranged between the first electrode and the second electrode, wherein the interlayer includes an emission layer, the emission layer includes m1 hosts m1, a sensitizer, and a fluorescent emitter, where m1 is an integer of 1 or more, and when m1 is 2 or more, the two or more hosts are each different from the other, the m1 hosts, the sensitizer, and the fluorescent emitter are each different from the other, and Expression 1 is satisfied.

$$0\ \text{debye} \leq |PDM(S) - PDM(H)| \leq 3\ \text{debye} \qquad \text{Expression 1}$$

In Expression 1,

PDM(S) is a permanent dipole moment of the sensitizer and has a unit of debye, PDM(H) is $$\sum_{x=1}^{m1} PDM(Hx) \cdot W(Hx)$$

which is an average value of permanent dipole moments of the m1 hosts present in the emission layer, and has a unit of debye wherein i) x is a variable of 1 to m1, ii) PDM(Hx) is a permanent dipole moment of an $x^{th}$ host in the emission layer and has a unit of debye, and iii) W(Hx) is a weight fraction of the $x^{th}$ host relative to a total weight of the host in the emission layer, and is calculated as (a weight of the $x^{th}$ host in the emission layer/a total weight of the host in the emission layer), and each of PDM(S) and PDM(H) is calculated based on density functional theory (DFT).

According to another aspect of the disclosure, an electronic apparatus includes the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
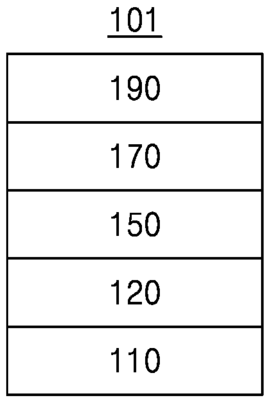
FIG. 1 is a schematic view of a light-emitting device according to an embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A light-emitting device according to an embodiment of the disclosure may include a first electrode, a second electrode facing the first electrode, and an interlayer arranged between the first electrode and the second electrode.

The interlayer may include an emission layer.

The emission layer may include m1 hosts, a fluorescent emitter, and a sensitizer. For example, the emission layer may consist of m1 hosts, a fluorescent emitter, and a sensitizer, where m1 is an integer of 1 or more. When m1 is 2 or more, the two or more hosts present in the emission layer are each different from the other. For example, when m1 is 2 or more, a host in the emission layer may be a mixture of two or more different hosts.

A weight of the m1 hosts in the emission layer is greater than a total weight of the fluorescent emitter and the sensitizer. For example, a total weight of the m1 hosts in the emission layer may be about 60 weight percent (wt %) to about 99 wt %, about 70 wt % to about 97 wt %, or about 80 wt % to about 96 wt %, based on 100 wt % of the emission layer.

In an embodiment, m1 may be 1, 2, 3, or 4.

In an embodiment, m1 may be 1 or 2.

When m1 is 2, a weight ratio of two different hosts included in the emission layer may be 1:9 to 9:1, 2:8 to 8:2, 3:7 to 7:3, or 4:6 to 6:4. When the weight ratio is satisfied, movement of holes and electrons in the emission layer may be efficiently performed.

Each of the m1 hosts, the sensitizer, and the fluorescent emitter in the emission layer may be different from each other.

Among total emission components of emitted light from the emission layer, a proportion of a fluorescent emission component emitted from a fluorescent emitter may be about 70% or more, for example, about 70% to 100%, about 70% to about 95%, about 70% to about 90%, about 70% to about 85%, or about 70% to about 80%.

The fluorescent emission component emitted from the fluorescent emitter may be an emission component emitted when an exciton of the fluorescent emitter transitions from a singlet excited state to a ground state. Therefore, the emission layer may be a fluorescent emission layer. The fluorescent emission layer may also include a phosphorescent emitter (for example, an organometallic compound including a transition metal). It is to be understood that a fluorescent emission layer is clearly distinguished from a phosphorescent emission layer in which, among total emission components, a proportion of a phosphorescent emission component of emitted light from the phosphorescent emitter is about 70% or more.

The light-emitting device may satisfy Expression 1:

$$0 \text{ debye} \leq |PDM(S) - PDM(H)| \leq 3 \text{ debye} \qquad \text{Expression 1}$$

wherein, in Expression 1, PDM(S) is a permanent dipole moment of the sensitizer and has a unit of debye.

In Expression 1, PDM(H) is $$\sum_{x=1}^{m1} PDM(Hx) \cdot W(Hx)$$

which is an average value of permanent dipole moments of the m1 hosts present in the emission layer, and has a unit of debye, wherein i) x is a variable of 1 to m1, ii) PDM(Hx) is a permanent dipole moment of an xth host in the emission layer and has a unit of debye, and iii) W(Hx) is a weight fraction of the xth host relative to a total weight of the host in the emission layer, and may be calculated as (a weight of the xth host in the emission layer/a total weight of the host in the emission layer).

For example, in the emission layer, when m1 is 1, the host in the emission layer consists of Host A, and PDM(H) is the same as a value of a permanent dipole moment of Host A.

As another example, in the emission layer, when m1 is 2, the host in the emission layer includes two different hosts (for example, a mixture of two different hosts). For example, in the emission layer, when m1 is 2 and the host in the emission layer includes Host A and Host B, which are different from each other, PDM(H) may be calculated as PDM(Host A)·W(Host A)+PDM(Host B)·W(Host B), that is, "(permanent dipole moment of Host A×weight fraction of Host A)+(permanent dipole moment of Host B×weight fraction of Host B)". In this regard, when the host includes Host A and Host B in a weight ratio of 7:3, PDM(H) may be calculated as "PDM(Host A)×0.7+PDM(Host B)×0.3".

Each of PDM(S) and PDM(H) is calculated based on the density functional theory (DFT). Any various programs may be used for the quantum mechanical calculation based on the DFT, and for example, a Gaussian 16 program may be used.

|A| indicates an absolute value of "A".

In an embodiment, PDM(S) may be greater than PDM(H).

In an embodiment, PDM(S) may be about 0.1 debye to about 3.0 debye, about 0.1 debye to about 2.5 debye, about 0.1 debye to about 2.0 debye, about 0.5 debye to about 3.0 debye, about 0.5 debye to about 2.5 debye, about 0.5 debye to about 2.0 debye, about 1.0 debye to about 3.0 debye, about 1.0 debye to about 2.5 debye, about 1.0 debye to about 2.0 debye, about 1.2 debye to about 3.0 debye, about 1.2 debye to about 2.5 debye, about 1.2 debye to about 2.0 debye, or about 1.5 debye to about 2.0 debye.

In an embodiment, PDM(H) may be about 0.01 debye to about 4.00 debye, about 0.01 debye to about 3.50 debye, about 0.01 debye to about 3.00 debye, about 0.01 debye to about 2.50 debye, about 0.01 debye to about 2.00 debye, about 0.01 debye to about 1.50 debye, about 0.01 debye to about 1.30 debye, about 0.01 debye to about 1.20 debye, about 0.05 debye to about 4.00 debye, about 0.05 debye to about 3.50 debye, about 0.05 debye to about 3.00 debye, about 0.05 debye to about 2.50 debye, about 0.05 debye to about 2.00 debye, about 0.05 debye to about 1.50 debye, about 0.05 debye to about 1.30 debye, about 0.05 debye to about 1.20 debye, about 0.09 debye to about 4.00 debye, about 0.09 debye to about 3.50 debye, about 0.09 debye to about 3.00 debye, about 0.09 debye to about 2.50 debye, about 0.09 debye to about 2.00 debye, about 0.09 debye to about 1.50 debye, about 0.09 debye to about 1.30 debye, about 0.09 debye to about 1.20 debye, about 0.1 debye to about 4.00 debye, about 0.1 debye to about 3.50 debye, about 0.1 debye to about 3.00 debye, about 0.1 debye to about 2.50 debye, about 0.1 debye to about 2.00 debye, about 0.1 debye to about 1.50 debye, about 0.1 debye to about 1.30 debye, or about 0.1 debye to about 1.20 debye.

In an embodiment, |PDM(S)−PDM(H)| may be about 0.1 debye to about 2.5 debye, about 0.2 debye to about 2.0 debye, about 0.3 debye to about 1.5 debye, about 0.4 debye to about 1.0 debye, about 0.4 debye to about 0.8 debye, or about 0.45 debye to about 0.6 debye.

In an embodiment, the light-emitting device may further satisfy Expression 2:

$$0\ \mathrm{eV} \le |S_1(S) - T_1(S)| \le 0.4\ \mathrm{eV} \quad \text{Expression 2}$$

wherein, in Expression 2, $S_1(S)$ is singlet energy of the sensitizer and has a unit of eV, $T_1(S)$ is triplet energy of the sensitizer and has a unit of eV, and each of $S_1(S)$ and $T_1(S)$ is calculated based on the DFT.

For example, $|S_1(S)-T_1(S)|$ may be about 0.01 eV to about 0.4 eV, about 0.01 eV to about 0.3 eV, about 0.01 eV to about 0.2 eV, about 0.05 eV to about 0.4 eV, about 0.05 eV to about 0.3 eV, about 0.05 eV to about 0.2 eV, about 0.1 eV to about 0.4 eV, about 0.1 eV to about 0.3 eV, or about 0.1 eV to about 0.2 eV.

In an embodiment, $S_1(S)$ may be about 2.25 eV to about 2.65 eV, about 2.25 eV to about 2.60 eV, about 2.25 eV to about 2.55 eV, about 2.25 eV to about 2.50 eV, about 2.35 eV to about 2.65 eV, about 2.35 eV to about 2.60 eV, about 2.35 eV to about 2.55 eV, about 2.35 eV to about 2.50 eV, about 2.40 eV to about 2.65 eV, about 2.40 eV to about 2.60 eV, about 2.40 eV to about 2.55 eV, or about 2.40 eV to about 2.50 eV.

In an embodiment, $T_1(S)$ may be about 2.2 eV to about 2.6 eV, about 2.2 eV to about 2.5 eV, about 2.2 eV to about 2.4 eV, about 2.3 eV to about 2.6 eV, about 2.3 eV to about 2.5 eV, or about 2.3 eV to about 2.4 eV.

In an embodiment, the light-emitting device may further satisfy Expression 3:

$$0\ \mathrm{eV} \le |S_1(FE) - T_1(FE)| \le 1.5\ \mathrm{eV} \quad \text{Expression 3}$$

wherein, in Expression 3, $S_1(FE)$ is singlet energy of the fluorescent emitter and has a unit of eV, $T_1(FE)$ is triplet energy of the fluorescent emitter and has a unit of eV, and each of $S_1(FE)$ and $T_1(FE)$ is calculated based on the DFT.

For example, $|S_1(FE)-T_1(FE)|$ may be about 0.1 eV to about 1.5 eV, about 0.1 eV to about 1.0 eV, about 0.1 eV to about 0.5 eV, about 0.3 eV to about 1.5 eV, about 0.3 eV to about 1.0 eV, or about 0.3 eV to about 0.5 eV.

In an embodiment, $S_1(FE)$ may be about 1.5 eV to about 3.0 eV, about 2.0 eV to about 3.0 eV, or about 2.5 eV to about 3.0 eV.

In an embodiment, $T_1(FE)$ may be about 1.0 eV to about 2.5 eV, about 1.5 eV to about 2.5 eV, or about 2.0 eV to about 2.5 eV.

In an embodiment, FWHM(FE) may be about 5 nanometers (nm) to about 50 nm, about 10 nm to about 45 nm, about 15 nm to about 45 nm, about 20 nm to about 45 nm, about 25 nm to about 45 nm, about 30 nm to about 45 nm, about 10 nm to about 40 nm, about 15 nm to about 40 nm, about 20 nm to about 40 nm, about 25 nm to about 40 nm, about 30 nm to about 40 nm, about 10 nm to about 35 nm, about 15 nm to about 35 nm, about 20 nm to about 35 nm, about 25 nm to about 35 nm, or about 30 nm to about 35 nm. FWHM(FE) is a full width at half maximum of a photoluminescence spectrum of the fluorescent emitter and has a unit of nm, and the photoluminescence spectrum is evaluated relative to a film including the fluorescent emitter.

In an embodiment, λmax(FE) may be about 500 nm to about 550 nm, about 510 nm to about 540 nm, about 515 nm to about 540 nm, about 520 nm to about 540 nm, about 525 nm to about 540 nm, about 510 nm to about 535 nm, about 515 nm to about 535 nm, about 520 nm to about 535 nm, or about 525 nm to about 535 nm. λmax(FE) is a maximum emission peak wavelength of a photoluminescence spectrum of the fluorescent emitter and has a unit of nm, and the photoluminescence spectrum is evaluated relative to a film including the fluorescent emitter.

The "film including the fluorescent emitter" may be prepared by using various methods, such as a vacuum deposition method, a coating method, and a heating method. The "film including the fluorescent emitter" may further include other compounds, for example, a host described in the present specification, in addition to the fluorescent emitter. For example, a method of evaluating FWHM(FE) is the same as described with reference to the following Evaluation Example.

In an embodiment, each of the sensitizer and the fluorescent emitter may emit yellow-green light, green light, or blue-green light.

In an embodiment, each of the sensitizer and the fluorescent emitter may emit green light.

In an embodiment, the emission layer may emit yellow-green light, green light, or blue-green light.

In an embodiment, the emission layer may emit green light.

In an embodiment, the light-emitting device may not emit white light.

The emission layer of the light-emitting device includes m1 hosts, a sensitizer, and a fluorescent emitter. Up to approximately 25% of singlet excitons formed in the host in the emission layer may be transferred to the sensitizer through Forster energy transfer, and energy of 75% of triplet excitons formed in the host may be transferred to a singlet excited state and triplet excited state of the sensitizer. Among them, the triplet excitons transferred to the triplet excited state and the singlet excitons of the sensitizer may be transferred to a singlet excited state of the fluorescent emitter through Forster energy transfer. Therefore, both the singlet excitons and the triplet excitons generated in the emission layer are transferred to the singlet excited state of the fluorescent emitter. Upon radiative transition to a ground state, the layer emitting fluorescence with high luminescence efficiency, and is referred to as hyper-fluorescence.

As the emission layer satisfies Expression 1 as described above, a difference between an average value of permanent dipole moments of the m1 hosts and a value of a permanent dipole moment of the sensitizer is relatively small. In other words, an average value of permanent dipole moments of the m1 hosts in the emission layer and a value of a permanent dipole moment of the sensitizer are near similar to each other, and thus, even in a case where a relatively large amount of sensitizers are used, when the emission layer is formed, sensitizer aggregation caused by intermolecular interaction of the sensitizers is minimized, and the sensitizers may be uniformly dispersed in the host. Accordingly, "Förster energy transfer from the host to the sensitizer" that induces the hyper-fluorescence is maximized, and "Dexter energy transfer from the host to the fluorescent emitter" that inhibits the hyper-fluorescence is relatively minimized. Thus, the light-emitting device as described above may have excellent characteristics in terms of luminescence efficiency, lifespan, and/or a roll-off ratio.

Furthermore, since at least one of Expression 2 and Expression 3 is further satisfied, the light-emitting device may have better luminescence efficiency, and thus, a high-quality electronic apparatus may be implemented by using the light-emitting device.

The above may be described in more detail in Evaluation Examples provided below.

The m1 hosts in the emission layer may include a hole-transporting compound, an electron-transporting compound, a bipolar compound, or a combination thereof. Each of the m1 hosts may not include a transition metal.

For example, if in the emission layer, m1 is 2, each of two hosts in the emission layer may include a hole-transporting compound and/or an electron-transporting compound, and the hole-transporting compound and the electron-transporting compound may be each be different from the other.

In an embodiment, the hole-transporting compound may include at least one π-electron rich $C_3$-$C_{60}$ cyclic group and may not include an electron-transporting group. Examples of the electron-transporting group may include a cyano group, a fluoro group, a π-electron deficient nitrogen-containing cyclic group, a phosphine oxide group, and a sulfoxide group.

The "π-electron deficient nitrogen-containing cyclic group" as used herein may be a $C_1$-$C_{60}$ heterocyclic group which has at least one *—N=*' moiety as a ring-forming moiety. Examples of the π-electron deficient nitrogen-containing cyclic group may include a triazine group, an imidazole group, and the like.

"π-electron rich $C_3$-$C_{60}$ cyclic group" may be a $C_3$-$C_{60}$ cyclic group that does not include a *—N=*' moiety as a ring-forming moiety. Examples of the π-electron rich $C_3$-$C_{60}$ cyclic group may include a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphthocarbazole group, a dinaphthofuran group, a dinaphthothiophene group, and a dibenzocarbazole group.

For example, the hole-transporting compound may include two or more carbazole groups.

In an embodiment, the electron-transporting compound may be a compound including at least one electron-transporting group. The electron-transporting group may be a cyano group, a fluoro group, a π-electron deficient nitrogen-containing $C_1$-$C_{60}$ cyclic group, a phosphine oxide group, a sulfoxide group, a combination thereof. In an embodiment, the electron-transporting compound may include a triazine group.

For example, the electron-transporting compound may include at least one electron-transporting group (for example, a triazine group) and at least one π-electron rich $C_3$-$C_{60}$ cyclic group (for example, a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphtho carbazole group, a dinaphthofuran group, a dinaphthothiophene group, a dibenzocarbazole group, or any combination thereof.

In an embodiment, the hole-transporting compound may be a compound represented by Formula 6:

Formula 6

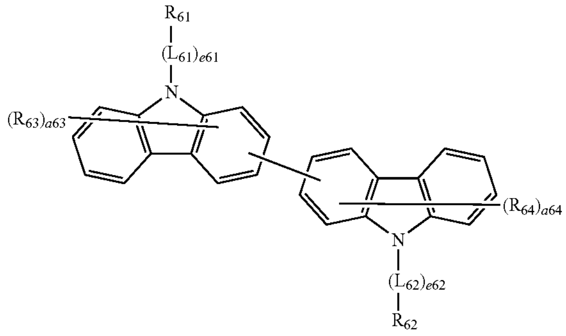

wherein, in Formula 6, $L_{61}$ and $L_{62}$ may each independently be a π-electron rich $C_3$-$C_{60}$ cyclic group that is unsubstituted or substituted with deuterium, a $C_1$-$C_{20}$ alkyl group, a deuterated $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, —Si($Q_{33}$)($Q_{34}$)($Q_{35}$), or any combination thereof, e61 and e62 may each independently be an integer from 1 to 6, $R_{61}$ to $R_{64}$ may each independently be:

hydrogen, deuterium, a $C_1$-$C_{20}$ alkyl group, or a deuterated $C_1$-$C_{20}$ alkyl group;

a π-electron rich $C_3$-$C_{60}$ cyclic group that is unsubstituted or substituted with deuterium, a $C_1$-$C_{20}$ alkyl group, a deuterated $C_1$-$C_{20}$ alkyl group, a phenyl group, a deuterated a phenyl group, a ($C_1$-$C_{20}$ alkyl)phenyl group, a biphenyl group, a deuterated biphenyl group, a ($C_1$-$C_{20}$ alkyl)biphenyl group, —Si($Q_{33}$)($Q_{34}$)($Q_{35}$), or any combination thereof; or —$Si(Q_3)(Q_4)(Q_5)$, and a63 and a64 may each independently be an integer from 0 to 7, where $Q_3$ to $Q_5$ and $Q_{33}$ to $Q_{35}$ are each the same as described in the present specification.

In an embodiment, the hole-transporting compound may be a compound represented by Formula 6-1, 6-2, or 6-3:

Formula 6-1

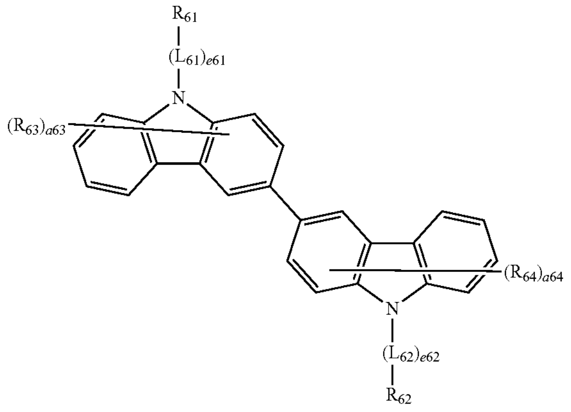

Formula 6-2

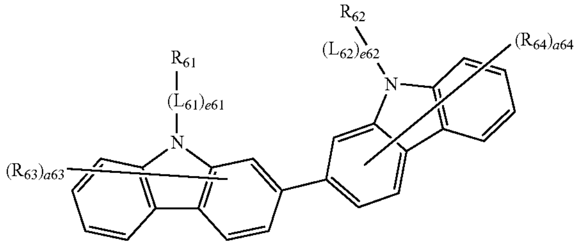

Formula 6-3

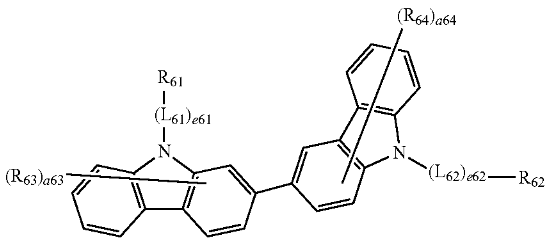

wherein, in Formulae 6-1 to 6-3, $L_{61}$, $L_{62}$, $R_{61}$ to $R_{64}$, e61, e62, a63, and a64 are respectively the same as those described in the present specification.

In an embodiment, the hole-transporting compound may be one of Compounds HTH1 to HTH6:

HTH1

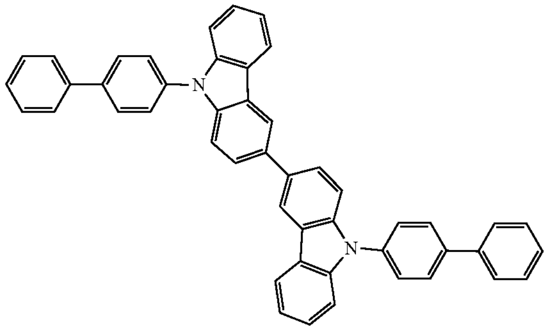

HTH2

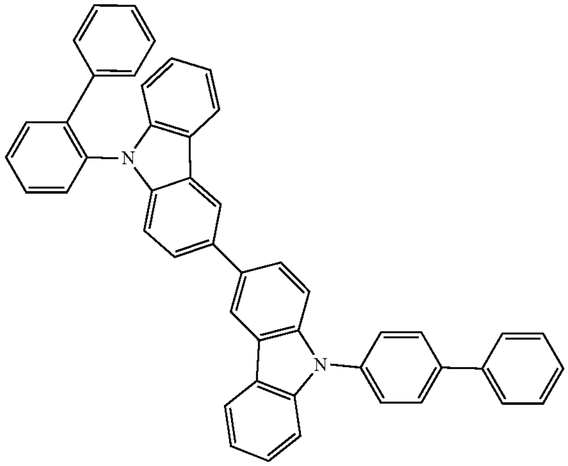

HTH3

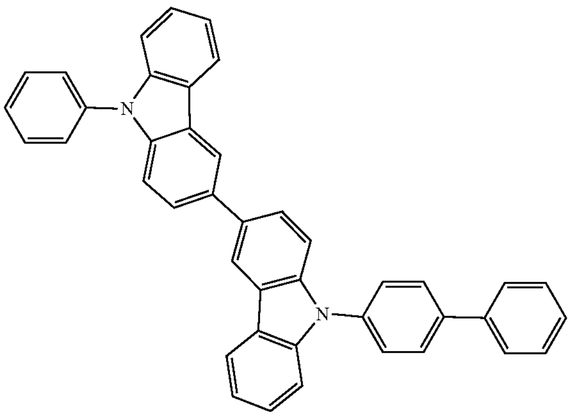

-continued

HTH4

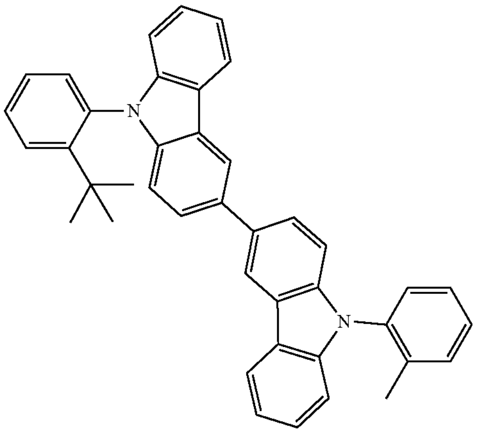

HTH5

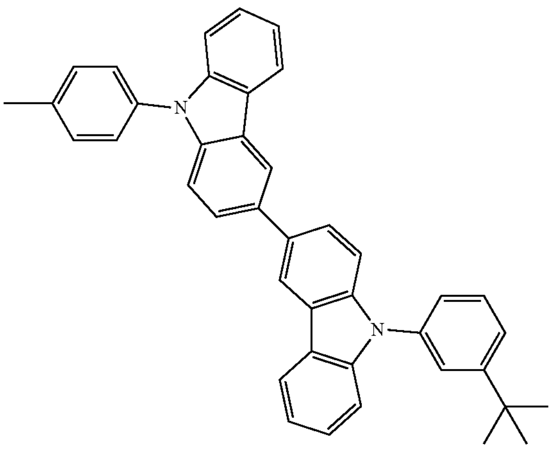

HTH6

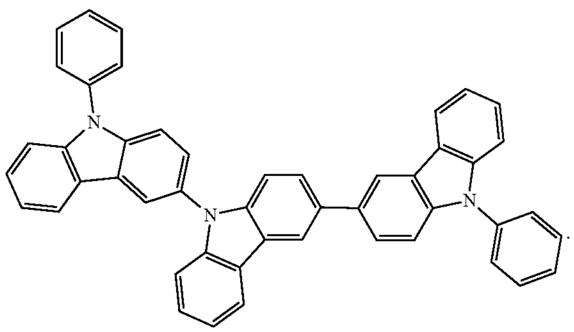

In an embodiment, the electron-transporting compound may be a compound represented by Formula 7:

Formula 7

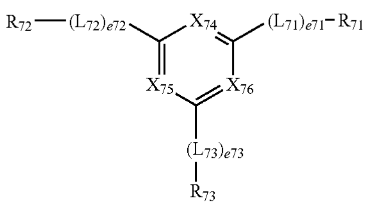

wherein, in Formula 7, $X_{74}$ may be $C(R_{74})$ or N, $X_{75}$ may be $C(R_{75})$ or N, $X_{76}$ may be $C(R_{76})$ or N, and at least one of $X_{74}$ to $X_{76}$ may be N, $L_{71}$ to $L_{73}$ may each independently be a $C_5$-$C_{30}$ carbocyclic group or a $C_1$-$C_{30}$ heterocyclic group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —$Si(Q_{33})(Q_{34})(Q_{35})$, or any combination thereof, e71 to e73 may each independently be an integer from 1 to 10, and $R_{71}$ to $R_{76}$ may each independently be:

hydrogen, deuterium, —F, or a cyano group;

a $C_1$-$C_{20}$ alkyl group that is unsubstituted or substituted with deuterium, —F, a cyano group, or any combination thereof;

a $C_5$-$C_{30}$ carbocyclic group or a $C_1$-$C_{30}$ heterocyclic group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —$Si(Q_{33})(Q_{34})(Q_{35})$, or any combination thereof; or —$Si(Q_3)(Q_4)(Q_5)$, where $Q_3$ to $Q_5$ and $Q_{33}$ to $Q_{35}$ are each the same as described in the present specification.

In an embodiment, $X_{74}$ to $X_{76}$ in Formula 7 may each be N.

In an embodiment, $L_{71}$ to $L_{73}$ in Formula 7 may each independently be a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphtho carbazole group, a dinaphthofuran group, a dinaphthothiophene group, or dibenzocarbazole group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl) phenyl group, a biphenyl group, a deuterated biphenyl group, a fluorinated biphenyl group, a ($C_1$-$C_{20}$ alkyl)biphenyl group, —$Si(Q_{33})(Q_{34})(Q_{35})$, or any combination thereof.

In an embodiment, in Formula 7, at least one of e71 $L_{71}$, at least one of e72 $L_{72}$, at least one of e73 $L_{73}$, or any combination thereof may each independently be a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphtho carbazole group, a dinaphthofuran group, a dinaphthothiophene group, or dibenzocarbazole group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —Si($Q_{33}$)($Q_{34}$)($Q_{35}$), or any combination thereof, where $Q_3$ to $Q_5$ and $Q_{33}$ to $Q_{35}$ are each the same as described in the present specification.

In an embodiment, in Formula 7, at least one of e71 $L_{71}$, at least one of e72 $L_{72}$, at least one of e73 $L_{73}$, or any combination thereof may include a carbazole group, an indolocarbazole group, a benzocarbazole group, a naphtho carbazole group, or a dibenzocarbazole group, and a nitrogen atom of a pyrrole group in the carbazole group, the indolocarbazole group, the benzocarbazole group, the naphtho carbazole group, or the dibenzocarbazole group may be connected to a carbon atom of a 6-membered ring including $X_{74}$ to $X_{76}$ in Formula 7 with a single bond or neighboring $L_{71}$, $L_{72}$, and/or $L_{73}$ therebetween.

In an embodiment, e71 to e73 in Formula 7 indicate numbers of $L_{71}$ to $L_{73}$, respectively, and may each independently be, for example, 1, 2, 3, 4, or 5.

In an embodiment, $R_{71}$ to $R_{76}$ in Formula 7 may each independently be:

hydrogen, deuterium, —F, or a cyano group;

a $C_1$-$C_{20}$ alkyl group that is unsubstituted or substituted with deuterium, —F, a cyano group, or any combination thereof;

a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphtho carbazole group, a dinaphthofuran group, a dinaphthothiophene group, or a dibenzocarbazole group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —Si($Q_{33}$)($Q_{34}$)($Q_{35}$), or any combination thereof; or —Si($Q_3$)($Q_4$)($Q_5$), where $Q_3$ to $Q_5$ and $Q_{33}$ to $Q_{35}$ are each the same as described in the present specification.

In an embodiment, the electron-transporting compound may be one of Compounds ETH1 to ETH7:

ETH1

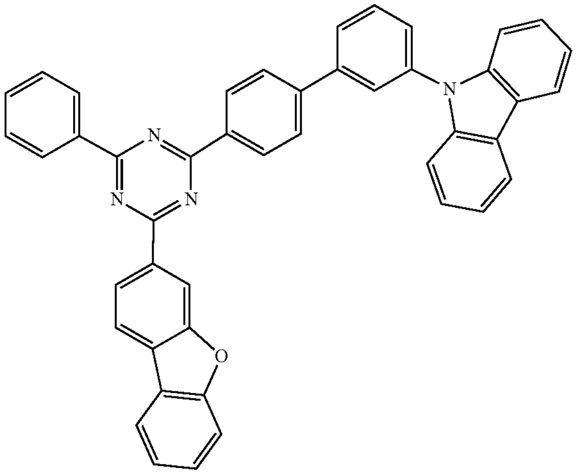

-continued

ETH2

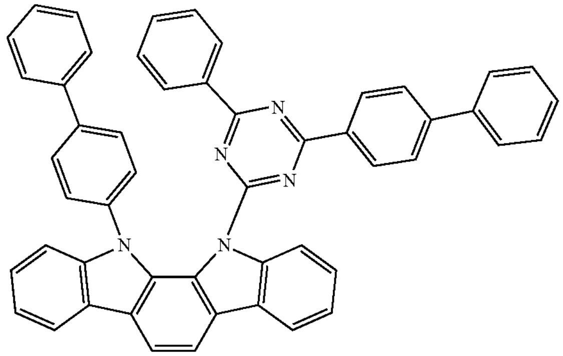

ETH3

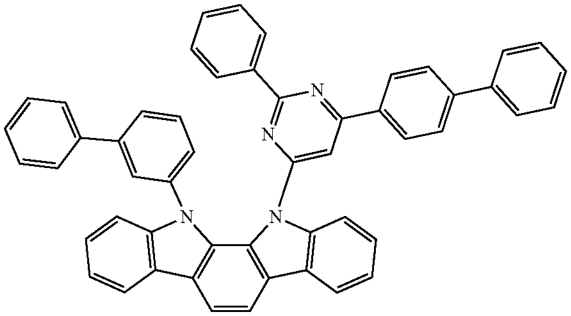

ETH4

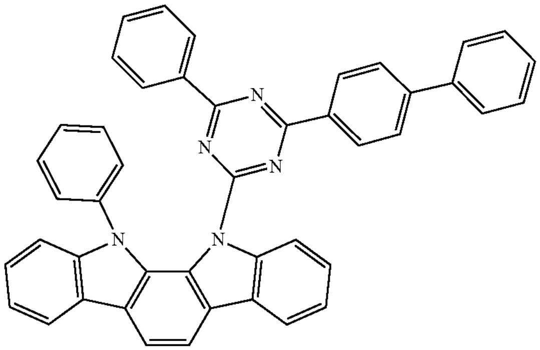

-continued

ETH5

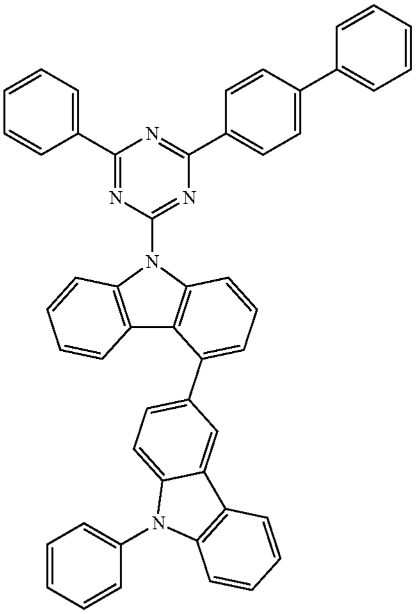

ETH6

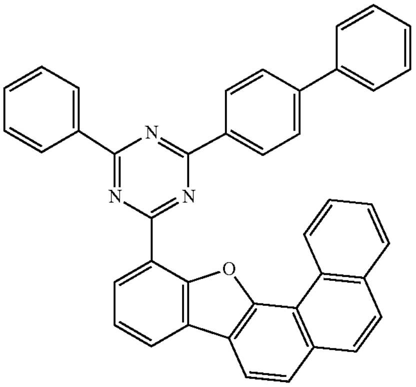

ETH7

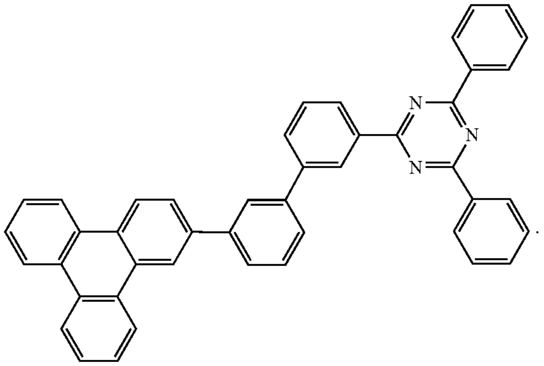

Description of Sensitizer

The sensitizer may include a transition metal.

In an embodiment, the sensitizer may include platinum. The sensitizer may be electrically neutral.

In an embodiment, the sensitizer may include a platinum-containing organometallic compound, and the platinum-containing organometallic compound may include platinum and a tetradentate ligand bonded to the platinum. In this regard, at least one of chemical bonds between the platinum and the tetradentate ligand may be a platinum-carbon chemical bond. In an embodiment, one of chemical bonds between the platinum and the tetradentate ligand may be a platinum-oxygen chemical bond.

In an embodiment, the platinum-containing organometallic compound may be an organometallic compound including a) a chemical bond (for example, a covalent bond) between carbon of the tetradentate ligand and the platinum and b) a chemical bond (for example, a covalent bond) between oxygen (O) of the tetradentate ligand and the platinum. The platinum-containing organometallic compound may include a chemical bond (for example, a coordinate bond) between nitrogen of the tetradentate ligand and the platinum.

In an embodiment, the platinum-containing organometallic compound may be an organometallic compound including a) a chemical bond (for example, a covalent bond) between carbon of the tetradentate ligand and the platinum and b) a chemical bond (for example, a covalent bond) between sulfur (S) of the tetradentate ligand and the platinum. The platinum-containing organometallic compound may include a chemical bond (for example, a coordinate bond) between nitrogen of the tetradentate ligand and the platinum.

In an embodiment, the tetradentate ligand may include a benzimidazole group. For example, the number of the benzimidazole group in the tetradentate ligand is 1.

In an embodiment, at least one of chemical bonds between the platinum and the tetradentate ligand of the platinum-containing organometallic compound may be a platinum-carbon chemical bond, and at least one of the platinum-carbon chemical bond may be a coordinate bond. In other words, the platinum-containing organometallic compound may be a carbene-containing organometallic compound.

In an embodiment, the platinum-containing organometallic compound may be an organometallic compound represented by Formula 1:

Formula 1

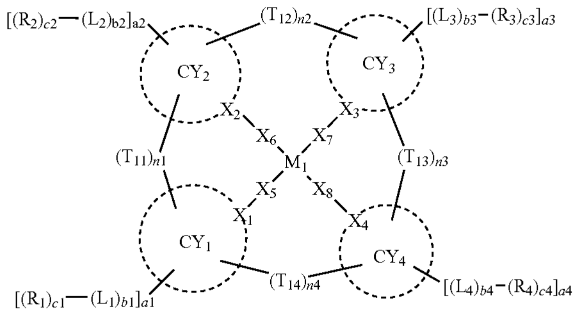

wherein, $M_1$ in Formula 1 is platinum (Pt).

In Formula 1, $X_1$ to $X_4$ may each independently be C or N.

In an embodiment, at least one of $X_1$ to $X_4$ in Formula 1 may be C.

In an embodiment, $X_1$ in Formula 1 may be C.

In an embodiment, in Formula 1, i) $X_1$ and $X_3$ may each be C, and $X_2$ and $X_4$ may each be N, or ii) $X_1$ and $X_4$ may each be C, and $X_2$ and $X_3$ may each be N.

In Formula 1, $X_5$ to $X_8$ may each independently be a chemical bond, O, S, N(R'), C(R')(R''), or C(=O), wherein at least one of $X_5$ to $X_8$ may not be a chemical bond. R' and R'' may each be the same as described in the present specification.

In an embodiment, $X_5$ in Formula 1 may not be a chemical bond.

In an embodiment, $X_5$ in Formula 1 may be O or S.

In an embodiment, in Formula 1, $X_5$ may be O or S, and $X_6$ to $X_8$ may each be a chemical bond.

In an embodiment, each of $X_5$ to $X_8$ in Formula 1 may be a chemical bond (for example, a covalent bond or a coordinate bond).

In Formula 1, two of a bond between $X_5$ or $X_1$ and $M_1$, a bond between $X_6$ or $X_2$ and $M_1$, a bond between $X_7$ or $X_3$ and $M_1$, and a bond between $X_8$ or $X_4$ and $M_1$ may each be a coordinate bond, and the other two bonds may each be a covalent bond.

For example, a bond between $X_2$ and $M_1$ in Formula 1 may be a coordinate bond.

In an embodiment, in Formula 1, a bond between $X_5$ or $X_1$ and $M_1$ and a bond between $X_3$ and $M_1$ may each be a coordinate bond, and a bond between $X_2$ and $M_1$ and a bond between $X_4$ and $M_1$ may each be a covalent bond.

In an embodiment, in Formula 1, a bond between $X_5$ or $X_1$ and $M_1$ and a bond between $X_3$ and $M_1$ may each be a covalent bond, and a bond between $X_2$ and $M_1$ and a bond between $X_4$ and $M_1$ may each be a coordinate bond.

In an embodiment, in Formula 1, $X_6$ may be a chemical bond, $X_2$ may be carbon, and a bond between $X_2$ and $M_1$ may be a coordinate bond.

In an embodiment, in Formula 1, $X_2$, $X_1$, and $X_4$ may each be C, $X_3$ may be N, $X_5$ to $X_8$ may each be a chemical bond, n2 may be 0, n1, n4, and n3 may each be 1, a bond between $X_2$ and $M_1$ and a bond between $X_3$ and $M_1$ may each be a coordinate bond, and a bond between X, and $M_1$ and a bond between $X_4$ and $M_1$ may each be a covalent bond.

Ring $CY_1$ to ring $CY_4$ in Formula 1 may each independently be a $C_5$-$C_{30}$ carbocyclic group or a $C_1$-$C_{30}$ heterocyclic group.

For example, each of ring $CY_1$, ring $CY_3$, and ring $CY_4$ in Formula 1 may not be a benzimidazole group.

For example, ring $CY_1$ to ring $CY_4$ in Formula 1 may each independently be i) a first ring, ii) a second ring, iii) a condensed cyclic ring in which two or more first rings are condensed with each other, iv) a condensed cyclic ring in which two or more second rings are condensed with each other, or v) a condensed cyclic ring in which one or more first rings and one or more second rings are condensed with each other, wherein the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In an embodiment, ring $CY_1$ to ring $CY_4$ in Formula 1 may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluoren-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isoxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a pyridinopyrrole group, a pyridinopyrazole group, pyridinoimidazole group, a pyridinoxazole group, a pyridinoisoxazole group, a pyridinothiazole group, a pyridinoisothiazole group, a pyridinoxadiazole group, a pyridinothiadiazole group, a pyrimidinopyrrole group, a pyrimidinopyrazole group, a pyrimidinoimidazole group, a pyrimidinoxazole group, a pyrimidinoisoxazole group, a pyrimidinothiazole group, a pyrimidinoisothiazole group, a pyrimidinoxadiazole group, a pyrimidinothiadiazole group, a naphthopyrrole group, a naphthopyrazole group, a naphthoimidazol group, a naphthoxazole group, a naphthoisoxazole group, a naphthothiazole group, a naphthoisothiazole group, a naphthoxadiazole group, a naphthothiadiazole group, a phenanthrenopyrrole group, a phenanthrenopyrazole group, a phenanthrenoimidazole group, a phenanthrenoxazole group, a phenanthrenoisoxazole group, a phenanthrenothiazole group, a phenanthrenoisothiazole group, a phenanthrenoxadiazole group, a phenanthrenothiadiazole group, a 5,6,7,8-tetrahydroisoquinoline group, a 5,6,7,8-tetrahydroquinoline group, an adamantane group, a norbornane group, a norbornene group, a benzene group condensed with a cyclohexane group, a benzene group condensed with a norbornane group, a pyridine group condensed with a cyclohexane group, or a pyridine group condensed with a norbornane group.

In an embodiment, ring $CY_1$ and ring $CY_3$ in Formula 1 may each independently be:

a benzene group, a naphthalene group, a phenanthrene group, a dibenzofuran group, a dibenzothiophene group, a dibenzoselenophene group, a carbazole group, a fluorene group, or a dibenzosilole group; or a benzene group, a naphthalene group, a phenanthrene group, a dibenzofuran group, a dibenzothiophene group, a dibenzoselenophene group, a carbazole group, a fluorene group, or a dibenzosilole group, each condensed with a cyclohexane group, a cyclohexene group, a norbornane group, a piperidine group, or any combination thereof.

In an embodiment, ring $CY_2$ in Formula 1 may be:

an imidazole group, a benzimidazole group, a pyridine group, a pyrimidine group, a pyridazine group, a pyrazine group, a triazine group, a quinoline group, an isoquinoline group, a quinoxaline group, or a quinazoline group; or an imidazole group, a benzimidazole group, a pyridine group, a pyrimidine group, a pyridazine group, a pyrazine group, a triazine group, a quinoline group, an isoquinoline group, a quinoxaline group, or a quinazoline group, each condensed with a cyclohexane group, a cyclohexene group, a norbornane group, a benzene group, a pyridine group, a pyrimidine group, or any combination thereof. In an embodiment, ring $CY_2$ in Formula 1 may be an imidazole group, or a benzimidazole group, with $X_2$ being one of the two imidazole nitrogen's coordinated to the platinum. Moreover, the other (opposite) imidazole nitrogen may be substituted with a $C_6$-$C_{14}$ aromatic group, e.g., a phenyl group, that is optionally substituted at one or more ring carbons. Examples of such substitution is indicated in the Group 1-2 structures described herein. In some instances, there may be an advantage to have the opposite imidazole nitrogen be substituted with a $C_6$-$C_{14}$ aromatic group with one or more ring carbons substituted with deuterium or a substituent with one or more deuterium atoms, e.g., $—CD_3$, $—CD_2CD_3$, $—CD(CD_3)_2$, or $C_6D_5$.

In an embodiment, ring $CY_4$ in Formula 1 may be:

a pyridine group, a pyrimidine group, a pyridazine group, a pyrazine group, a triazine group, a quinoline group, an isoquinoline group, a quinoxaline group, a quinazoline group, an azadibenzofuran group, an azadibenzothiophene group, an azadibenzoselenophene group, an azacarbazole group, an azafluorene group, or an azadibenzosilole group; or a pyridine group, a pyrimidine group, a pyridazine group, a pyrazine group, a triazine group, a quinoline group, an isoquinoline group, a quinoxaline group, a quinazoline group, an azadibenzofuran group, an azadibenzothiophene group, an azadibenzoselenophene group, an azacarbazole group, an azafluorene group, or an azadibenzosilole group, each condensed with a cyclohexane group, a cyclohexene group, a norbornane group, a benzene group, a pyridine group, a pyrimidine group, or any combination thereof.

In Formula 1, $T_{11}$ to $T_{14}$ may each independently be a single bond, a double bond, $*—N(R_{5a})—*'$, $*—B(R_{5a})—*'$, $*—P(R_{5a})—*'$, $*—C(R_{5a})(R_{5b})—*'$, $*—Si(R_{5a})(R_{5b})—*'$, $*—Ge(R_{5a})(R_{5b})—*'$, $*—S—*'$, $*—Se—*—O—*'$, $*—C(=O)—*'$, $*—S(=O)—*'$, $*—S(=O)_2—*'$, $*—C(R_{5a})=*'$, $*=C(R_{5a})—*'$, $*—C(R_{5a})=C(R_{5b})—*'$, $*—C(=S)—*'$, $*—C{\equiv}C—*'$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In an embodiment, $T_{11}$ and $T_{12}$ in Formula 1 may be a single bond, and $T_{13}$ may be a single bond, $*—N(R_{5a})—*'$, $*—B(R_{5a})—*'$, $*—P(R_{5a})—*'$, $*—C(R_{5a})(R_{5b})—*'$, $*—Si(R_{5a})(R_{5b})—*'$, $*—Ge(R_{5a})(R_{5b})—*'$, $*—S—*'$, or $*—O—*'$.

In Formula 1, n1 to n4 indicate numbers of $T_{11}$ to $T_{14}$, respectively, and may each independently be 0 or 1, wherein three or more of n1 to n4 may each be 1. In other words, an organometallic compound represented by Formula 1 may have a tetradentate ligand.

In Formula 1, when n1 is 0, $T_{11}$ does not exist (that is, ring $CY_1$ and ring $CY_2$ are not linked to each other), when n2 is 0, $T_{12}$ does not exist (that is, ring $CY_2$ and ring $CY_3$ are not linked to each other), when n3 is 0, $T_{13}$ does not exist (that is, ring $CY_3$ and ring $CY_4$ are not linked to each other), and when n4 is 0, $T_{14}$ does not exist (that is, ring $CY_4$ and ring $CY_1$ are not linked to each other).

In an embodiment, in Formula 1, n1 to n3 may each be 1, and n4 may be 0.

$L_1$ to $L_4$ in Formula 1 may each independently be a single bond, a $C_1$-$C_{60}$ alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

For example, $L_1$ to $L_4$ in Formula 1 may each independently be:

a single bond; or a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{10a}$.

In an embodiment, $L_1$ to $L_4$ in Formula 1 may each independently be:

a single bond; or a benzene, a naphthalene group, a pyridine group, a fluorene group, a carbazole group, a dibenzofuran group, or a dibenzothiophene group, each unsubstituted or substituted with at least one $R_{10a}$.

In an embodiment, $L_1$ to $L_4$ in Formula 1 may each independently be:

a single bond; or a $C_1$-$C_{20}$ alkylene group, a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

In Formula 1, b1 to b4 indicate numbers of $L_1$ to $L_4$, respectively, and may each independently be an integer from 1 to 10. When b1 is 2 or more, two or more $L_1$ may be identical to or different from each other, when b2 is 2 or more, two or more $L_2$ may be identical to or different from each other, when b3 is 2 or more, two or more $L_3$ may be identical to or different from each other, and when b4 is 2 or more, two or more $L_4$ may be identical to or different from each other. For example, b1 to b4 may each independently be 1, 2, or 3.

In Formula 1, $R_1$ to $R_4$, $R_{5a}$, $R_{5b}$, R', and R" may each independently be hydrogen, deuterium, —F, —Cl, —Br, —I, —$SF_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), where $Q_1$ to $Q_9$ may each be the same as described in the present specification.

For example, $R_1$ to $R_4$, $R_{5a}$, $R_{5b}$, R', and R" in Formula 1 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkenyl group, a $C_1$-$C_{20}$ alkoxy group, or a $C_1$-$C_{20}$ alkylthio group;

a $C_1$-$C_{20}$ alkyl group, a $C_1$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cycloctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a fluorinated alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cycloctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$alkyl)phenyl group, a deuterated phenyl group, a fluorinated phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $Q_1$ to $Q_9$ may each independently be:

deuterium, —F, $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, $—CD_2CDH_2$, $—CF_3$, $—CF_2H$, $—CFH_2$, $—CH_2CF_3$, $—CH_2CF_2H$, $—CH_2CFH_2$, $—CHFCH_3$, $—CHFCF_2H$, $—CHFCFH_2$, $—CHFCF_3$, $—CF_2CF_3$, $—CF_2CF_2H$, or $—CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

In an embodiment, $R_1$ to $R_4$, $R_{5a}$, $R_{5b}$, R', and R" in Formula 1 may each independently be:

hydrogen, deuterium, —F, or a cyano group;

a $C_1$-$C_{20}$ alkyl group that is unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or any combination thereof; or $—Si(Q_3)(Q_4)(Q_5)$ or $—Ge(Q_3)(Q_4)(Q_5)$, where $Q_3$ to $Q_5$ may each independently be:

a $C_1$-$C_{60}$ alkyl group that is unsubstituted or substituted with deuterium, a $C_1$-$C_{60}$ alkyl group, a $C_6$-$C_{60}$ aryl group, or any combination thereof; or a $C_6$-$C_{60}$ aryl group that is unsubstituted or substituted with deuterium, a $C_1$-$C_{60}$ alkyl group, a $C_6$-$C_{60}$ aryl group, or any combination thereof.

In an embodiment, $Q_3$ to $Q_5$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In an embodiment, $Q_3$ to $Q_5$ may be identical to each other.

In an embodiment, two or more of $Q_3$ to $Q_5$ may be different from each other.

In an embodiment, $R_1$ to $R_4$, $R_{5a}$, $R_{5b}$, R', and R" in Formula 1 may each independently be hydrogen, deuterium, —F, $—CH_3$, $—CD_3$, $—CD_2H$, $—CDH_2$, $—CF_3$, $—CF_2H$, $—CFH_2$, a $C_1$-$C_{10}$ alkyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-227, a group represented by one of Formulae 9-201 to 9-227 in which at least one hydrogen is substituted with deuterium, a group represented by one of Formulae 9-201 to 9-227 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, $—Si(Q_3)(Q_4)(Q_5)$, or $—Ge(Q_3)(Q_4)(Q_5)$ (wherein $Q_3$ to $Q_5$ are respectively the same as those described in the present specification):

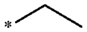
9-1

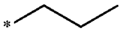
9-2

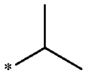
9-3

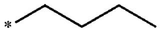
9-4

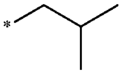
9-5

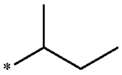
9-6

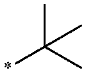
9-7

9-8

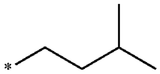
9-9

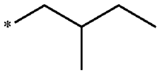
9-10

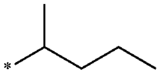
9-11

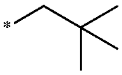
9-12

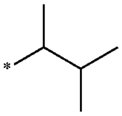
9-13

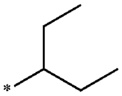
9-14

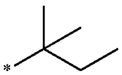
9-15

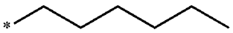
9-16

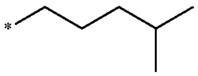
9-17

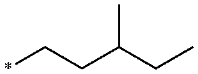
9-18

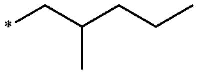
9-19

-continued
9-20
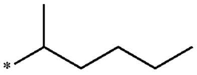
9-21
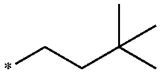
9-22
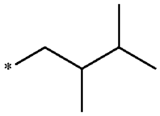
9-23
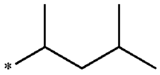
9-24
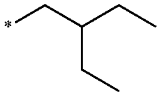
9-25
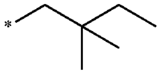
9-26
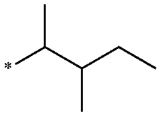
9-27
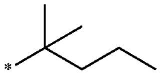
9-28
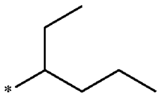
9-29
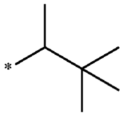
9-30
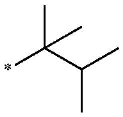
9-31
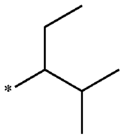
9-32
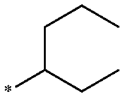
9-33
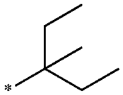
-continued
9-34
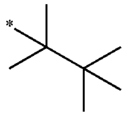
9-35
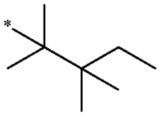
9-36
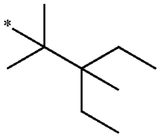
9-37
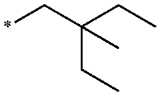
9-38
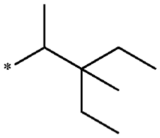
9-39
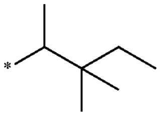
9-201
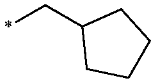
9-202
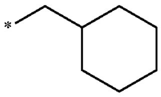
9-203
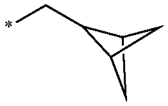
9-204
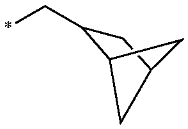
9-205
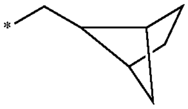
9-206
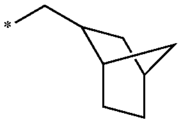

-continued
9-207
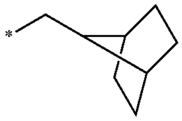
9-208
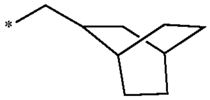
9-209
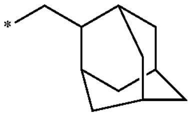
9-210
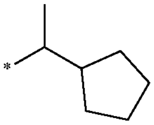
9-211
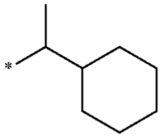
9-212
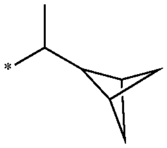
9-213
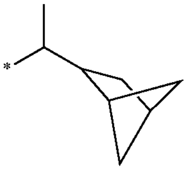
9-214
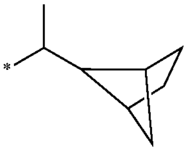
9-215
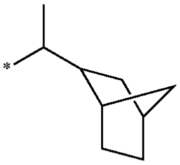
9-216
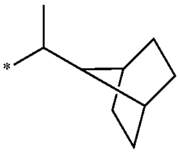
-continued
9-217
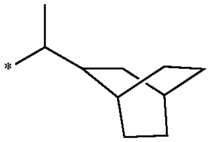
9-218
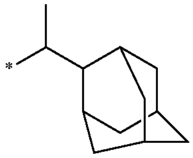
9-219
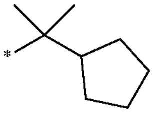
9-220
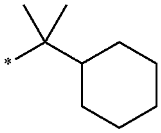
9-221
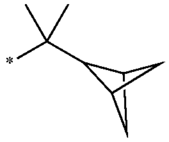
9-222
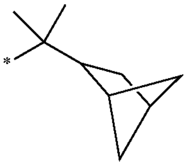
9-223
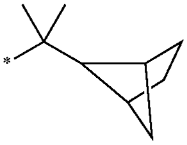
9-224
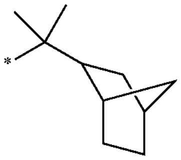
9-225
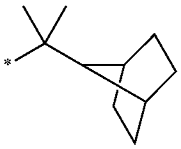
9-226
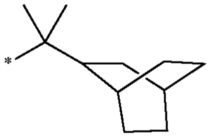

-continued
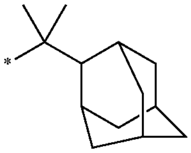
9-227
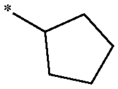
10-1
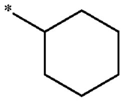
10-2
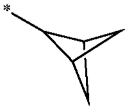
10-3
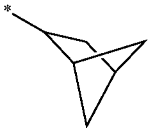
10-4
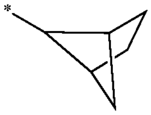
10-5
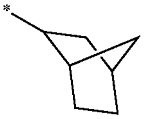
10-6
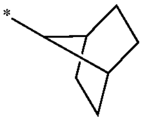
10-7
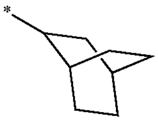
10-8
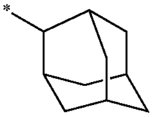
10-9
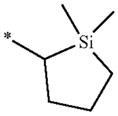
10-10
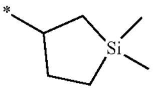
10-11
-continued
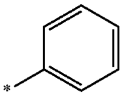
10-12
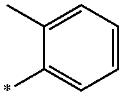
10-13
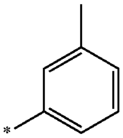
10-14
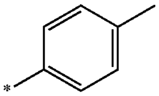
10-15
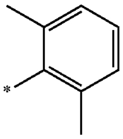
10-16
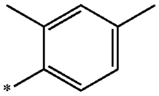
10-17
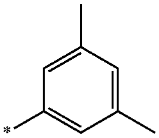
10-18
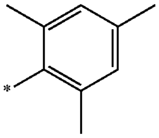
10-19
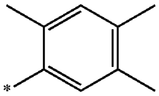
10-20
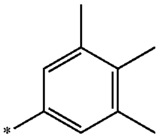
10-21
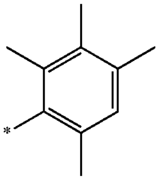
10-22

-continued
10-23
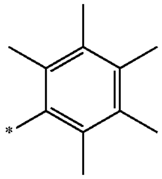
10-24
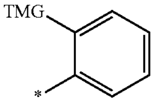
10-25
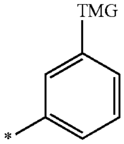
10-26
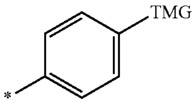
10-27
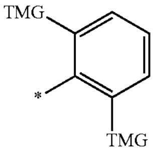
10-28
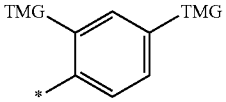
10-29
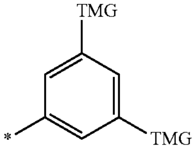
10-30
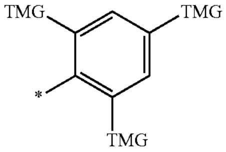
10-31
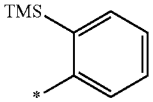
10-32
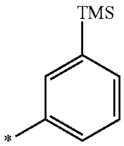
10-33
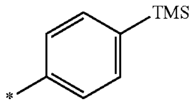
-continued
10-34
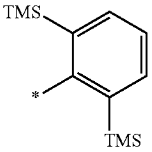
10-35
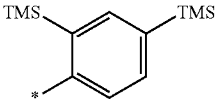
10-36
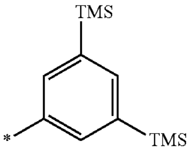
10-37
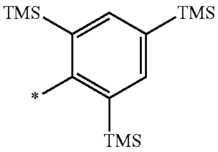
10-38
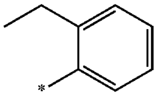
10-39
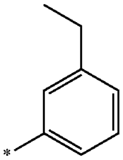
10-40
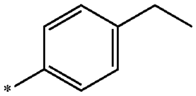
10-41
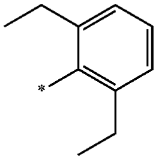
10-42
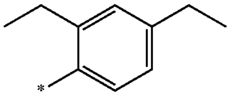
10-43
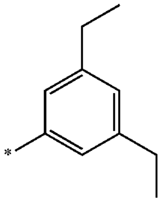

-continued
10-44
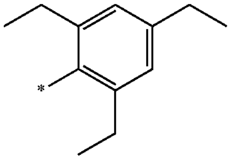
10-45
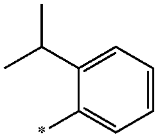
10-46
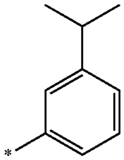
10-47
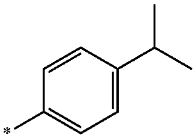
10-48
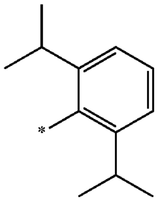
10-49
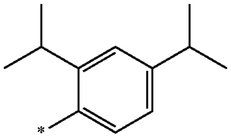
10-50
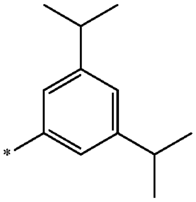
10-51
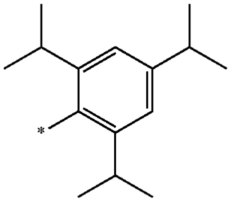
10-52
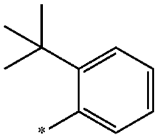
-continued
10-53
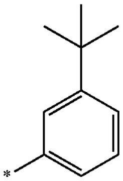
10-54
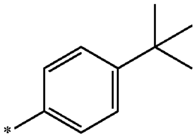
10-55
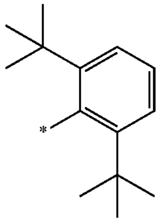
10-56
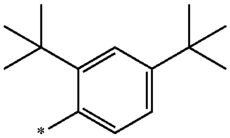
10-57
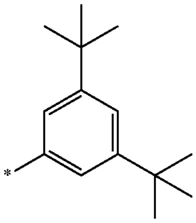
10-58
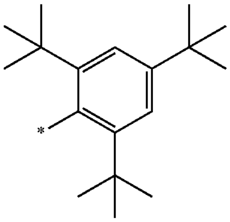
10-59
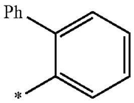
10-60
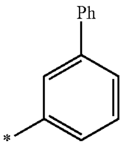
10-61
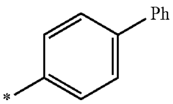

-continued
10-62
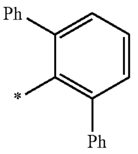
10-63
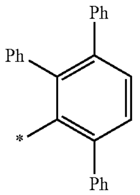
10-64
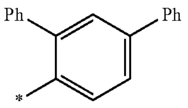
10-65
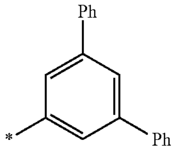
10-66
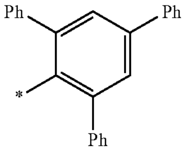
10-67
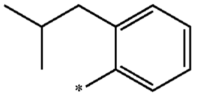
10-68
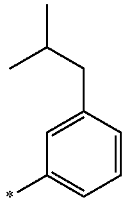
10-69
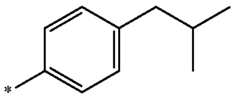
10-70
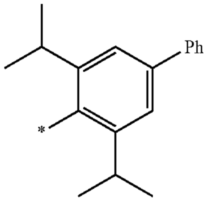
-continued
10-71
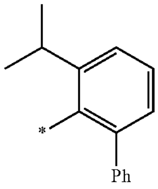
10-72
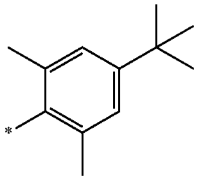
10-73
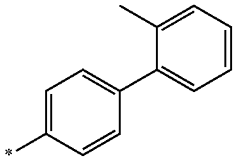
10-74
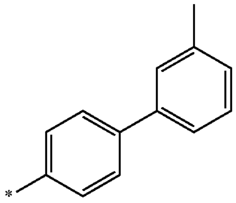
10-75
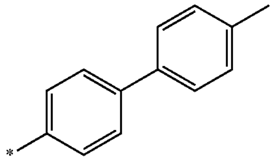
10-76
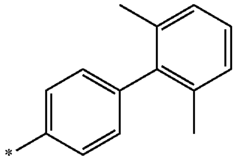
10-77
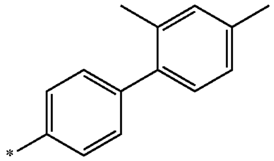
10-78
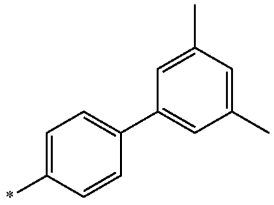

-continued
10-79
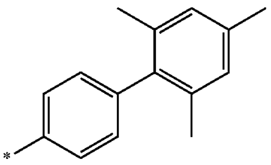
10-80
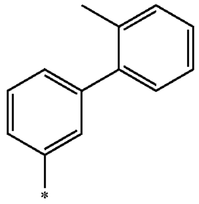
10-81
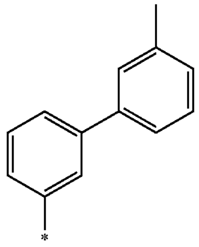
10-82
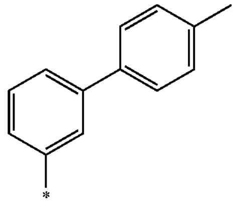
10-83
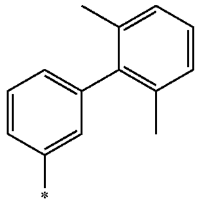
10-84
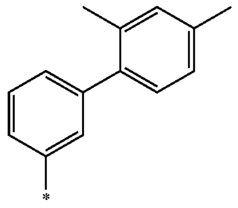
10-85
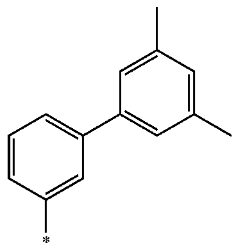
-continued
10-86
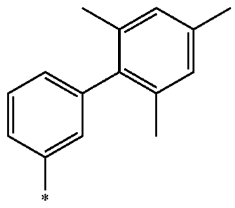
10-87
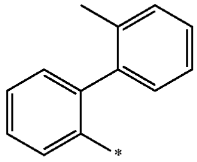
10-88
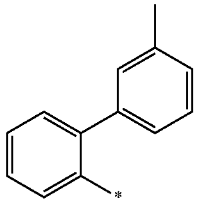
10-89
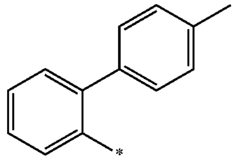
10-90
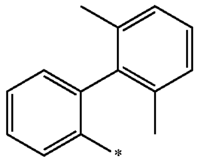
10-91
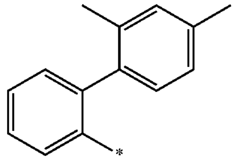
10-92
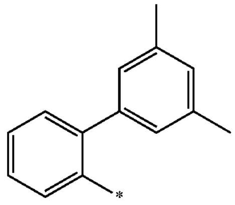
10-93
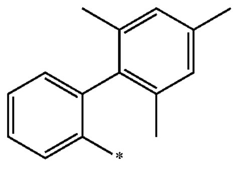

-continued
10-94
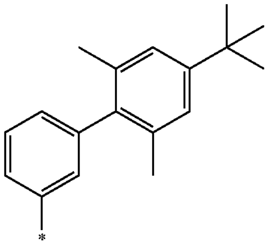
10-95
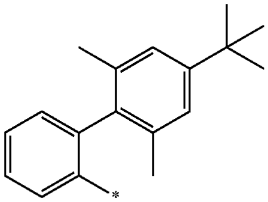
10-96
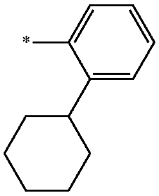
10-97
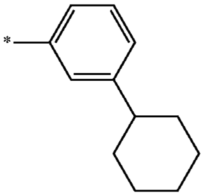
10-98
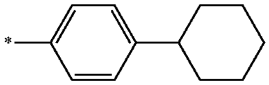
10-99
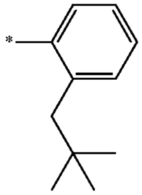
10-100
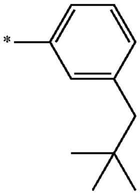
10-101
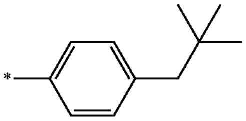
-continued
10-102
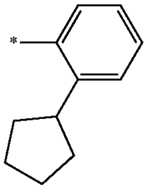
10-103
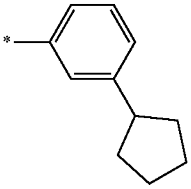
10-104
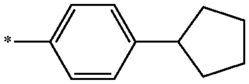
10-105
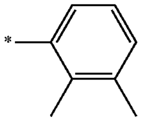
10-106
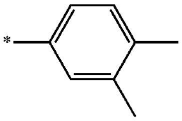
10-107
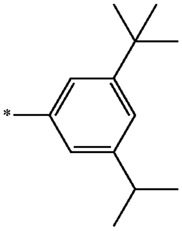
10-108
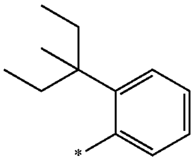
10-109
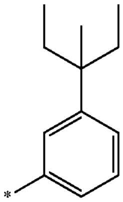
10-110
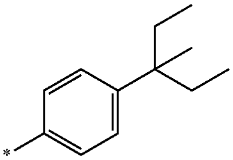

-continued
10-111
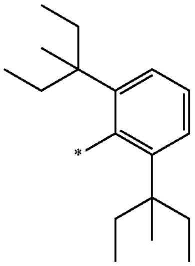
10-112
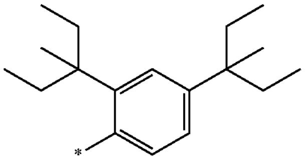
10-113
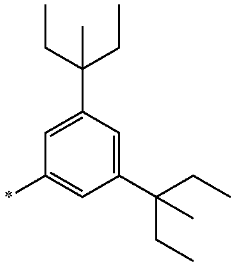
10-114
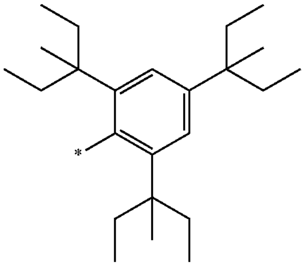
10-115
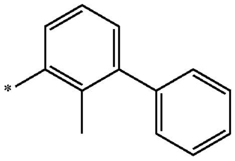
10-116
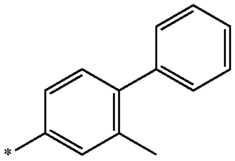
10-117
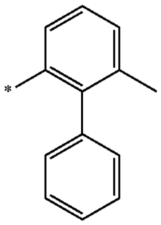
-continued
10-118
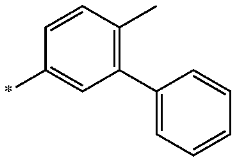
10-119
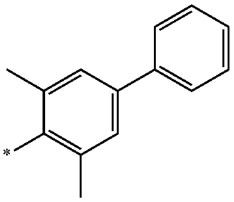
10-120
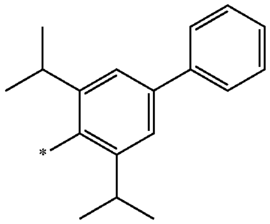
10-121
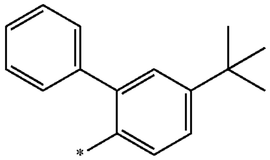
10-122
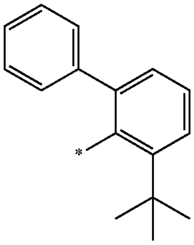
10-123
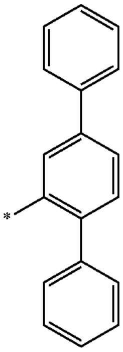

-continued
10-124
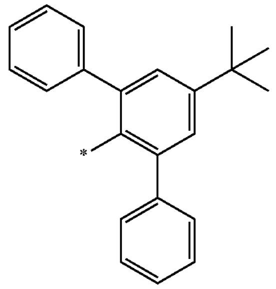
10-125
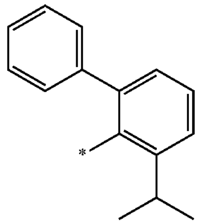
10-126
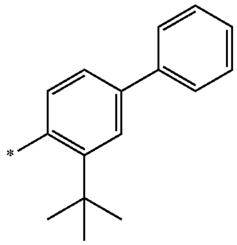
10-127
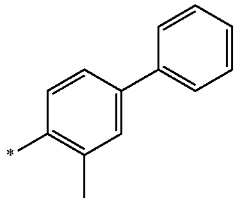
10-128
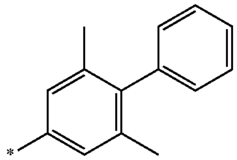
10-129
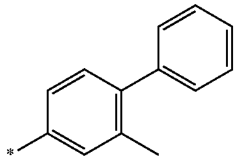
10-201
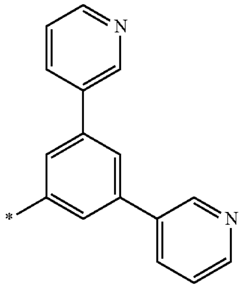
-continued
10-202
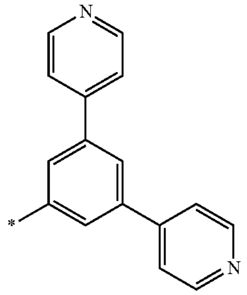
10-203
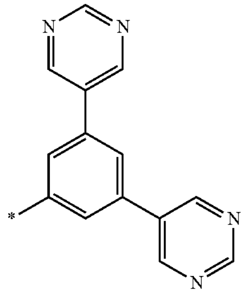
10-204
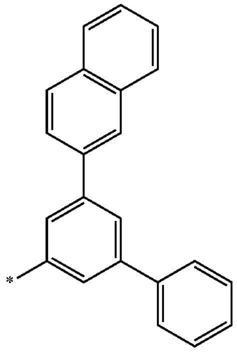
10-205
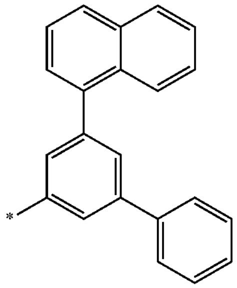
10-206
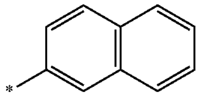
10-207
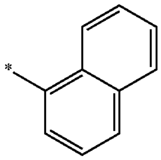

-continued
10-208
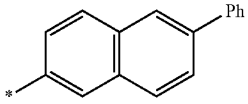
10-209
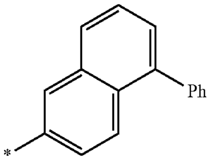
10-210
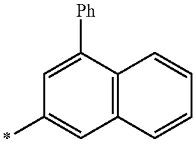
10-211
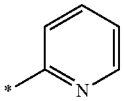
10-212
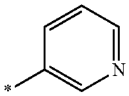
10-213
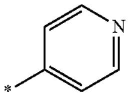
10-214
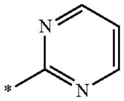
10-215
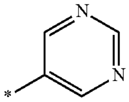
10-236
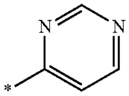
10-217
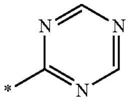
10-218
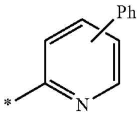
10-219
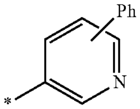
10-220
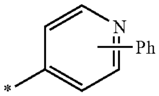
-continued
10-221
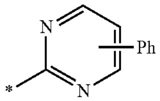
10-222
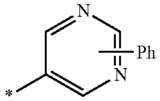
10-223
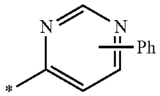
10-224
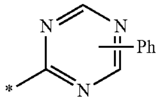
10-225
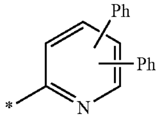
10-226
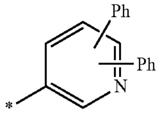
10-227
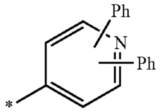
10-228
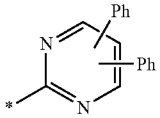
10-229
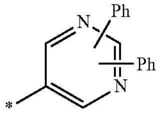
10-230
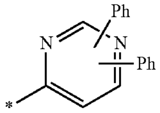
10-231
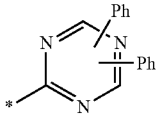
10-232
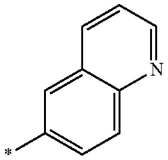

-continued
10-233
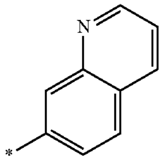
10-234
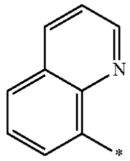
10-235
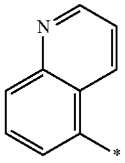
10-236
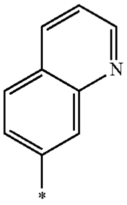
10-237
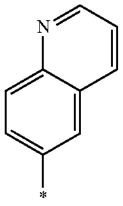
10-238
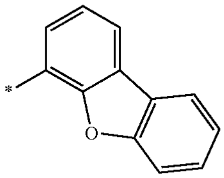
10-239
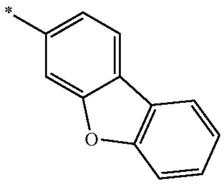
10-240
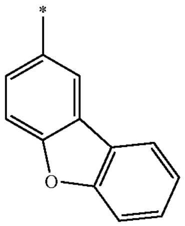
-continued
10-241
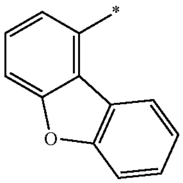
10-242
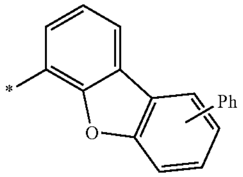
10-243
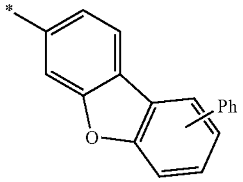
10-244
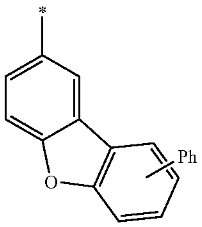
10-245
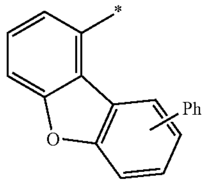
10-246
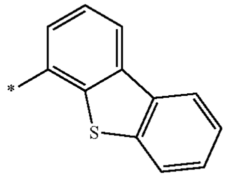
10-247
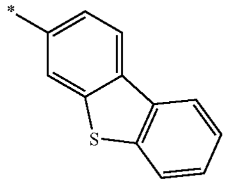
10-248
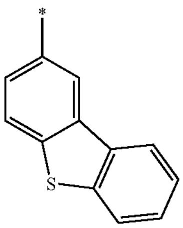

-continued
10-249
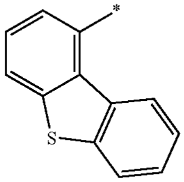
10-250
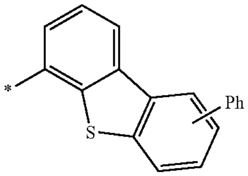
10-251
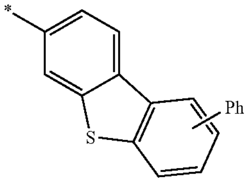
10-252
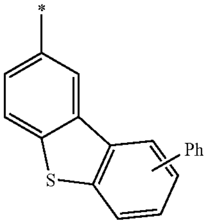
10-253
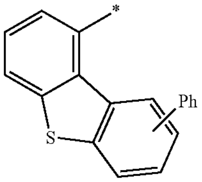
10-254
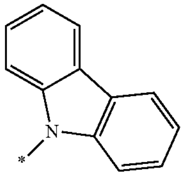
10-255
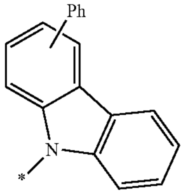
10-256
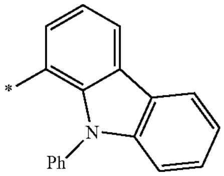
-continued
10-257
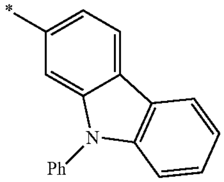
10-258
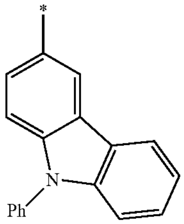
10-259
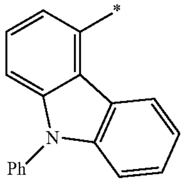
10-260
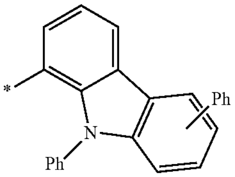
10-261
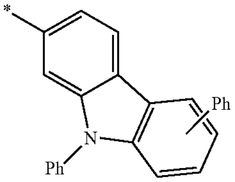
10-262
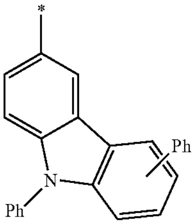
10-263
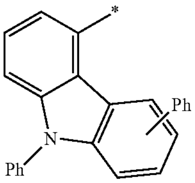

-continued
10-264
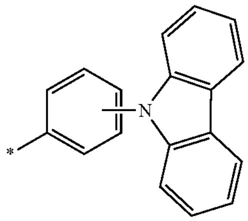
10-265
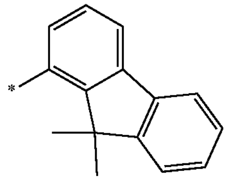
10-266
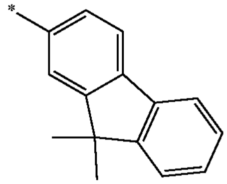
10-267
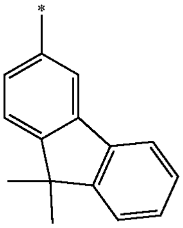
10-268
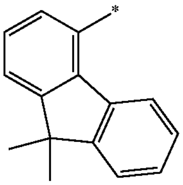
10-269
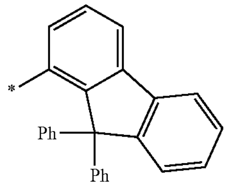
10-270
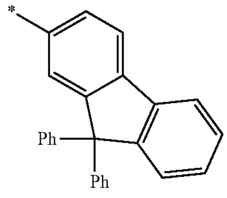
-continued
10-271
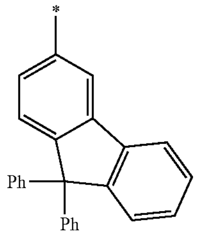
10-272
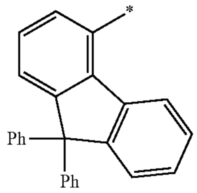
10-273
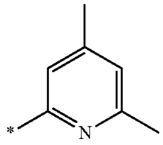
10-274
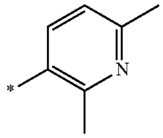
10-275
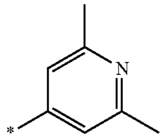
10-276
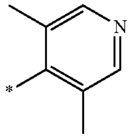
10-277
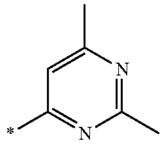
10-278
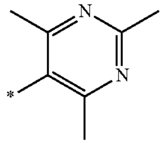
10-279
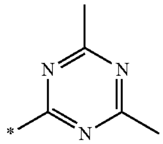

-continued
10-280
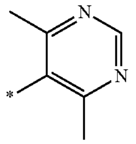
10-281
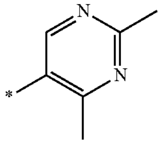
10-282
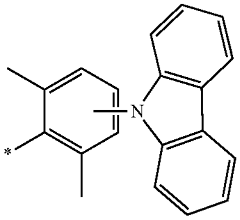
10-283
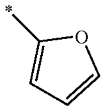
10-284
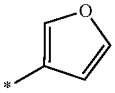
10-285
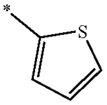
10-286
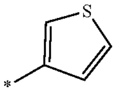
10-287
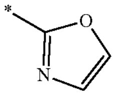
10-288
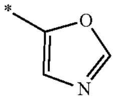
10-289
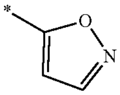
10-290
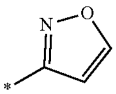
10-291
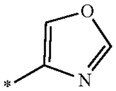
-continued
10-292
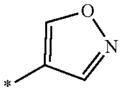
10-293
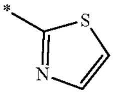
10-294
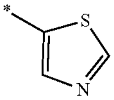
10-295
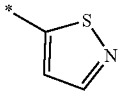
10-296
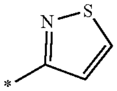
10-297
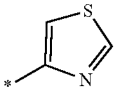
10-298
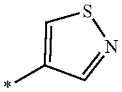
10-299
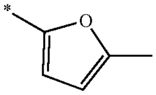
10-300
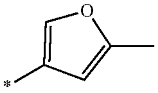
10-301
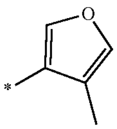
10-302
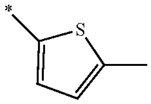
10-303
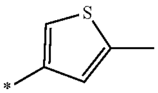
10-304
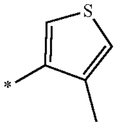

-continued
10-305
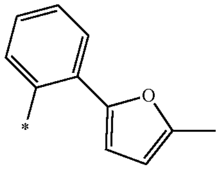
10-306
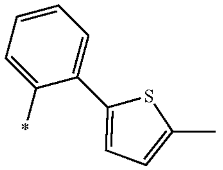
10-307
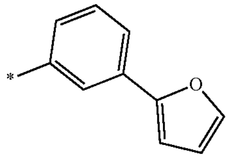
10-308
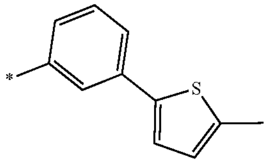
10-309
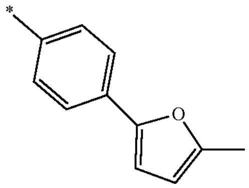
10-310
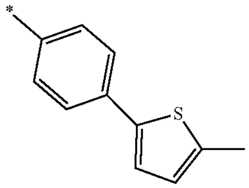
10-311
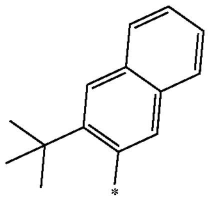
10-312
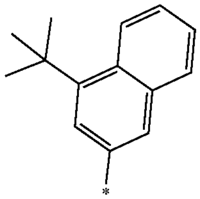
-continued
10-313
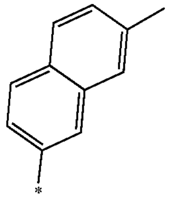
10-314
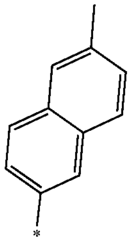
10-315
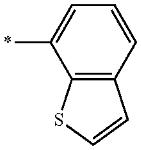
10-316
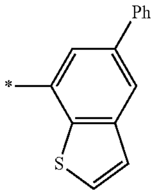
10-317
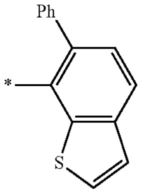
10-318
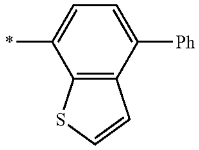
10-319
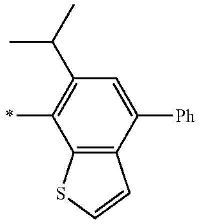

-continued
10-320
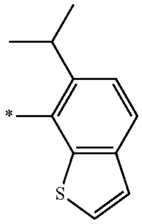
10-321
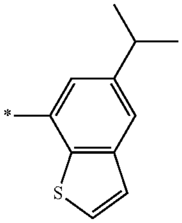
10-322
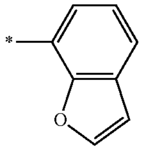
10-323
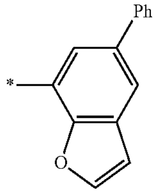
10-324
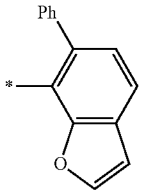
10-325
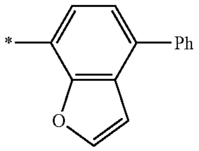
10-326
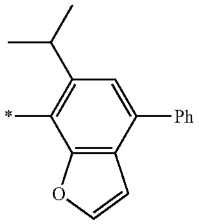
-continued
10-327
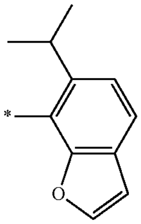
10-328
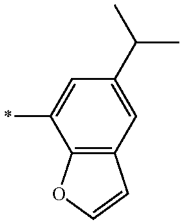
10-329
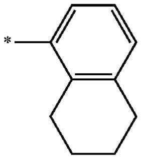
10-330
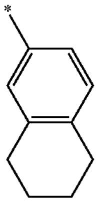
10-331
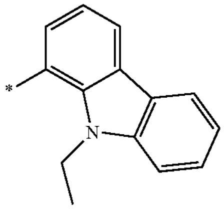
10-332
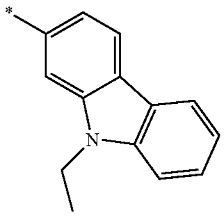
10-333
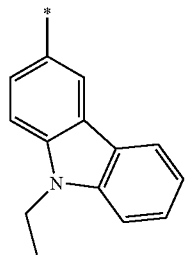

-continued 10-334

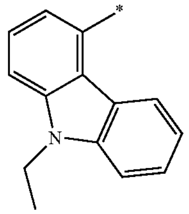

10-335

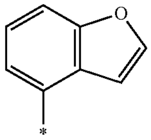

10-336

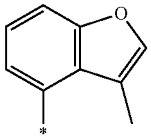

10-337

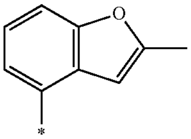

10-338

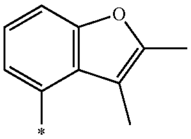

10-339

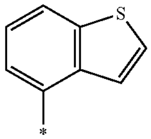

10-340

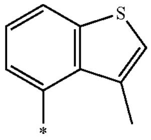

10-341

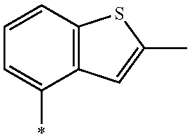

10-342

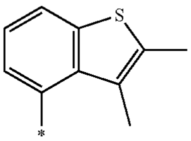

-continued 10-343

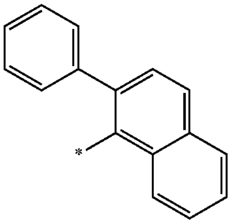

10-344

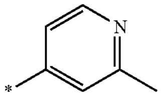

10-345

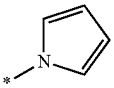

10-346

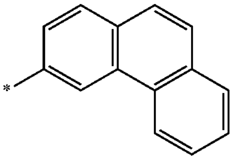

10-347

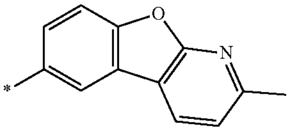

10-348

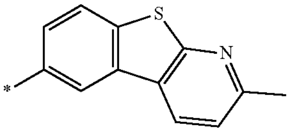

10-349

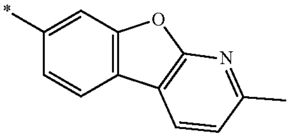

10-350

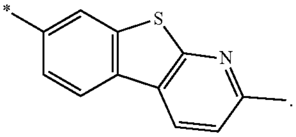

In Formulae 9-1 to 9-39, 9-201 to 9-227, 10-1 to 10-129, and 10-201 to 10-350, * indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-227 in which at least one hydrogen is substituted with deuterium" may each be, for example, a group represented by one of Formulae 9-501 to 9-514 and 9-601 to 9-636:

9-501

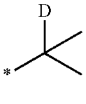

-continued
9-502
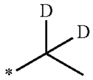
9-503
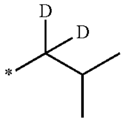
9-504
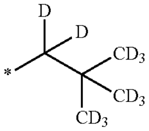
9-505
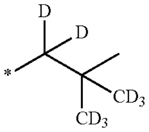
9-506
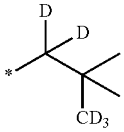
9-507
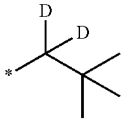
9-508
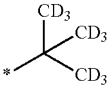
9-509
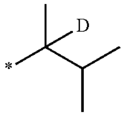
9-510
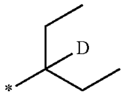
9-511
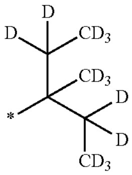
9-512
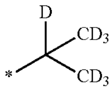
9-513
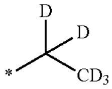
-continued
9-514
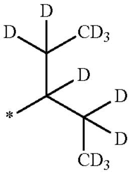
9-601
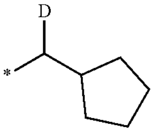
9-602
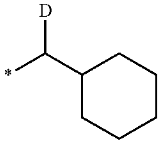
9-603
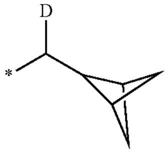
9-604
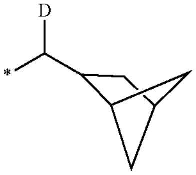
9-605
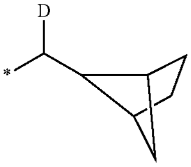
9-606
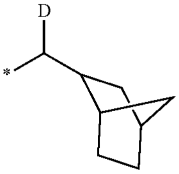
9-607
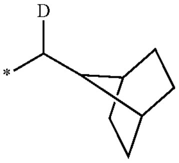
9-608
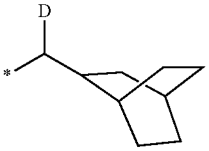

-continued
9-609
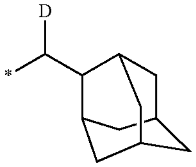
9-610
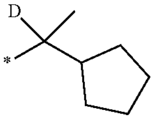
9-611
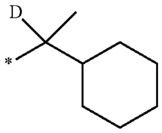
9-612
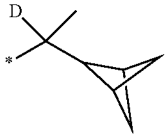
9-613
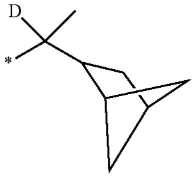
9-614
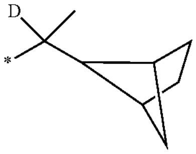
9-615
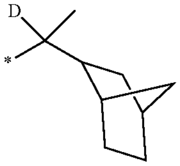
9-616
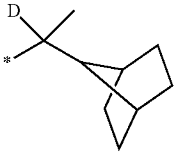
9-617
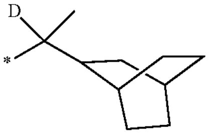
9-618
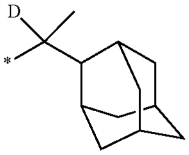
-continued
9-619
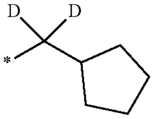
9-620
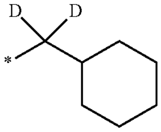
9-621
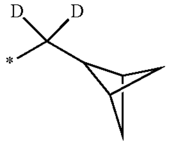
9-622
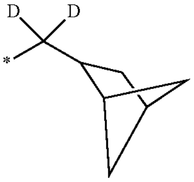
9-623
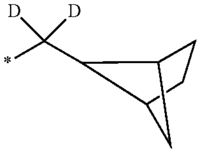
9-624
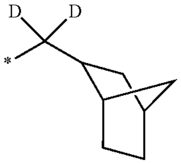
9-625
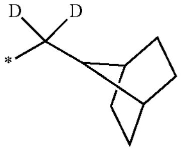
9-626
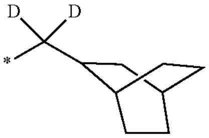
9-627
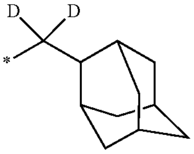
9-628
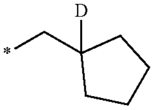

-continued 9-629

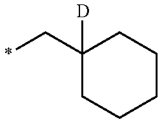

9-630

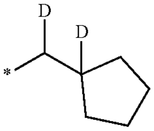

9-631

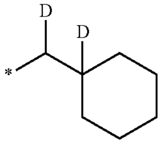

9-632

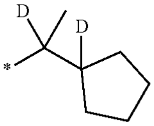

9-633

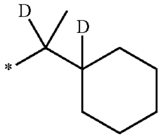

9-634

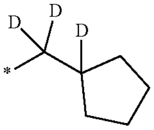

9-635

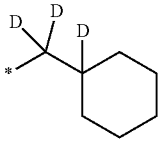

9-636

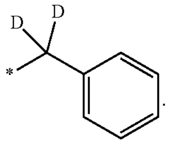

The "group represented by one of Formulae 9-1 to 9-39 in which at least one hydrogen is substituted with —F" and the "group represented by one of Formulae 9-201 to 9-227 in which at least one hydrogen is substituted with —F" may each be, for example, a group represented by one of Formulae 9-701 to 9-710:

9-701

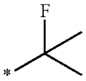

9-702

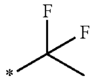

-continued 9-703

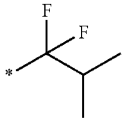

9-704

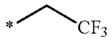

9-705

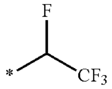

9-706

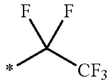

9-707

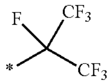

9-708

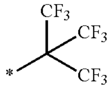

9-709

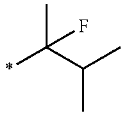

9-710

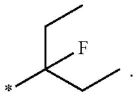

The "group represented by one of Formulae 10-1 to 10-129 in which at least one hydrogen is substituted with deuterium" and the "group represented by one of Formulae 10-201 to 10-350 in which at least one hydrogen is substituted with deuterium" may be, for example, a group represented by one of Formulae 10-501 to 10-553:

10-501

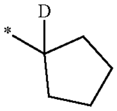

10-502

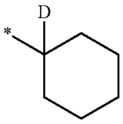

10-503

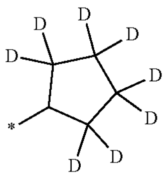

-continued
10-504
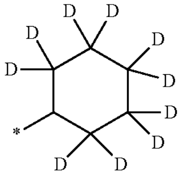
10-505
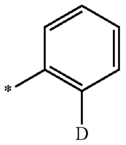
10-506
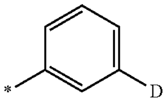
10-507
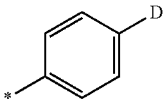
10-508
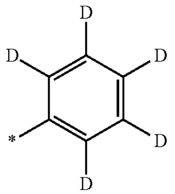
10-509
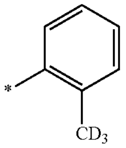
10-510
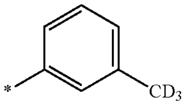
10-511
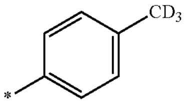
10-512
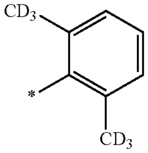
10-513
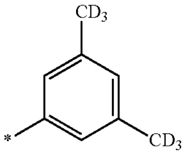
-continued
10-514
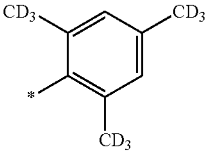
10-515
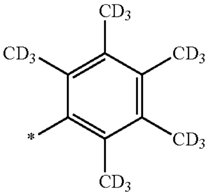
10-516
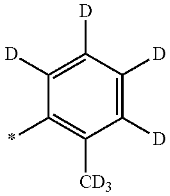
10-517
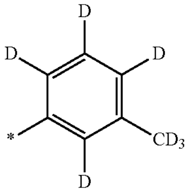
10-518
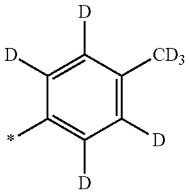
10-519
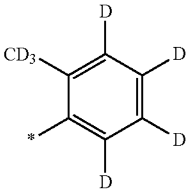
10-520
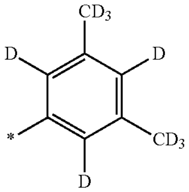
10-521
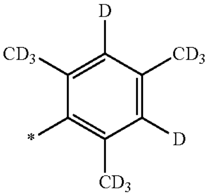

-continued
10-522
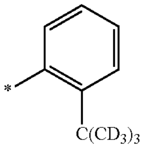
10-523
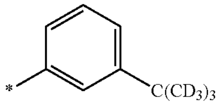
10-524
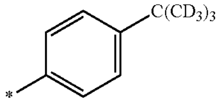
10-525
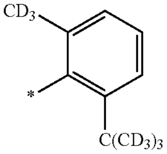
10-526
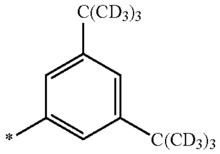
10-527
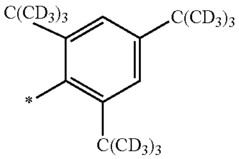
10-528
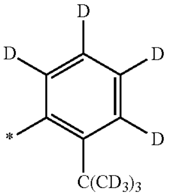
10-529
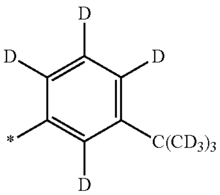
10-530
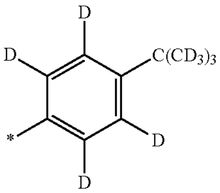
-continued
10-531
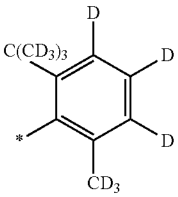
10-532
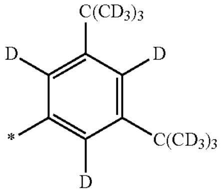
10-533
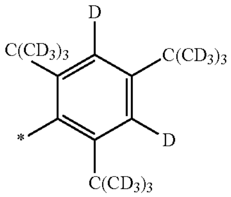
10-534
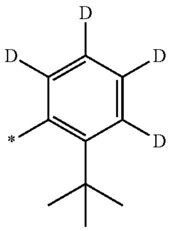
10-535
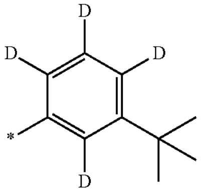
10-536
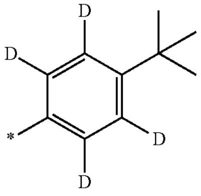
10-537
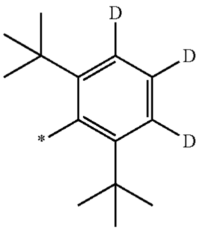

-continued
10-538
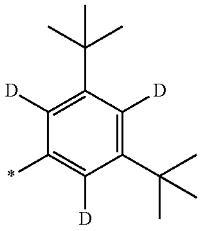
10-540
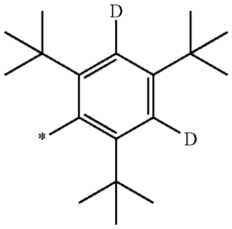
10-541
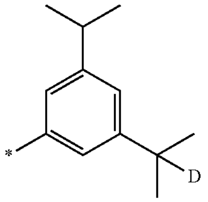
10-542
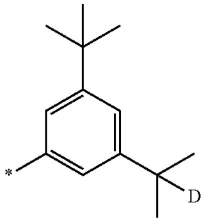
10-543
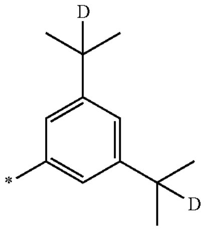
10-544
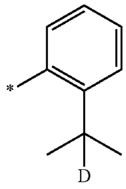
10-545
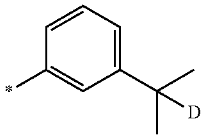
-continued
10-546
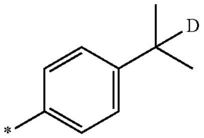
10-547
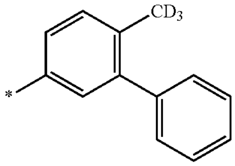
10-548
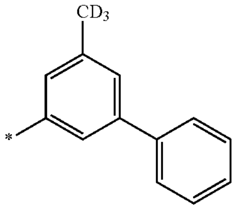
10-549
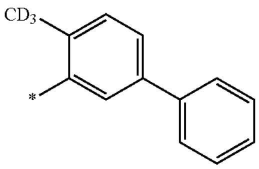
10-550
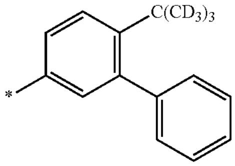
10-551
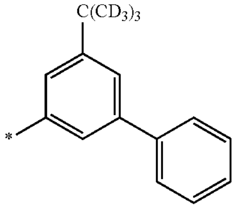
10-552
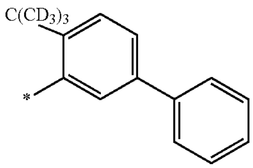
10-553
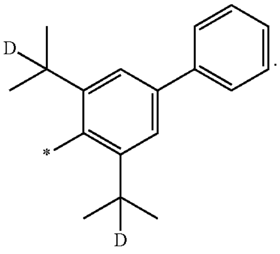
The "group represented by one of Formulae 10-1 to 10-129 in which at least one hydrogen is substituted with —F" and the "group represented by one of Formulae 10-201 to 10-350 in which at least one hydrogen is substituted with —F" may be, for example, a group represented by one of Formulae 10-601 to 10-617:

10-601

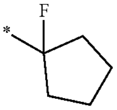

10-602

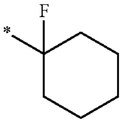

10-603

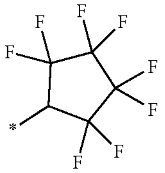

10-604

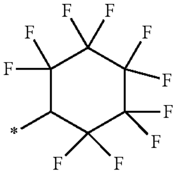

10-605

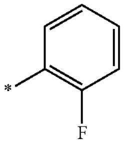

10-606

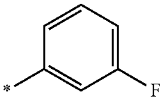

10-607

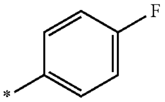

10-608

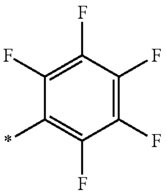

10-609

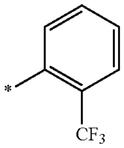

10-610

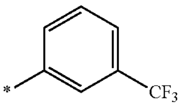

-continued 10-611

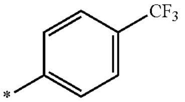

10-612

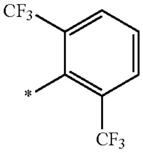

10-613

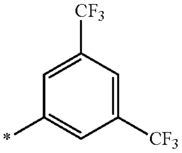

10-614

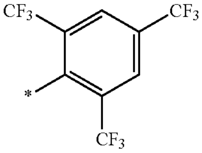

10-615

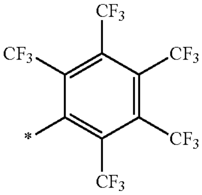

10-616

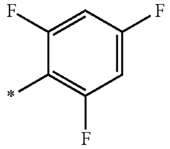

10-617

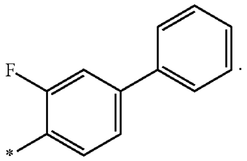

In Formula 1, c1 to c4 and a1 to a4 may be numbers of $R_1$ to $R_4$, a group represented by $*-[(L_1)_{b1}-(R_1)_{c1}]$, a group represented by $*-[(L_2)_{b2}-(R_2)_{c2}]$, a group represented by $*-[(L_3)_{b3}-(R_3)_{c3}]$, a group represented by $*-[(L_4)_{b4}-(R_4)_{c4}]$, respectively, and may each independently be an integer from 0 to 20. When c1 is 2 or more, two or more $R_1$ may be identical to or different from each other, when c2 is 2 or more, two or more $R_2$ may be identical to or different from each other, when c3 is 2 or more, two or more $R_3$ may be identical to or different from each other, when c4 is 2 or more, two or more $R_4$ may be identical to or different from each other, when a1 is 2 or more, two or more groups represented by $*-[(L_1)_{b1}-(R_1)_{c1}]$ may be identical to or different from each other, when a2 is 2 or more, two or more groups represented by $*-[(L_2)_{b2}-(R_2)_{c2}]$ may be identical to or different from each other, when a3 is 2 or more, two or more groups represented by $*-[(L_3)_{b3}-(R_3)_{c3}]$ may be identical to or different from each other, and when a4 is 2 or more, two or more groups represented by $*-[(L_4)_{b4}-(R_1)_{c4}]$ may be identical to or different from each other. For example, c1 to c4 and a1 to a4 in Formula 1 may each independently be 0, 1, 2, or 3.

In Formula 1, at least one of i) two or more of a plurality of $R_1$, ii) two or more of a plurality of $R_2$, iii) two or more of a plurality of $R_3$, iv) two or more of a plurality of $R_4$, v) $R_{5a}$ and $R_{5b}$, and vi) two or more of $R_1$ to $R_4$, $R_{5a}$, and $R_{5b}$ may each optionally bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. In other words, in Formula 1, i) two or more of a plurality of $R_1$ may optionally be bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_2$ may optionally be bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of a plurality of $R_3$ may optionally be bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iv) two or more of a plurality of $R_4$ may optionally be bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, v) $R_{5a}$ and $R_{5b}$ may optionally be bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and/or vi) two or more of $R_1$ to $R_4$, $R_{5a}$, and $R_{5b}$ may optionally be bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ may be the same as described in connection with $R_1$.

The symbols * and *' as used herein each indicate a binding site to a neighboring atom, unless otherwise stated.

In an embodiment, in Formula 1, n1 may not be 0, n4 may be 0, and a group represented by

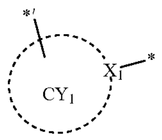

may be a group represented by one of Formulae CY1(1) to CY1(23):

CY1(1)

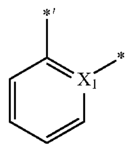

CY1(2)

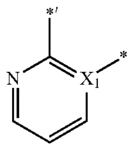

-continued

CY1(3)

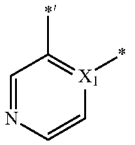

CY1(4)

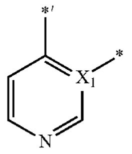

CY1(5)

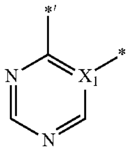

CY1(6)

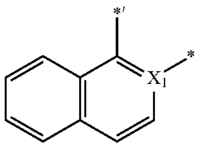

CY1(7)

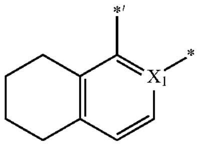

CY1(8)

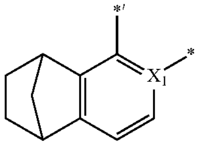

CY1(9)

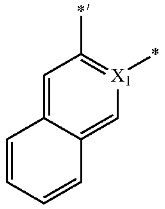

CY1(10)

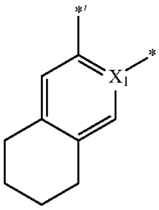

CY1(11)

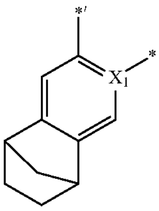

-continued

CY1(12)

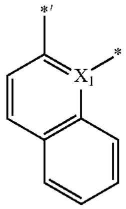

CY1(13)

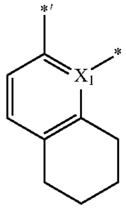

CY1(14)

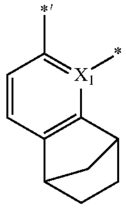

CY1(15)

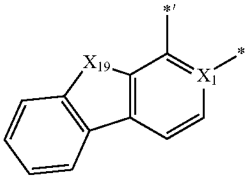

CY1(16)

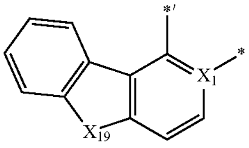

CY1(17)

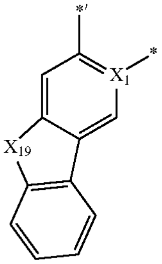

CY1(18)

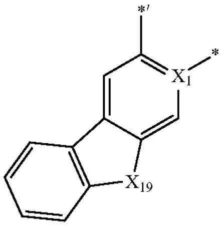

-continued

CY1(19)

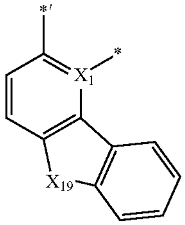

CY1(20)

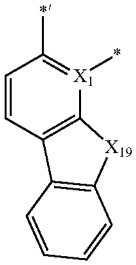

CY1(21)

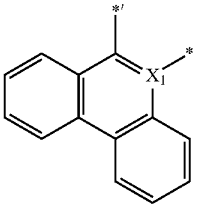

CY1(22)

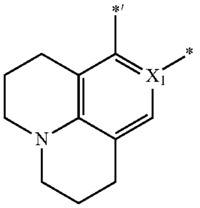

CY1(23)

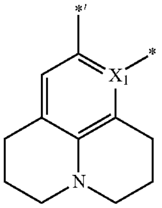

wherein, in Formulae CY1(1) to CY1(23), $X_1$ may be the same as described in the present specification, $X_{19}$ may be O, S, Se, $N(R_{19a})$, $C(R_{19a})(R_{19b})$, or $Si(R_{19a})(R_{19b})$, $R_{19a}$ and $R_{19b}$ may each be the same as described in connection with $R_1$,

* may indicate a binding site to $M_1$ or $X_5$ in Formula 1, and

*' may indicate a binding site to $T_{11}$ in Formula 1.

In an embodiment, in Formula 1, n1 may be 1, n4 may be 0, and a group represented by

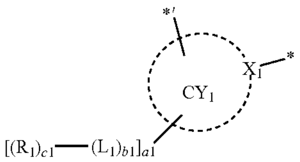
may be a group represented by one of Formulae CY1-1 to CY1-18:
CY1-1
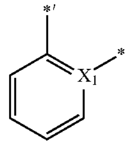
CY1-2
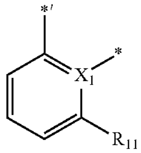
CY1-3
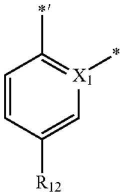
CY1-4
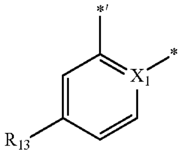
CY1-5
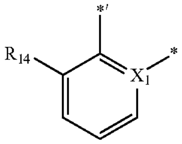
CY1-6
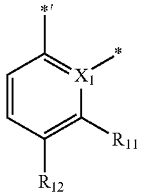
CY1-7
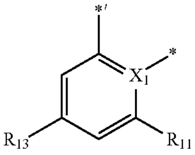
-continued
CY1-8
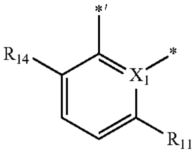
CY1-9
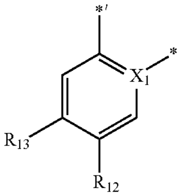
CY1-10
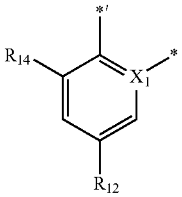
CY1-11
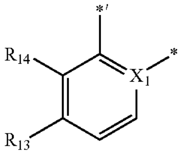
CY1-12
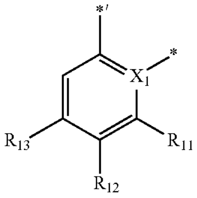
CY1-13
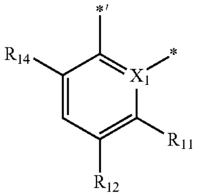
CY1-14
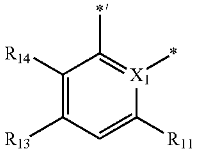
CY1-15
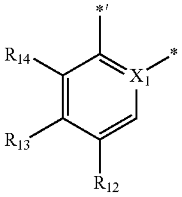

-continued

CY1-16

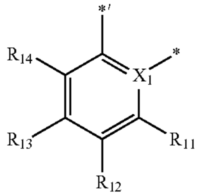

CY1-17

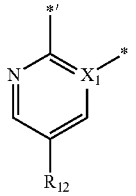

CY1-18

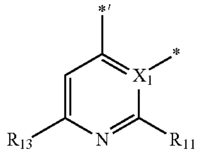

wherein, in Formulae CY1-1 to CY1-18, $X_1$ is the same as described in the present specification, $R_{11}$ to $R_{14}$ may each be the same as described in connection with $R_1$, and each of $R_{11}$ to $R_{14}$ may not be hydrogen,

* may indicate a binding site to $M_1$ or $X_5$ in Formula 1, and

*' may indicate a binding site to $T_{11}$ in Formula 1.

In an embodiment, in Formula 1, n1 and n2 may each be 1, and ring $CY_2$ may be a group represented by Formula CY2A or CY2B:

CY2A

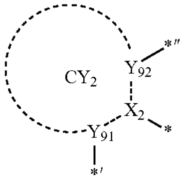

CY2B

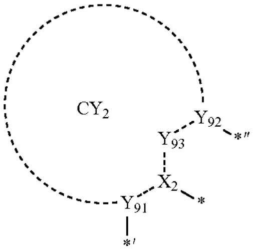

wherein, in Formulae CY2A and CY2B, $X_2$ and ring $CY_2$ may respectively be the same as those described in the present specification, $Y_{91}$ and $Y_{92}$ may each independently be N, C, or Si, and $Y_{93}$ may be O, S, N, C, or Si, a bond between $X_2$ and $Y_{91}$, a bond between $X_2$ and $Y_{92}$, a bond between $X_2$ and $Y_{93}$, and a bond between $Y_{92}$ and $Y_{93}$ in Formulae CY2A and CY2B may each be a chemical bond,

*' may indicate a binding site to $T_{11}$ in Formula 1,

* may indicate a binding site to $X_6$ or $M_1$ in Formula 1, and

*" may indicate a binding site to $T_{12}$ in Formula 1.

In an embodiment, in Formula 1, each of n1 and n2 may not be 0, and a group represented by

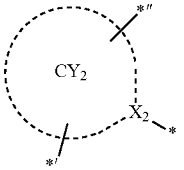

may be a group represented by one of Formulae CY2(1) to CY2(21):

CY2(1)

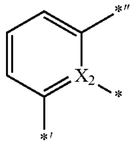

CY2(2)

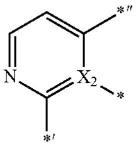

CY2(3)

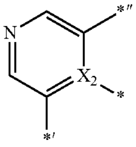

CY2(4)

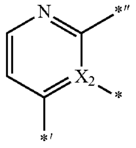

CY2(5)

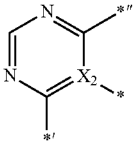

CY2(6)

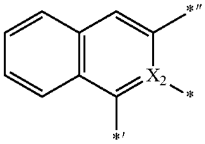

CY2(7)

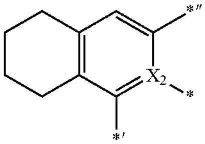

-continued

CY2(8)

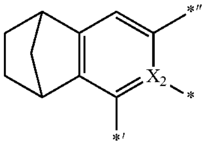

CY2(9)

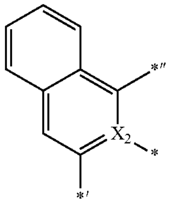

CY2(10)

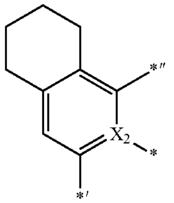

CY2(11)

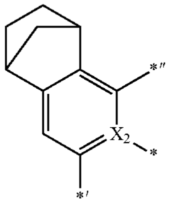

CY2(12)

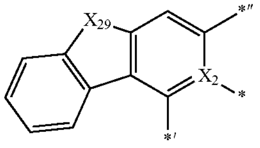

CY2(13)

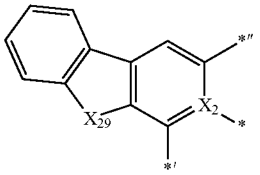

CY2(14)

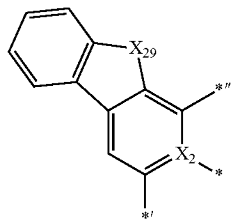

CY2(15)

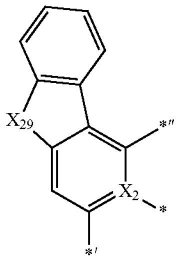

-continued

CY2(16)

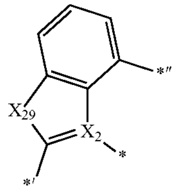

CY2(17)

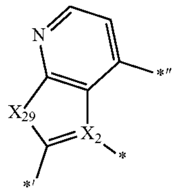

CY2(18)

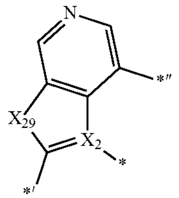

CY2(19)

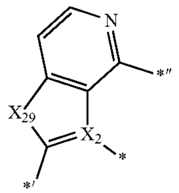

CY2(20)

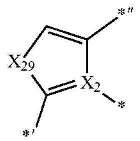

CY2(21)

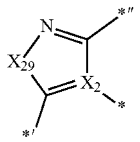

wherein, in Formulae CY2(1) to CY2(21), $X_2$ may be the same as described in the present specification, $X_{29}$ may be O, S, N-[$(L_2)_{b2}$-$(R_2)_{c2}$], $C(R_{29a})(R_{29b})$, or $Si(R_{29a})(R_{29b})$, $L_2$, b2, $R_2$, and c2 may respectively be the same as those described in the present specification, $R_{29a}$ and $R_{29b}$ may each be the same as described in connection with $R_2$,

*' may indicate a binding site to $T_{11}$ in Formula 1,

* may indicate a binding site to $X_6$ or $M_1$ in Formula 1, and

*" may indicate a binding site to $T_{12}$ in Formula 1.

In an embodiment, in Formula 1, each of n1 and n2 may be 1, and a group represented by

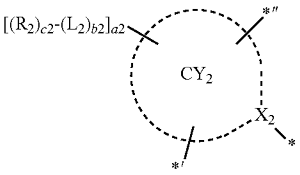
may be a group represented by one of Formulae CY2-1 to CY2-16:
CY2-1
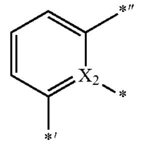
CY2-2
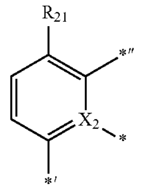
CY2-3
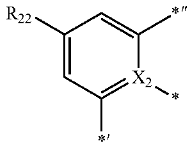
CY2-4
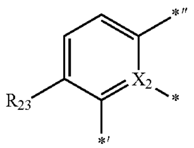
CY2-5
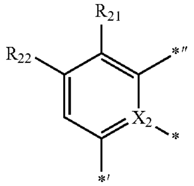
CY2-6
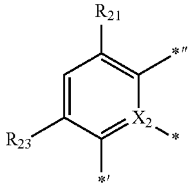
CY2-7
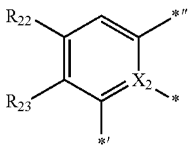
-continued
CY2-8
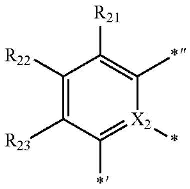
CY2-9
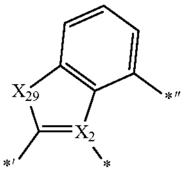
CY2-10
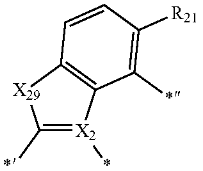
CY2-11
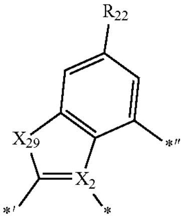
CY2-12
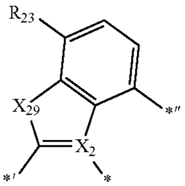
CY2-13
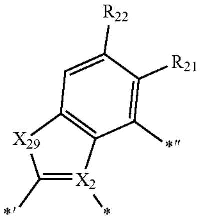
CY2-14
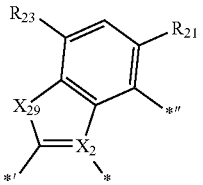
CY2-15
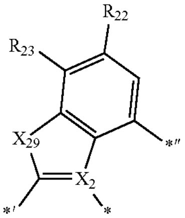

-continued

CY2-16

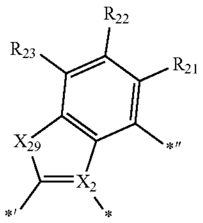

wherein, in Formulae CY2-1 to CY2-16, $X_2$ may be the same as described in the present specification, $X_{29}$ may be O, S, N-[$(L_2)_{b2}$-$(R_2)_{c2}$], C($R_{29a}$)($R_{29b}$), or Si($R_{29a}$)($R_{29b}$), $L_2$, b2, $R_2$, and c2 may respectively be the same as those described in the present specification, $R_{21}$ to $R_{23}$, $R_{29a}$, and $R_{29b}$ may each be the same as described in connection with $R_2$, wherein each of $R_{21}$ to $R_{23}$ may not be hydrogen,

*' may indicate a binding site to $T_{11}$ in Formula 1,

* may indicate a binding site to $X_6$ or $M_1$ in Formula 1, and

*" may indicate a binding site to $T_{12}$ in Formula 1.

In an embodiment, in Formula 1, each of n1 and n2 may be 1, a group represented by

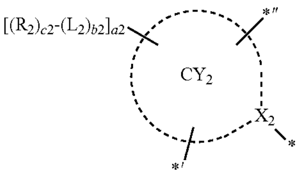

may be represented by one of Formulae CY2-9 to CY2-16, $X_{29}$ in Formulae CY2-9 to CY2-16 may be N-[$(L_2)_{b2}$-$(R_2)_{c2}$], $L_2$ may be a benzene group that is unsubstituted or substituted with at least one $R_{10a}$, b2 may be 1 or 2, c2 may be 1 or 2, and when c2 is 1, $R_2$ may be a phenyl group that is unsubstituted or substituted with deuterium, a $C_1$-$C_{20}$ alkyl group, a phenyl group, a deuterated phenyl group, a ($C_1$-$C_{20}$ alkyl)phenyl group, or any combination thereof, and when c2 is 2, a) one of two $R_2$ may be a phenyl group that is unsubstituted or substituted with deuterium, a $C_1$-$C_{20}$ alkyl group, a phenyl group, a deuterated phenyl group, a ($C_1$-$C_{20}$ alkyl)phenyl group, or any combination thereof, and b) the other $R_2$ may be a $C_4$-$C_{20}$ alkyl group or a deuterated $C_1$-$C_{20}$ alkyl group, each unsubstituted or substituted with a $C_3$-$C_{10}$ cycloalkyl group.

In an embodiment, in Formula 1, each of n2 and n3 may not be 0, and a group represented by

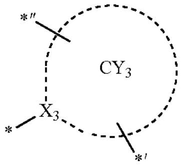

may be a group represented by one of Formulae CY3(1) to CY3(15):

CY3(1)

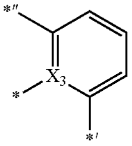

CY3(2)

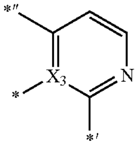

CY3(3)

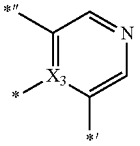

CY3(4)

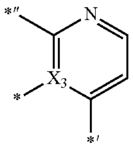

CY3(5)

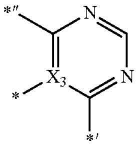

CY3(6)

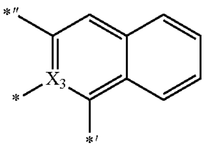

CY3(7)

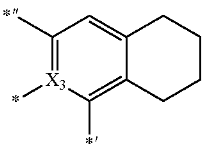

CY3(8)

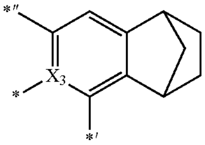

-continued

CY3(9)

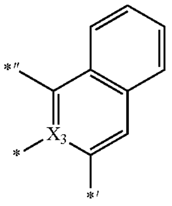

CY3(10)

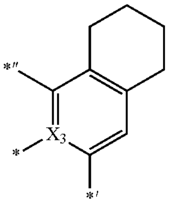

CY3(11)

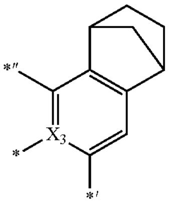

CY3(12)

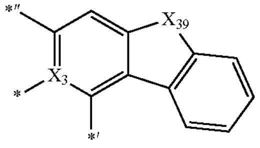

CY3(13)

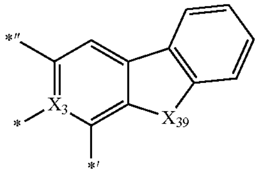

CY3(14)

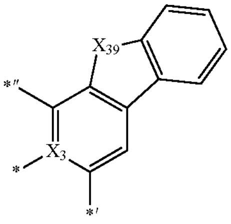

CY3(15)

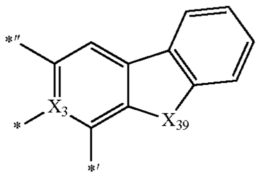

wherein, in Formulae CY3(1) to CY3(15), $X_3$ may be the same as described in the present specification, $X_{39}$ may be O, S, $N(Z_{39a})$, $C(R_{39a})(R_{39b})$, or $Si(R_{39a})(R_{39b})$, $R_{39a}$ and $R_{39b}$ may each be the same as described in connection with $R_3$,

*" may indicate a binding site to $T_{12}$ in Formula 1,

* may indicate a binding site to $X_7$ or $M_1$ in Formula 1, and

*' may indicate a binding site to $T_{13}$ in Formula 1.

In an embodiment, in Formula 1, each of n2 and n3 may be 1, and a group represented by

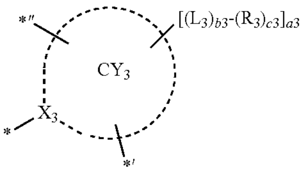

may be represented by one of Formulae CY3-1 to CY3-13:

CY3-1

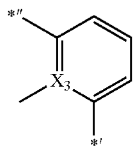

CY3-2

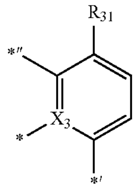

CY3-3

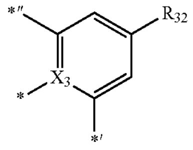

CY3-4

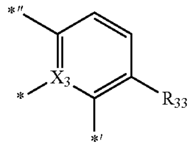

CY3-5

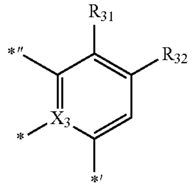

CY3-6

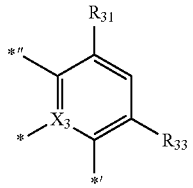

CY3-7

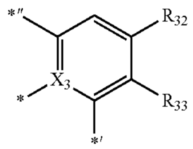

-continued

CY3-8

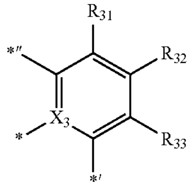

CY3-8

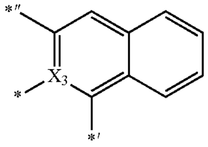

CY3-9

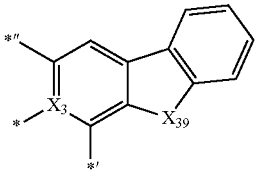

CY3-10

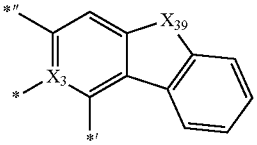

CY3-11

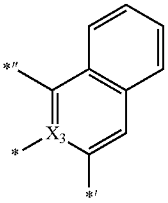

CY3-12

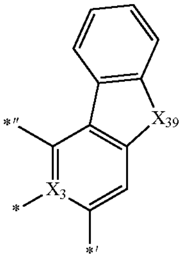

CY3-13

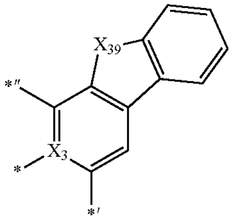

wherein, in Formulae CY3-1 to CY3-13, $X_3$ may be the same as described in the present specification, $X_{39}$ may be O, S, N-[$(L_3)_{b3}$-$(R_3)_{c3}$], C($R_{39a}$)($R_{39b}$), or Si($R_{39a}$)($R_{39b}$), $L_3$, b3, $R_3$, and c3 may respectively be the same as those described in the present specification, $R_{31}$ to $R_{33}$, $R_{39a}$, and $R_{39b}$ may each be the same as described in connection with $R_3$, wherein each of $R_{31}$ to $R_{33}$ may not be hydrogen,

*" may indicate a binding site to $T_{12}$ in Formula 1,

* may indicate a binding site to $X_7$ or $M_1$ in Formula 1, and

*' may indicate a binding site to $T_{13}$ in Formula 1.

In an embodiment, in Formula 1, n3 may not be 0, n4 may be 0, and a group represented by

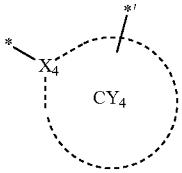

may be represented by one of Formulae CY4(1) to CY4(20):

CY4(1)

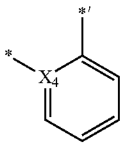

CY4(2)

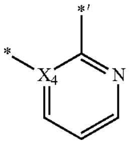

CY4(3)

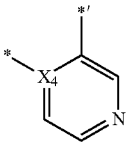

CY4(4)

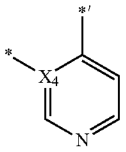

CY4(5)

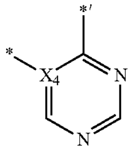

CY4(6)

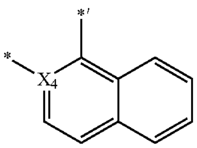

CY4(7)

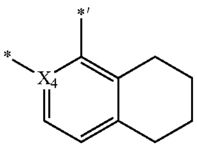

-continued

CY4(8)

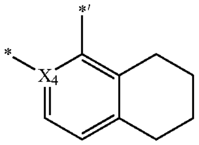

CY4(9)

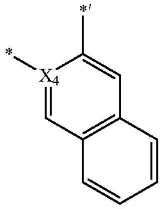

CY4(10)

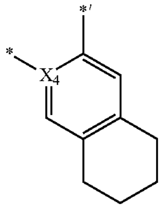

CY4(11)

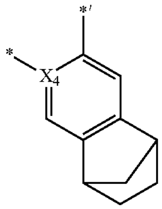

CY4(12)

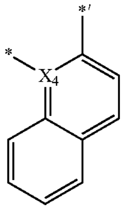

CY4(13)

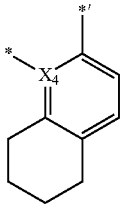

CY4(14)

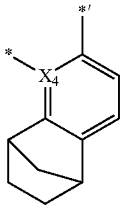

-continued

CY4(15)

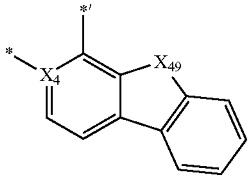

CY4(16)

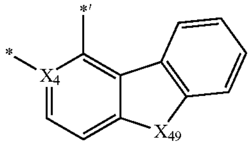

CY4(17)

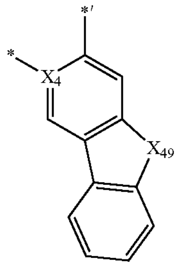

CY4(18)

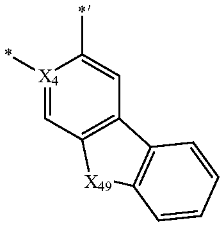

CY4(19)

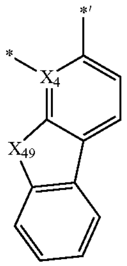

CY4(20)

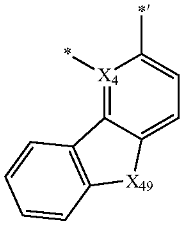

wherein, in Formulae CY4(1) to CY4(20), $X_4$ may be the same as described in the present specification, $X_{49}$ may be O, S, $N(R_{49a})$, $C(R_{49a})(R_{49b})$, or $Si(R_{49a})(R_{49b})$, $R_{49a}$ and $R_{49b}$ may each be the same as described in connection with $R_4$,

*' may indicate a binding site to $T_{13}$ in Formula 1, and

* may indicate a binding site to $X_8$ or $M_1$ in Formula 1.

In an embodiment, in Formula 1, n3 may be 1, n4 may be 0, and a group represented by

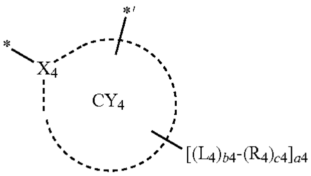
may be a group represented by one of Formulae CY4-1 to CY4-16:
CY4-1
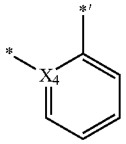
CY4-2
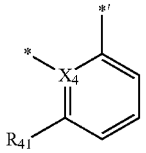
CY4-3
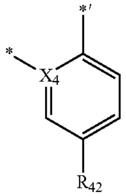
CY4-4
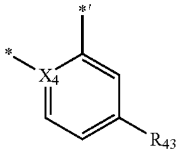
CY4-5
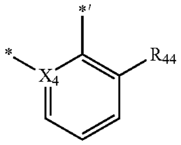
CY4-6
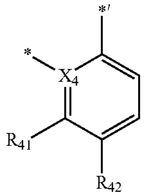
CY4-7
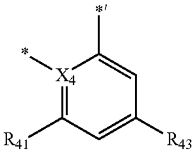
-continued
CY4-8
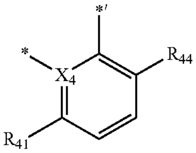
CY4-9
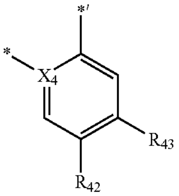
CY4-10
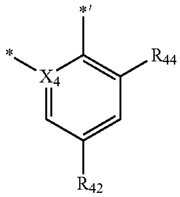
CY4-11
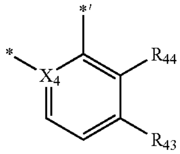
CY4-12
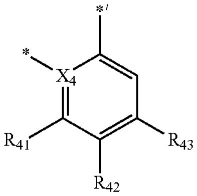
CY4-13
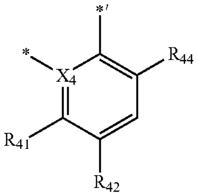
CY4-14
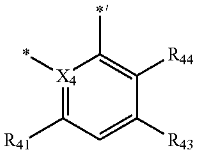
CY4-15
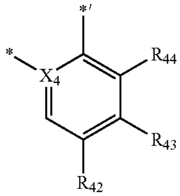

-continued

CY4-16

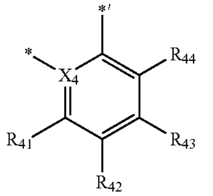

wherein, in Formulae CY4-1 to CY4-16, $X_4$ may be the same as described in the present specification, $R_{41}$ to $R_{44}$ may each be the same as described in connection with $R_4$, wherein each of $R_{41}$ to $R_{44}$ is not hydrogen,

*' may indicate a binding site to $T_{13}$ in Formula 1, and

* may indicate a binding site to $X_8$ or $M_1$ in Formula 1.

In an embodiment, the organometallic compound represented by Formula 1 may be a compound represented by one of Formulae 1-1 to 1-3:

1-1

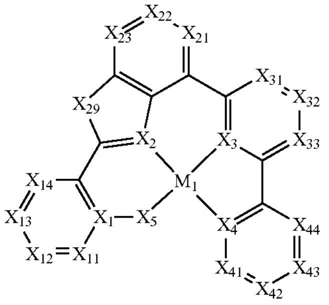

1-2

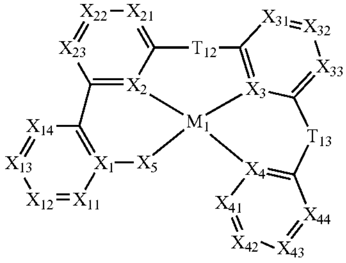

1-3

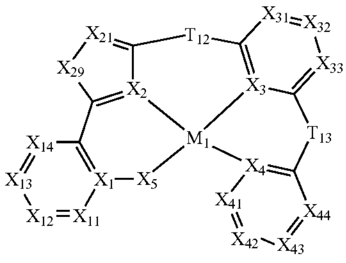

wherein, in Formulae 1-1 to 1-3, $M_1$, $X_1$ to $X_5$, $T_{12}$, and $T_{13}$ may each be the same as described in the present specification, $X_{11}$ may be N or $C(R_{11})$, $X_{12}$ may be N or $C(R_{12})$, $X_{13}$ may be N or $C(R_{13})$, and $X_{14}$ may be N or $C(R_{14})$, $R_{11}$ to $R_{14}$ may each be the same as described in connection with $R_1$, or two or more of $R_{11}$ to $R_{14}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{21}$ may be N or $C(R_{21})$, $X_{22}$ may be N or $C(R_{22})$, and $X_{23}$ may be N or $C(R_{23})$, $X_{29}$ may be O, S, N-$[(L_2)_{b2}$-$(R_2)_{c2}]$, $C(R_{29a})(R_{29b})$, or $Si(R_{29a})(R_{29b})$, $L_2$, b2, $R_2$, and c2 may each be the same as described in the present specification, $R_{21}$ to $R_{23}$, $R_{29a}$, and $R_{29b}$ may each be the same as described in connection with $R_2$, or two or more of $R_{21}$ to $R_{23}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{31}$ may be N or $C(R_{31})$, $X_{32}$ may be N or $C(R_{32})$, and $X_{33}$ may be N or $C(R_{33})$, $R_{31}$ to $R_{33}$ may each be the same as described in connection with $R_3$, or two or more of $R_{31}$ to $R_{33}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{41}$ may be N or $C(R_{41})$, $X_{42}$ may be N or $C(R_{42})$, $X_{43}$ may be N or $C(R_{43})$, and $X_{44}$ may be N or $C(R_{44})$, $R_{41}$ to $R_{44}$ may each be the same as described in connection with $R_4$, or two or more of $R_{41}$ to $R_{44}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

In an embodiment, the sensitizer may include at least one deuterium.

For example, the organometallic compound represented by Formula 1 may be a compound represented by Formula 1-1(1) or a compound represented by First dopant 1-2(1):

1-1(1)

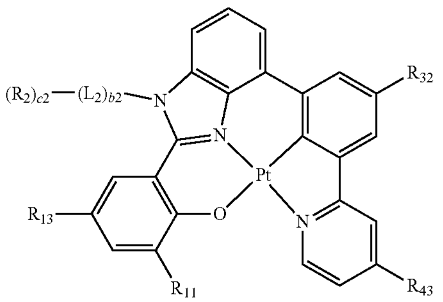

1-2(1)

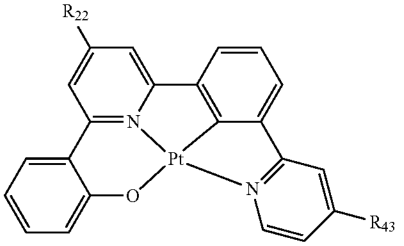

wherein, in Formulae 1-1(1) and 1-2(1), $R_{11}$ and $R_{13}$ may each independently be a $C_1$-$C_{10}$ alkyl group that is unsubstituted or substituted with deuterium, $L_2$ may be a benzene group that is unsubstituted or substituted with deuterium, a $C_1$-$C_{10}$ alkyl group, a $C_3$-$C_{10}$ cycloalkyl group, a phenyl group, a biphenyl group, or any combination thereof, b2 may be 1 or 2, c2 may be 0, 1, or 2, $R_2$ and $R_{32}$ may each independently be:

a $C_1$-$C_{10}$ alkyl group that is unsubstituted or substituted with deuterium, a $C_3$-$C_{10}$ cycloalkyl group, or any combination thereof; or a phenyl group that is unsubstituted or substituted with deuterium, a $C_1$-$C_{10}$ alkyl group, a $C_3$-$C_{10}$ cycloalkyl group, a phenyl group, a biphenyl group, or any combination thereof, and $R_{22}$ and $R_{43}$ may each independently be a phenyl group that is unsubstituted or substituted with deuterium, a $C_1$-$C_{10}$ alkyl group, a $C_3$-$C_{10}$ cycloalkyl group, a phenyl group, a biphenyl group, or any combination thereof.

The $C_1$-$C_{10}$ alkyl group may include, for example, a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group.

The $C_3$-$C_{10}$ cycloalkyl group may include a cyclopentyl group, a cyclohexyl group, a cycloheptyl group, a cyclooctyl group, an adamantanyl group, a norbornanyl group (or, a bicyclo[2.2.1]heptyl group), a bicyclo[1.1.1]pentyl group, a bicyclo[2.1.1]hexyl group, and a bicyclo[2.2.2]octyl group.

In an embodiment, the sensitizer may be selected from compounds of Group 1-1 to Group 1-4:

Group 1-1

3-534

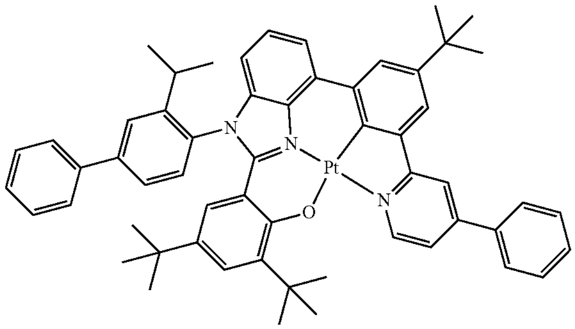

-continued 3-540

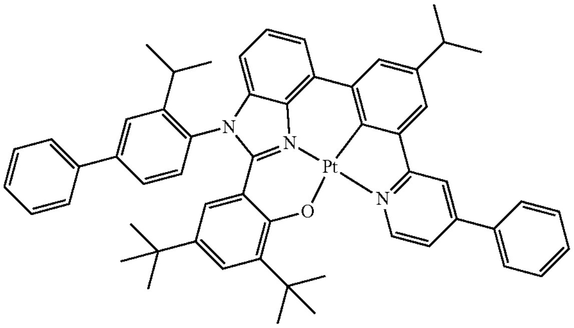

3-566

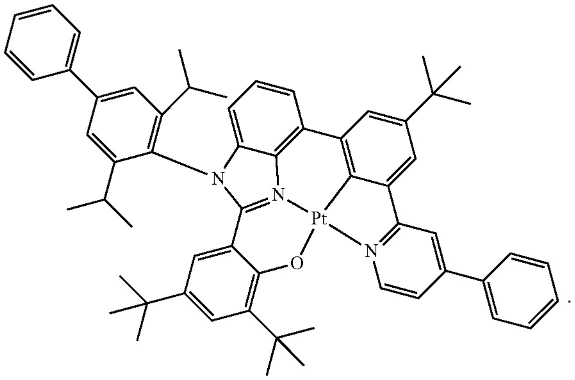

Group 1-2

1

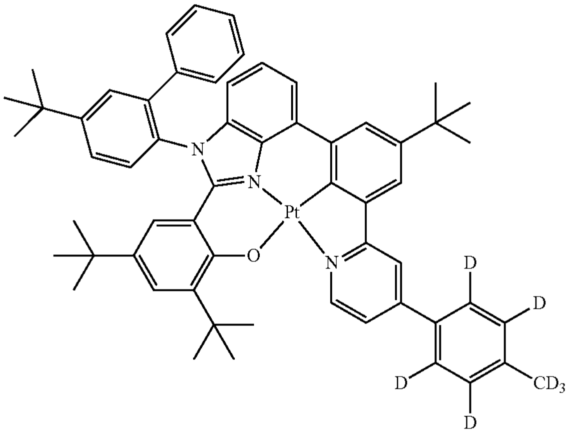

2

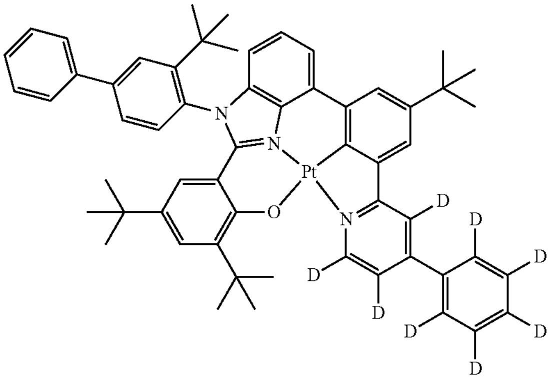

3
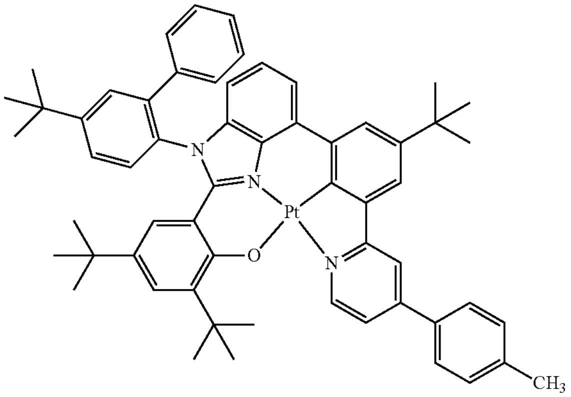
4
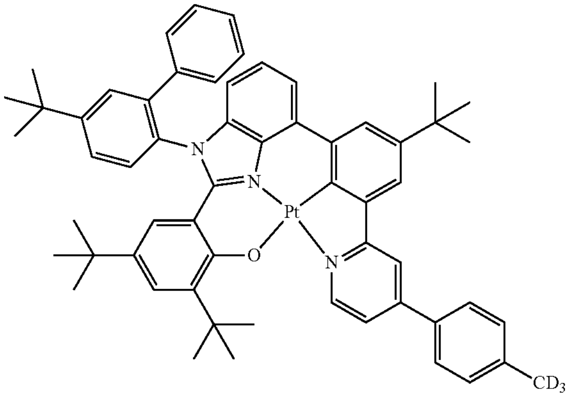
5
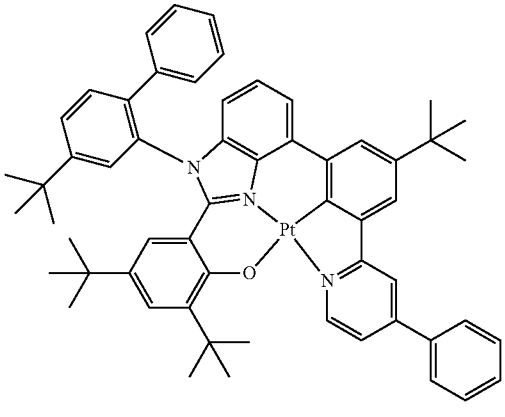
6
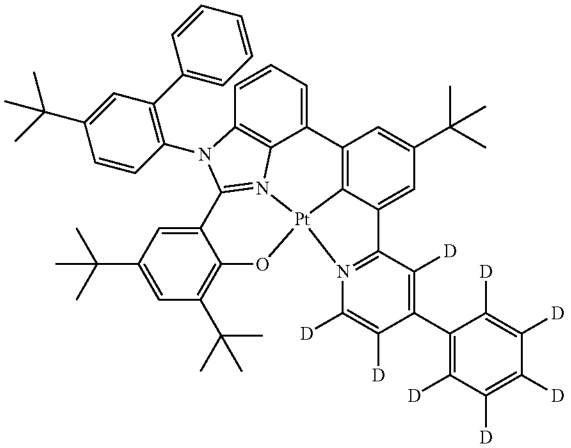
7
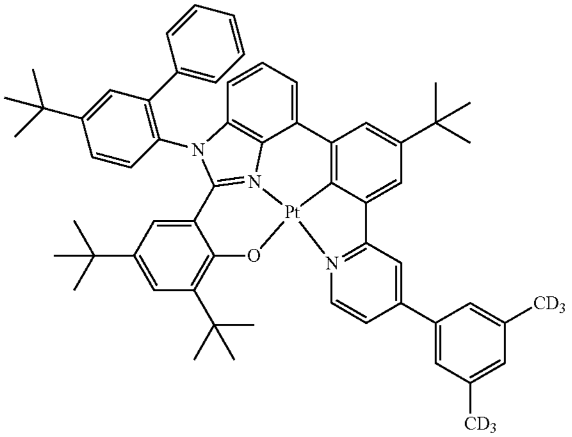
8
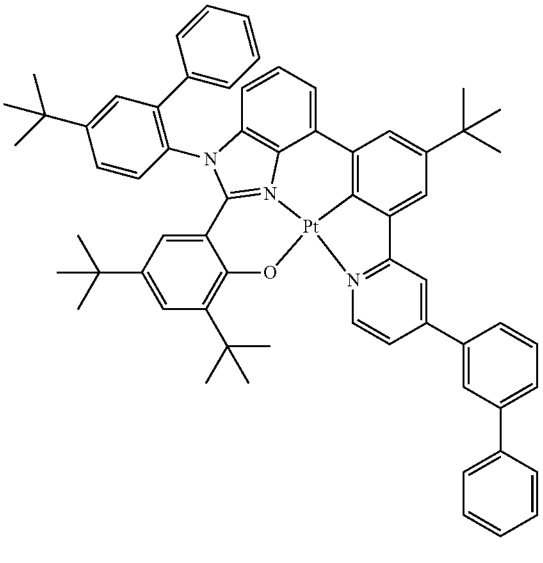

9
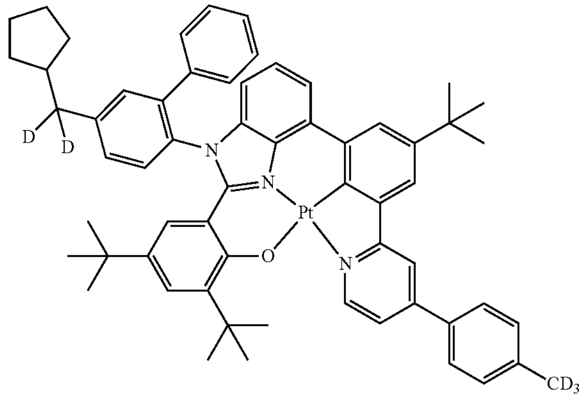
10
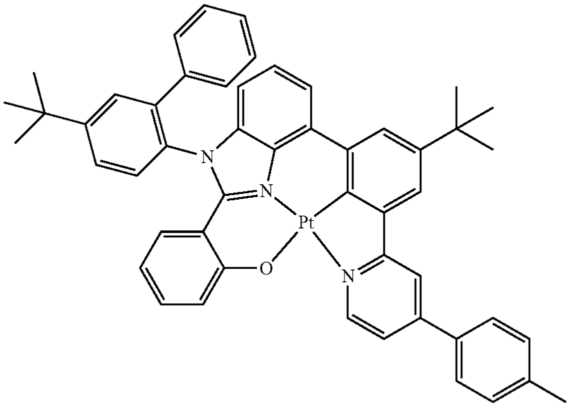
11
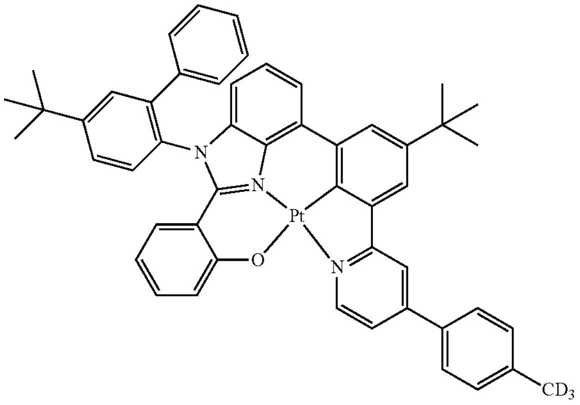
12
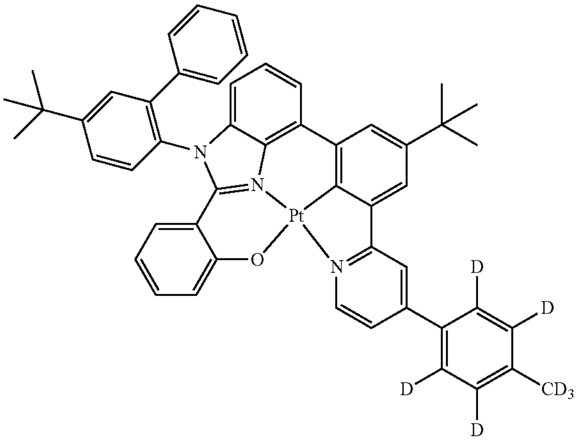
13
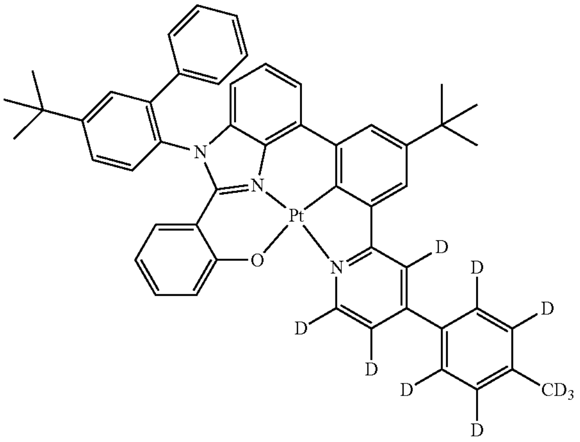
14
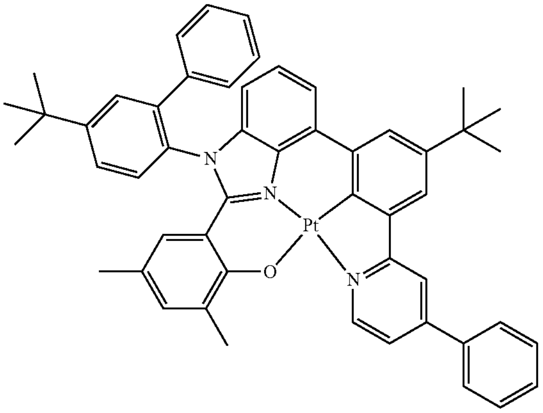

-continued
15
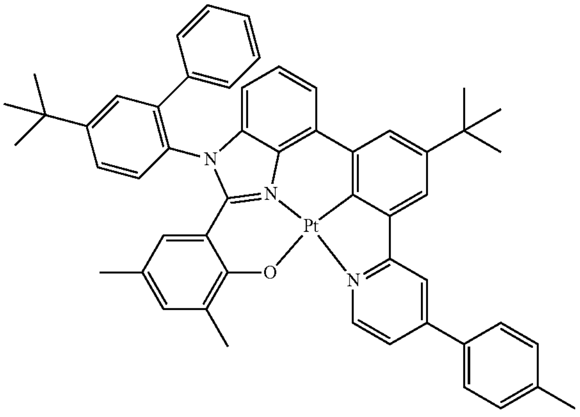
16
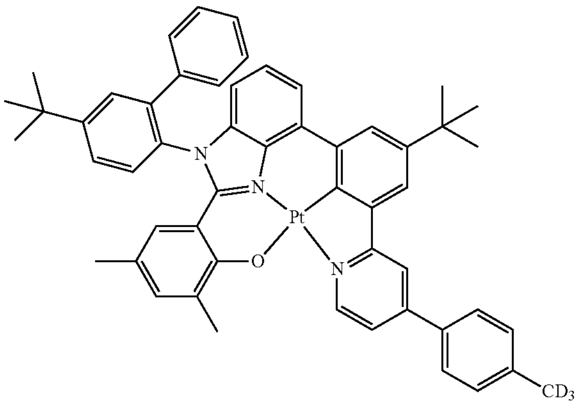
17
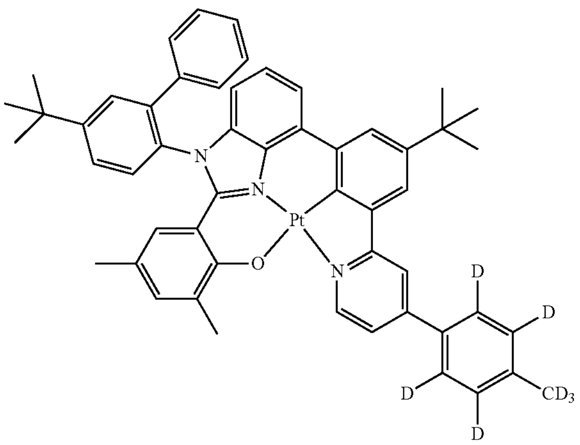
-continued
18
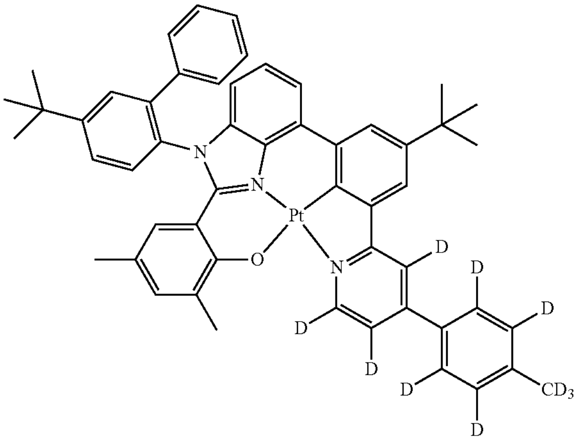
19
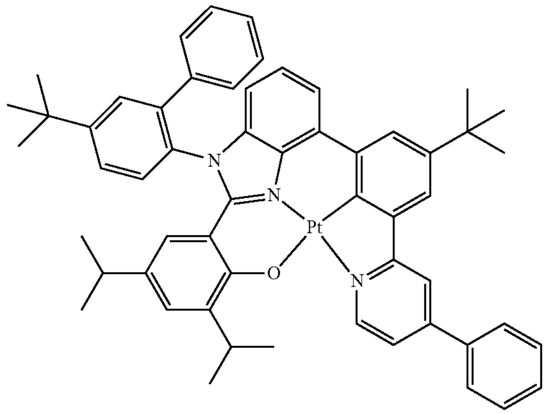
20
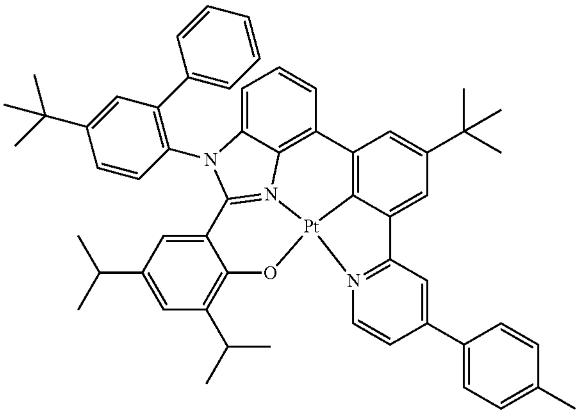

-continued
21
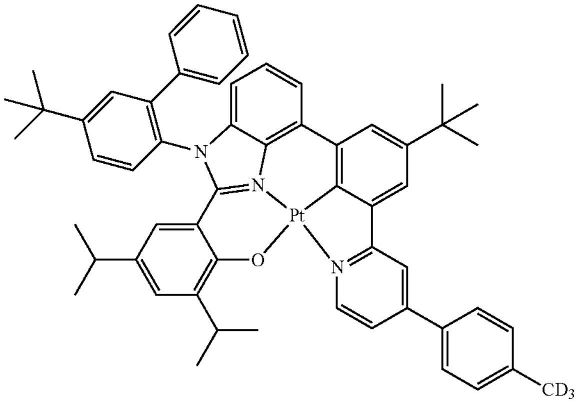
22
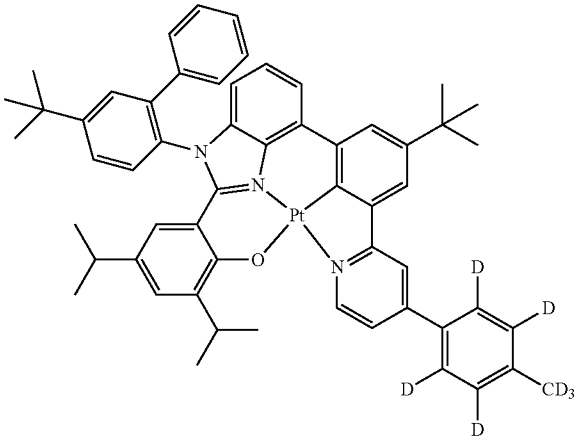
23
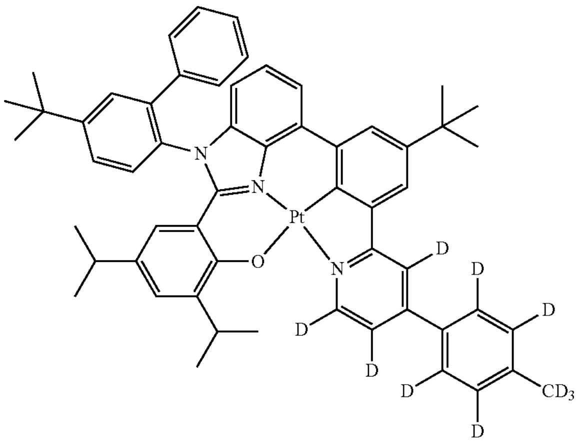
-continued
24
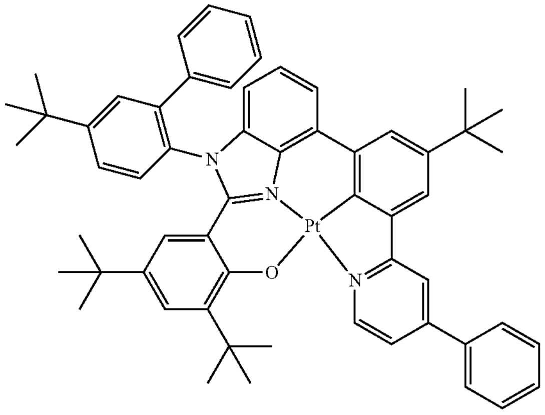
25
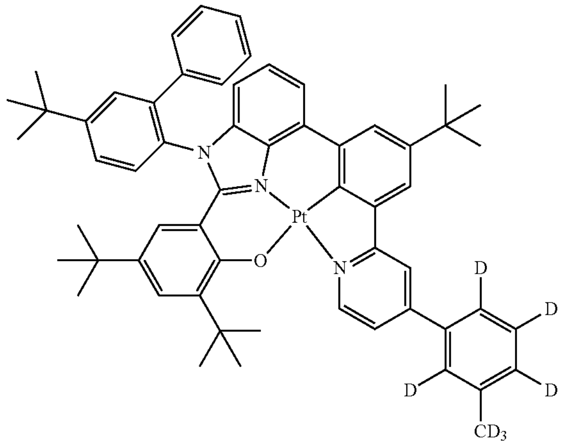
26
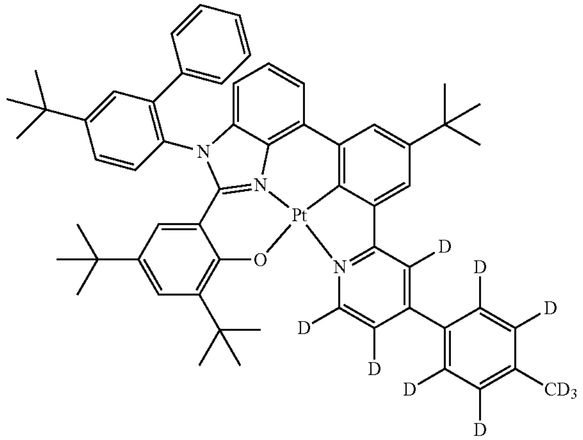

-continued
27
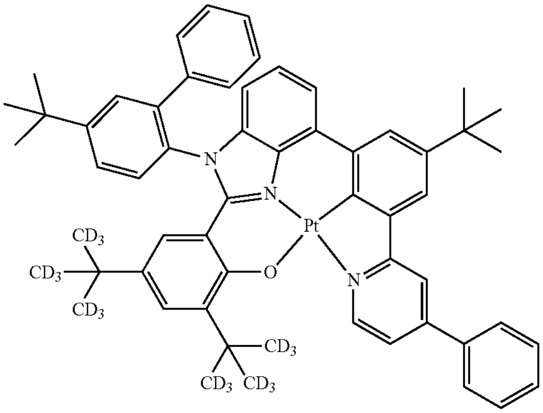
28
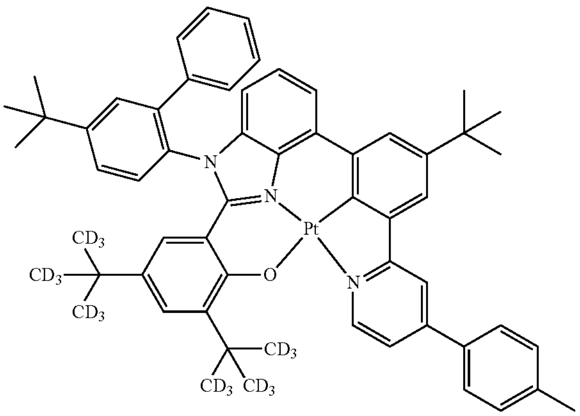
29
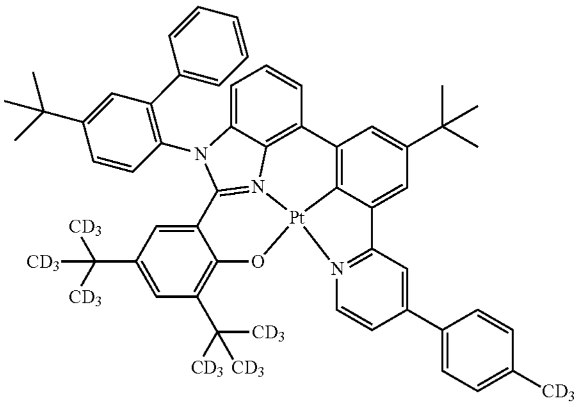
-continued
30
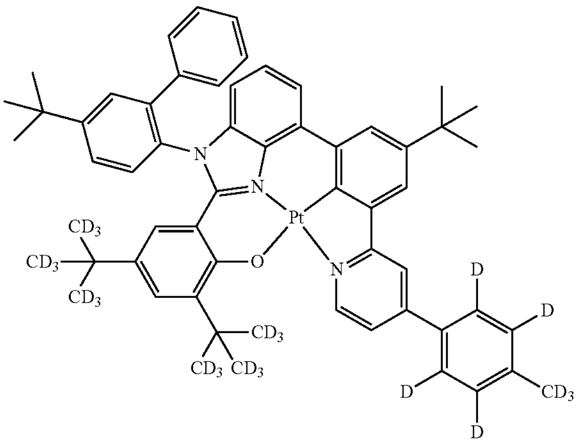
31
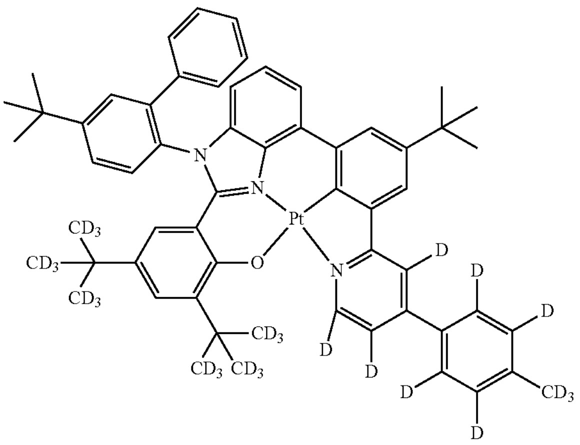
32
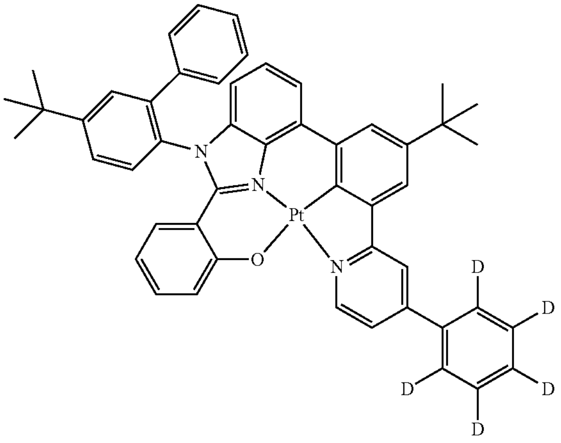

-continued
33
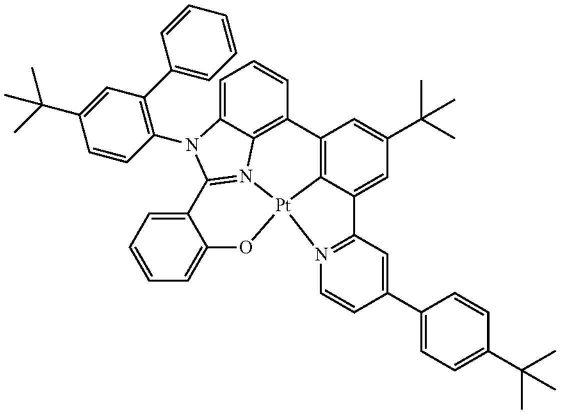
34
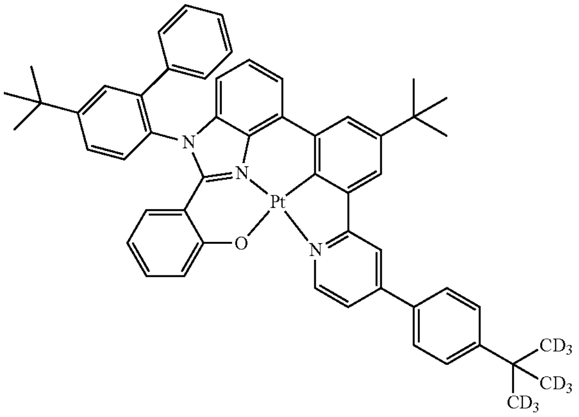
35
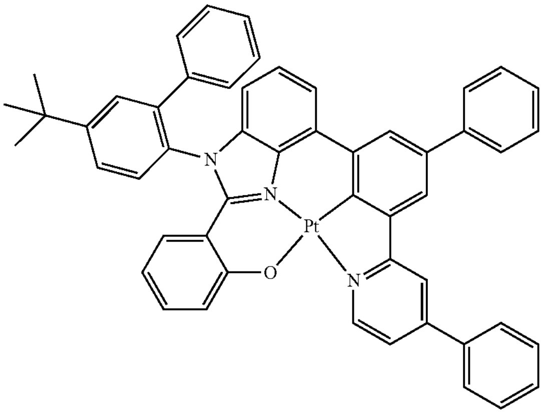
-continued
36
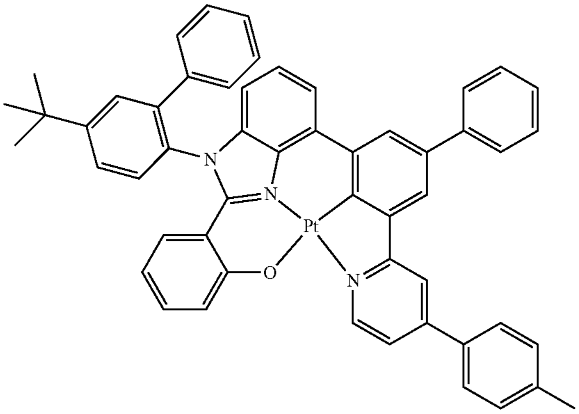
97
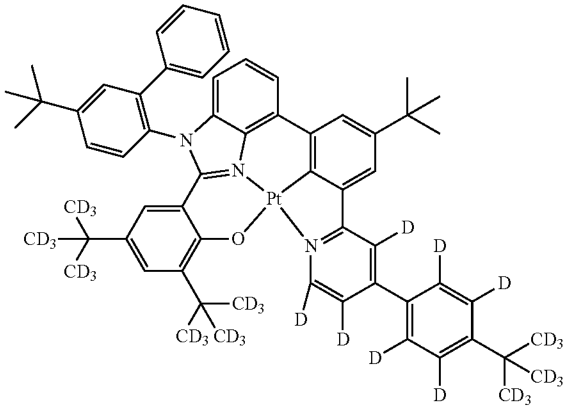
98
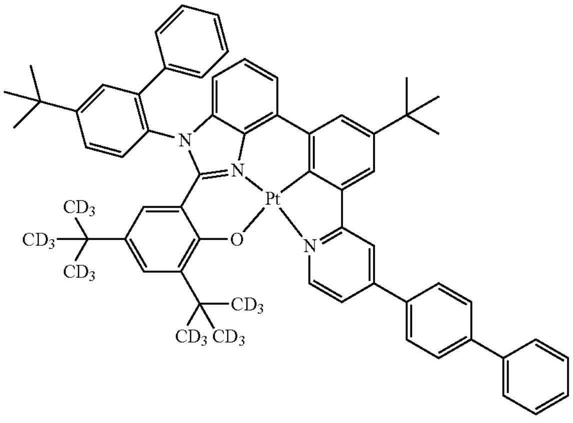

-continued
99
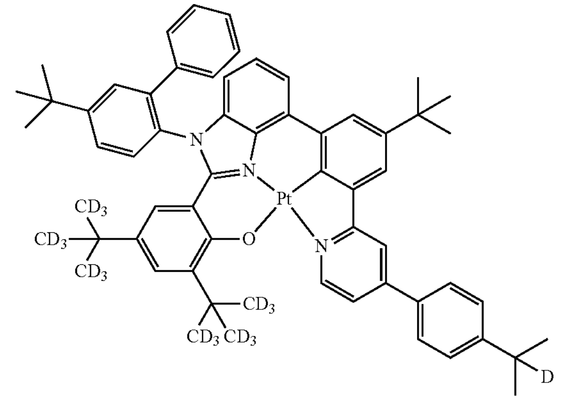
100
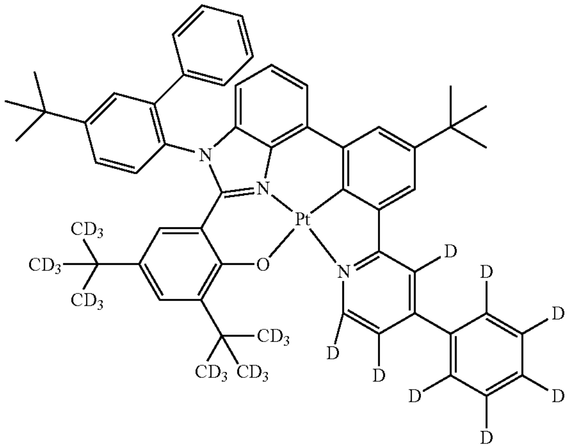
101
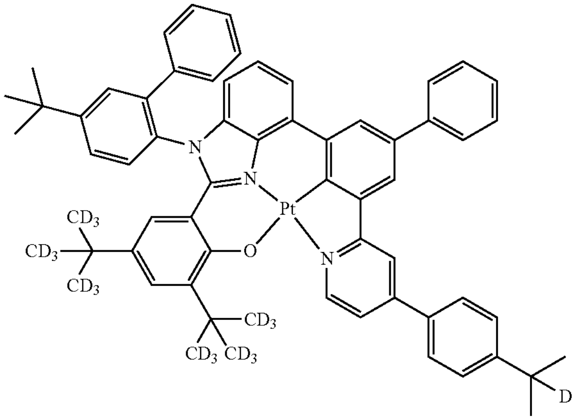
-continued
102
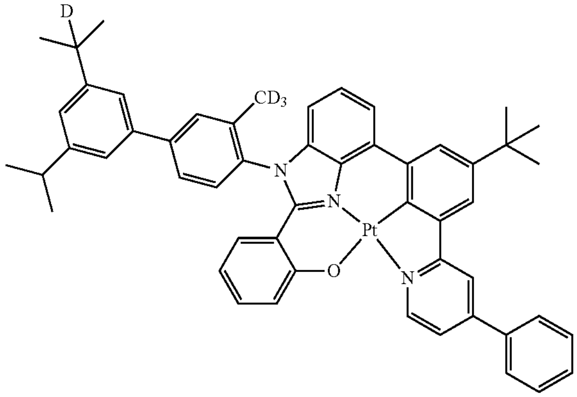
103
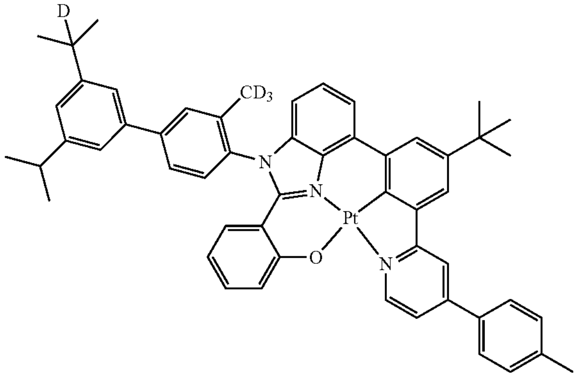
104
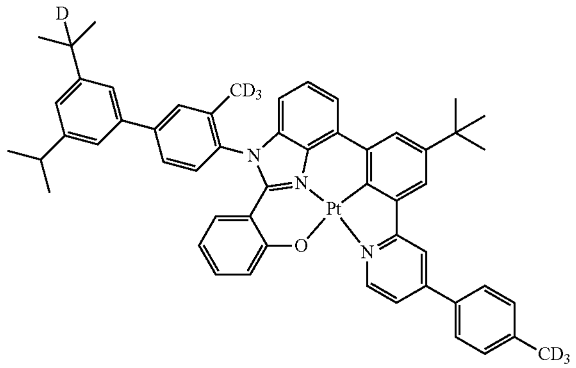
105
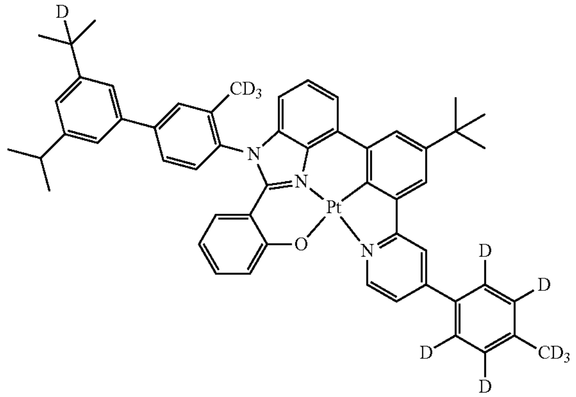

-continued
106
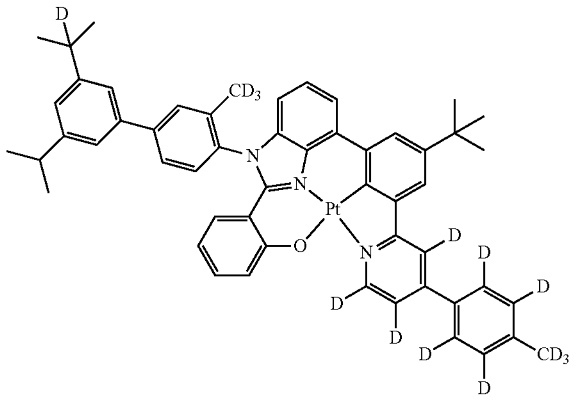
107
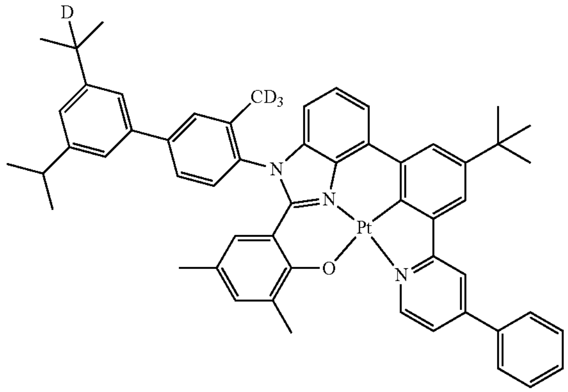
108
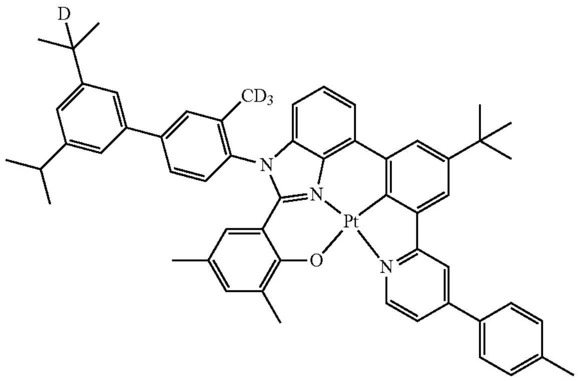
109
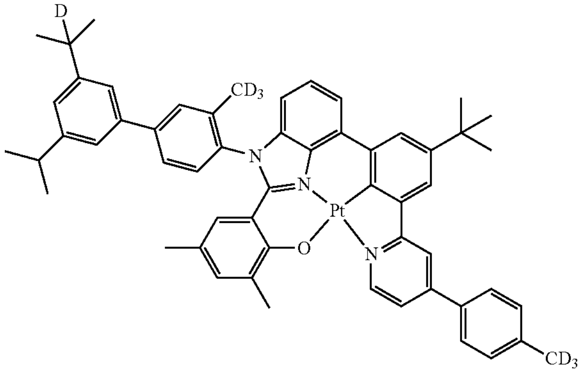
-continued
110
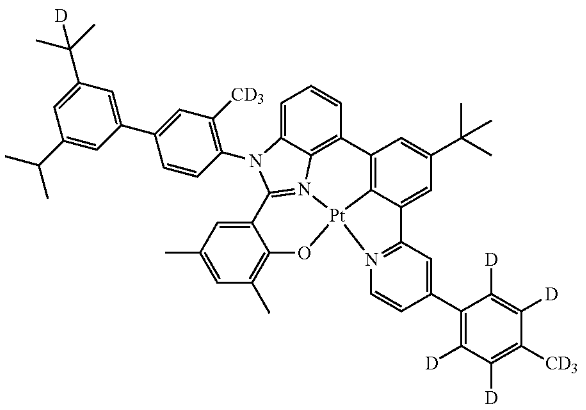
111
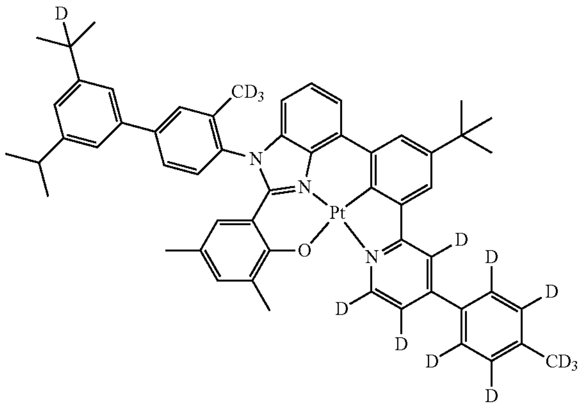
112
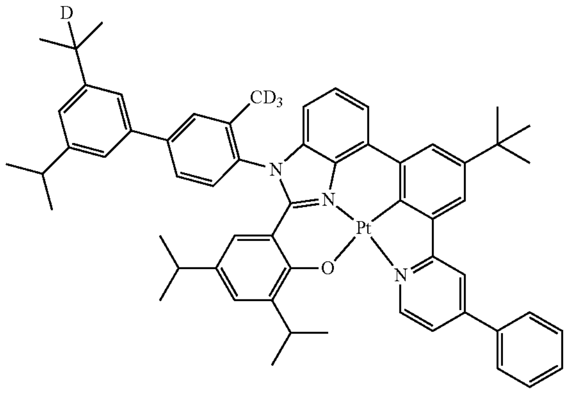

-continued
113
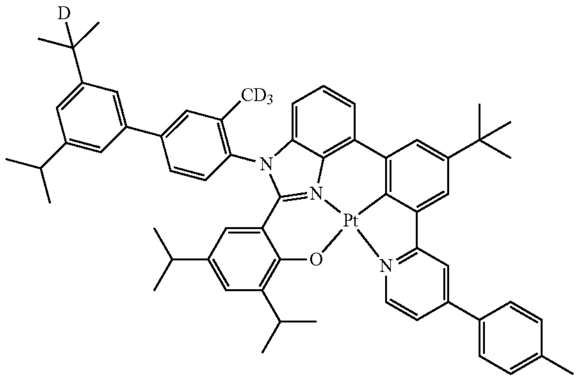
114
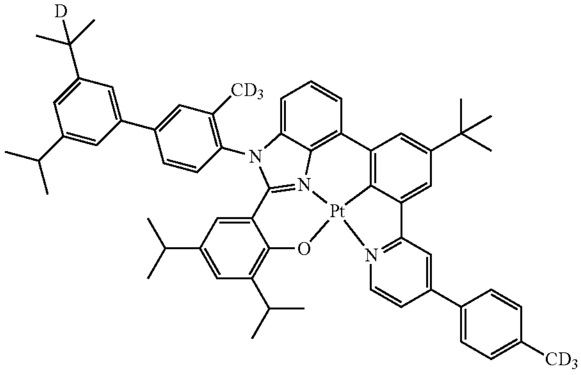
115
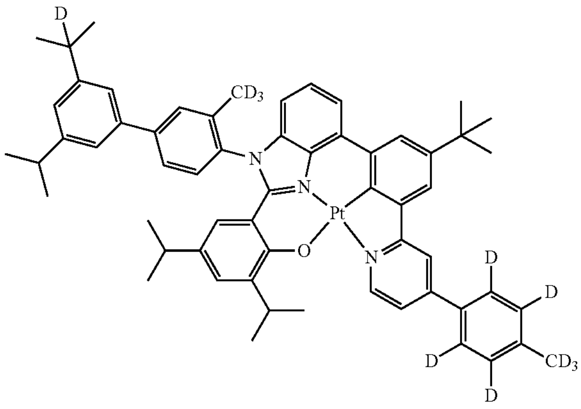
116
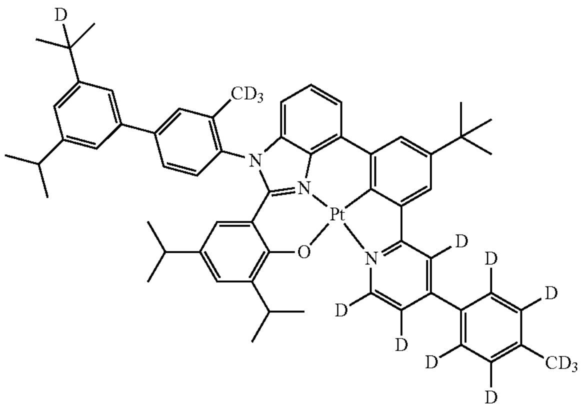
-continued
117
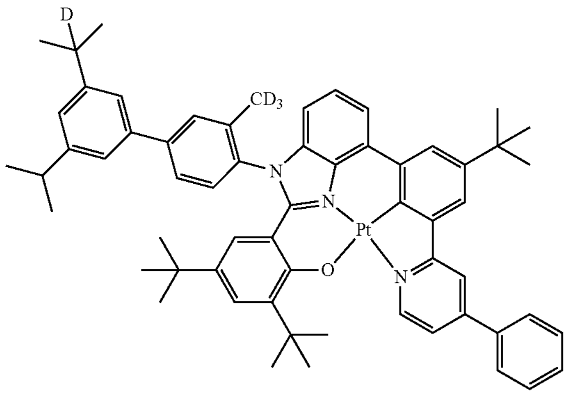
118
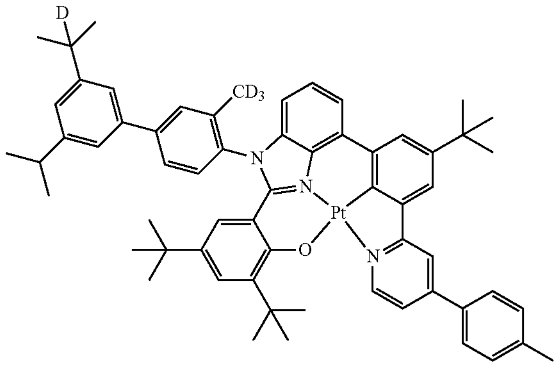
119
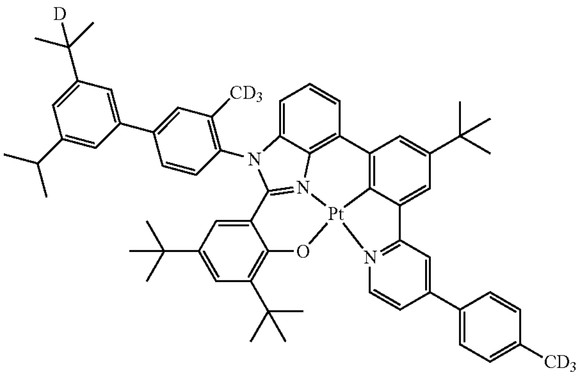
120
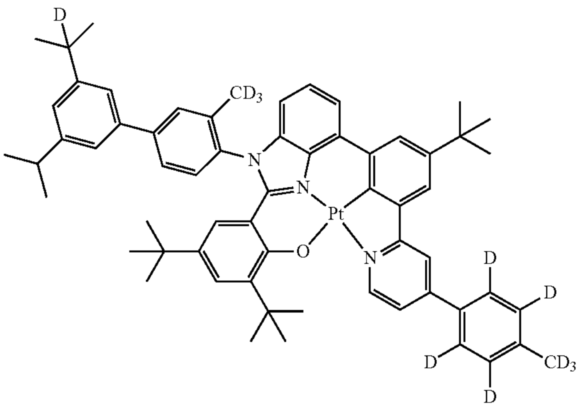

-continued
493
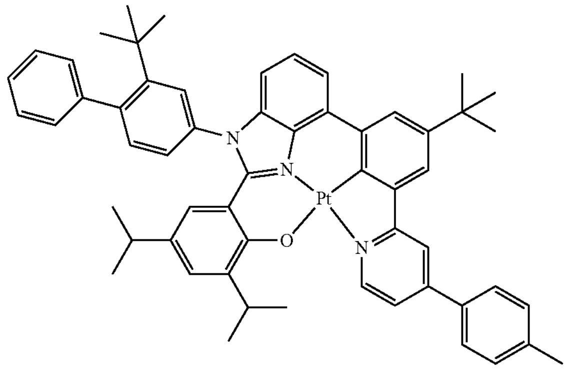
494
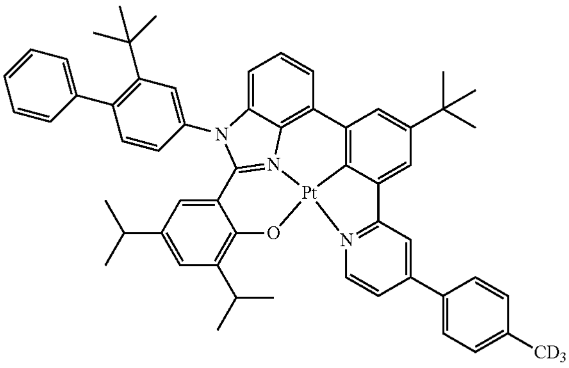
495
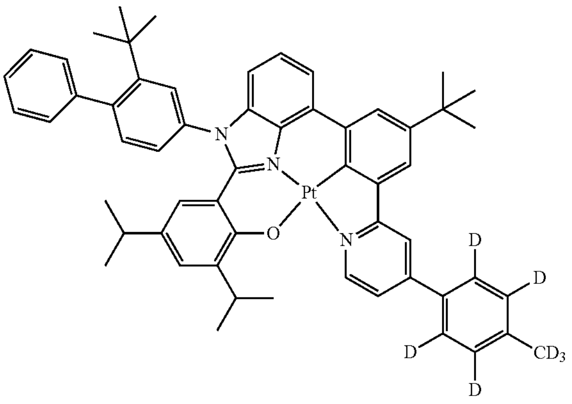
496
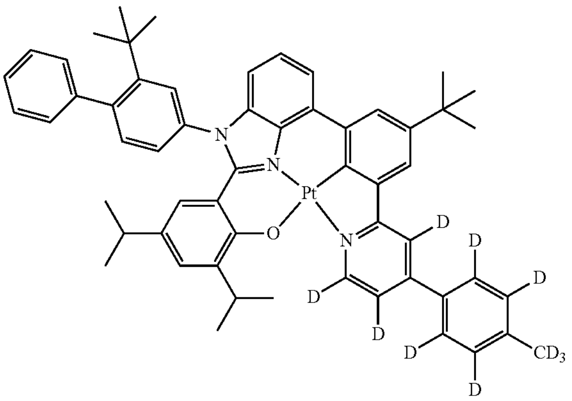
-continued
497
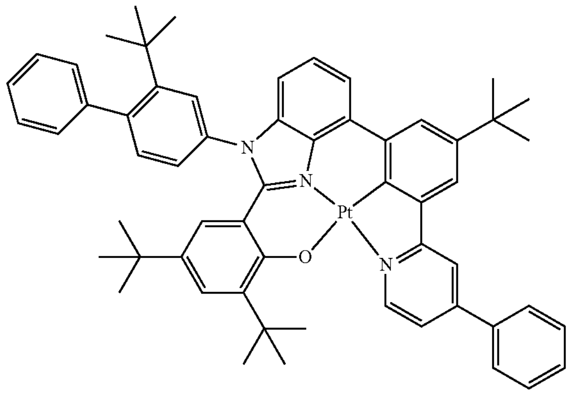
498
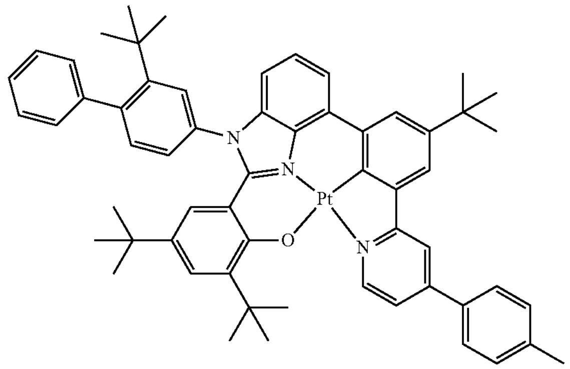
499
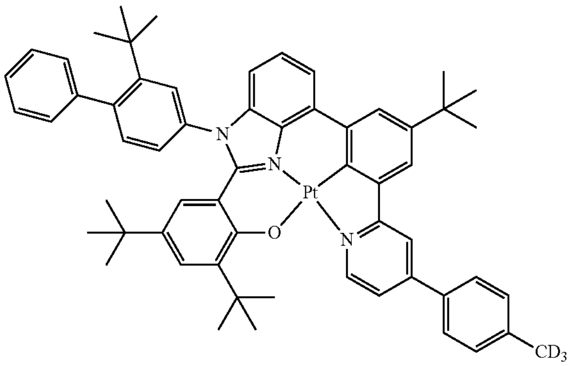
500
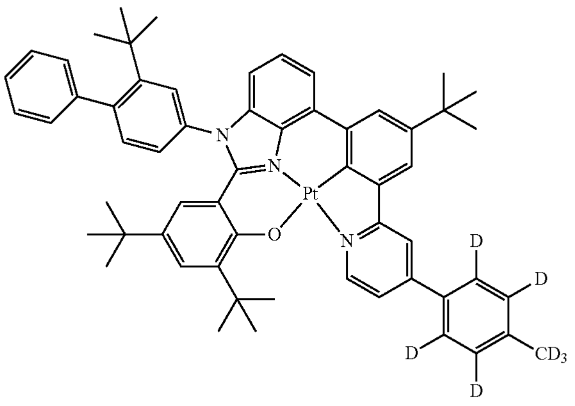

-continued
501
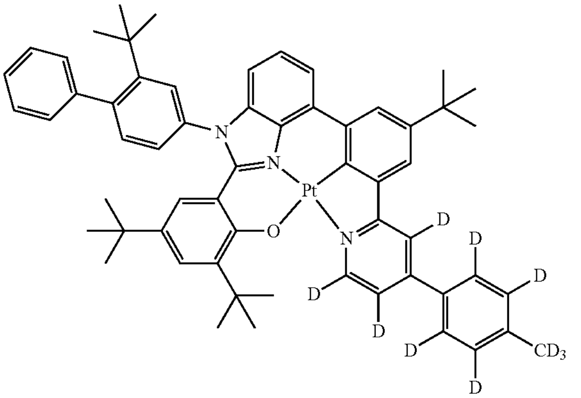
502
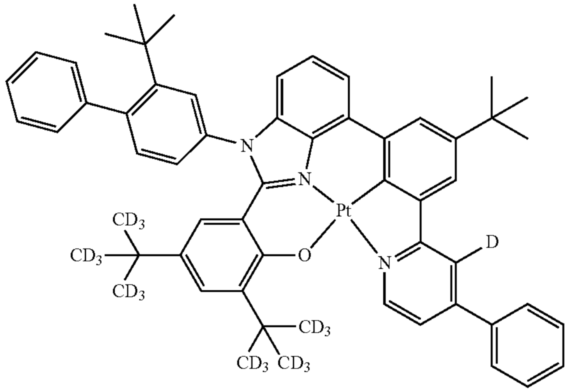
503
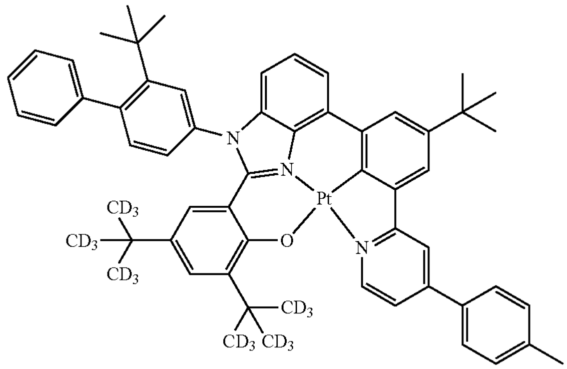
504
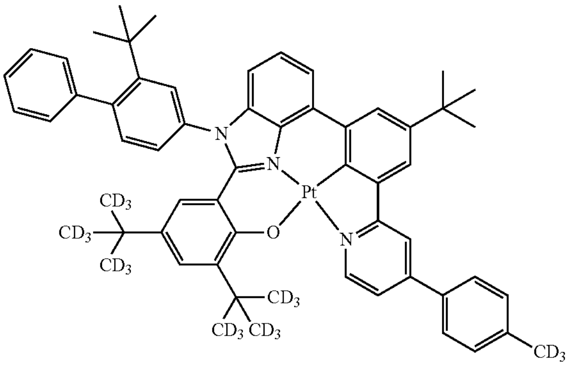
-continued
577
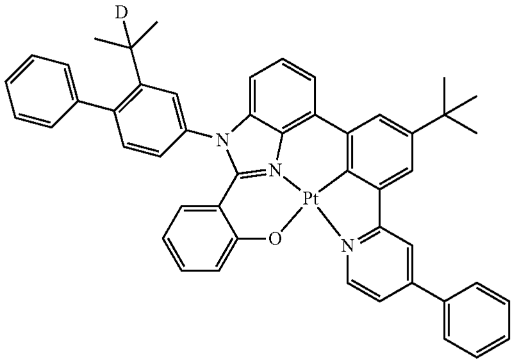
578
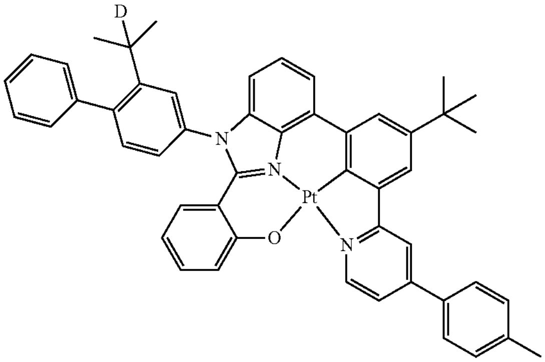
579
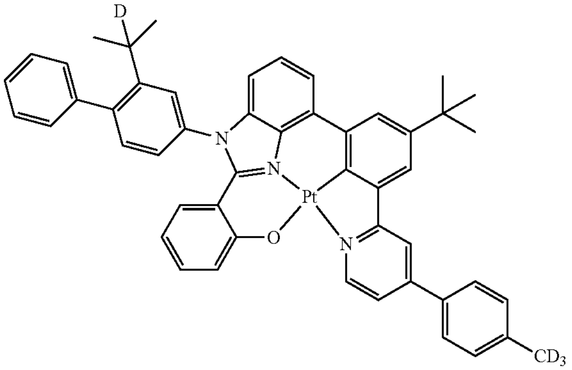
580
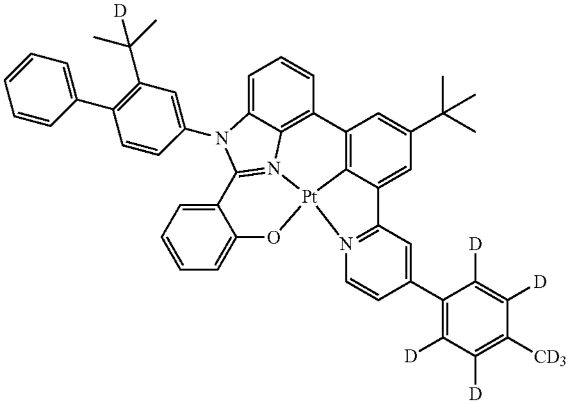

-continued
581
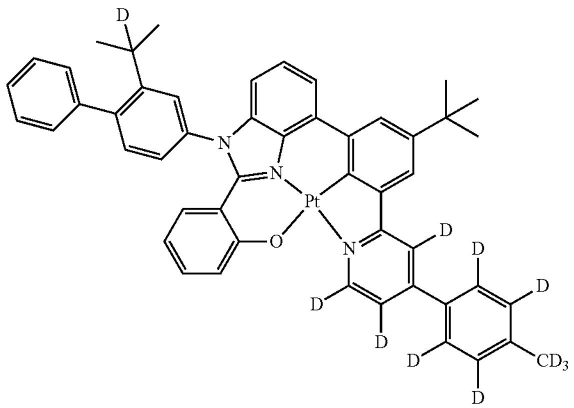
582
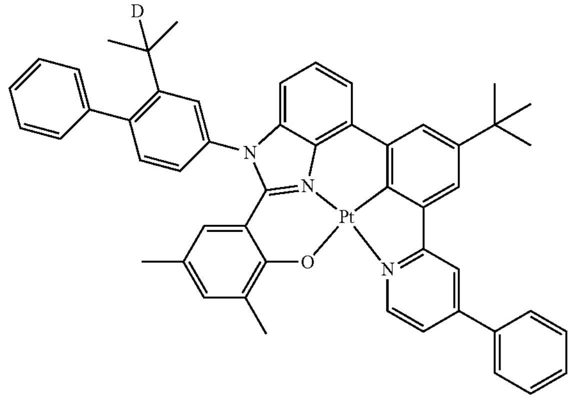
583
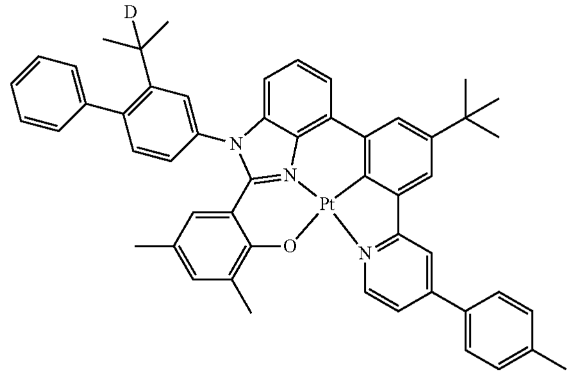
584
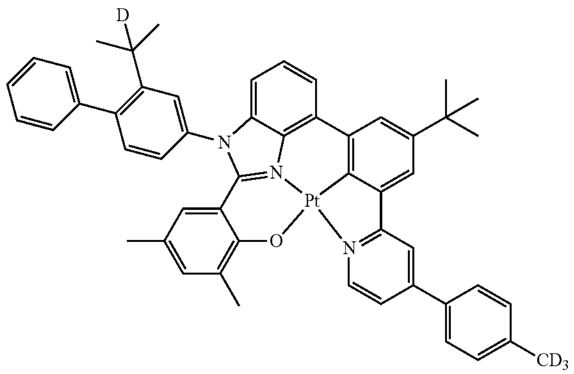
-continued
585
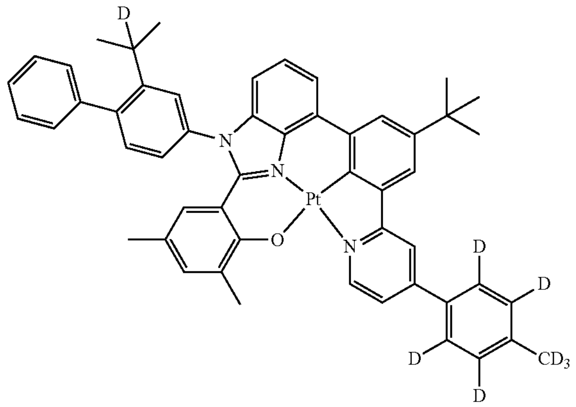
586
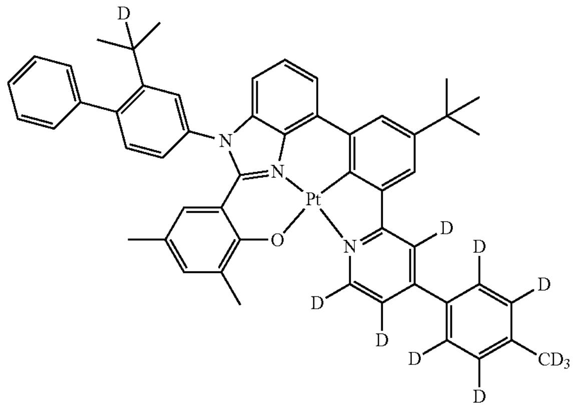
587
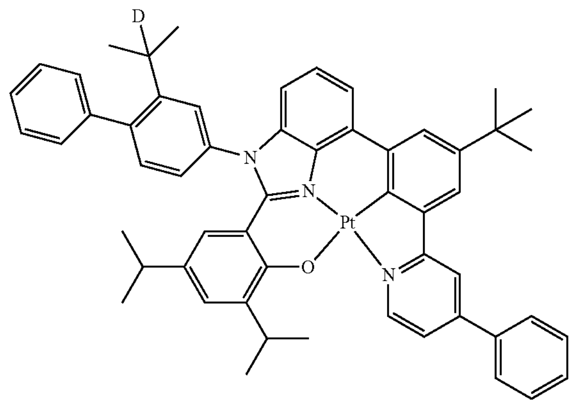

588
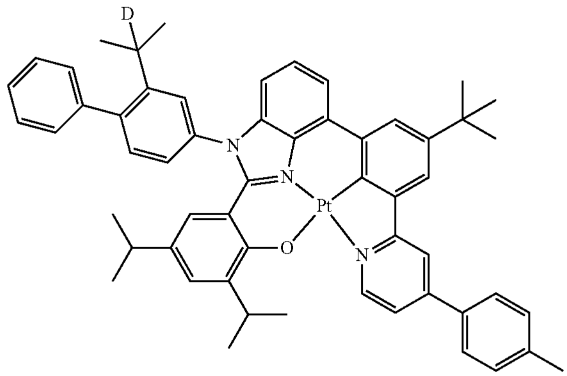
781
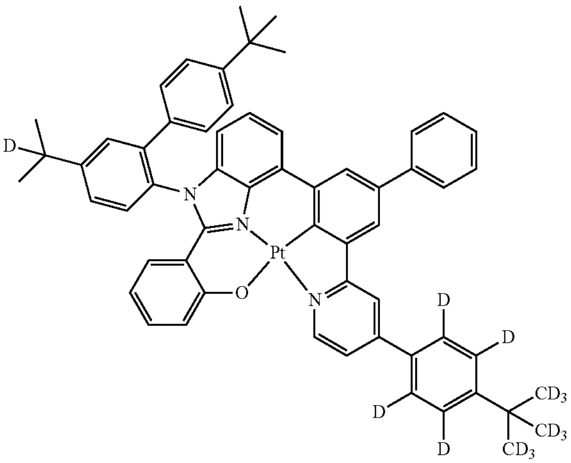
782
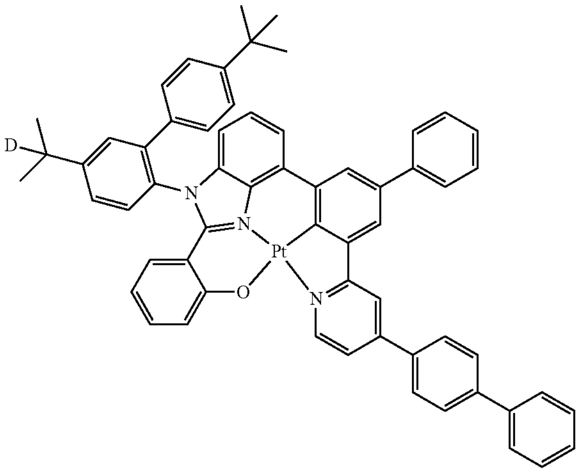
783
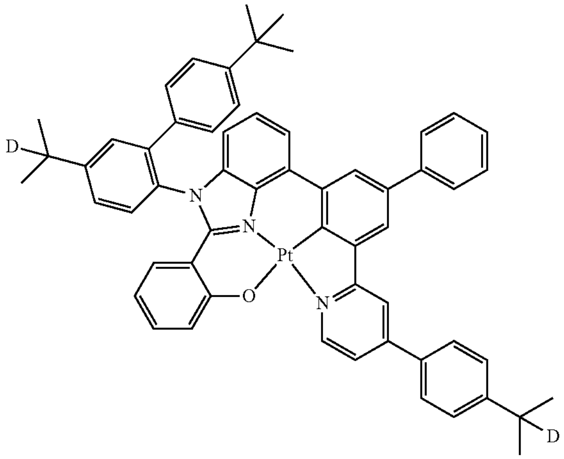
784
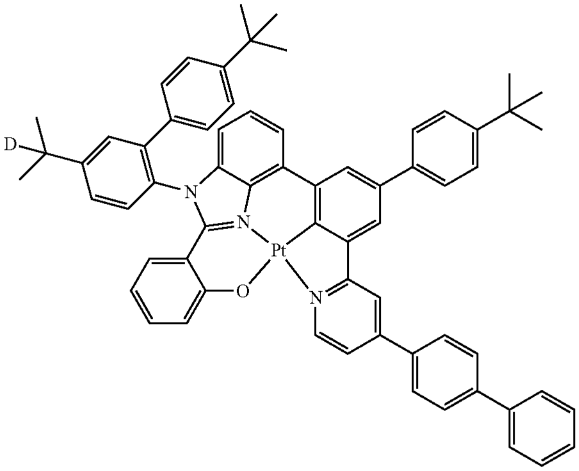
785
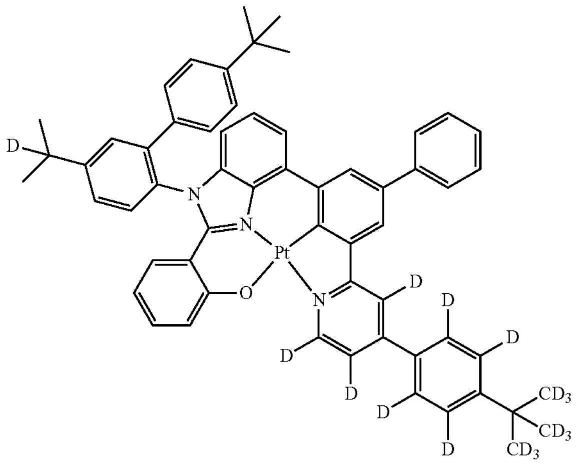

-continued
786
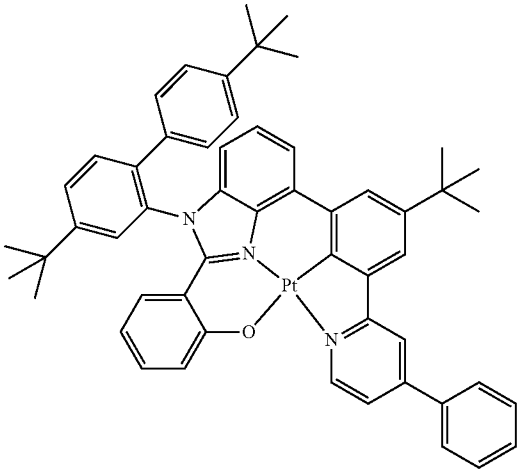
787
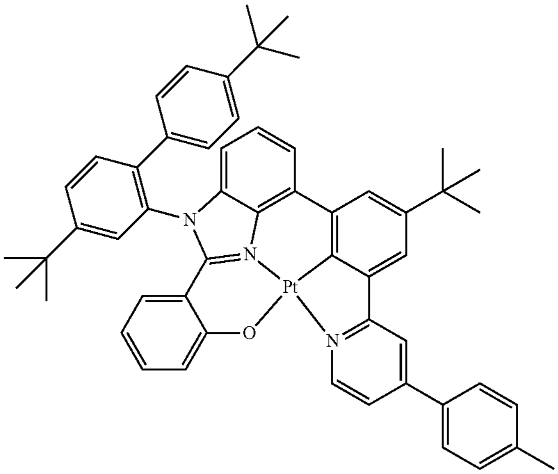
788
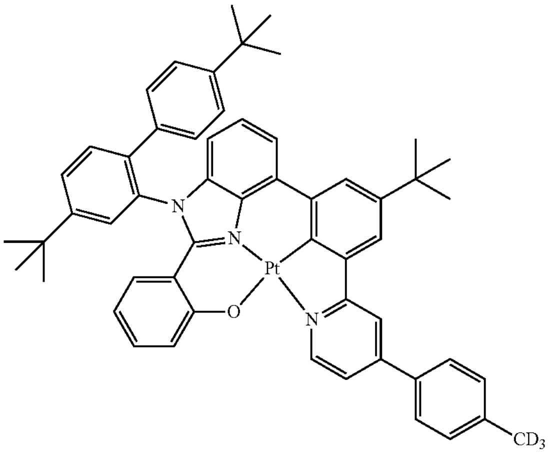
-continued
789
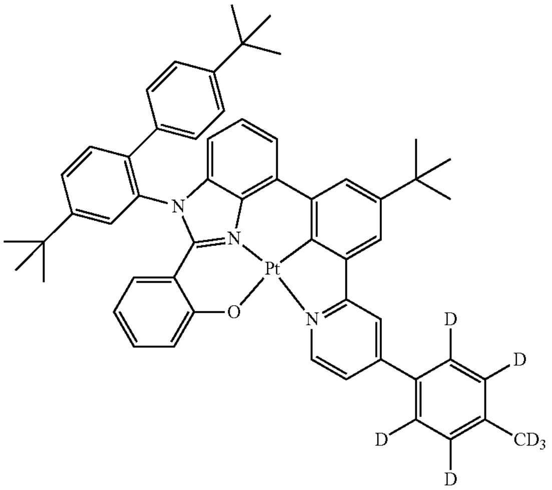
790
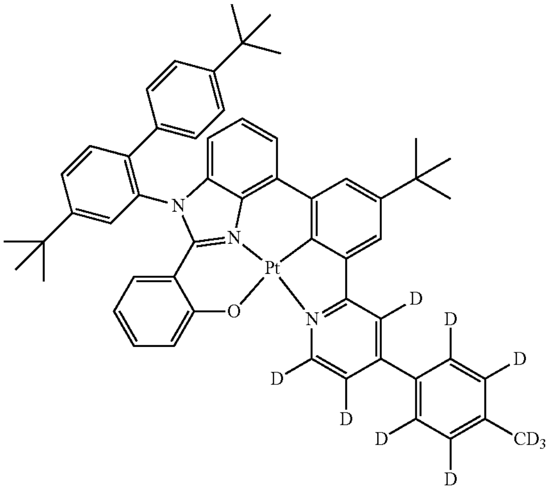
791
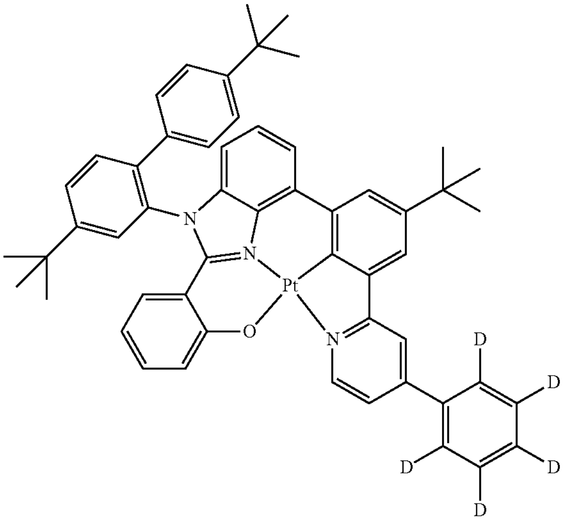

-continued
792
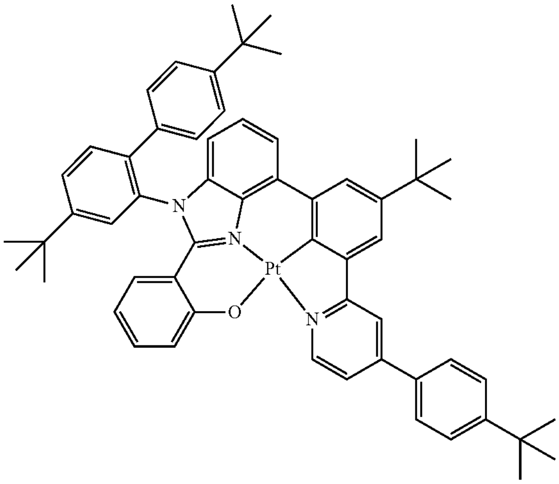
925
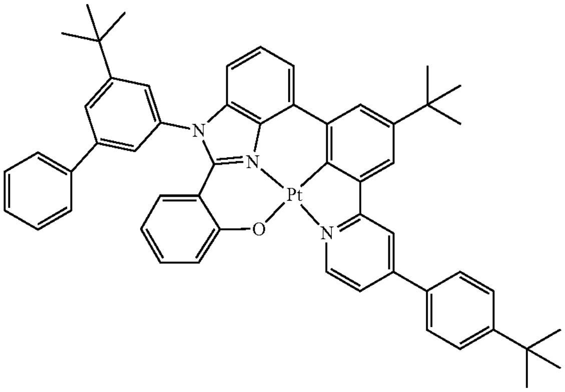
926
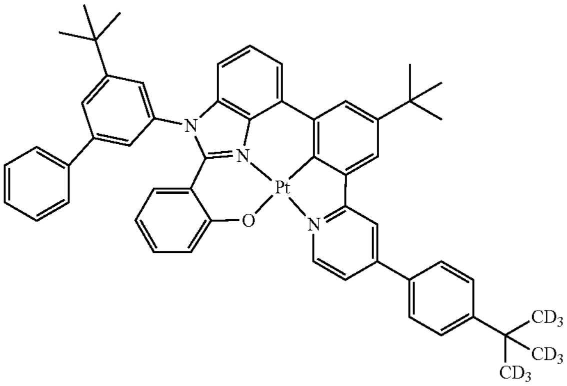
-continued
927
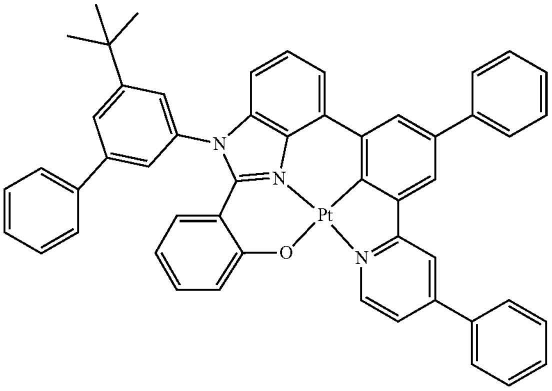
928
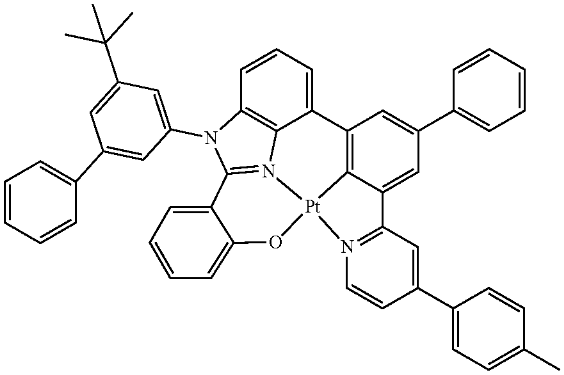
929
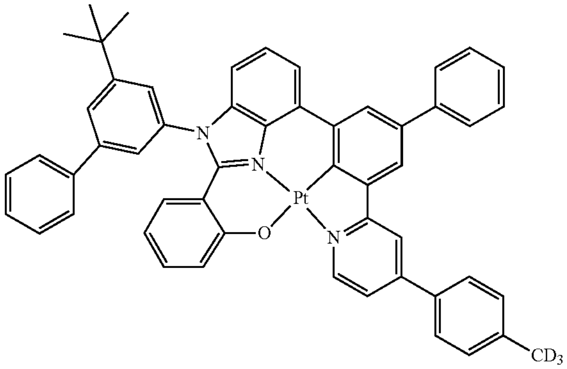
930
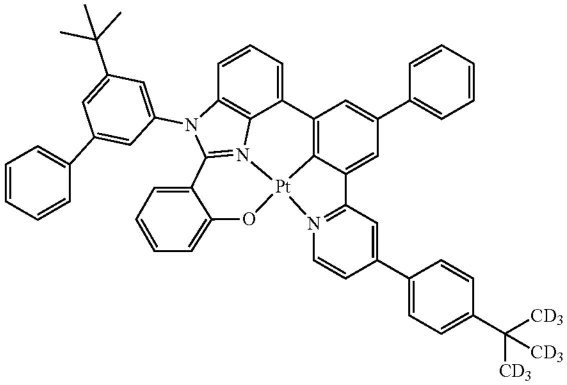

-continued
931
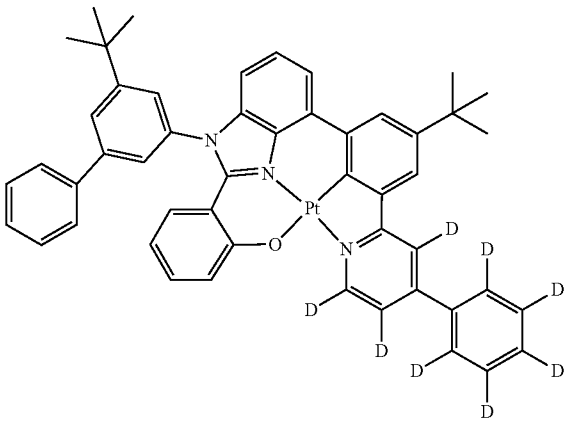
932
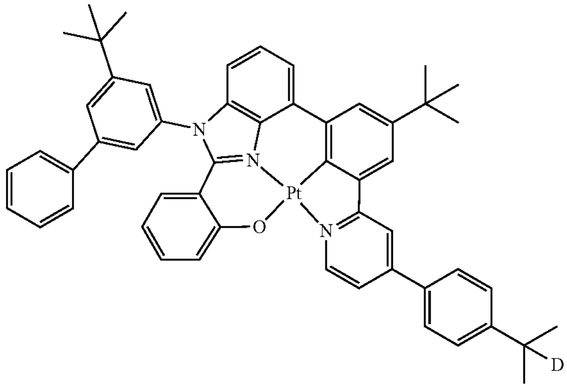
933
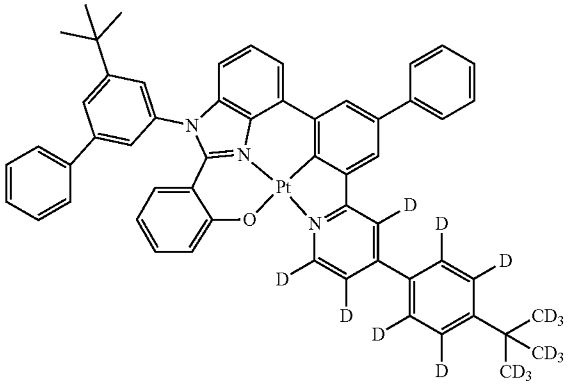
-continued
934
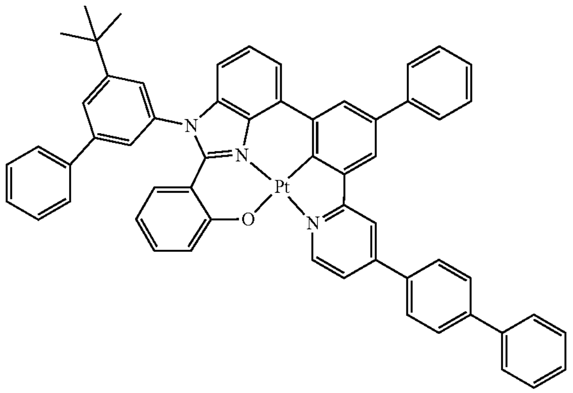
935
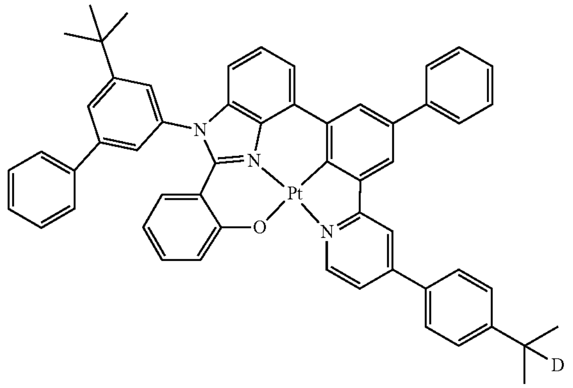
936
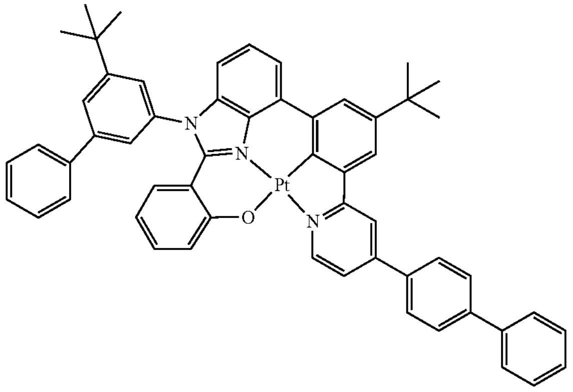
937
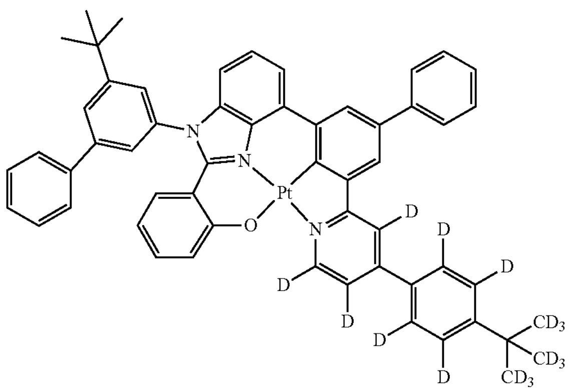

938
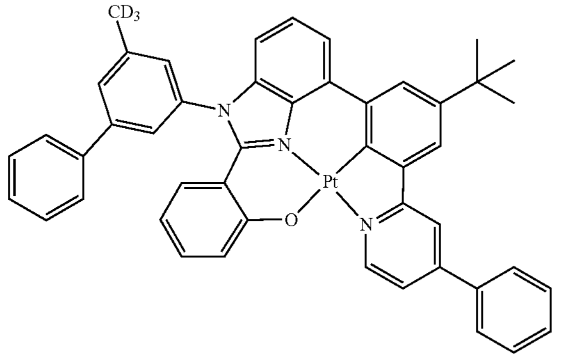
939
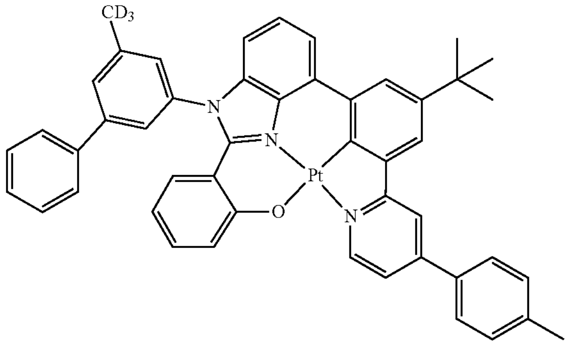
940
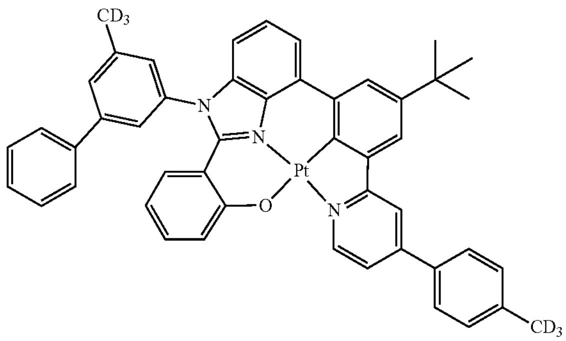
941
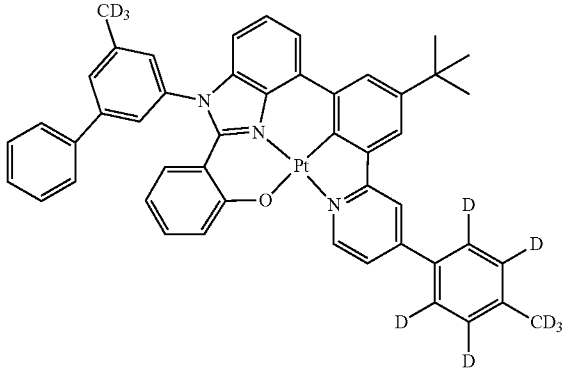
942
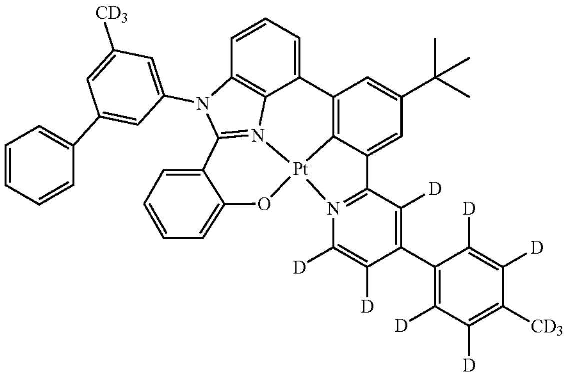
943
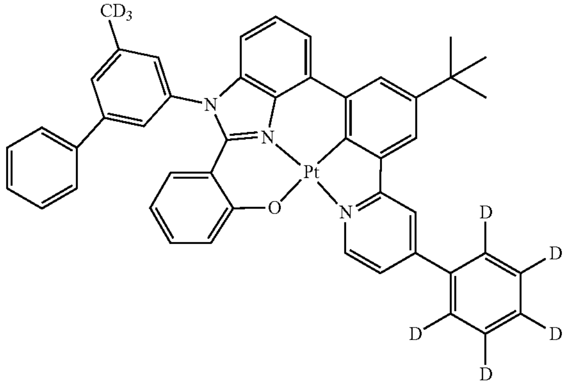
944
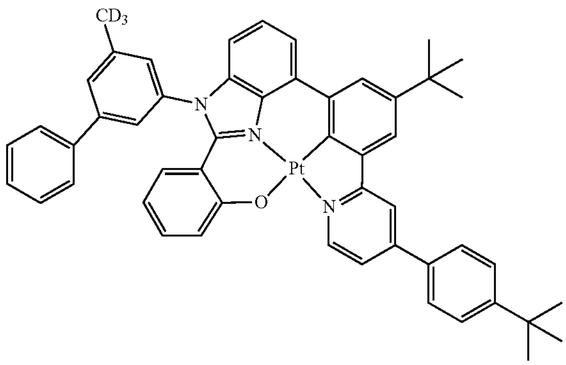
945
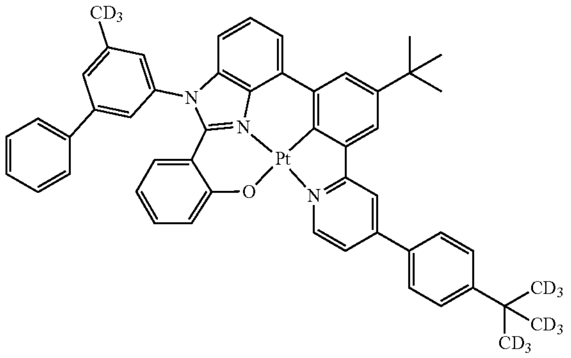

-continued
946
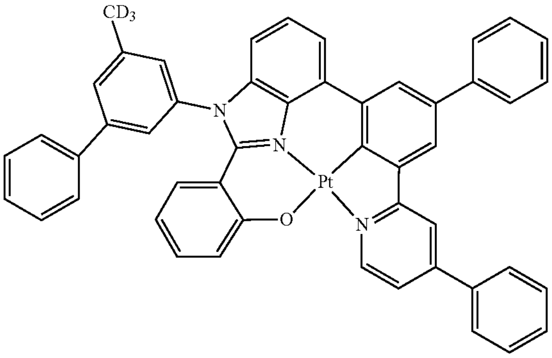
947
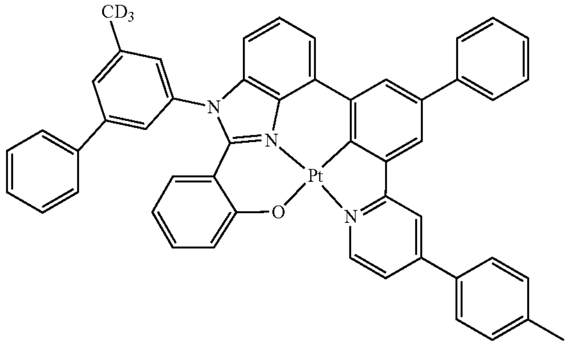
948
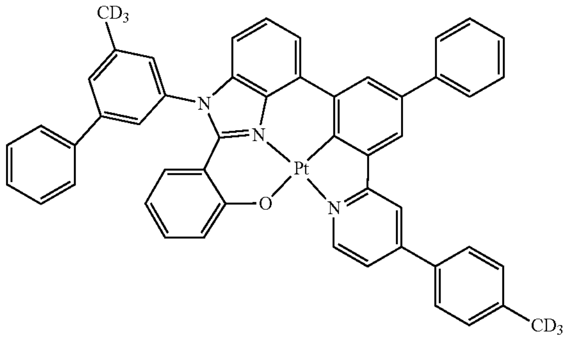
985
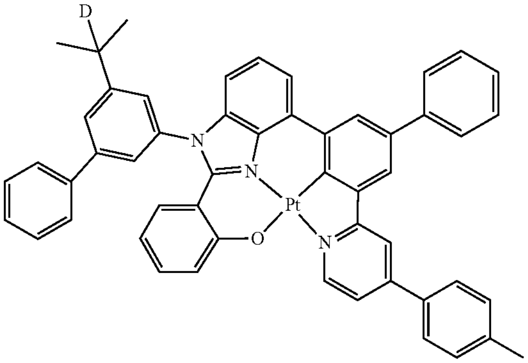
-continued
986
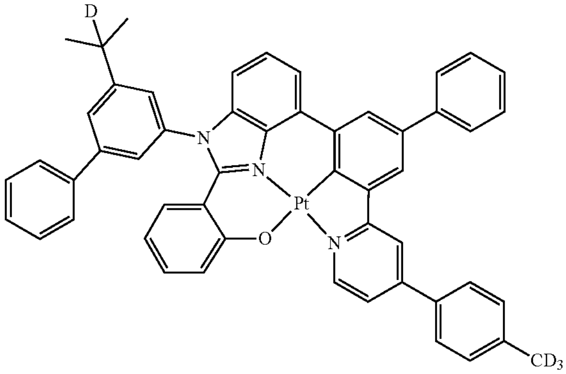
987
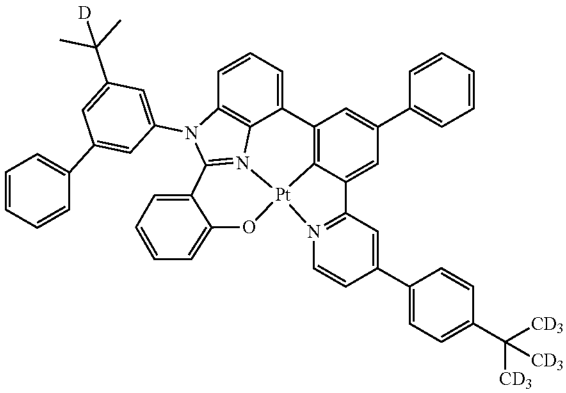
988
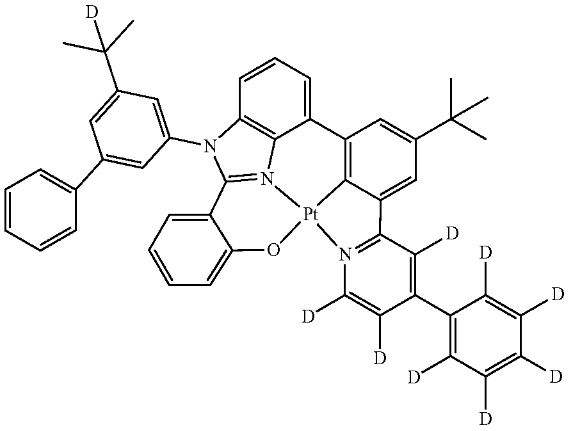

-continued
989
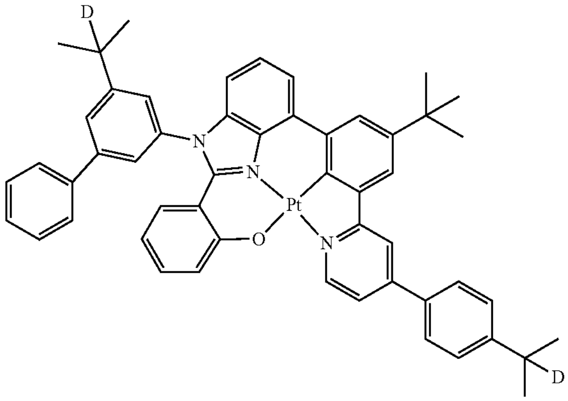
990
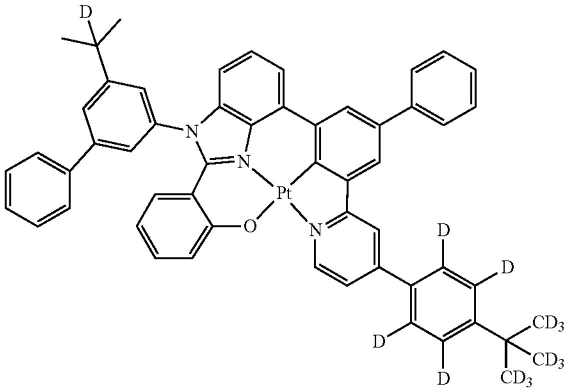
991
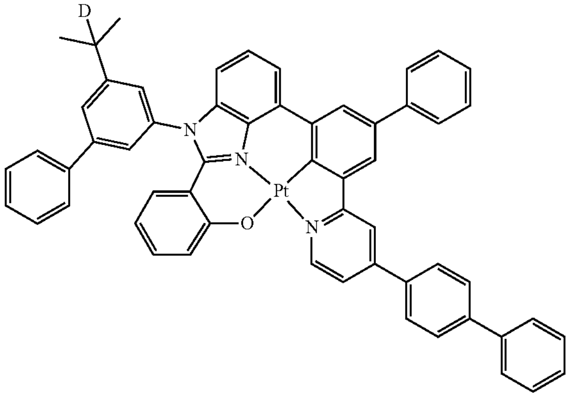
-continued
992
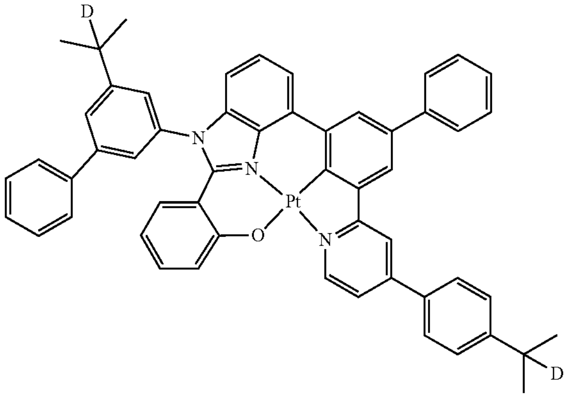
993
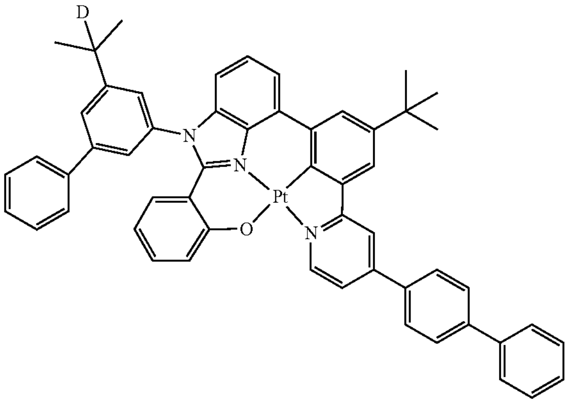
994
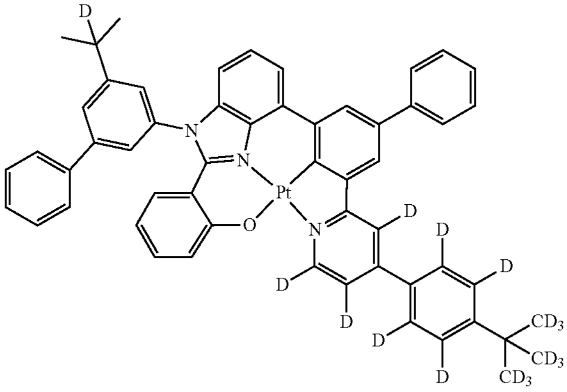

995
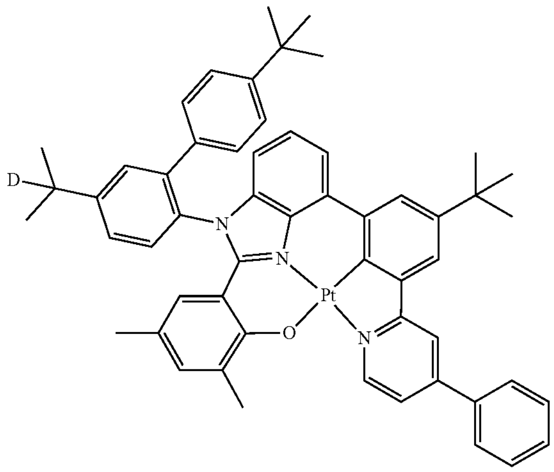
996
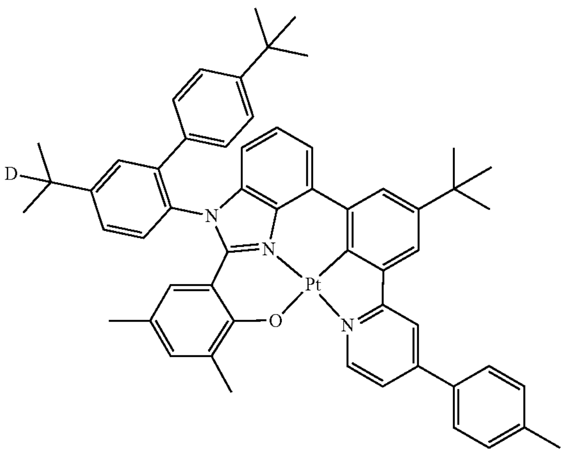
2779
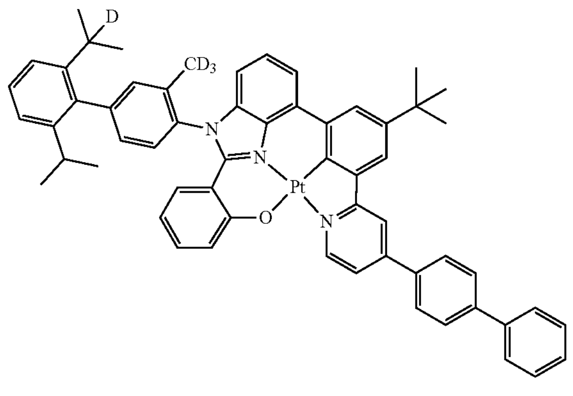
2780
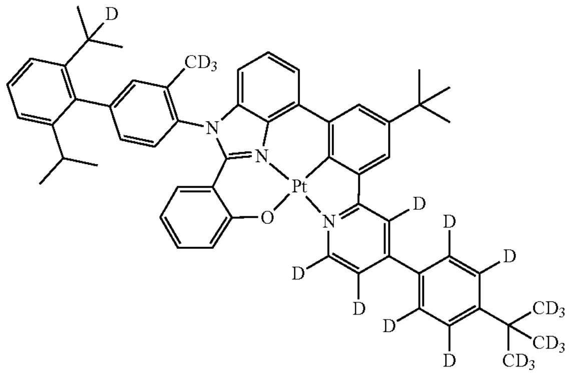
2781
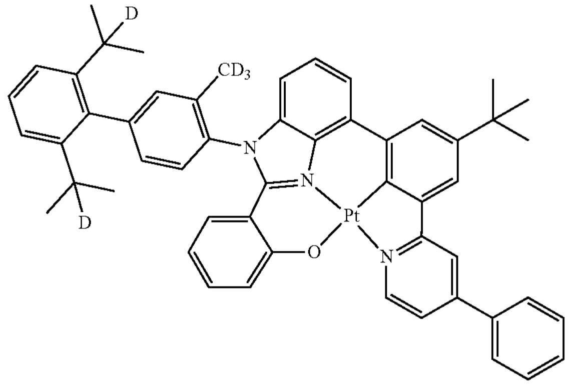
2782
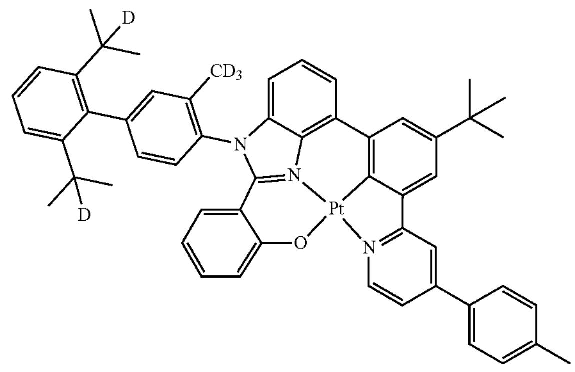
2783
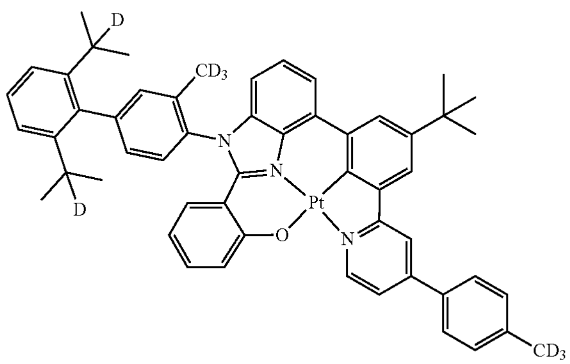

-continued
2784
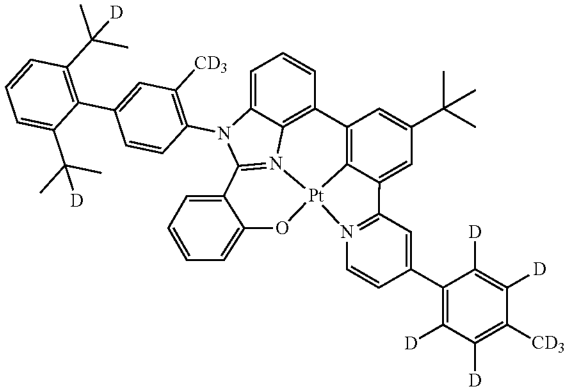
2785
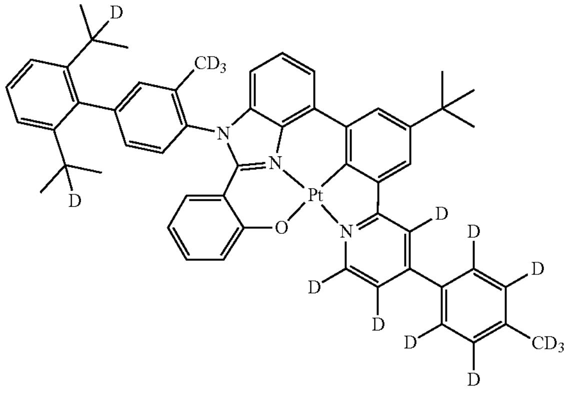
2786
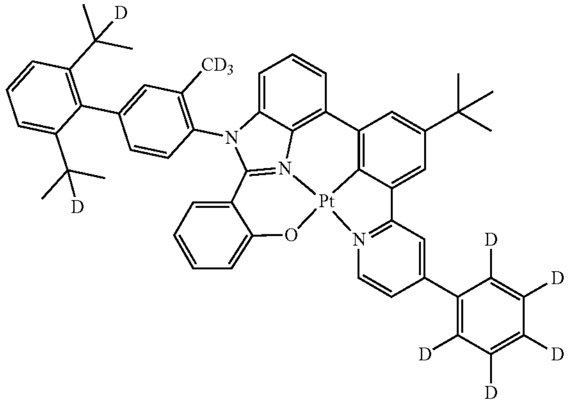
2787
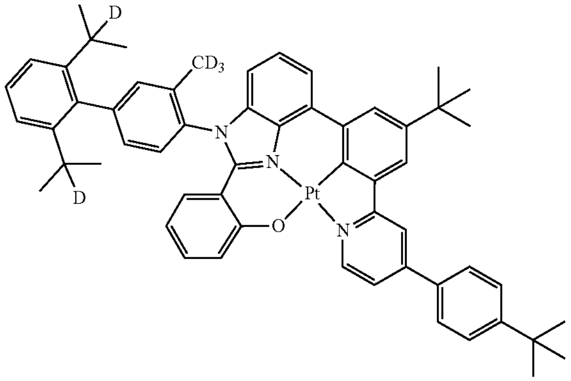
-continued
2788
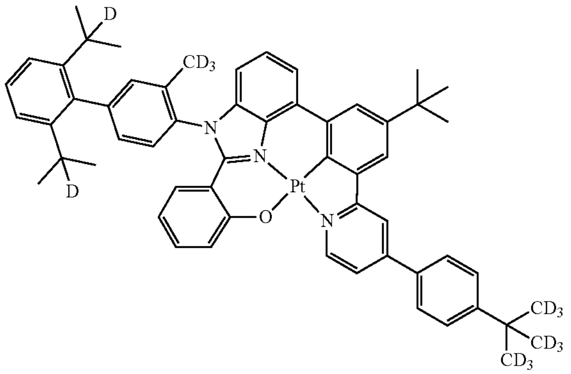
2789
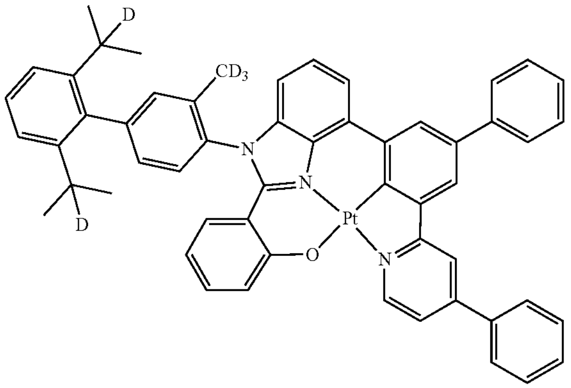
2790
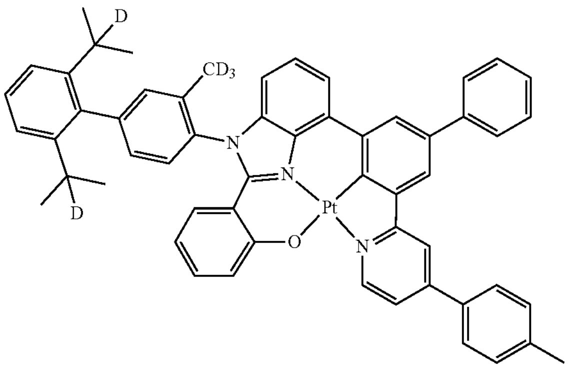
2991
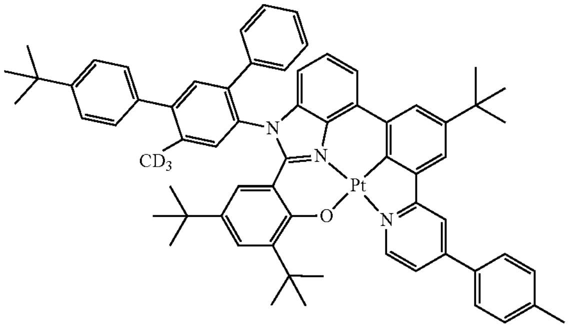

-continued
2992
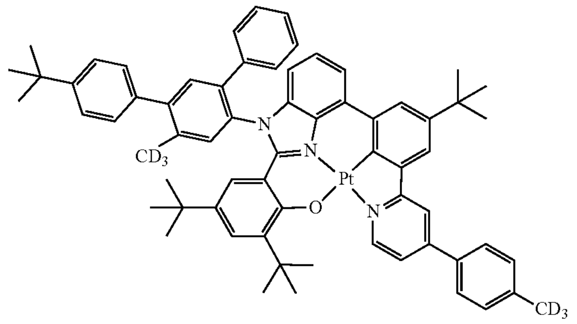
2993
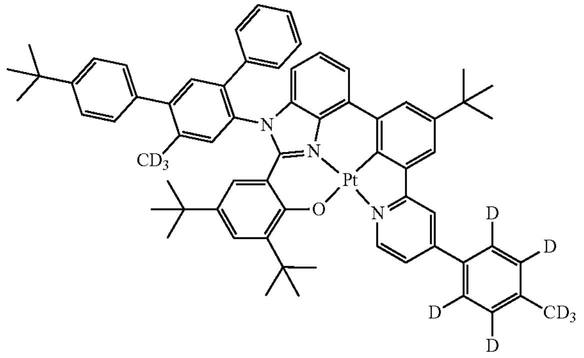
2994
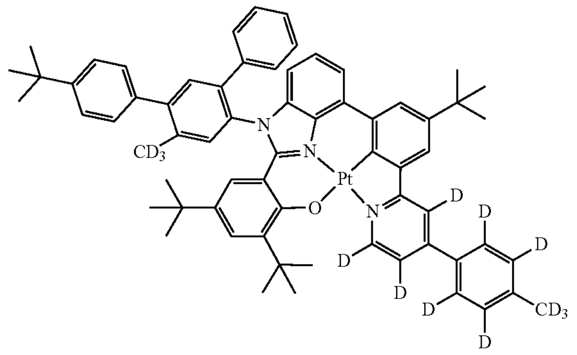
2995
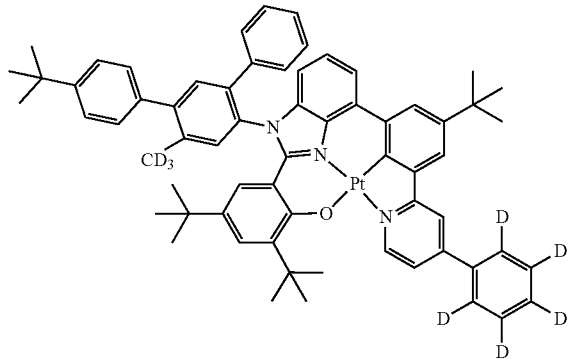
-continued
2996
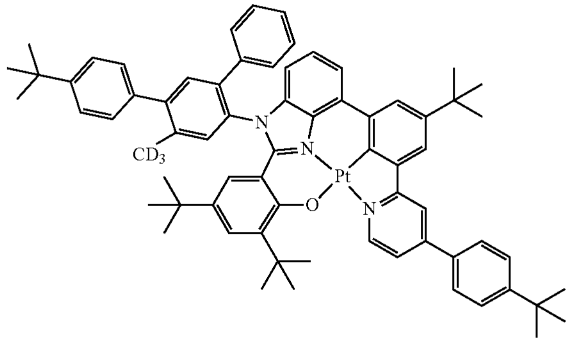
2997
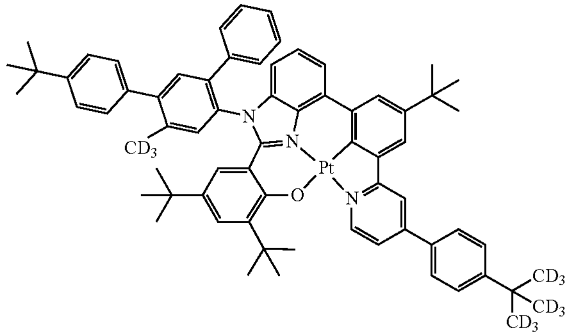
2998
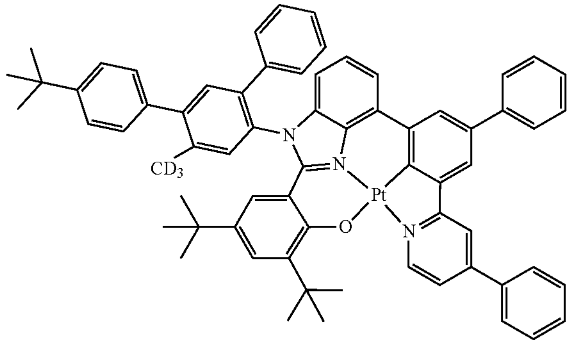
2999
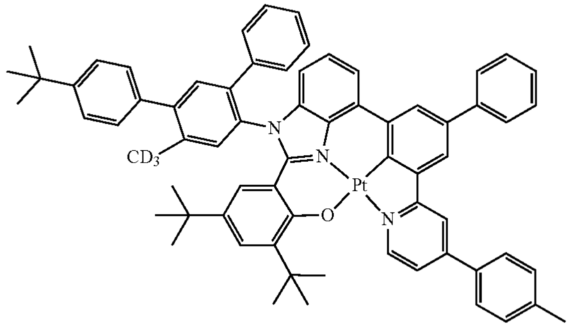

-continued
3000
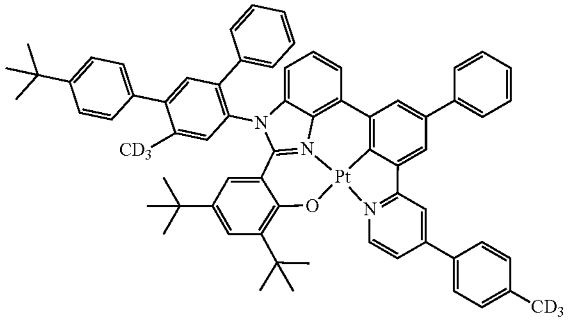
3001
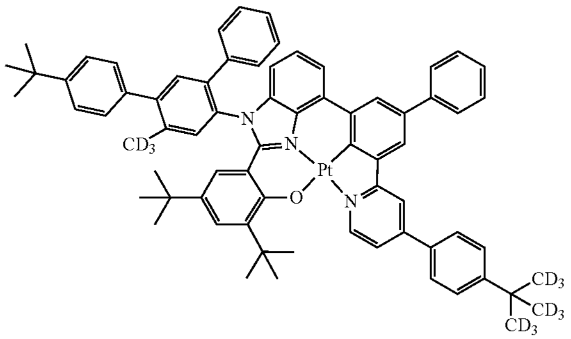
3002
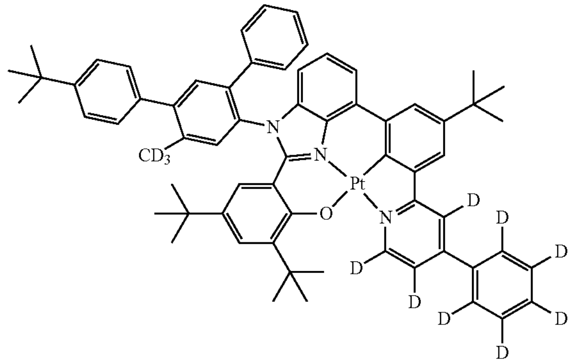
3515
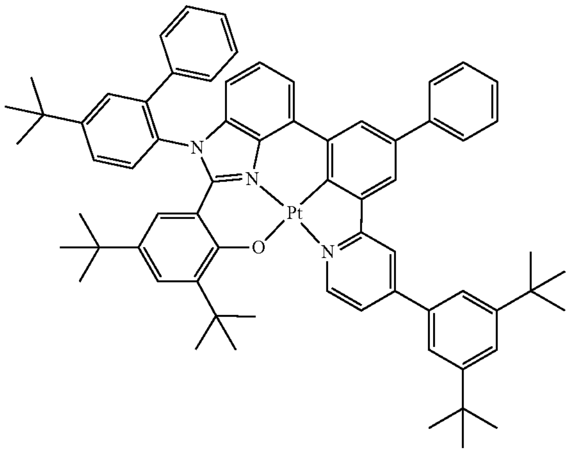
-continued
3516
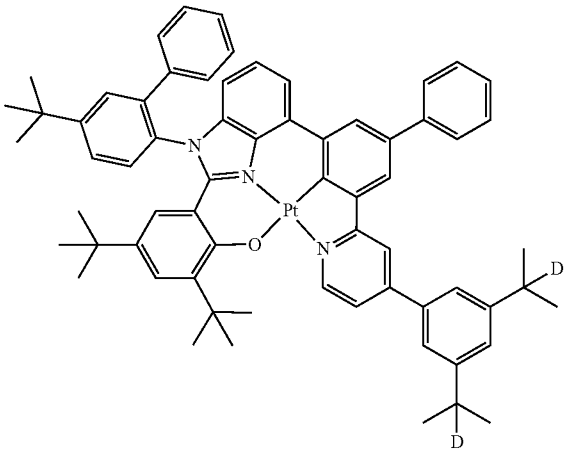
3517
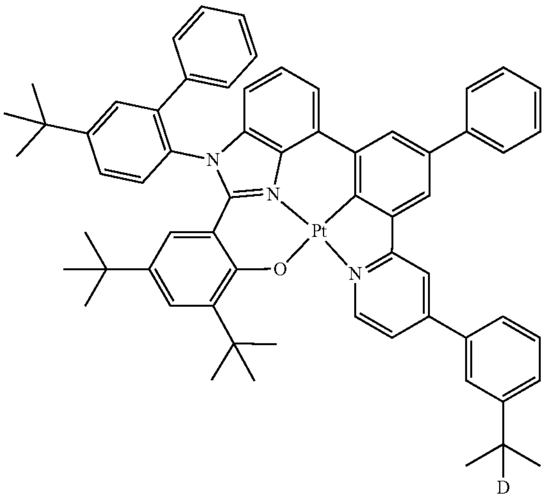
3518
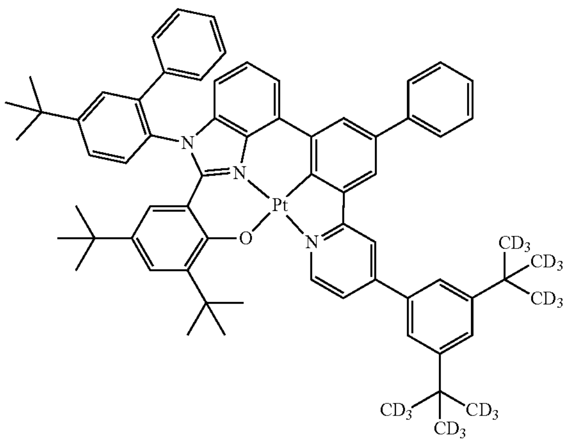

-continued
3519
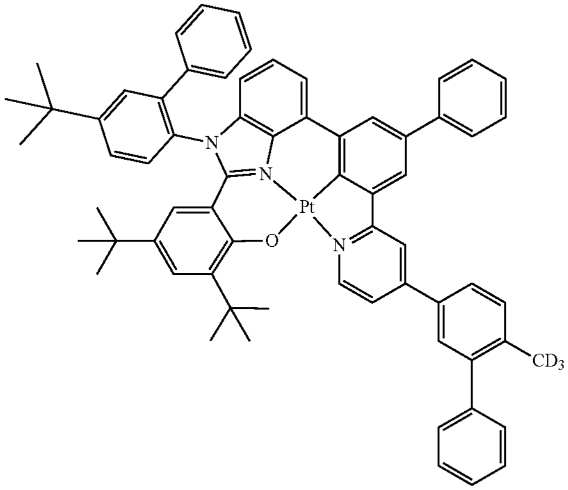
3520
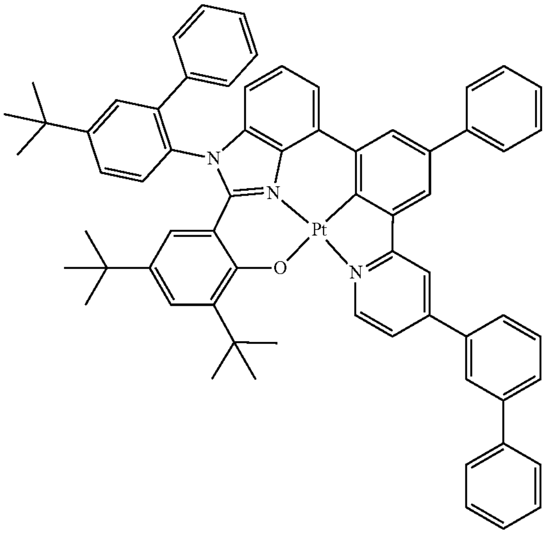
3521
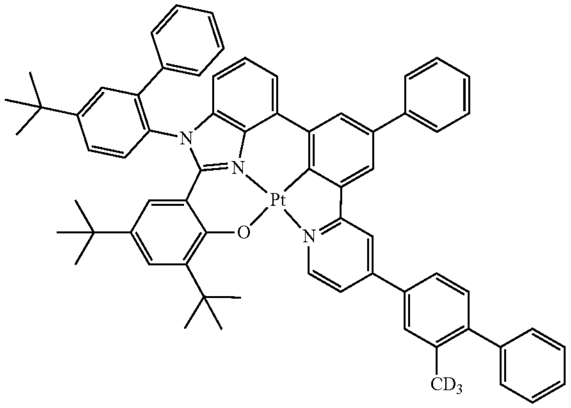
-continued
3522
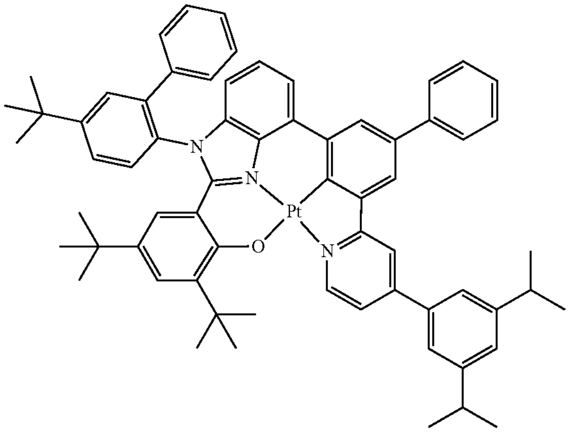
Group 1-3
37
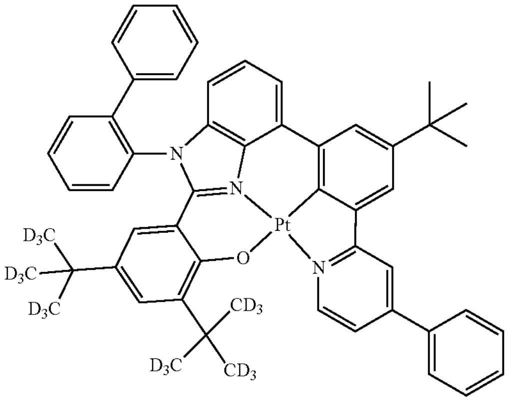
38
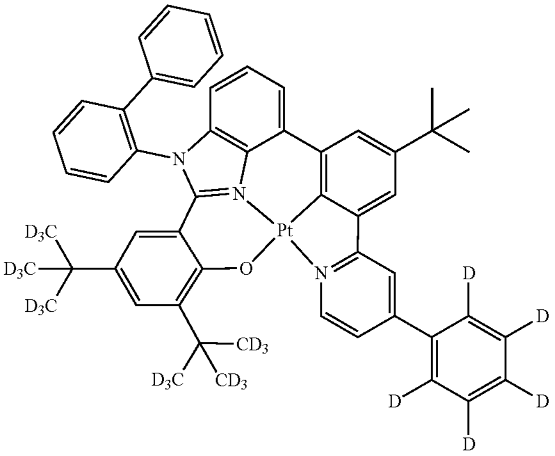

-continued
39
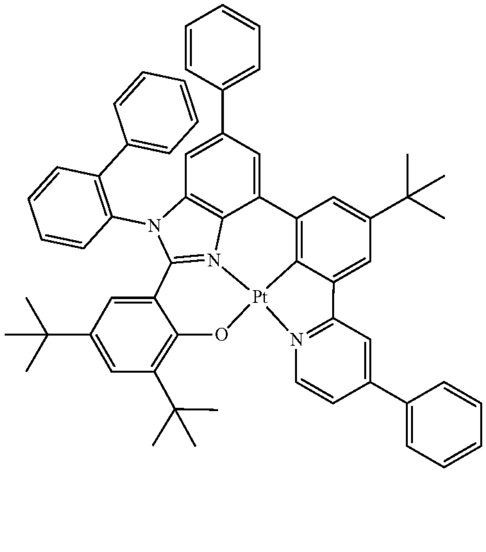
40
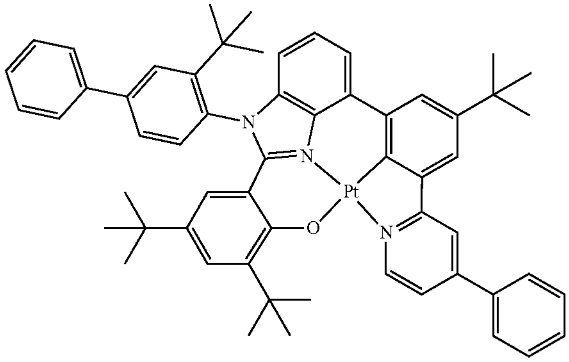
41
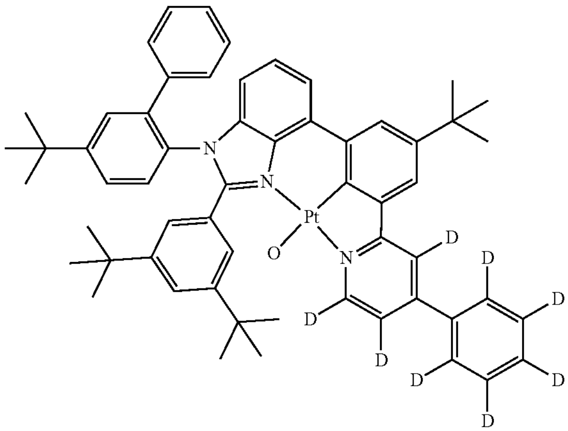
-continued
42
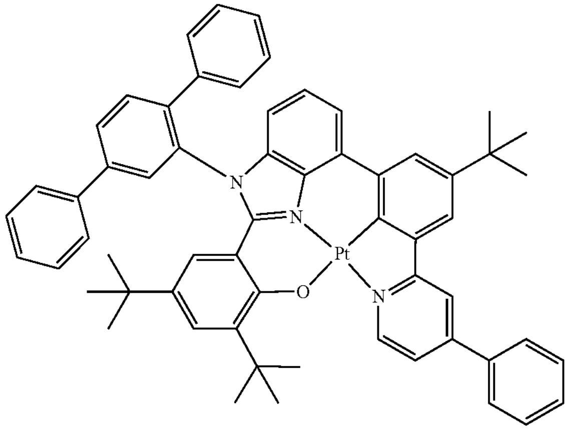
43
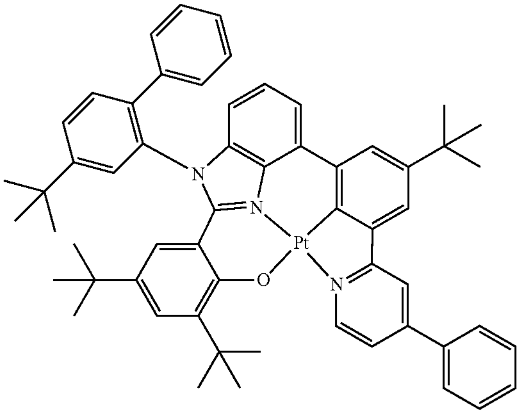
44
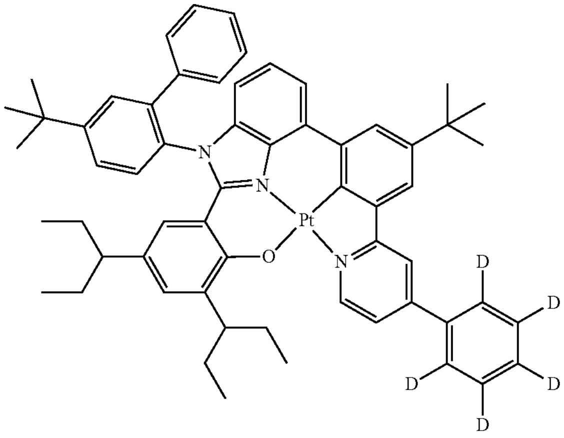

-continued
45
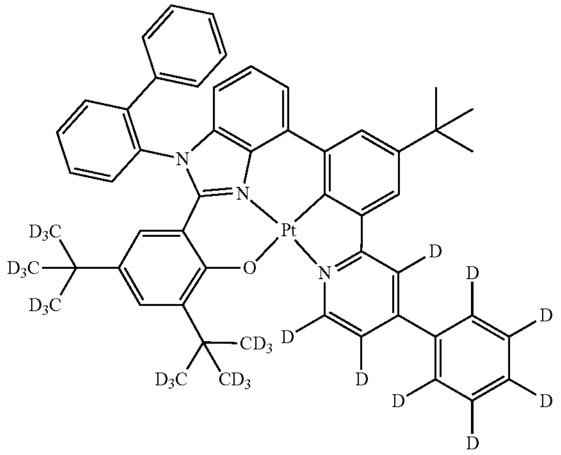
46
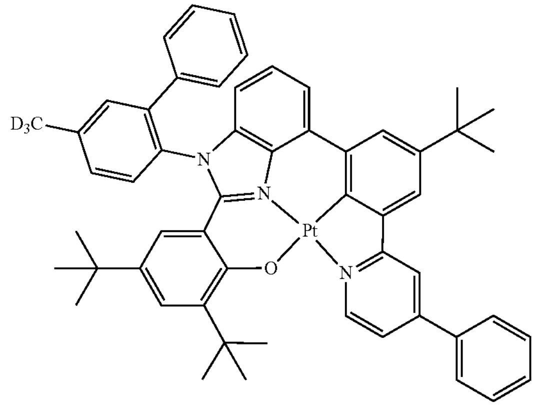
47
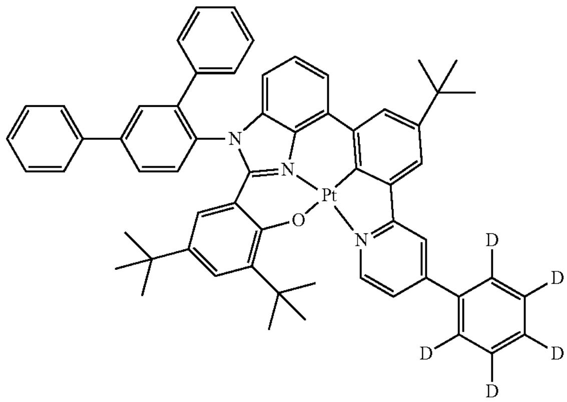
-continued
48
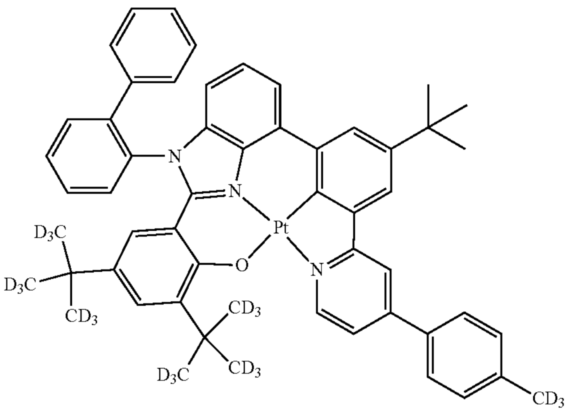
49
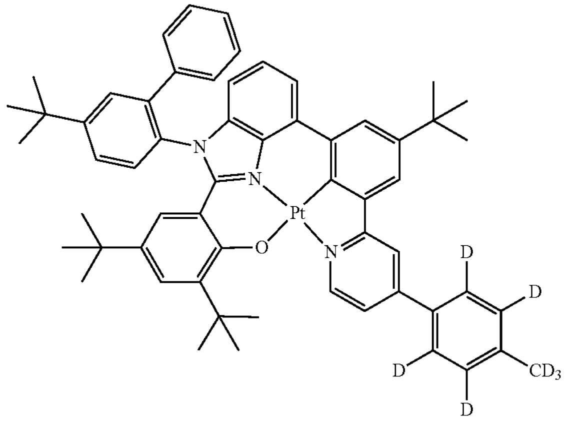
50
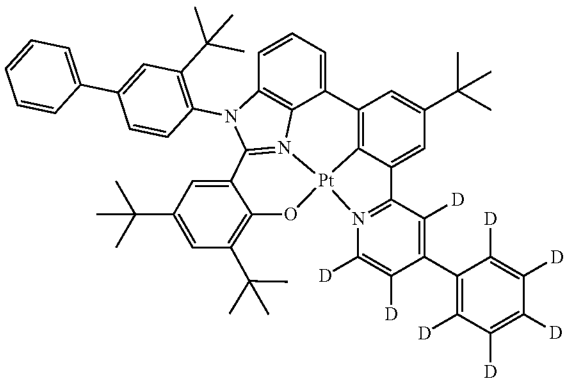

-continued
51
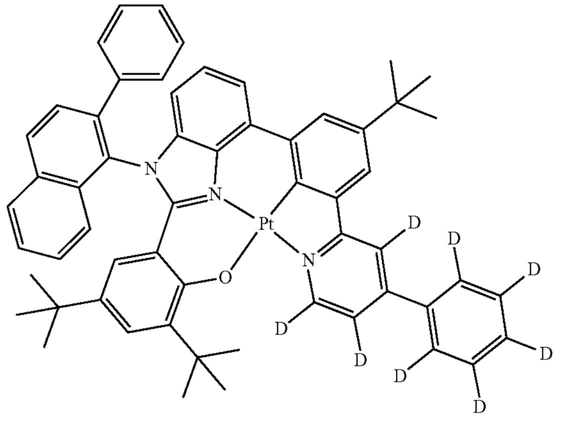
52
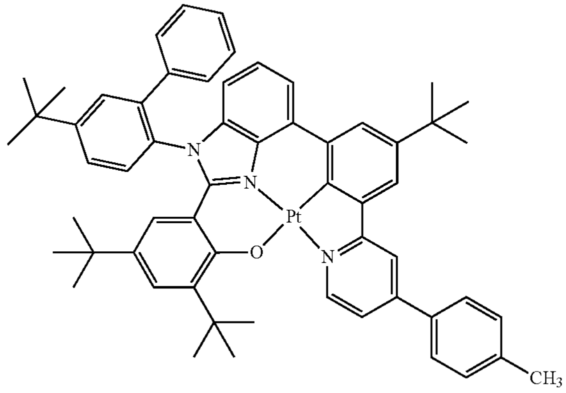
53
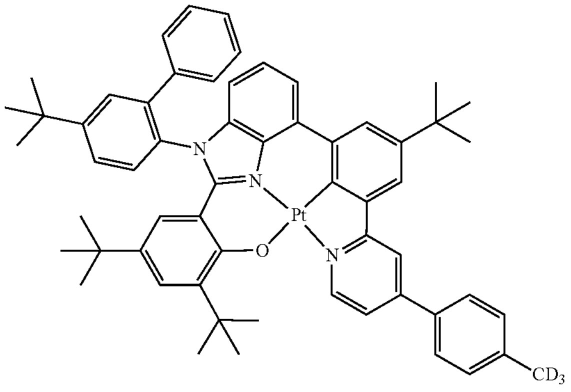
-continued
54
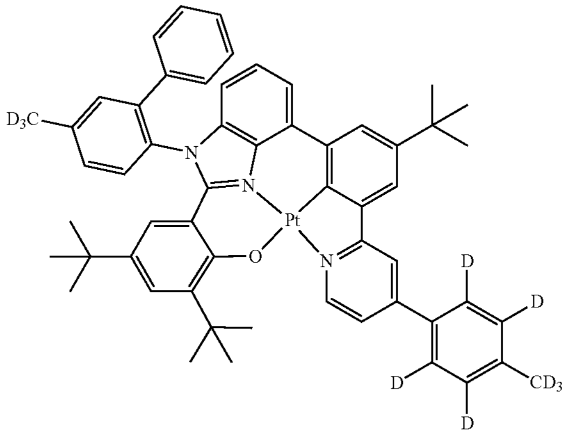
55
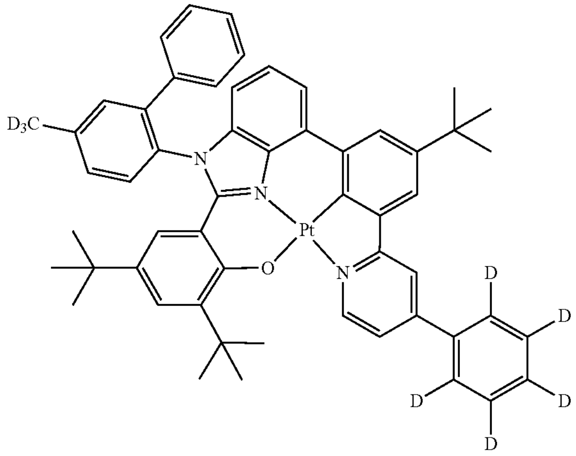
56
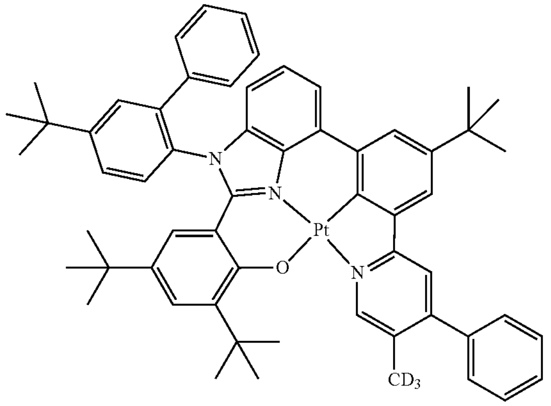

-continued
57
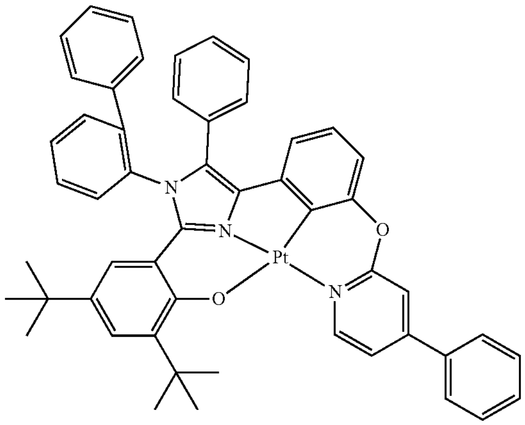
58
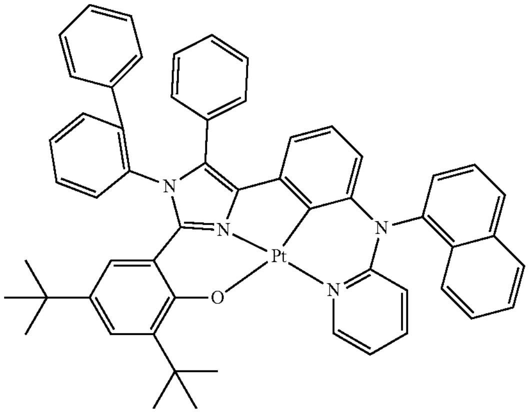
59
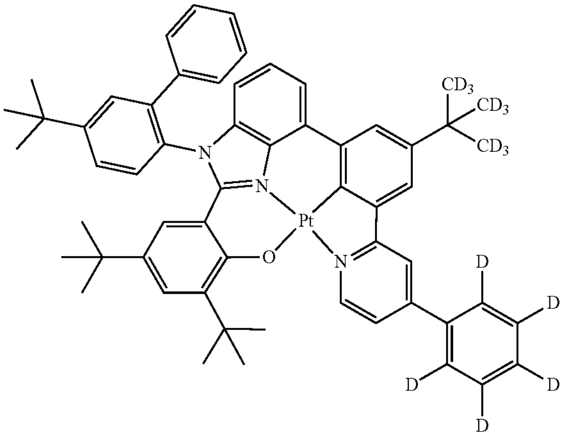
-continued
60
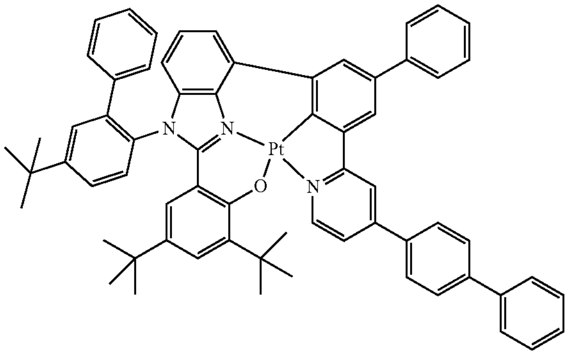
61
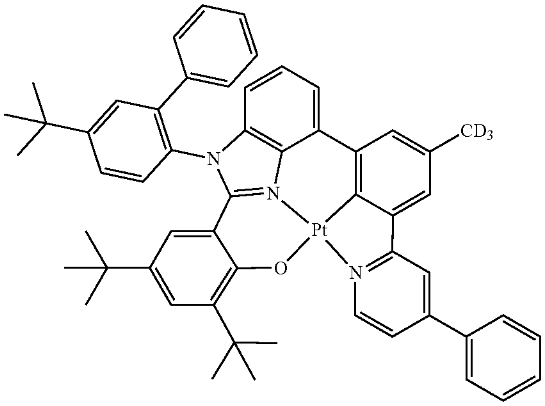
62
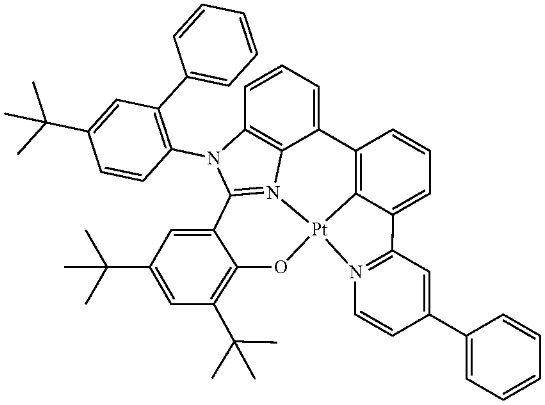
63
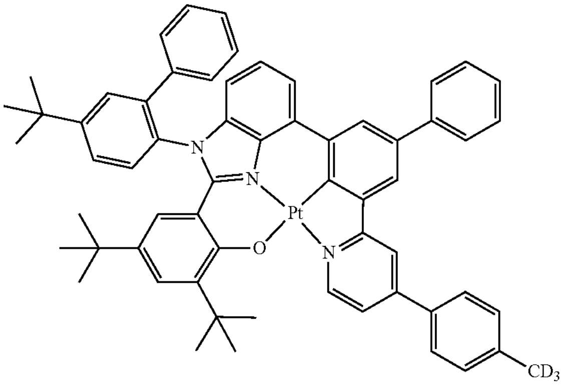

-continued
64
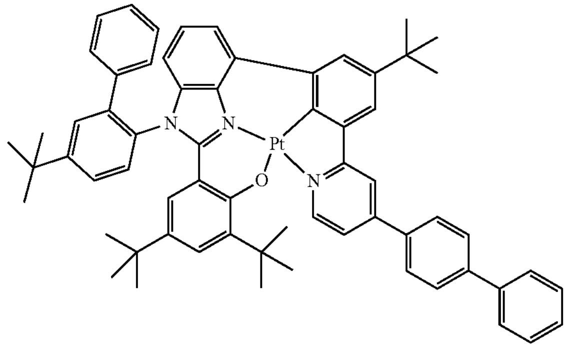
65
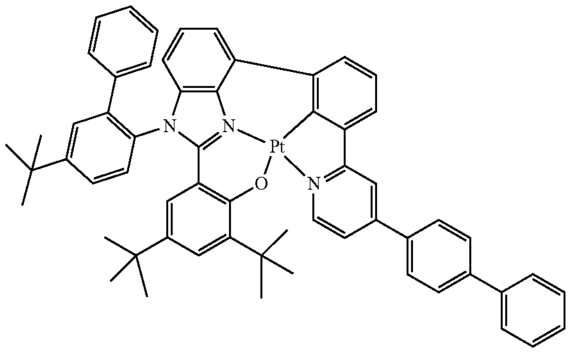
66
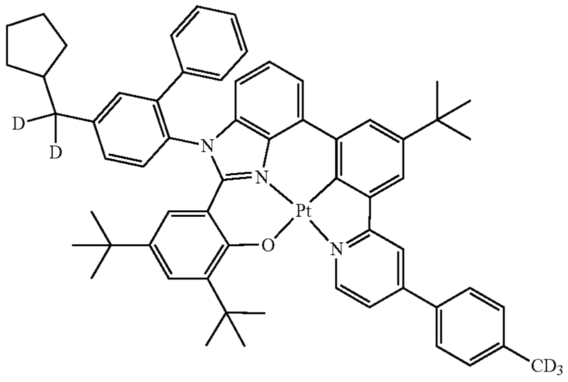
67
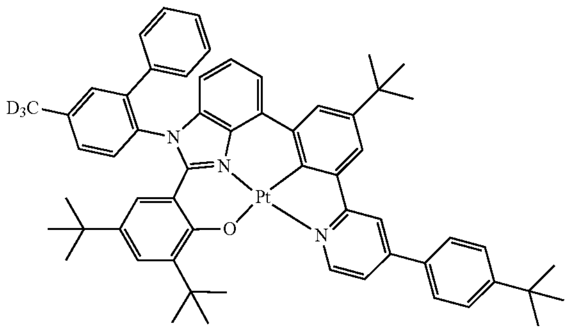
-continued
68
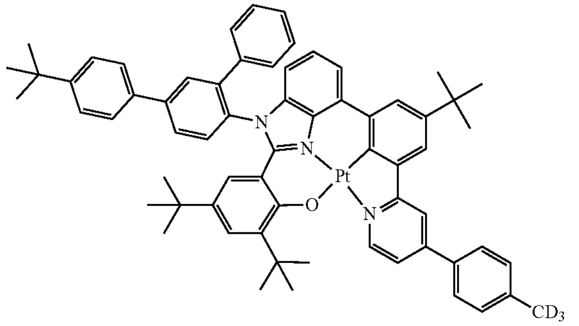
69
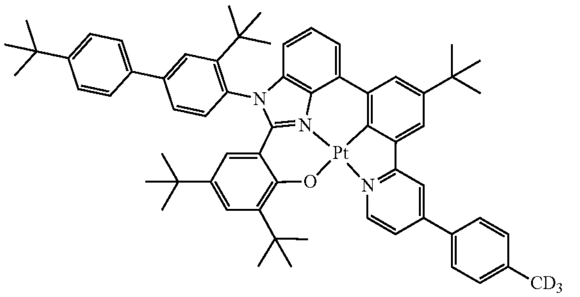
70
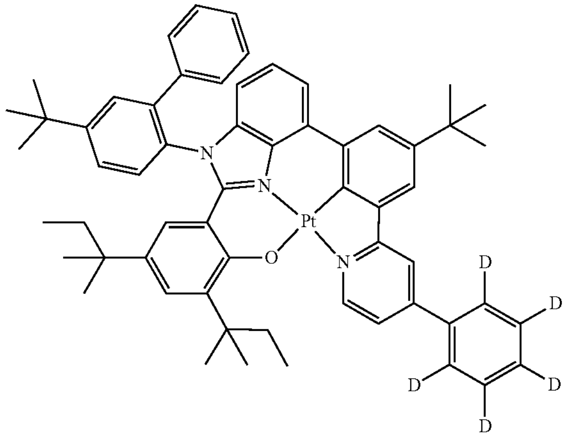
71
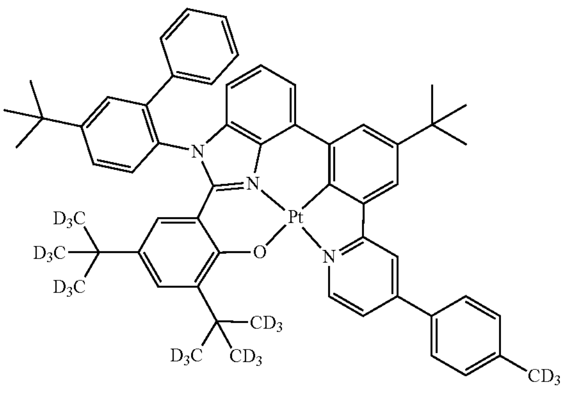

-continued

72

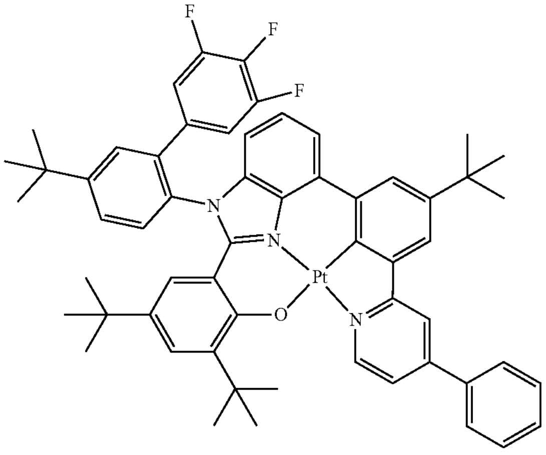

Group 1-4

1

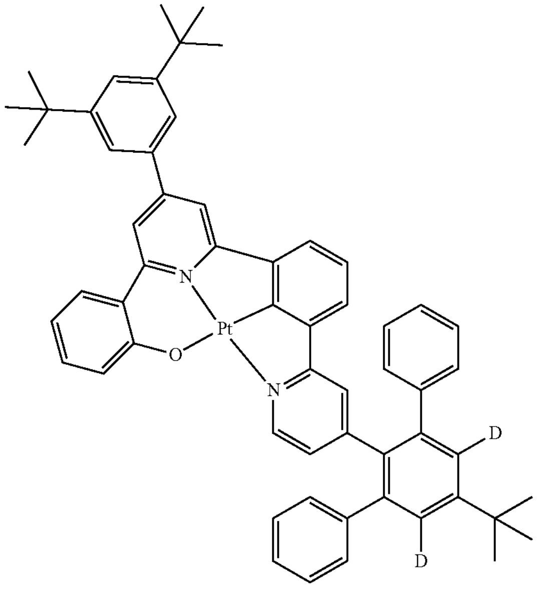

-continued

2

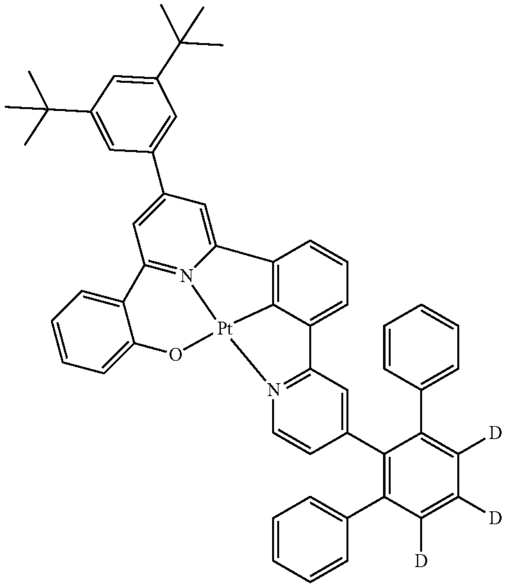

3

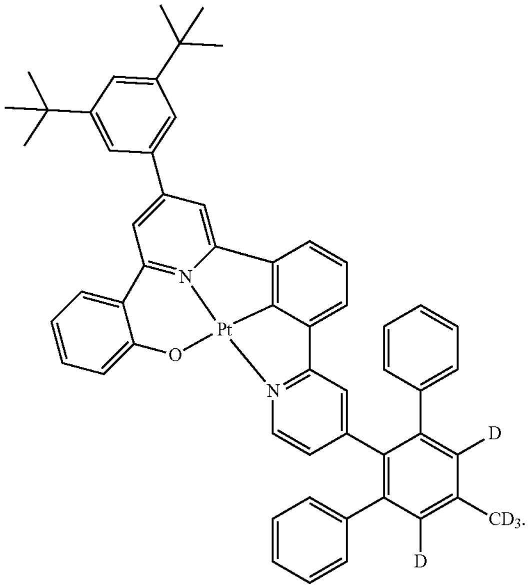

In the present specification, OMe is a methoxy group, TMS is a trimethylsilyl group, and TMG is a trimethylgermyl group.

Description of Fluorescent Emitter

The fluorescent emitter may not include a transition metal.

In an embodiment, the fluorescent emitter may include at least one of a thermally activated delayed fluorescence emitter and a prompt fluorescence emitter.

In an embodiment, the fluorescent emitter may be a thermally activated delayed fluorescence emitter including at least one 6-membered ring including at least one nitrogen (N) and at least one boron (B), e.g., as a ring atom.

In an embodiment, the fluorescent emitter may be a prompt fluorescence emitter including at least one 5-membered ring or 6-membered ring including at least one boron (B), e.g., as a ring atom.

In an embodiment, the fluorescent emitter may be a compound represented by Formula 3-1, a compound represented by Formula 3-2, a compound represented by Formula 3-3, or a compound represented by Formula 4:

Formula 3-1

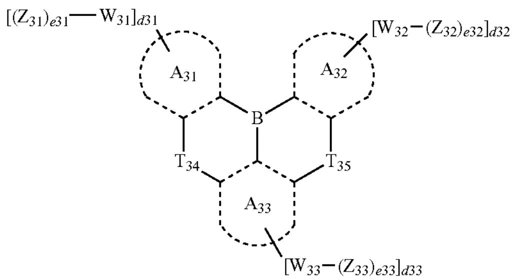

Formula 3-2

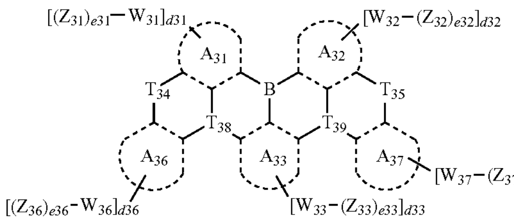

Formula 3-3

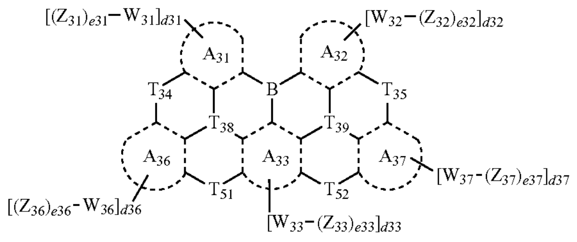

Formula 4

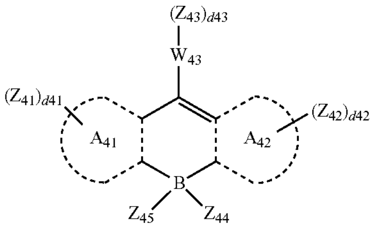

wherein, in Formulae 3-1, 3-2, 3-3, and 4, ring $A_{31}$, ring $A_{32}$, ring $A_{33}$, ring $A_{36}$, ring $A_{37}$, ring $A_{41}$, and ring $A_{42}$ may each independently be a $C_5$-$C_{30}$ carbocyclic group or a $C_1$-$C_{30}$ heterocyclic group, $T_{34}$ may be a single bond, O, S, N—[$W_{34}$—$(Z_{34})_{e34}$], or $C(Z_{34a})(Z_{34b})$, $T_{35}$ may be a single bond, O, S, N—[$W_{35}$—$(Z_{35})_{e35}$], or $C(Z_{35a})(Z_{35b})$, $T_{51}$ may be a single bond, O, S, N—[$W_{51}$—$(Z_{51})_{e51}$], or $C(Z_{51a})(Z_{51b})$, $T_{52}$ may be a single bond, O, S, N—[$W_{52}$—$(Z_{52})_{e52}$], or $C(Z_{52a})(Z_{52b})$, $T_{38}$ and $T_{39}$ may each independently be N or B, $T_{41}$ and $T_{42}$ may each independently be N or C, $W_{31}$ to $W_{37}$, $W_{43}$, $W_{51}$, and $W_{52}$ may each be the same as described in connection with $L_1$, $Z_{31}$ to $Z_{37}$, $Z_{51}$, $Z_{52}$, $Z_{34a}$, $Z_{34b}$, $Z_{35a}$, $Z_{35b}$, $Z_{51a}$, $Z_{51b}$, $Z_{52a}$, $Z_{52b}$, and $Z_{41}$ to $Z_{45}$ may each be the same as described in connection with $R_1$, e31 to e37, e51, and e52 may each be the same as described in connection with c1, and d31 to d33, d36, d37, and d41 to d43 may each be the same as described in connection with a1.

For example, ring $A_{31}$, ring $A_{32}$, ring $A_{33}$, ring $A_{36}$, ring $A_{37}$, ring $A_{41}$, and ring $A_{42}$ may each be the same as described in connection with ring $CY_1$.

In an embodiment, each of rings $A_{31}$, $A_{32}$, $A_{36}$ and $A_{37}$ in Formulae 3-1, 3-2, and 3-3 may be a benzene group, a carbazole group, a dibenzofuran group, a dibenzothiophene group, or an indolocarbazole group, and ring $A_{33}$ may be a benzene group, a carbazole group, a dibenzofuran group, a dibenzothiophene group, an indolocarbazole group, a quinoline group, an isoquinoline group, a benzoquinoline group, or a benzoisoquinoline group.

In an embodiment, $T_{34}$ in Formulae 3-1 to 3-3 may be N—[$W_{34}$—$(Z_{34})_{e34}$].

In an embodiment, $T_{34}$ in Formulae 3-1 to 3-3 may be N—[$W_{34}$—$(Z_{34})_{e34}$], and $Z_{34}$ and ring $A_{31}$ and/or $Z_{34}$ and $Z_{31}$ may be bonded together via a single bond or a linking group including O, S, N, B, C, or any combination thereof.

In an embodiment, $T_{35}$ in Formulae 3-1 to 3-3 may be N—[$W_{35}$—$(Z_{35})_{e35}$].

In an embodiment, $T_{35}$ in Formulae 3-1 to 3-3 may be N—[$W_{35}$—$(Z_{35})_{e35}$], and $Z_{35}$ and ring $A_{32}$ and/or $Z_{35}$ and $Z_{32}$ may be bonded together via a single bond or a linking group including O, S, N, B, C, or any combination thereof.

In an embodiment, $T_{34}$ may be $C(Z_{34a})(Z_{34b})$, and $Z_{34a}$ and $Z_{34b}$ may optionally be bonded together to form a $C_5$-$C_{30}$ carbocyclic group or a $C_1$-$C_{30}$ heterocyclic group.

In an embodiment, $T_{35}$ may be $C(Z_{35a})(Z_{35b})$, and $Z_{35a}$ and $Z_{35b}$ may optionally be bonded together to form a $C_5$-$C_{30}$ carbocyclic group or a $C_1$-$C_{30}$ heterocyclic group.

In an embodiment, $T_{51}$ may be $C(Z_{51a})(Z_{51b})$, and $Z_{51a}$ and $Z_{51b}$ may optionally be bonded together to form a $C_5$-$C_{30}$ carbocyclic group or a $C_1$-$C_{30}$ heterocyclic group.

In an embodiment, $T_{52}$ may be $C(Z_{52a})(Z_{52b})$, and $Z_{52a}$ and $Z_{52b}$ may optionally be bonded together to form a $C_5$-$C_{30}$ carbocyclic group or a $C_1$-$C_{30}$ heterocyclic group.

In an embodiment, ring $A_{41}$ and ring $A_{42}$ in Formula 4 may each be:

a pyrrole group; or a pyrrole group condensed with a cyclopentane group, a cyclopentene group, a cyclopentadiene group, a cyclohexane group, a cyclohexene group, a cyclohexadiene group, a cycloheptane group, a cycloheptene group, a cycloheptadiene group, a cyclooctane group, a cyclooctene group, a cyclooctadiene group, a benzene group, a naphthalene group, a phenanthrene group, an anthracene group, a 2,7-dihydrooxepine group, a 2,7-dihydrothiepine group, a 2,3-dihydrooxepine group, a 2,3-dihydrothiepine group, a furan group, a thiophene group, a benzofuran group, a benzothiophene group, an indene group, a dihydrofuran group, a dihydrothiophene group, or any combination thereof.

For example, $T_{41}$ and $T_{42}$ may each be N.

For example, the fluorescent emitter may be selected from compounds of Groups 3 and 4:

Group 3
1
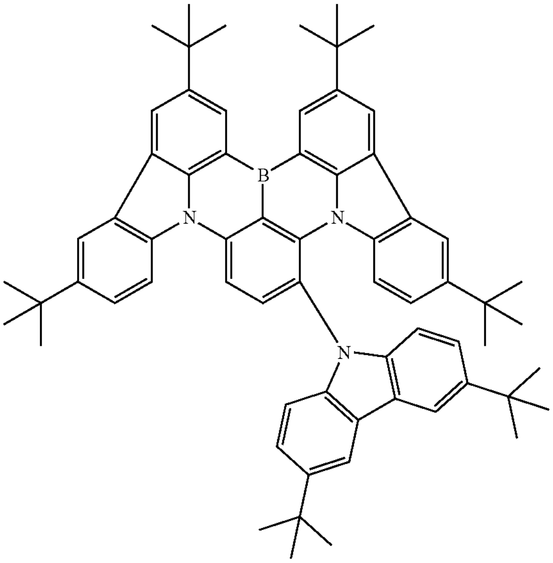
2
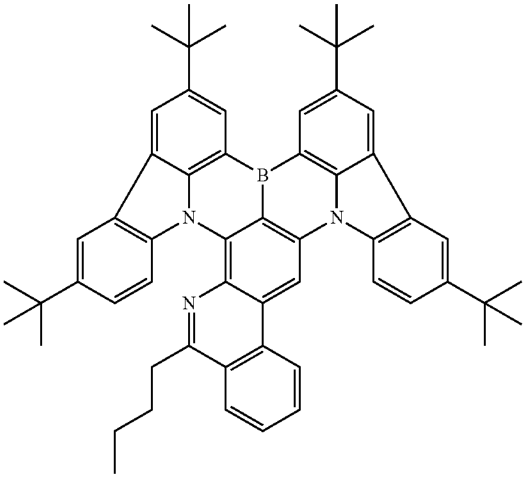
3
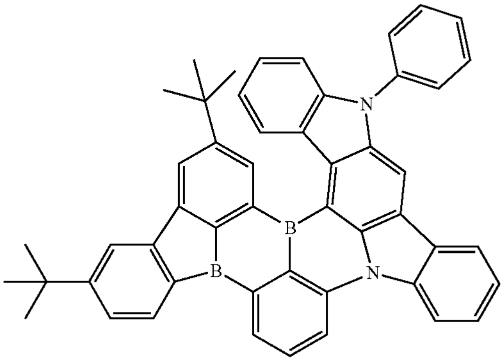
-continued
4
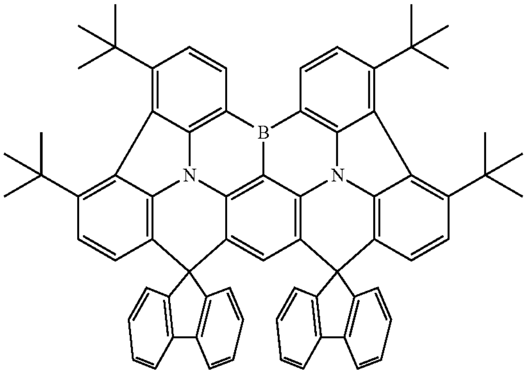
Group 4
1
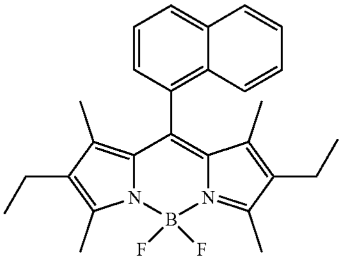
2
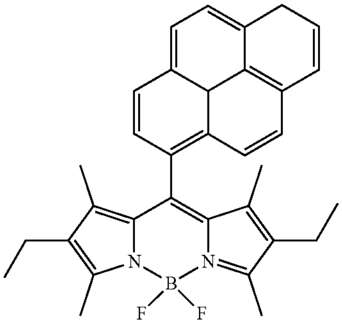
3
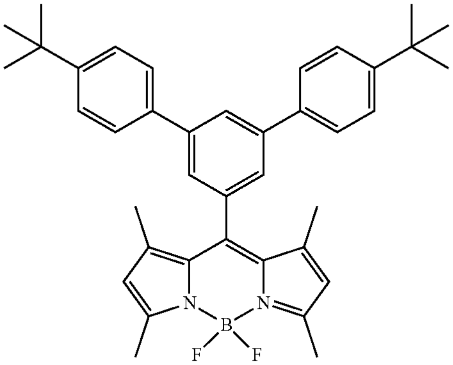
4
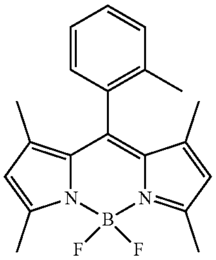

-continued
5
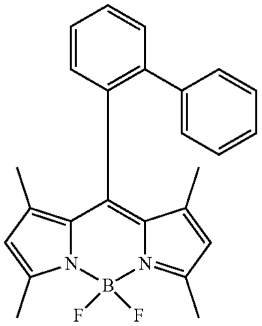
6
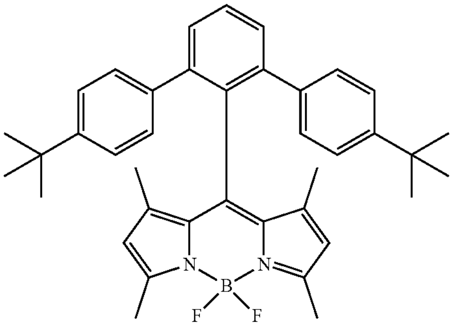
7
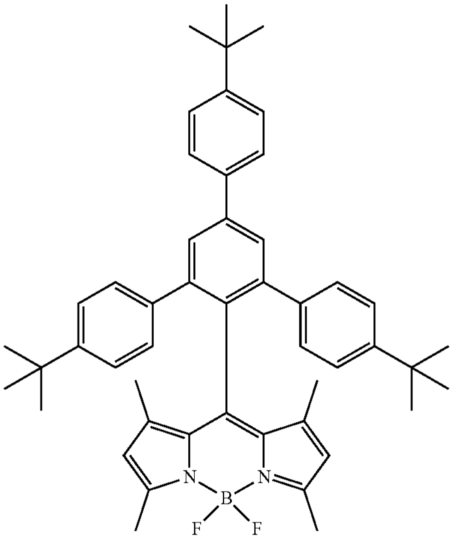
-continued
8
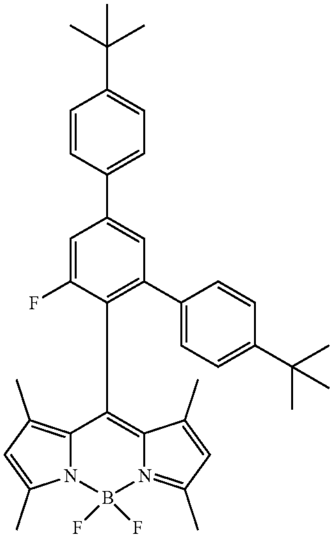
9
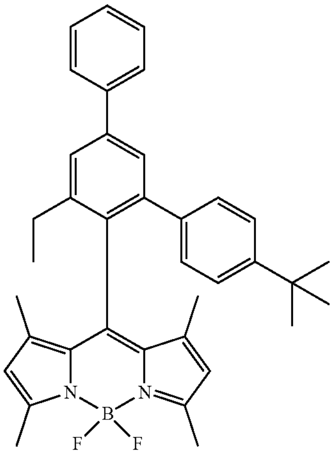
10
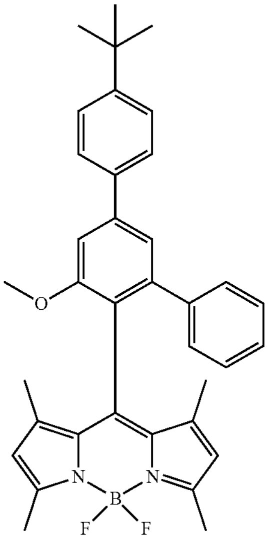

-continued
11
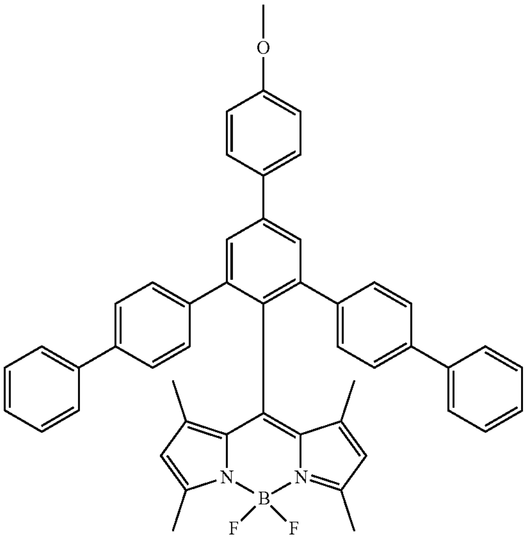
12
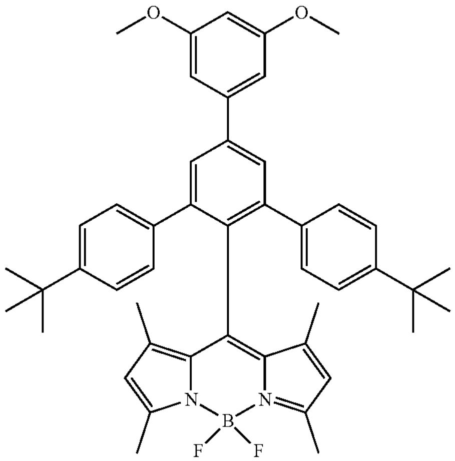
13
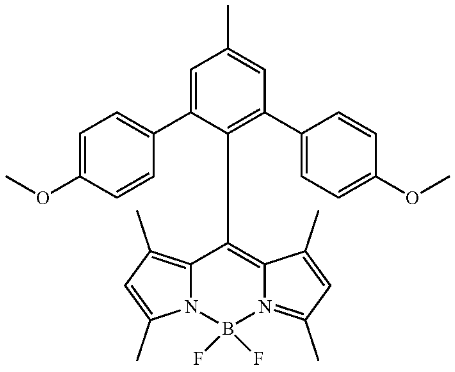
-continued
14
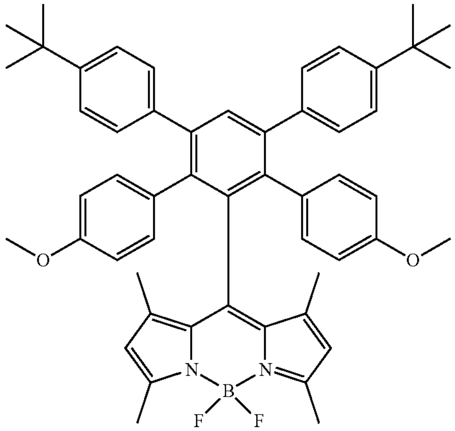
15
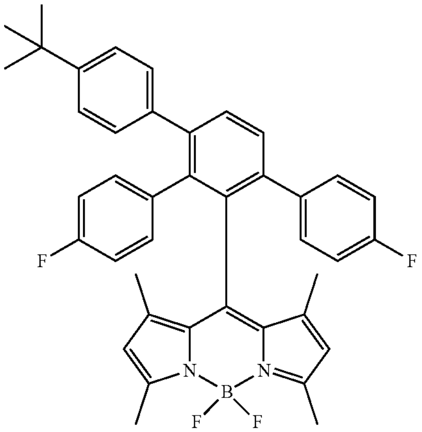
16
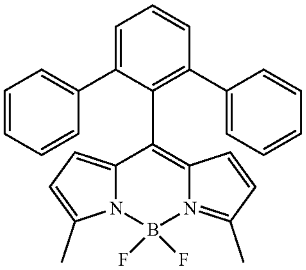
17
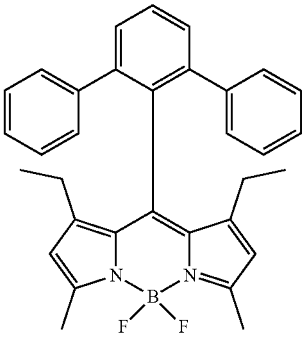

-continued

18

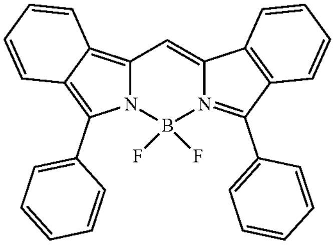

19

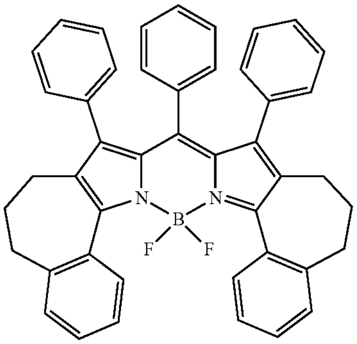

20

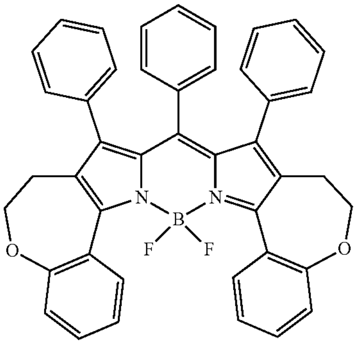

21

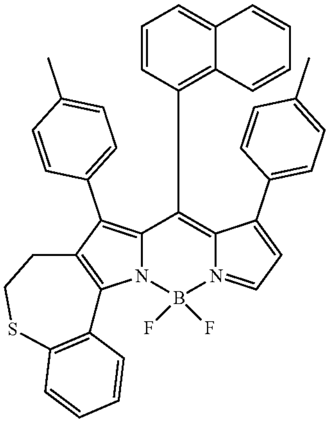

-continued

22

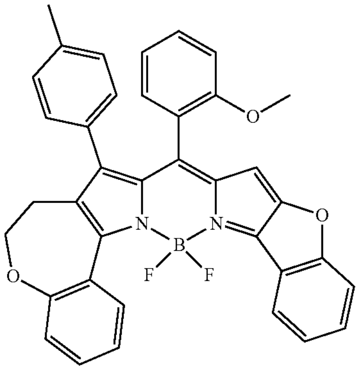

23

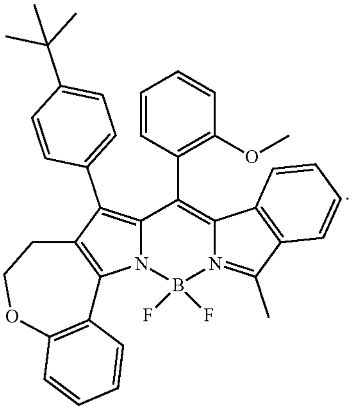

An amount of the sensitizer in the emission layer may be 1 wt % to 30 wt % based on 100 wt % of a host in the emission layer. Alternatively, an amount of the sensitizer in the emission layer may be 0.5 wt % to 30 wt % based on 100 wt % of the emission layer. Meanwhile, an amount of the fluorescent emitter in the emission layer may be 0.01 wt % to 15 wt % based on 100 wt % of the emission layer. When the amounts of the sensitizer and the fluorescent emitter satisfy the ranges as described above, an emission layer having excellent characteristics may be implemented without concentration quenching.

In an embodiment, the emission layer may not include compounds of Group A:

Group A

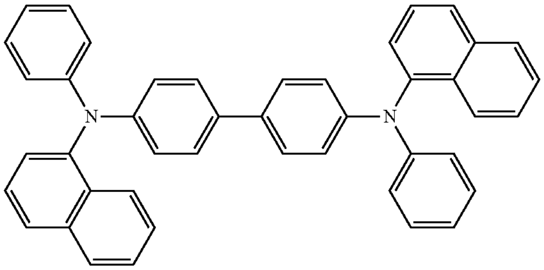

NPB

-continued
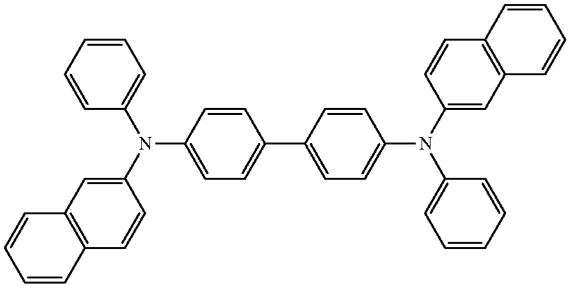
β-NPB
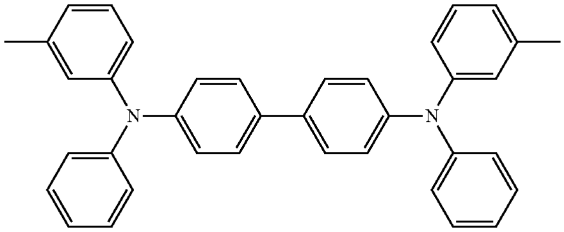
TPD
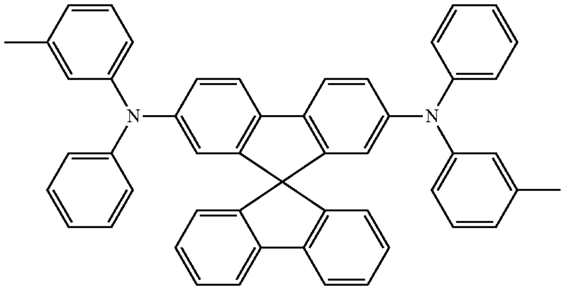
Spiro-TPD
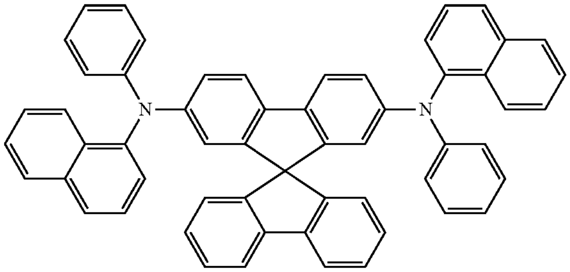
Spiro-NPD
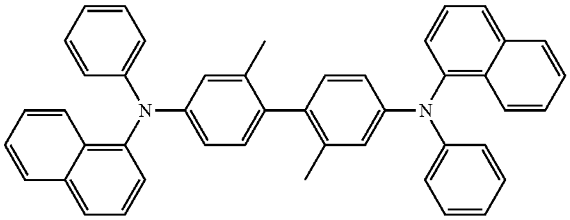
methylated NPB
-continued
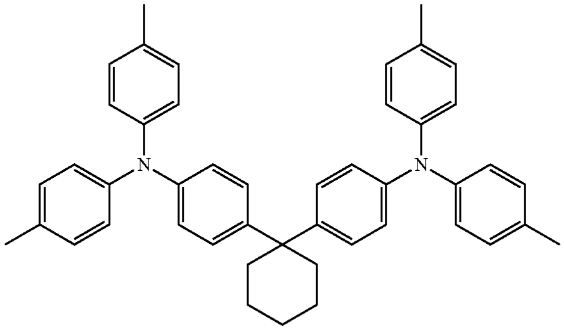
TAPC
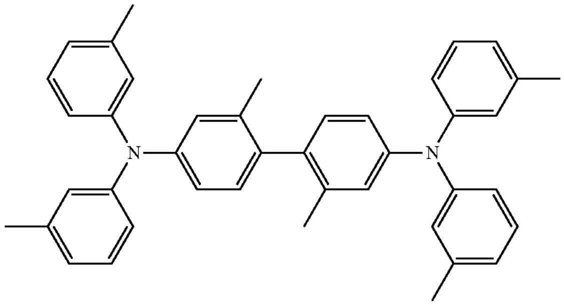
HMTPD
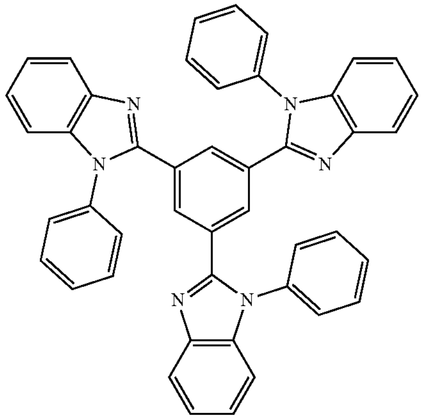
TPBi
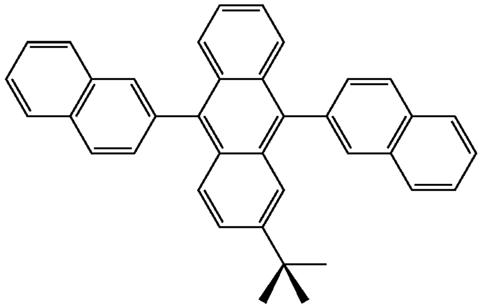
TBADN -continued
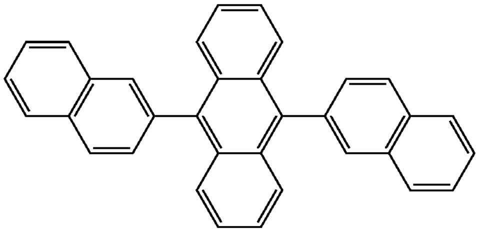
ADN
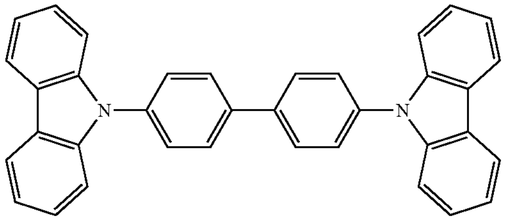
CBP
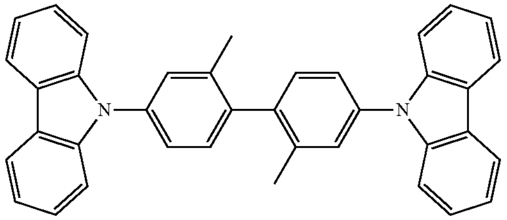
CDBP
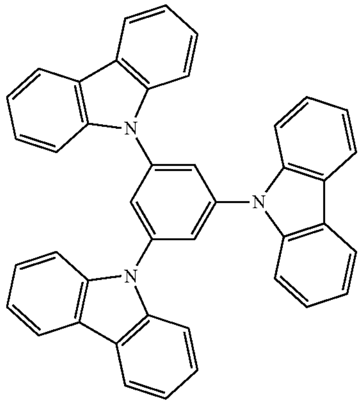
TCP
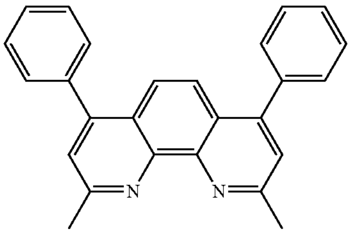
BCP
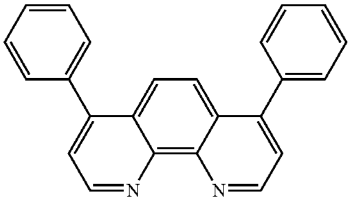
Bphen
-continued
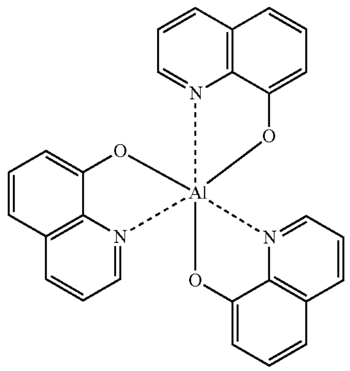
Alq3
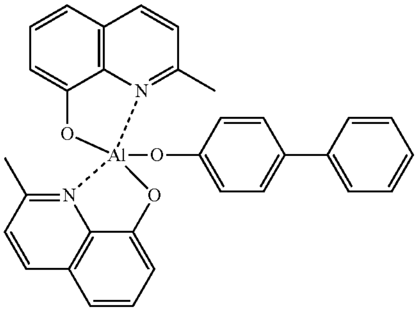
BAlq
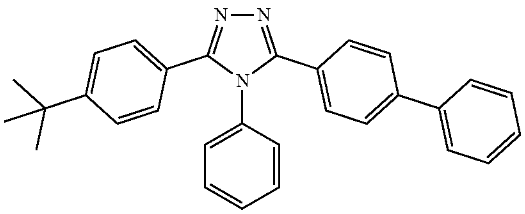
TAZ
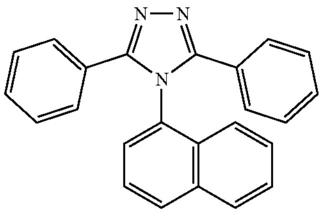
NTAZ
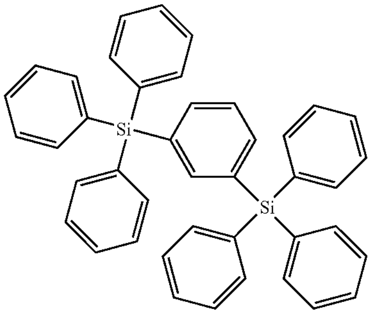
m-bis-(triphenylsily)benzene -continued

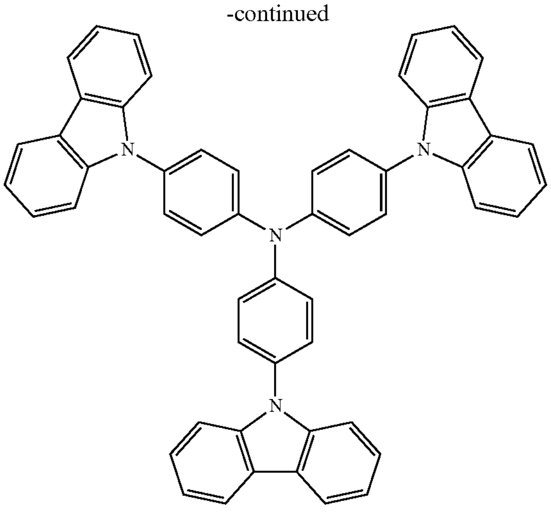

TCTA
(4,4′,4″-tris(carbazol-9-yl)triphenylamine)

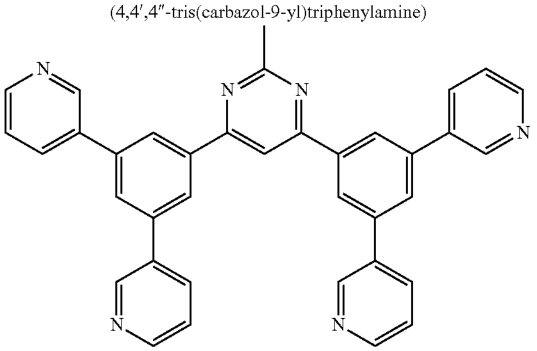

B3PYMPM
(4,6-bis(3,5-di(pyridine-3-yl)phenyl)-2-methylpyrimidine)

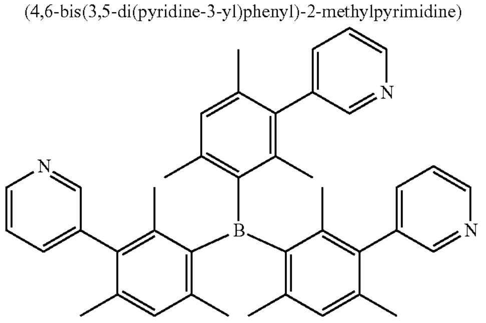

3TPYMB
(tris(2,4,6-trimethyl-3-(pyridine-3-yl)phenyl)borane)

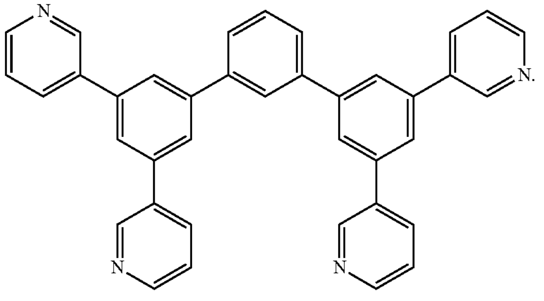

BmPyPhB
(1,3-bis[3,5-di(pyridine-3-yl)phenyl]benzene)

In an embodiment, the interlayer of the light-emitting device may further include a hole transport region arranged between the first electrode and the emission layer and an electron transport region arranged between the emission layer and the second electrode.

The hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "interlayer" as used herein refers to a single layer and/or a plurality of layers arranged between the first electrode and the second electrode of the light-emitting device. The term "interlayer" may include an organometallic compound and an organometallic complex including a metal.

In an embodiment, the interlayer of the light-emitting device may include:

m light-emitting units including at least one emission layer; and m−1 charge generation layers arranged between two adjacent light-emitting units among the m light-emitting units, when m is an integer of 2 or more.

In other words, the light-emitting device may be a tandem light-emitting device.

For example, m may be 2, 3, 4, 5, 6, 7, 8, 9, or 10. In an embodiment, m may be 2, 3, 4, 5, or 6.

In an embodiment, at least one light-emitting unit among the m light-emitting units may include the emission layer as described in the present specification.

In an embodiment, at least one light-emitting unit among the m light-emitting units may emit blue light.

According to another aspect of the disclosure, the light-emitting device may be included in an electronic apparatus. Thus, an electronic apparatus including the light-emitting device is provided. The electronic apparatus may include, for example, a display, an illumination, a sensor, and the like.

FIG. 1 schematically illustrates a cross-sectional view of an organic light-emitting device 101, which is a light-emitting device according to an embodiment. Hereinafter, the structure of an organic light-emitting device according to an embodiment and a method of manufacturing an organic light-emitting device according to an embodiment will be described in connection with FIG. 1.

The organic light-emitting device 101 of FIG. 1 includes a first electrode 110, a second electrode 190, and an interlayer (not shown) arranged between the first electrode 110 and the second electrode 190, wherein the interlayer includes a hole transport region 120, an emission layer 150, and an electron transport region 170.

A substrate may be additionally arranged under the first electrode 110 or above the second electrode 190. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

The first electrode 110 may be formed by providing, on the substrate, a material for forming the first electrode 110, by using a deposition or sputtering method. The first electrode 110 may be an anode. The material for forming the first electrode 110 may include materials with a high work function to facilitate hole injection. The first electrode 110 may be a reflective electrode. The material for forming the first electrode 110 may be indium tin oxide (ITO), indium zinc oxide (IZO), tin oxide ($SnO_2$), or zinc oxide (ZnO). In an embodiment, the material for forming the first electrode 110 may be metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 110 may have a single-layered structure or a multilayer structure including two or more layers. For example, the first electrode 110 may have a three-layered structure of ITO/Ag/ITO.

The hole transport region 120 may be arranged between the first electrode 110 and the emission layer 150.

The hole transport region 120 may include a hole injection layer, a hole transport layer, an electron blocking layer, a buffer layer, or any combination thereof.

The hole transport region 120 may include only a hole injection layer or only a hole transport layer. In an embodiment, the hole transport region 120 may have a hole injection layer/hole transport layer structure or a hole injection layer/hole transport layer/electron blocking layer structure, which are sequentially stacked in this stated order from the first electrode 110.

When the hole transport region 120 includes a hole injection layer, the hole injection layer may be formed on the first electrode 110 by using one or more suitable methods, for example, a vacuum deposition method, a spin coating method, a casting method, a Langmuir-Blodgett (LB) method, and/or an ink-jet printing method.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec.

When the hole injection layer is formed by spin coating, the coating conditions may vary depending on a material for forming the hole injection layer, and the structure and thermal characteristics of the hole injection layer. For example, the coating conditions may include a coating speed of about 2,000 rpm to about 5,000 rpm and a heat treatment temperature of about 80° C. to about 200° C. for removing a solvent after coating.

Conditions for forming a hole transport layer and an electron blocking layer may be understood by referring to conditions for forming the hole injection layer.

The hole transport region 120 may include, for example, m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or any combination thereof:

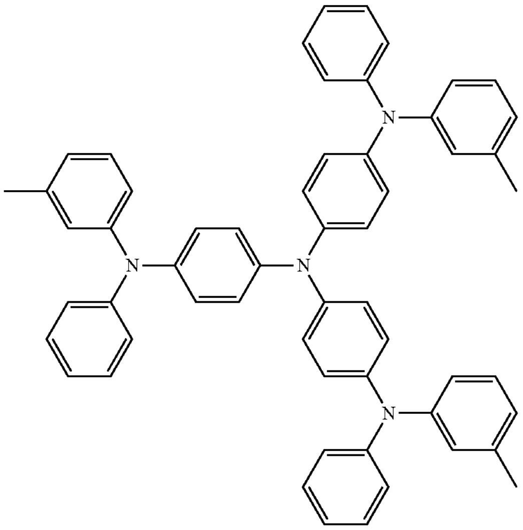

m-MTDATA

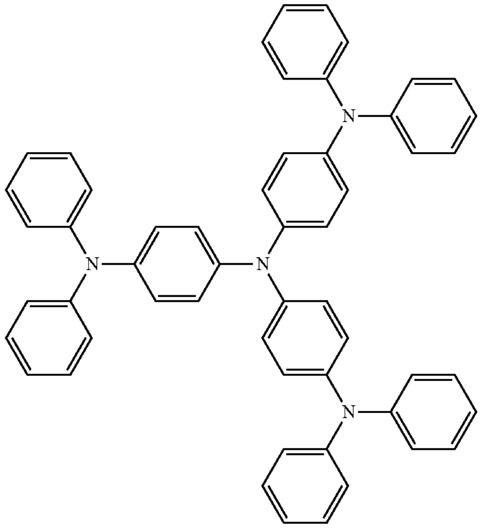

TDATA

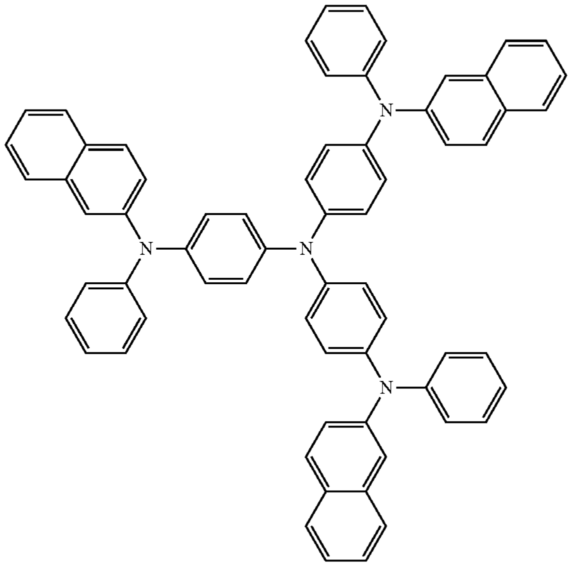

2-TNATA

-continued
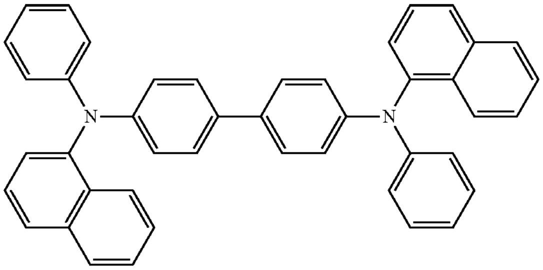
NPB
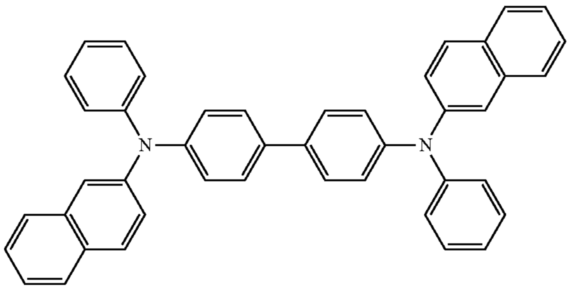
β-NPB
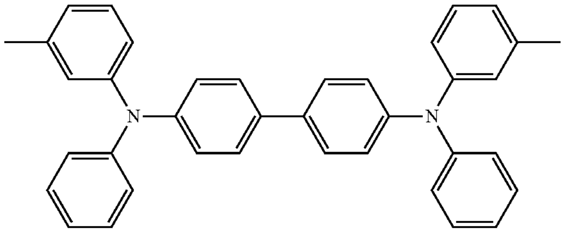
TPD
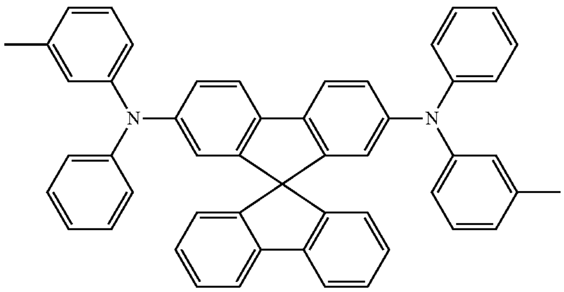
Spiro-TPD
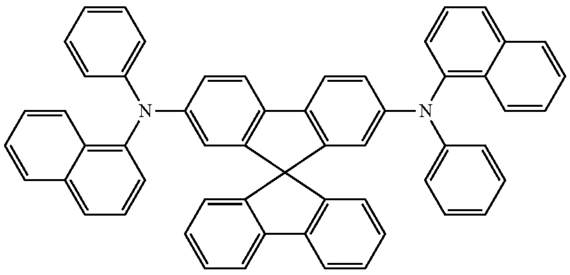
Spiro-NPD
-continued
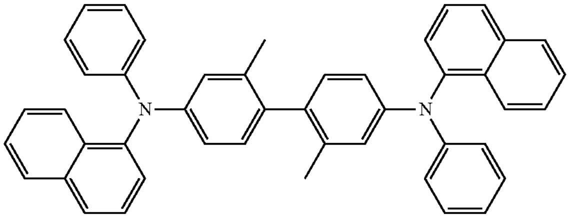
methylated NPB
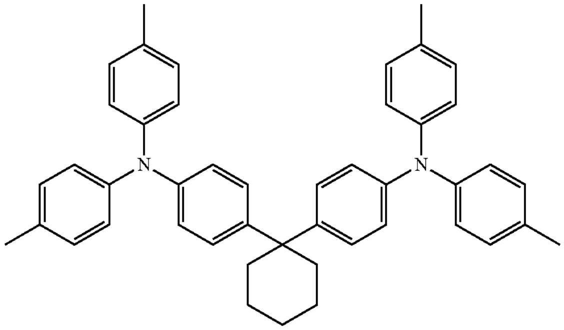
TAPC
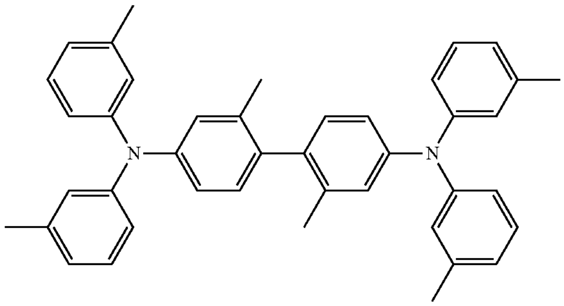
HMTPD
Formula 201
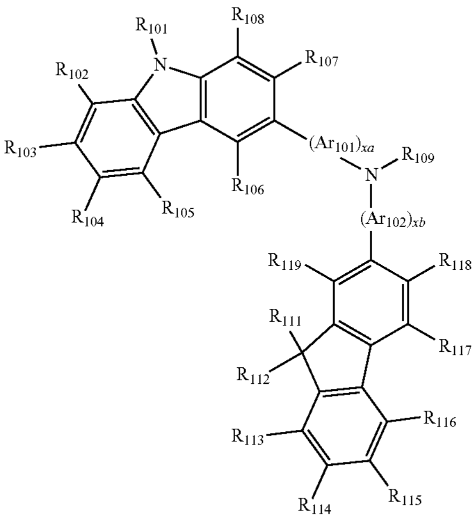

-continued

Formula 202

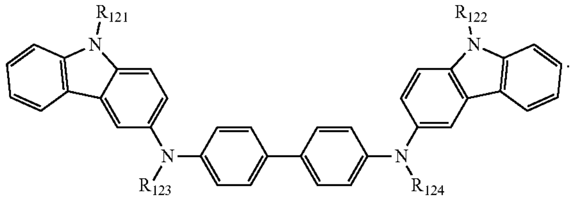

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or 0, 1, or 2. For example, xa may be 1 and xb may be 0.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, a $C_1$-$C_{10}$ alkyl group (for example, a methyl group, an ethyl group, a propyl group, a butyl group, a pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a naphthyl group, an anthracenyl group, a pyridinyl group, or any combination thereof.

In an embodiment, the compound represented by Formula 201 may be represented by Formula 201A:

Formula 201A

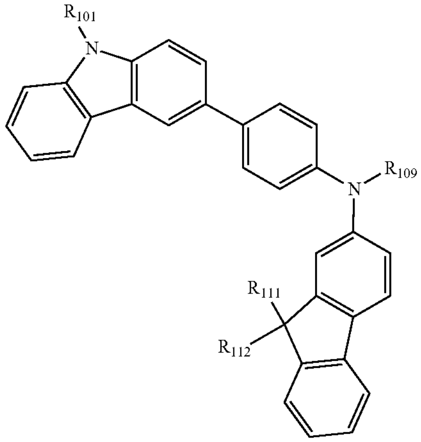

wherein, in Formula 201A, $R_{101}$, $R_{111}$, $R_{112}$, and $R_{109}$ may be understood by referring to the description provided herein.

For example, the hole transport region 120 may include one of Compounds HT1 to HT20 or any combination thereof:

HT1

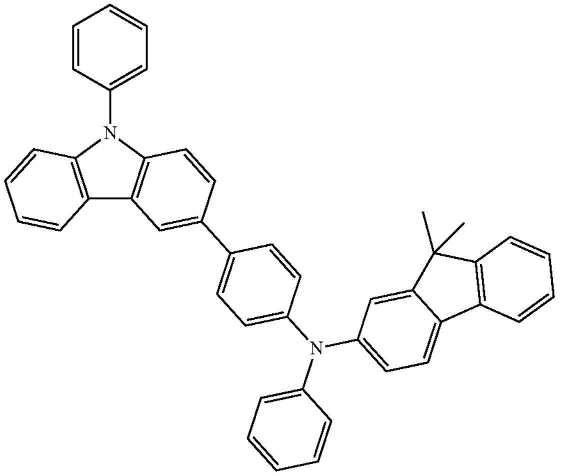

-continued
HT2
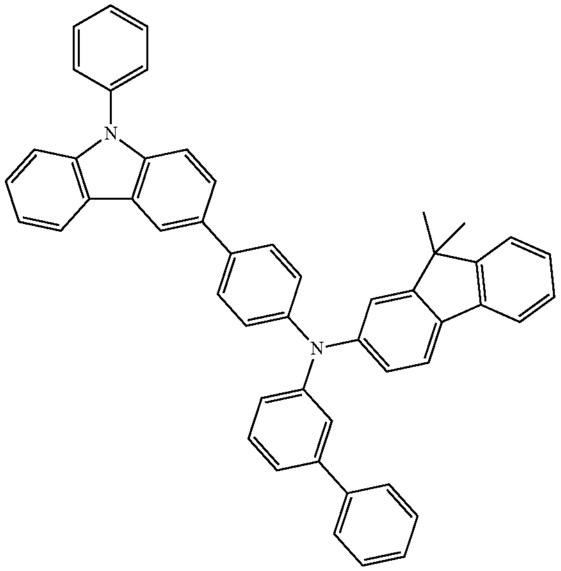
HT3
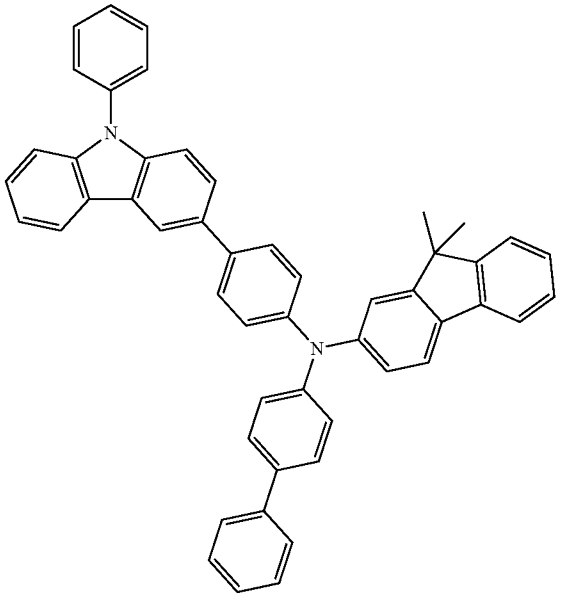
-continued
HT4
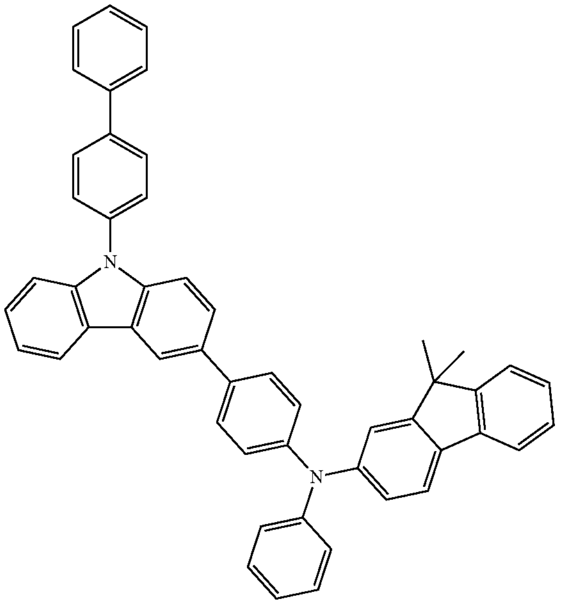
HT5
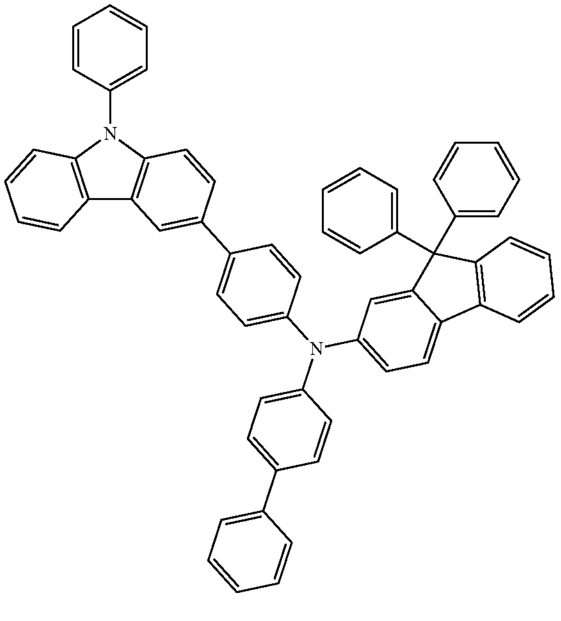

-continued
HT6
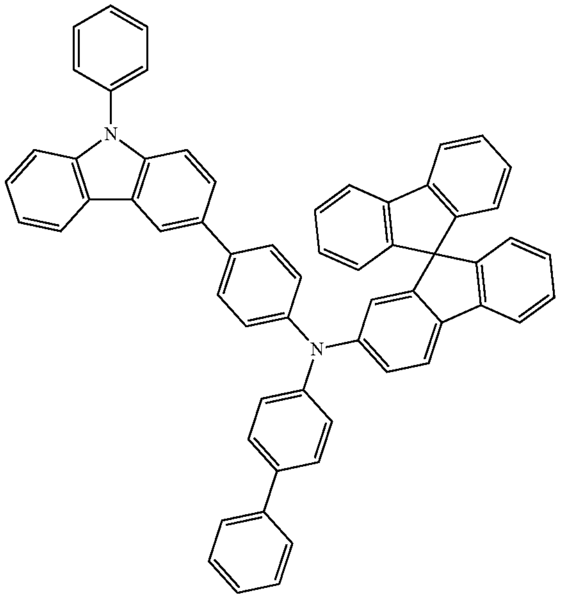
HT7
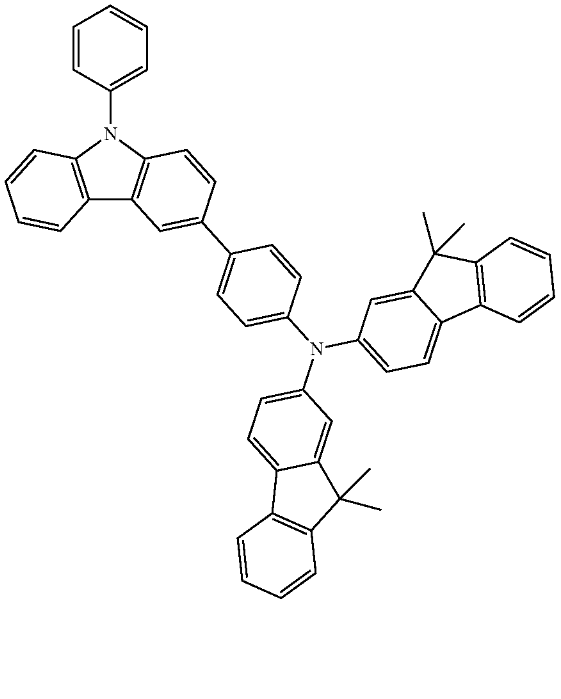
-continued
HT8
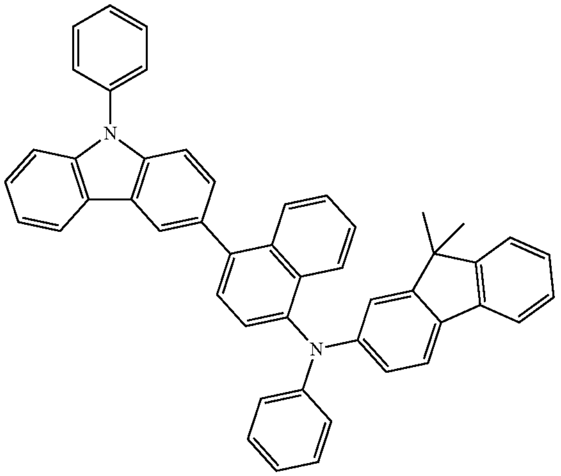
HT9
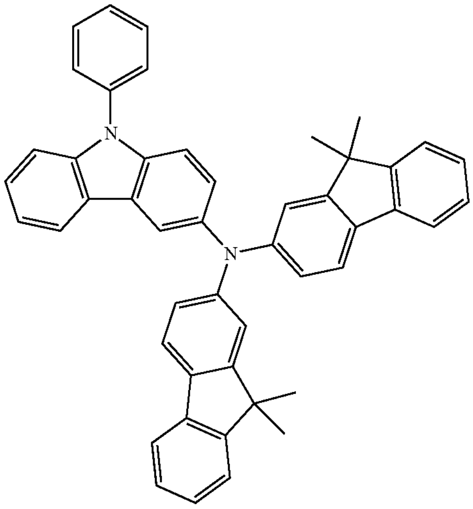
HT10
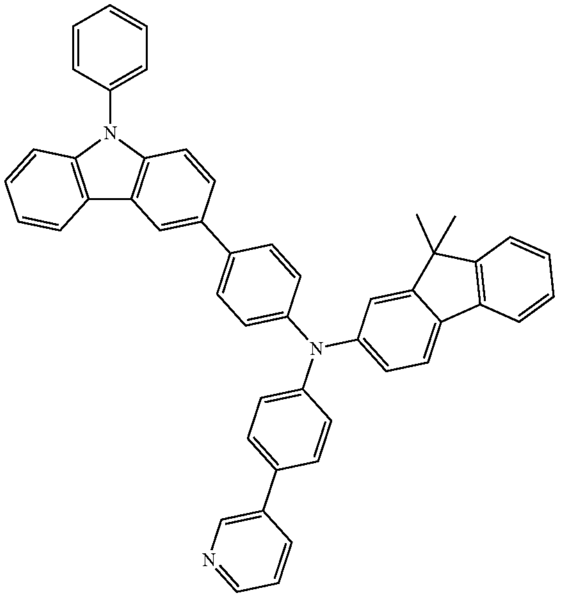

-continued
HT11
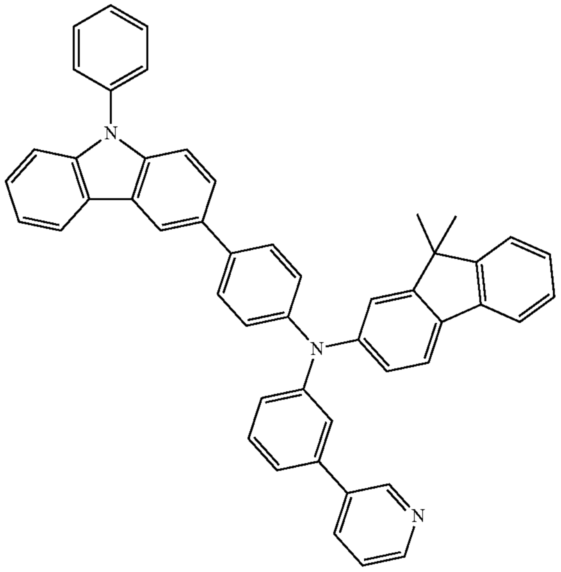
HT12
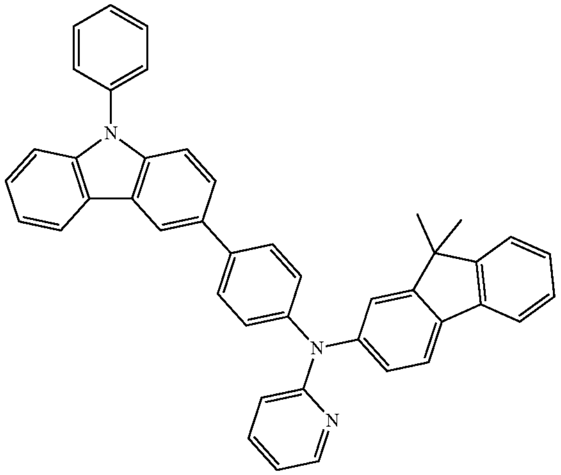
HT13
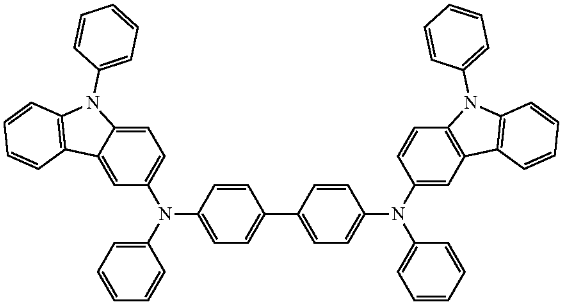
-continued
HT14
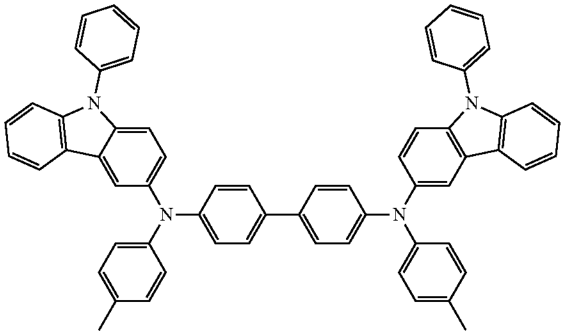
HT15
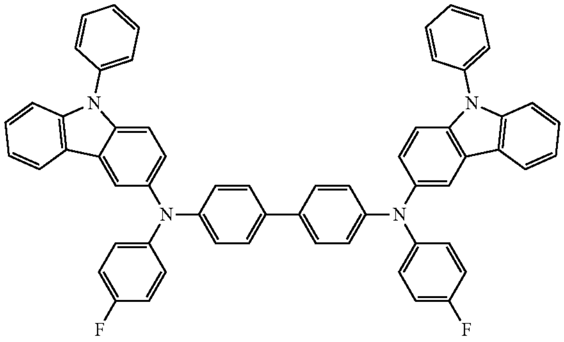
HT16
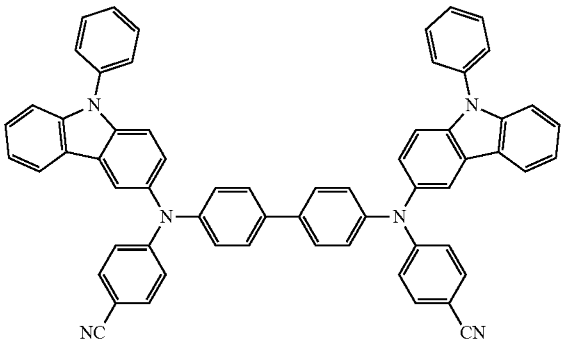
HT17
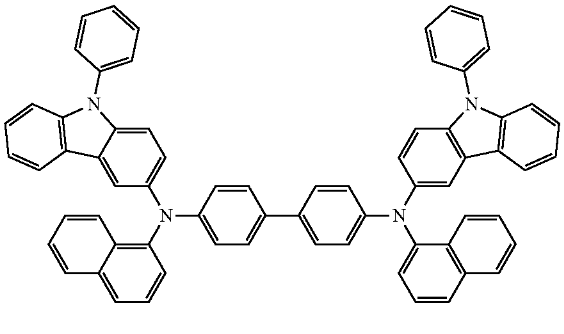

-continued

HT18

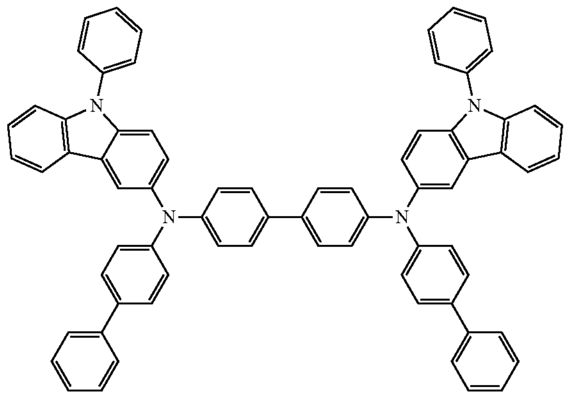

HT19

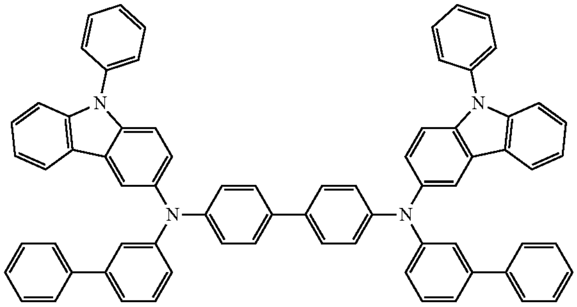

HT20

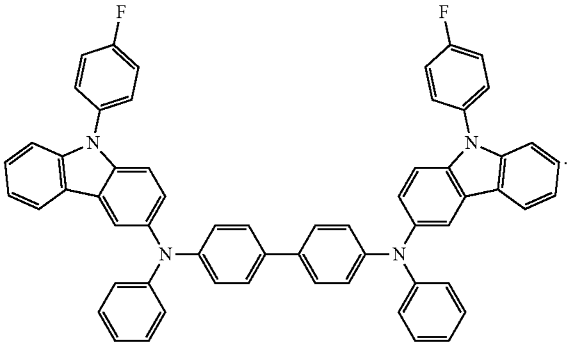

A thickness of the hole transport region 120 may be about 100 Å to about 10,000 Å, for example, about 100 Å to about 1,000 Å. When the hole transport region 120 includes a hole injection layer, a hole transport layer, an electron blocking layer, or a combination thereof, a thickness of the hole injection layer may be about 100 Å to about 10,000 Å, for example, about 100 Å to about 1,000 Å, and a thickness of the hole transport layer may be about 50 Å to about 2,000 Å, for example, about 100 Å to about 1,500 Å. When the thicknesses of the hole transport region 120, the hole injection layer, and the hole transport layer are within these ranges as described above, satisfactory hole transporting characteristics may be obtained without a substantial increase in driving voltage.

In addition to the above-described materials, the hole transport region 120 may further include a charge-generation material to improve conductivity. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof. For example, the p-dopant may be: a quinone derivative such as tetracyanoquinonedimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or any combination thereof.

HT-D1

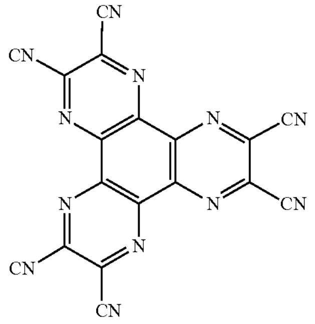

F4-TCNQ

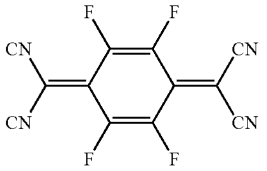

F6-TCNNQ

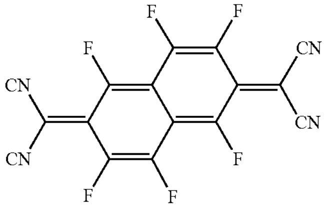

The hole transport region 120 may further include a buffer layer.

The buffer layer may compensate for an optical resonance distance according to a wavelength of light emitted from the emission layer, and thus, efficiency may be increased.

Meanwhile, when the hole transport region 120 includes an electron blocking layer, the material for the electron blocking layer may include a material that may be used in the hole transport region 120 as described above, a host material, or any combination thereof. For example, when a hole transport region includes an electron blocking layer, mCP or Compound HTH1 may be used as a material for the electron blocking layer.

The emission layer 150 may be formed on the hole transport region 120 by using, for example, a vacuum deposition method, a spin coating method, a casting method, an LB method, and/or an ink-jet printing method. When the emission layer 150 is formed by vacuum deposition or spin coating, the deposition or coating conditions may be similar to those applied in forming the hole injection layer although the deposition or coating conditions may vary depending on a material that is used to form the emission layer.

The emission layer 150 is the same as described in the present specification.

A thickness of the emission layer 150 may be about 100 Å to about 1,000 Å, for example, about 200 Å to about 600 Å. When the thickness of the emission layer 150 is within the range as described above, excellent light-emission characteristics may be obtained without a substantial increase in driving voltage.

When the light-emitting device is a full-color light-emitting device, the emission layer 150 may be patterned into a red emission layer, a green emission layer, and/or a blue emission layer.

Next, the electron transport region 170 may be arranged on the emission layer 150.

The electron transport region 170 may include a hole blocking layer, an electron transport layer, an electron injection layer, or any combination thereof.

For example, the electron transport region 170 may have a hole blocking layer/electron transport layer/electron injection layer structure, a hole blocking layer/electron transport layer structure, or an electron transport layer/electron injection layer structure. The electron transport layer may have a single-layered structure or a multilayer structure including two or more different materials.

The conditions for the forming the hole blocking layer, the electron transport layer, and the electron injection layer in the electron transport region 170 are the same as the conditions for the forming the hole injection layer.

When the electron transport region 170 includes a hole blocking layer, the hole blocking layer may include, for example, BCP, Bphen, BAlq, or any combination thereof:

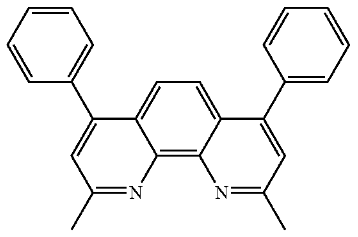

BCP

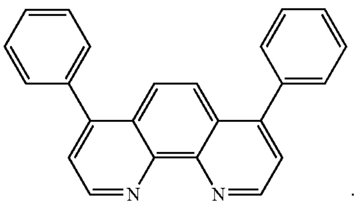

Bphen

In an embodiment, the hole blocking layer may include any host material, a material for an electron transport layer, a material for an electron injection layer, or a combination thereof, which will be described later.

A thickness of the hole blocking layer may be about 20 Å to about 1,000 Å, for example, about 30 Å to about 600 Å. When the thickness of the hole blocking layer is within the range as described above, excellent hole blocking characteristics may be obtained without a substantial increase in driving voltage.

The electron transport layer may include BCP, Bphen, TPBi, $Alq_3$, BAlq, TAZ, NTAZ, or any combination thereof:

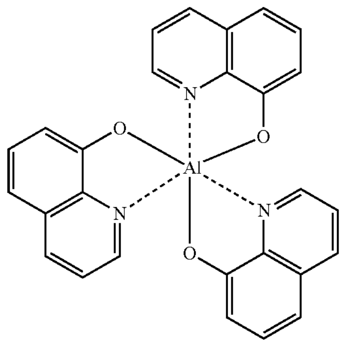

$Alq_3$

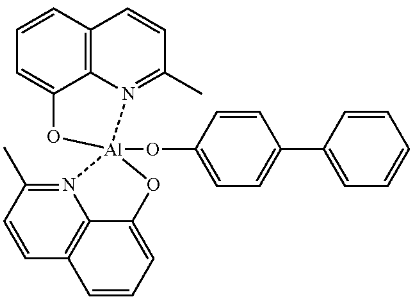

BAlq

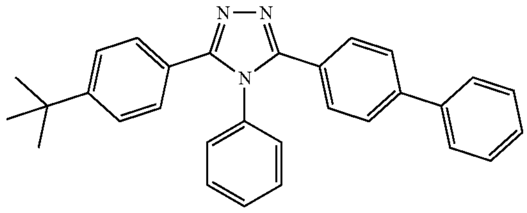

TAZ

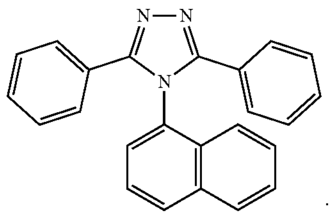

NTAZ

In an embodiment, the electron transport layer may include one of Compounds ET1 to ET25 or any combination thereof:

-continued
ET1
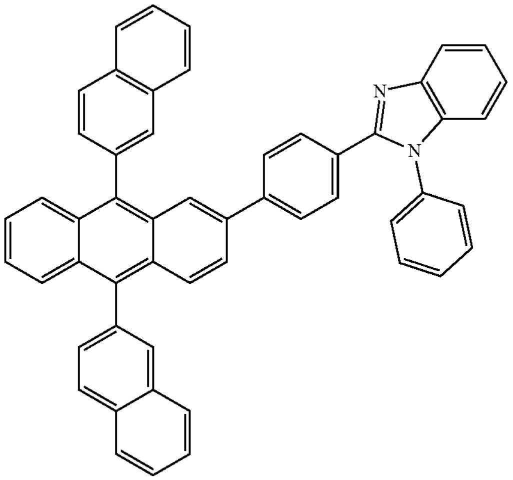
ET2
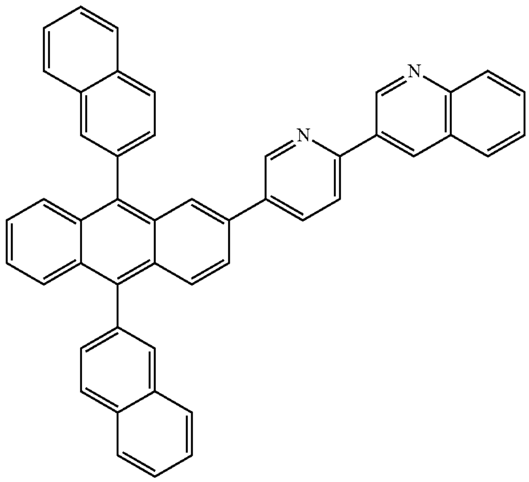
ET3
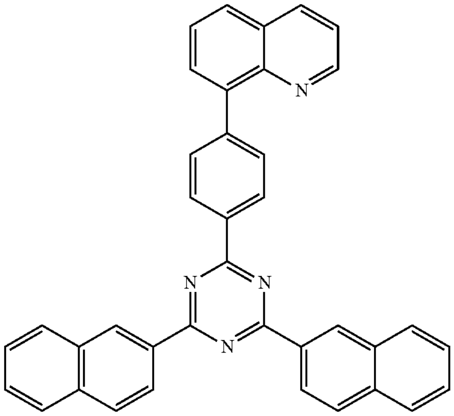
ET4
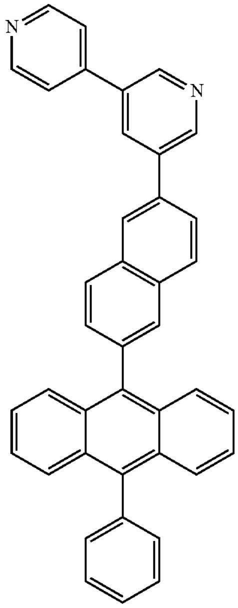
ET5
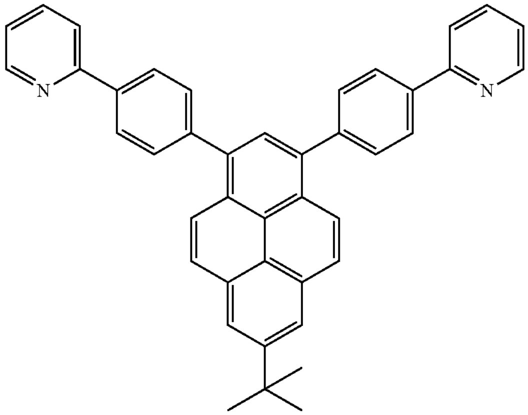
ET6
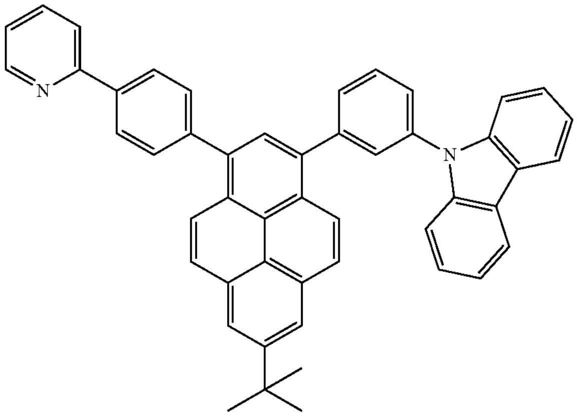

-continued
ET7
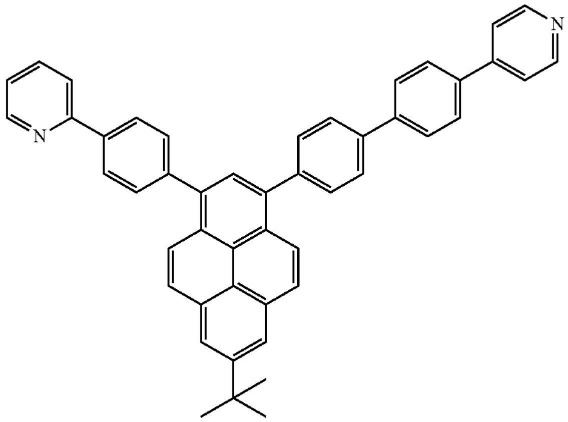
ET8
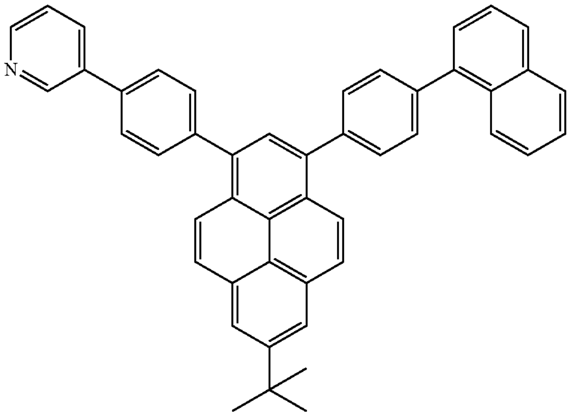
ET9
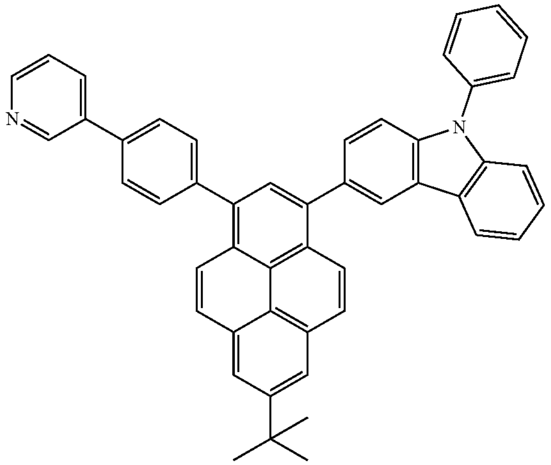
-continued
ET10
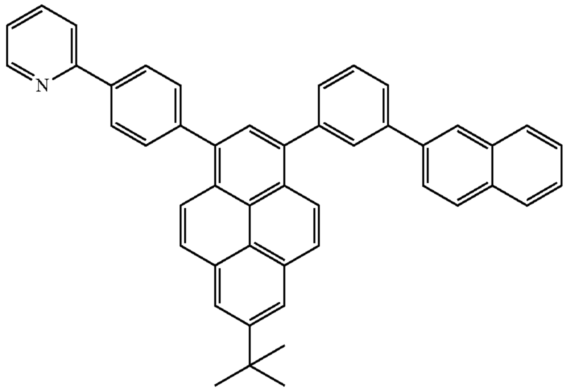
ET11
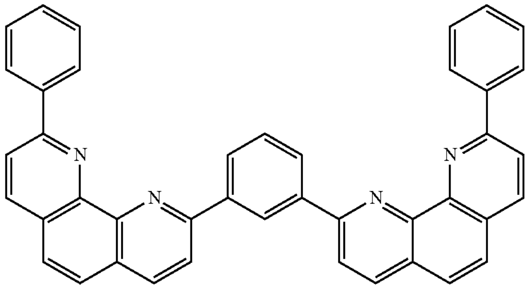
ET12
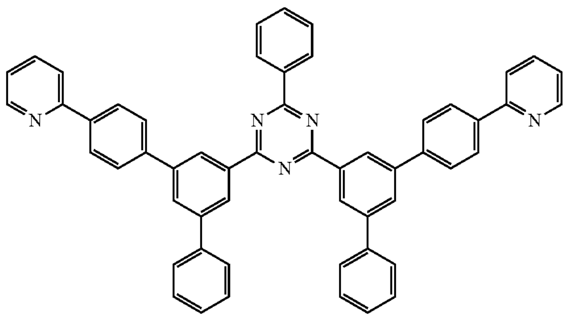
ET13
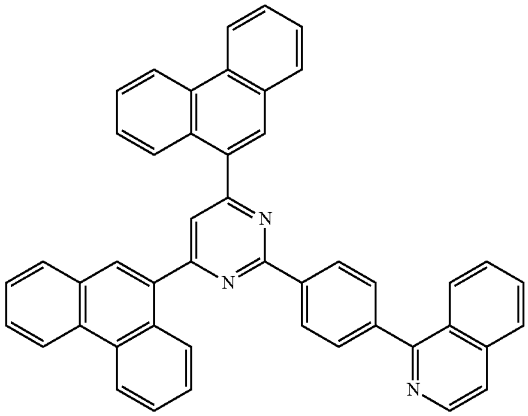

-continued
ET14
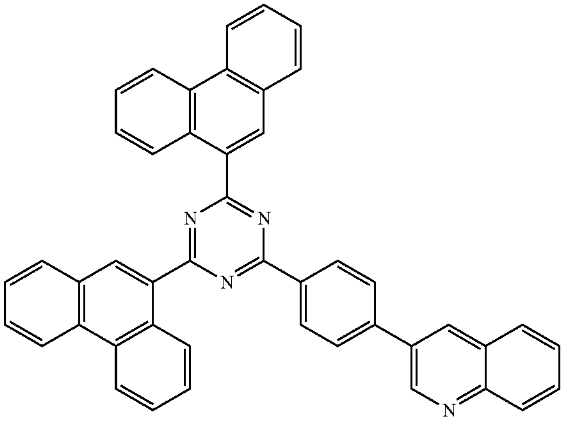
ET15
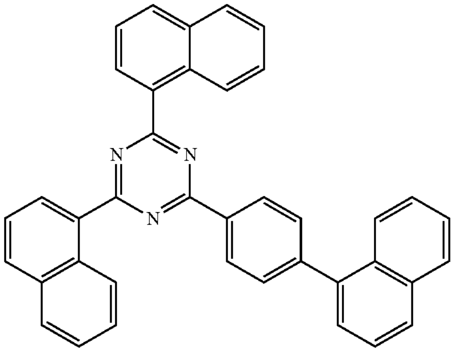
ET16
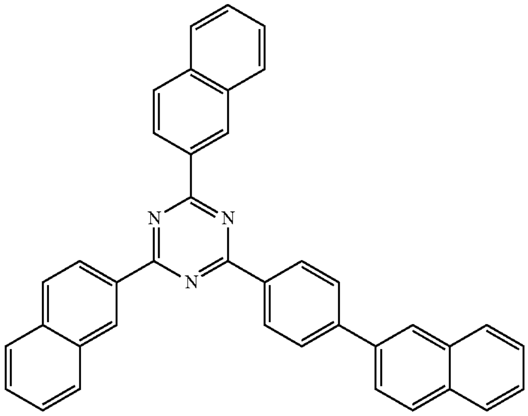
-continued
ET17
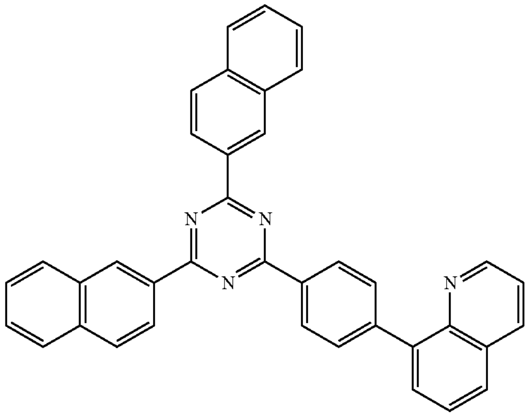
ET18
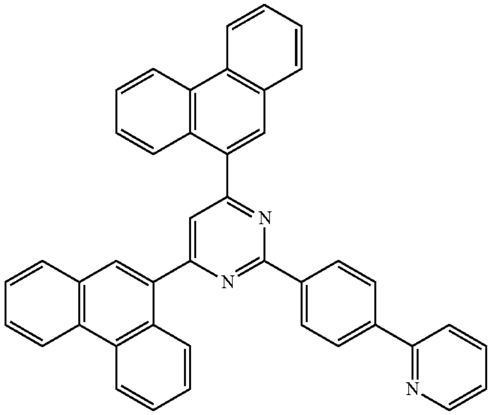
ET19
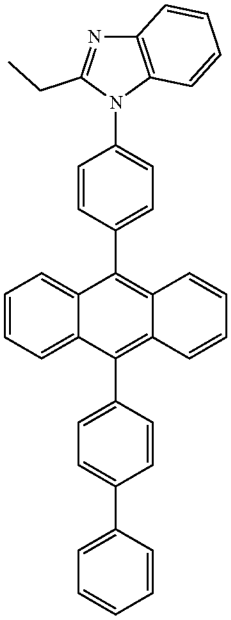

-continued
ET20
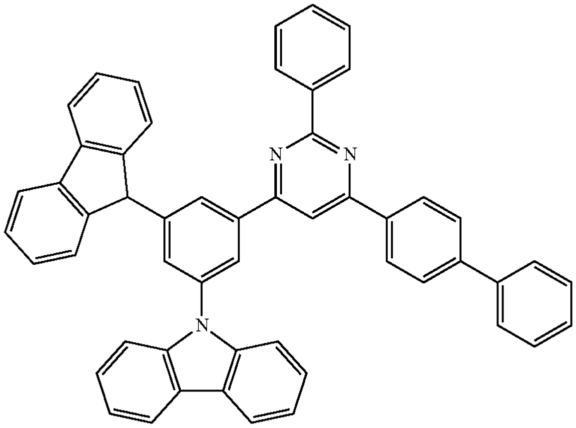
ET21
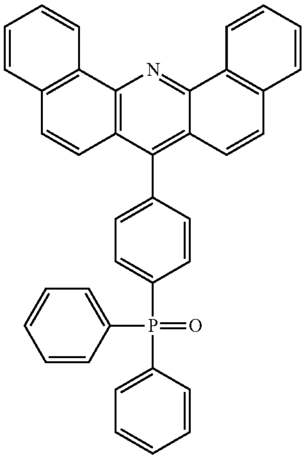
ET22
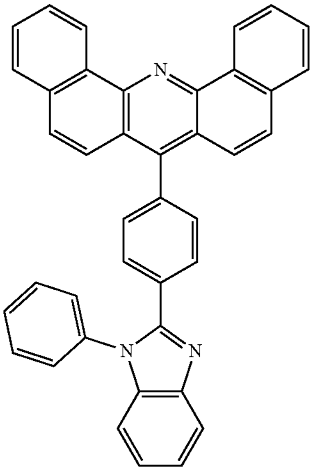
-continued
ET23
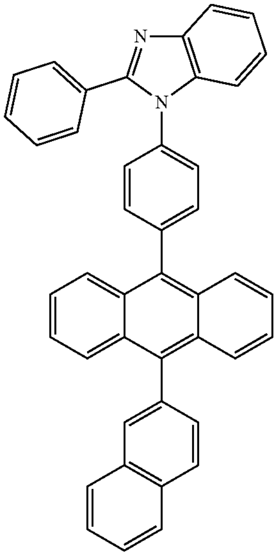
ET24
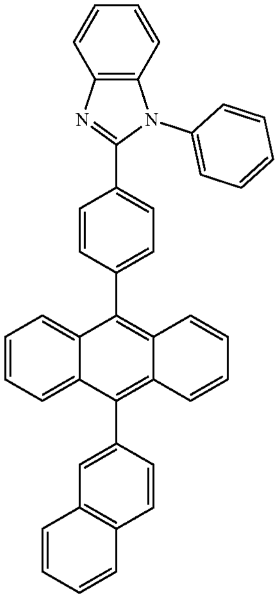
ET25
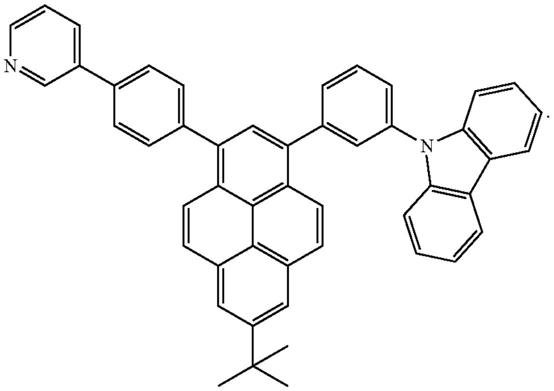
A thickness of the electron transport layer may be in a range of about 100 Å to about 1,000 Å, for example, about 150 Å to about 500 Å. When the thickness of the electron transport layer is within the range as described above, satisfactory electron transport characteristics may be obtained without a substantial increase in driving voltage.

Also, the electron transport layer may further include, in addition to the materials described above, a metal-containing material.

The metal-containing material may include a Li complex. The Li complex may include, for example, Compound ET-D1 or ET-D2.

ET-D1

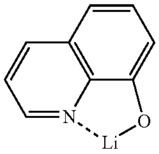

ET-D2

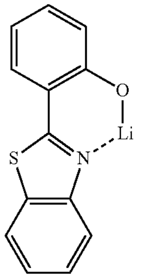

In addition, the electron transport region 170 may include an electron injection layer that facilitates injection of electrons from the second electrode 190.

The electron injection layer may include LiF, NaCl, CsF, $Li_2O$, BaO, Yb, Compound ET-D1, Compound ET-D2, or any combination thereof.

A thickness of the electron injection layer may be about 1 Å to about 100 Å, for example, about 3 Å to about 90 Å. When the thickness of the electron injection layer is within the range described above, satisfactory electron injection characteristics may be obtained without a substantial increase in driving voltage.

The second electrode 190 may be arranged on the electron transport region 170. The second electrode 190 may be a cathode. A material for forming the second electrode 190 may be metal, an alloy, an electrically conductive compound, or any combination thereof, which have a relatively low work function. For example, lithium (Li), magnesium (Mg), aluminum (Al), silver (Ag), aluminum-lithium (Al—Li), calcium (Ca), magnesium-indium (Mg—In), magnesium-silver (Mg—Ag), or the like may be used as the material for forming the second electrode 190. In an embodiment, to manufacture a top-emission type light-emitting device, a transparent or semi-transparent electrode formed using ITO or IZO may be used as the second electrode 190, and various modifications may be made.

Figure 2:
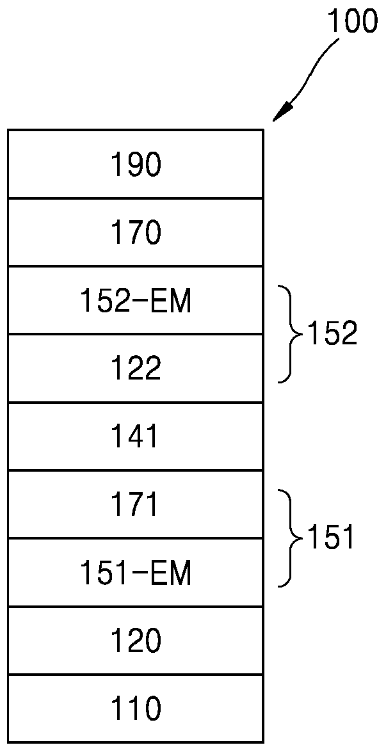
FIG. 2 is a schematic view of a light-emitting device according to another embodiment.

FIG. 2 is a schematic view of a light-emitting device 100 according to an embodiment. The light-emitting device 100 of FIG. 2 may include a first electrode 110, a second electrode 190 facing the first electrode 110, and a first light-emitting unit 151 and a second light-emitting unit 152 which are stacked between the first electrode 110 and the second electrode 190. A charge generation layer 141 is arranged between the first light-emitting unit 151 and the second light-emitting unit 152. The charge generation layer 141 may include an n-type charge generation layer, a p-type charge generation layer, or a combination thereof. The charge generation layer 141 is a layer that generates charge and supplies the charge to neighboring light-emitting units, and any known material may be used therefor.

The first light-emitting unit 151 may include an emission layer 1 151-EM, and the second light-emitting unit 152 may include an emission layer 2 152-EM.

In an embodiment, the emission layer 1 151-EM may include the emission layer as described in the present specification.

In an embodiment, the emission layer 2 152-EM may include the emission layer as described in the present specification.

A hole transport region 120 is arranged between the first light-emitting unit 151 and the first electrode 110, and the second light-emitting unit 152 includes a second hole transport region 122 arranged on the side of the first electrode 110.

An electron transport region 170 may be arranged between the second light-emitting unit 152 and the second electrode 190, and the first light-emitting unit 151 may include a first electron transport region 171 arranged between the charge generation layer 141 and the emission layer 1 151-EM.

The first electrode 110 and the second electrode 190 illustrated in FIG. 2 are the same as described in connection with the first electrode 110 and the second electrode 190 illustrated in FIG. 1, respectively.

The hole transport region 120 and the second hole transport region 122 illustrated in FIG. 2 are each the same as described in connection with the hole transport region 120 illustrated in FIG. 1.

The electron transport region 170 and the first electron transport region 171 illustrated in FIG. 2 are each the same as described in connection with the electron transport region 170 illustrated in FIG. 1.

Hereinbefore, an example of a tandem light-emitting device has been described with reference to FIG. 2. However, the tandem light-emitting device may have various other forms. For example, the tandem light-emitting device may include three or more light-emitting units.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, or a pentoxy group.

The term "$C_1$-$C_{60}$ alkylthio group" as used herein refers to a monovalent group represented by —$SA_{101}$ (wherein $A_{101}$ is the $C_1$-$C_{60}$ alkyl group).

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Examples of the $C_3$-$C_{10}$ cycloalkyl group are a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{60}$ heterocycloalkyl group" as used herein refers to a monovalent saturated cyclic group that includes at least one hetero atom selected from N, O, P, Si, S, Se, Ge, and B as a ring-forming atom and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group may include a silolanyl group, a silinanyl group, a tetrahydrofuranyl group, a tetrahydro-2H-pyranyl group, and a tetrahydrothiophenyl group.

The term "$C_3$-$C_{10}$ cycloalkenyl group" as used herein refers to a monovalent monocyclic group that has 3 to 10 carbon atoms, at least one carbon-carbon double bond in the ring thereof, and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, Ge, and B as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The "$C_7$-$C_{60}$ alkylaryl group" as used herein refers to a $C_6$-$C_{60}$ aryl group that is substituted with at least one $C_1$-$C_{60}$ alkyl group.

The term "$C_1$-$C_{60}$ heteroaryl group" as used herein refers to a monovalent group having a cyclic aromatic system having at least one hetero atom selected from N, O, P, Si, S, Se, Ge, and B as a ring-forming atom and 1 to 60 carbon atoms, and the term "$C_1$-$C_{60}$ heteroarylene group" as used herein refers to a divalent group having a cyclic aromatic system having at least one hetero atom selected from N, O, P, Si, S, Se, Ge, and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be fused to each other.

The "$C_2$-$C_{60}$ alkylheteroaryl group" as used herein refers to a $C_1$-$C_{60}$ heteroaryl group that is substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$ (wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its molecular structure when considered as a whole. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one hetero atom selected from N, O, P, Si, S, Se, Ge, and B, other than carbon atoms (for example, having 1 to 60 carbon atoms), as a ring-forming atom, and no aromaticity in its molecular structure when considered as a whole. The monovalent non-aromatic condensed heteropolycyclic group includes a carbazolyl group. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (that is unsubstituted or substituted with at least one $R_{10a}$)" used herein are an adamantane group, a norbornene group, a bicyclo[1.1.1]pentane group, a bicyclo[2.1.1]hexane group, a bicyclo[2.2.1]heptane group (norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group, (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

Examples of the "$C_5$-$C_{30}$ carbocyclic group" and "$C_1$-$C_{30}$ heterocyclic group" as used herein are i) a first ring, ii) a second ring, iii) a condensed ring in which two or more first rings are condensed with each other, iv) a condensed ring in which two or more second rings are condensed with each other, or v) a condensed ring in which at least one first ring is condensed with at least one second ring, wherein the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "fluorinated $C_3$-$C_{10}$ cycloalkyl group", "fluorinated $C_1$-$C_{10}$ heterocycloalkyl group", or "fluorinated phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "deuterated $C_3$-$C_{10}$ cycloalkyl group", "deuterated $C_1$-$C_{10}$ heterocycloalkyl group", or "deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein is substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein is not substituted with deuterium.

The term "($C_1$-$C_{20}$ alkyl) 'X' group" as used herein refers to an 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group that is substituted with at least one $C_1$-$C_{20}$ alkyl group, and the term "($C_1$-$C_{20}$ alkyl)phenyl group" as used herein refers to a phenyl group that is substituted with at least one $C_1$-$C_{20}$ alkyl group. Examples of a ($C_1$ alkyl) phenyl group include a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," in which, in each group, at least one carbon atom selected from ring-forming carbon atoms is substituted with nitrogen.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof.

$Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each unsubstituted or substituted with deuterium, a $C_1$-$C_{60}$ alkyl group, a $C_6$-$C_{60}$ aryl group, or any combination thereof.

For example, $Q_1$ to $Q_9$, $Q_{11}$ to $Q_{19}$, $Q_{21}$ to $Q_{29}$, and $Q_{31}$ to $Q_{39}$ described herein may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a light-emitting device according to an embodiment is described in detail with reference to Examples. However, the disclosure is not limited to the following Examples.

EXAMPLES

Evaluation Example 1

DFT calculation using a Gaussian 16 program was performed by optimizing a molecular structure of each of Compounds S-1, S-2, S-A, S-B, and S-C by using B3LYP/LanL2DZ function with respect to a metal included in each of Compounds S-1, S-2, S-A, S-B, and S-C and using B3LYP/6-31G(D,P) function with respect to an organic ligand included in each of Compounds S-1, S-2, S-A, S-B, and S-C, to calculate a permanent dipole moment, singlet energy, and triplet energy of each of Compounds S-1, S-2, S-A, S-B, and S-C. Results are shown in Table 1. Also, DFT calculation using a Gaussian 16 program was performed by optimizing a molecular structure of each of Compounds HTH1, ETH1, HTH2, ETH2, and TBADN by using B3LYP/6-31G(D,P) function, to calculate each of permanent dipole moment, singlet energy, and/or triplet energy of each of Compounds HTH1, ETH1, HTH2, ETH2, and TBADN. Results are shown in Table 1.

TABLE 1

| Compound | Permanent dipole moment (debye) | Singlet ($S_1$) energy (eV) | Triplet ($T_1$) energy (eV) |
|---|---|---|---|
| S-1 (Compound 4 of Group 1-2) | 1.56 | 2.4706 | 2.339 |
| S-2 (Compound 24 of Group 1-2) | 1.76 | 2.4425 | 2.311 |
| S-A | 12.5899 | 2.8612 | 2.553 |
| S-B | 6.332 | 2.8198 | 2.643 |
| S-C | 7.7357 | 2.8673 | 2.487 |
| FE1 (Compound 2 of Group 3) | 1.792 | 2.6374 | 2.2337 |
| HTH1 | 0.753 | 3.522 | 2.887 |
| ETH1 | 2.0813 | 3.011 | 2.741 |
| HTH2 | 0.6285 | 3.539 | 3.009 |
| ETH2 | 2.3079 | 2.767 | 2.703 |
| TBADN | 0.523 | — | — |

S-1

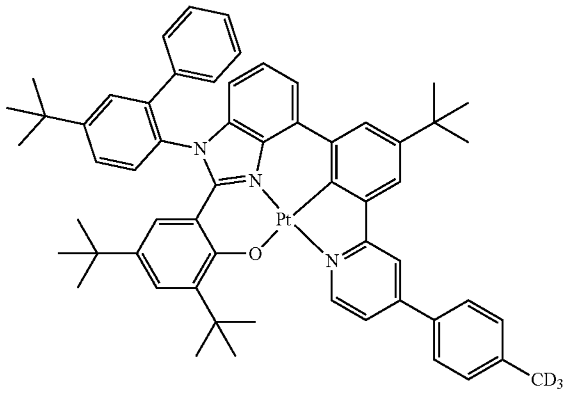

S-2

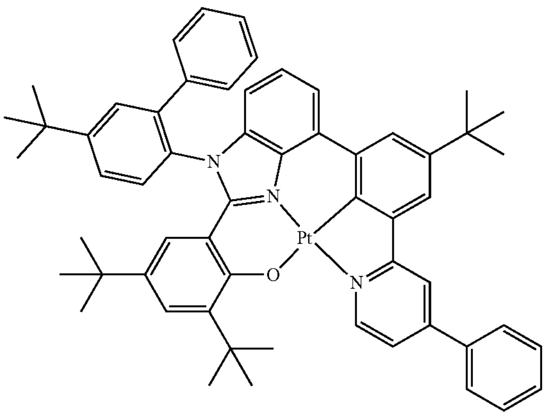

-continued

S-A

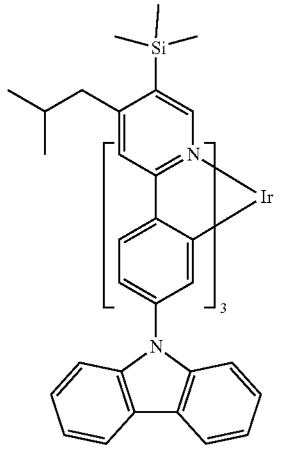

S-B

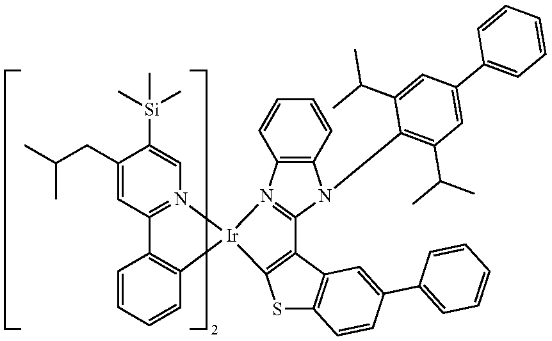

S-C

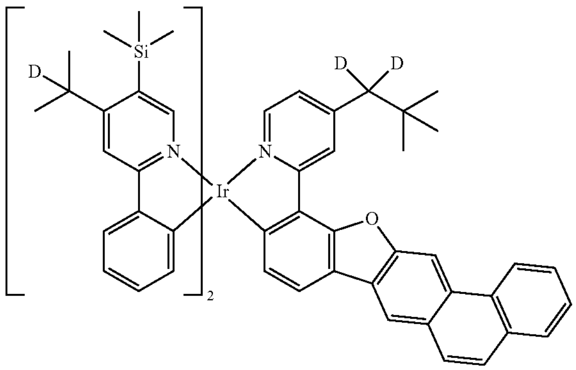

-continued

FE1

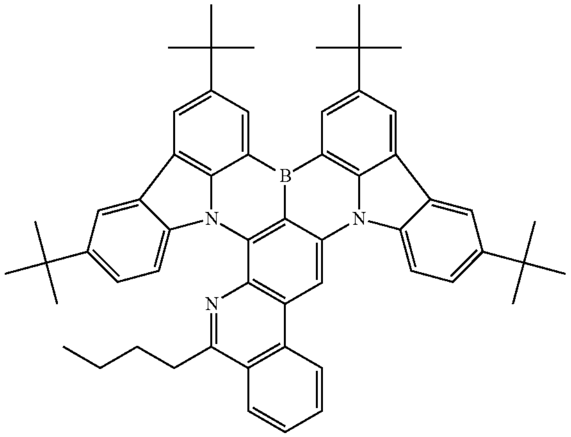

HTH1

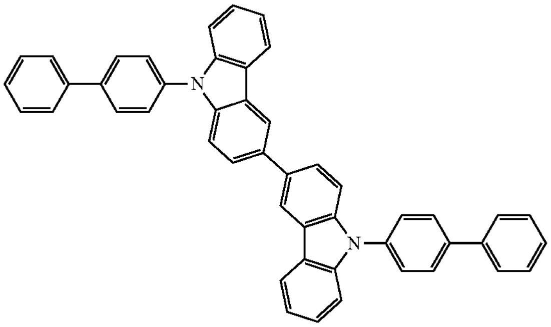

ETH1

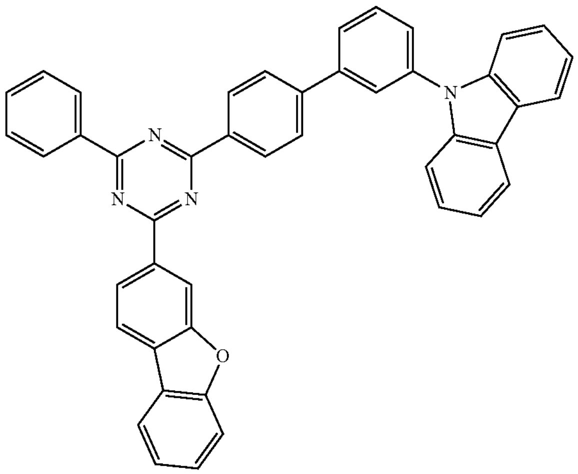

-continued

HTH2

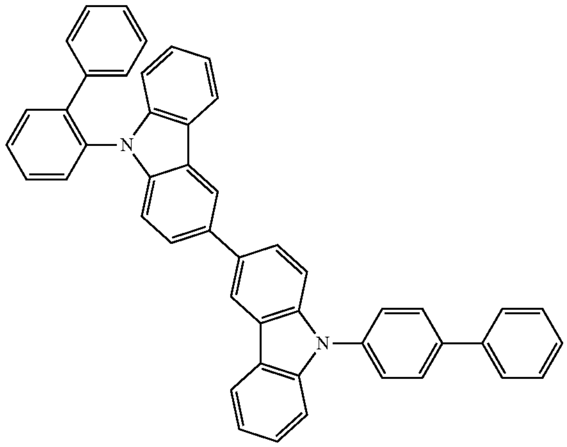

ETH2

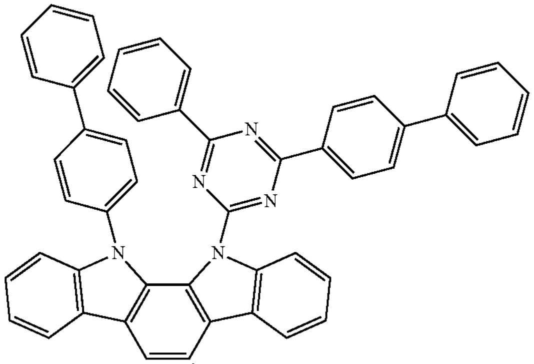

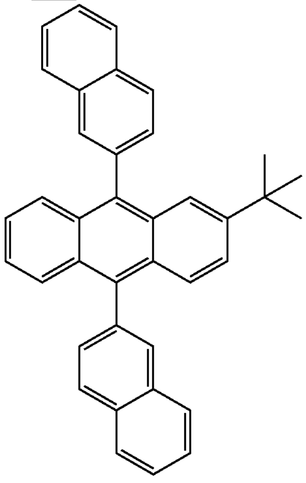

TBADN

Evaluation Example 2

Compounds shown in Table 2 were vacuum-code posited on a quartz substrate at a vacuum degree of $10^{-7}$ torr in a weight ratio shown in Table 2 to prepare Films S-1, S-2, S-A, S-B, S-C, and FE1, each having a thickness of 40 nm.

Next, a photoluminescence spectrum of each of Films S-1, S-2, S-A, S-B, S-C, and FE1 was measured by using a Quantaurus-QY Absolute PL quantum yield spectrometer of Hamamatsu Inc. (equipped with a xenon light source, a monochromator, a photonic multichannel analyzer, and an integrating sphere, and using PLQY measurement software (Hamamatsu Photonics, Ltd., Shizuoka, Japan)). During the measurement, an excitation wavelength was scanned from 320 nm to 380 nm at 10 nm intervals, and a spectrum measured at the excitation wavelength of 320 nm was taken. From the photoluminescence spectrum of each of Films S-1, S-2, S-A, S-B, S-C, and FE1, a full width at half maximum and maximum emission peak wavelength of each of Compounds S-1, S-2, S-A, S-B, S-C, and FE1 were determined and results are shown in Table 2.

TABLE 2

| Film No. | Film composition (weight ratio) | FWHM (nm) | Maximum emission peak wavelength (nm) |
|---|---|---|---|
| S-1 | HTH1:ETH1:S-1 (71:24:5) | 61.2 | 522 |
| S-2 | HTH1:ETH1:S-2 (71:24:5) | 63.9 | 527 |
| S-A | HTH1:ETH1:S-A (71:24:5) | 53.8 | 512 |
| S-B | HTH1:ETH1:S-B (71:24:5) | 63 | 522 |
| S-C | HTH1:ETH1:S-C (71:24:5) | 32.9 | 526 |
| FE1 | TBADN:FE1 (97:3) | 32.4 | 529 |

From Table 2, emission characteristics of each of Compounds S-1, S-2, S-A, S-B, S-C, and FE1 could be confirmed.

Evaluation Example 3

Compounds shown in Table 3 were vacuum-code posited on a quartz substrate at a vacuum degree of $10^{-7}$ torr in a weight ratio shown in Table 3 to prepare Films S-1_FE1, S-2_FE1, S-A_FE1, S-B_FE1, and S-C_FE1, each having a thickness of 40 nm.

Figure 3:
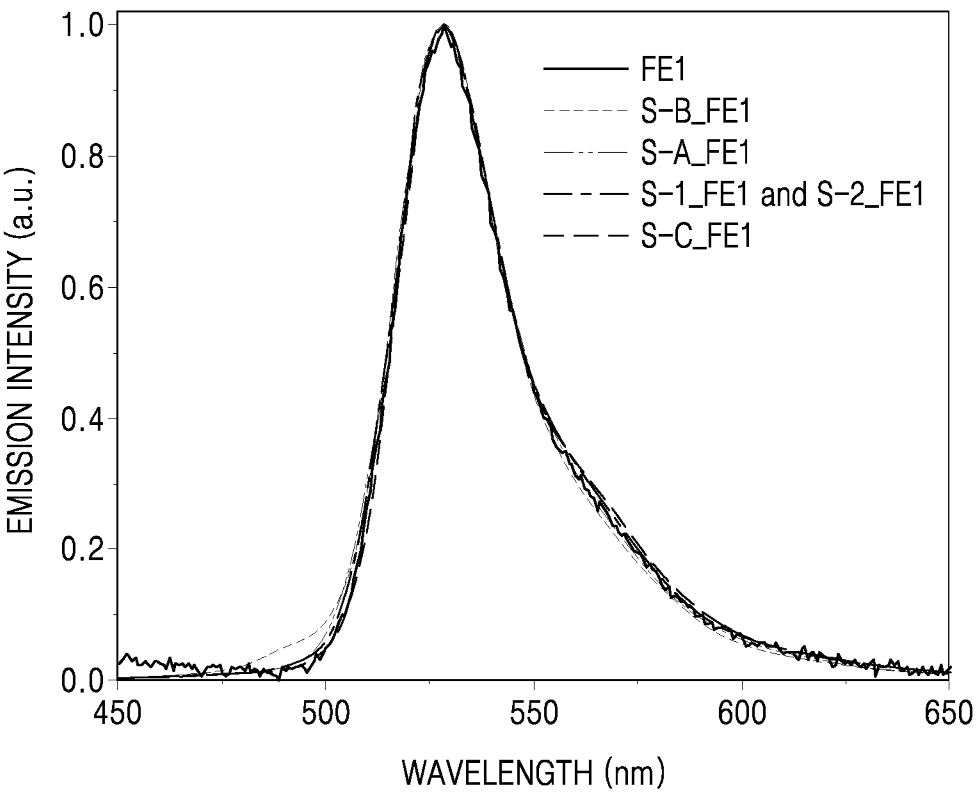
FIG. 3 shows a photoluminescence spectrum of each of Films S-1_FE1, S-2_FE1, S-A_FE1, S-B_FE1, and S-C_FE1.

Next, a photoluminescence spectrum of each of Films S-1_FE1, S-2_FE1, S-A_FE1, S-B_FE1, and S-C_FE1 was evaluated by using the same method as that used in Evaluation Example 2, and from the photoluminescence spectrum of each of Films S-1_FE1, S-2_FE1, S-A_FE1, S-B_FE1, and S-C_FE1, a full width at half maximum and maximum emission peak wavelength of each of a combination of S-1 and FE1, a combination of S-2 and FE1, a combination of S-A and FE1, a combination of S-B and FE1, and a combination of S-C and FE1 were determined. Results are shown in Table 3. The photoluminescence spectrum of each of Films S-1_FE1, S-2_FE1, S-A_FE1, S-B_FE1, and S-C_FE1 are as shown in FIG. 3. For comparison, the photoluminescence spectrum of Film FE1 prepared in Evaluation Example 2 is also shown in FIG. 3.

Afterwards, PL spectrum of each of Films S-1_FE1, S-2_FE1, S-A_FE1, S-B_FE1, and S-C_FE1 was evaluated at room temperature by using a TRPL measurement system, FluoTime® 300, of PicoQuant® and a pumping source, PLS340, of PicoQuant® comprises m1 hosts, a sensitizer, and a fluorescent emitter comprises m1 hosts, a sensitizer, and a fluorescent emitter comprises m1 hosts, a sensitizer, and a fluorescent emitter (excitation wavelength=340 nm, spectral width=20 nm), and then a wavelength of a main peak of the spectrum was determined. PLS340 repeated the measurement of the number of photons emitted from each Film at the wavelength of the main peak by a photon pulse (pulse width=500 picoseconds) applied to each Film according to the time, based on time-correlated single photon counting (TCSPC), to obtain a sufficiently fit TRPL curve. $T_{decay}$(Ex), that is, decay time, of each of Films S-1_FE1, S-2_FE1, S-A_FE1, S-B_FE1, and S-C_FE1 was obtained by fitting two or more exponential decay functions to the results obtained and the results are shown in Table 3. A function for fitting of the data is shown in Equation 100, and from the $T_{decay}$ values obtained from each exponential decay function used for fitting, the largest $T_{decay}$ was obtained as $T_{decay}$(Ex). In this regard, the same measurement was performed during the same measurement time as that for obtaining TRPL curve in the dark state (in which pumping signals entering a certain film are blocked) to obtain a baseline or a background signal curve for use as a baseline for fitting.

$$f(t) = \sum_{i=1}^{n} A_i \exp(-t/T_{decay,i}) \quad \text{Equation 100}$$

TABLE 3

| Film No. | Film composition (weight ratio) | FWHM (nm) | Maximum emission peak wavelength (nm) | Decay time (ns) |
|---|---|---|---|---|
| S-1_FE1 | HTH1:ETH1:S-1:FE1 (70.5:23.5:5:1) | 33.4 | 529 | 168 |
| S-2_FE1 | HTH1:ETH1:S-2:FE1 (70.5:23.5:5:1) | 33.3 | 529 | 169 |
| S-A_FE1 | HTH1:ETH1:S-A:FE1 (70.5:23.5:5:1) | 33.2 | 529 | 250 |
| S-B_FE1 | HTH1:ETH1:S-B:FE1 (70.5:23.5:5:1) | 32.5 | 529 | 129 |
| S-C_FE1 | HTH1:ETH1:S-C:FE1 (70.5:23.5:5:1) | 32 | 529 | 378 |

From Table 3 and FIG. 3, 1) it could be confirmed that in Films S-1_FE1, S-2_FE1, S-A_FE1, and S-C_FE1, the Compound FE1 is a relatively strong emitter of light, and each of Compounds S-1, S-2, S-A, and S-C are relatively poor emitters (photoluminescence spectra of Films S-1_FE1, S-2_FE1, S-A_FE1, and S-C_FE1 in FIG. 3 are substantially identical to each other, and thus, are not clearly distinguished),
2) it could be confirmed that Film S-1_FE1 and Film S-2_FE1 had smaller decay times than those of Film S-A_FE1 and Film S-C_FE1, respectively, and thus, a rate of energy transfer from Compound S-1 to FE1, and a rate of energy transfer from Compound S-2 to FE1, were greater than a rate of energy transfer from Compound S-A to FE1 and a rate of energy transfer from Compound S-C to FE1, respectively, and
3) it could be confirmed that although Film S-B_FE1 had smaller decay time than those of Films S-1_FE1 and S-2_FE1, complete energy transfer from Compound S-B to FE1 was not achieved, and thus, some luminescence also occurred in Compound S-B (see the photoluminescence spectrum of Film S-B_FE1 in FIG. 3).

Manufacture of OLED 1

As an anode, a glass substrate with ITO deposited thereon to a thickness of 1,500 Å was cut to a size of 50 mm×50 mm×0.5 mm, sonicated with isopropyl alcohol and pure water each for 5 minutes, and then cleaned by irradiation of ultraviolet rays and exposure of ozone thereto for 30 minutes. Then, the resultant glass substrate was loaded onto a vacuum deposition apparatus.

HT3 and F6-TCNNQ were co-deposited on the anode in a weight ratio of 98:2 to form a hole injection layer (HIL) having a thickness of 10 nm, HT3 was deposited on the hole injection layer to form a hole transport layer (HTL) having a thickness of 150 nm, and HTH1 was vacuum-deposited on the hole transport layer to form an electron blocking layer (EBL) having a thickness of 5 nm.

Next, hosts (HTH1 and ETH1), a sensitizer (S-1), and a fluorescent emitter (FE1) were co-deposited on the electron blocking layer in a weight ratio of 89:10:1 to form an emission layer having a thickness of 40 nm. In this regard, a weight ratio of HTH1 to ETH1 was adjusted to 75:25, and PDM(H) was calculated as "(0.753 debye×0.75)+(2.0813 debye×0.25)=0.56475 debye+0.520325 debye=1.085075 debye".

Next, ET3 was vacuum-deposited on the emission layer to form a hole blocking layer (HBL) having a thickness of 5 nm, ET3 and ET-D1 were co-deposited on the hole blocking layer in a volume ratio of 50:50 to form an electron transport layer (ETL) having a thickness of 31 nm, and Al was deposited on the electron transport layer to form a cathode having a thickness of 100 nm, thereby completing the manufacture of a light-emitting device.

HT3

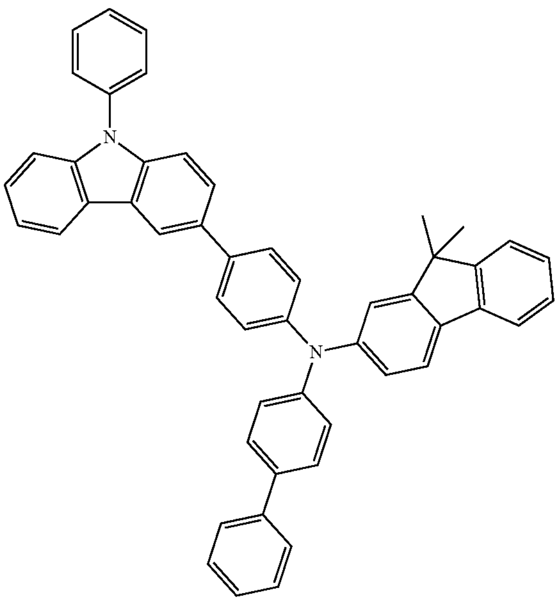

-continued

F6-TCNNQ

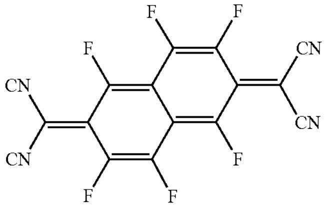

ET3

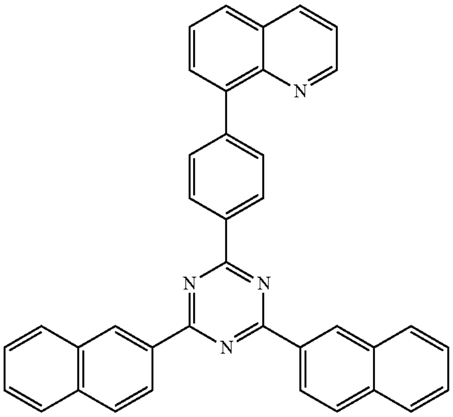

ET-D1

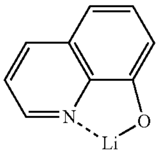

Manufacture of OLED A, OLED B, and OLED C

OLED A, OLED B, and OLED C were manufactured in the same manner as used to manufacture OLED 1, except that, a compound shown in Table 4 (S-A, S-B, or S-C) was used instead of Compound S-1, respectively, as the sensitizer in the emission layer.

Manufacture of OLED D

OLED D was manufactured in the same manner as used to manufacture OLED 1, except that, in forming the emission layer, a host (TBADN) and a fluorescent emitter (FE1) were co-deposited on the electron blocking layer in a weight ratio of 97:3 to form an emission layer having a thickness of 40 nm.

Compositions of the emission layers of OLEDs 1 and A to D are the same as described in Table 4.

TABLE 4

| | Host | | Sensitizer | | | |
|---|---|---|---|---|---|---|
| Device No. | Composition | PDM(H) (debye) | Compound | PDM(S) (debye) | \|PDM(S) − PDM(H)\| | Fluorescent emitter |
| OLED 1 | HTH1:ETH1 (89 wt %) | 1.085075 | S-1 (10 wt %) | 1.56 | 0.474925 | FE1 (1 wt %) |
| OLED A | HTH1:ETH1 (89 wt %) | 1.085075 | S-A (10 wt %) | 12.5899 | 11.504825 | FE1 (1 wt %) |
| OLED B | HTH1:ETH1 (89 wt %) | 1.085075 | S-B (10 wt %) | 6.332 | 5.246925 | FE1 (1 wt %) |
| OLED C | HTH1:ETH1 (89 wt %) | 1.085075 | S-C (10 wt %) | 7.7357 | 6.650625 | FE1 (1 wt %) |
| OLED D | TBADN (97 wt %) | 0.523 | — | — | — | FE1 (3 wt %) |

Evaluation Example 4

External quantum efficiency (%), driving voltage (V), and roll-off ratio (%) of OLEDs 1 and A to D were evaluated, and the results are shown in Table 5. A current-voltmeter (Keithley 2400) and a luminance meter (Topcon SR3) were used as evaluation devices, and the roll-off ratio was calculated according to the following Equation 20:

$$\text{Roll-off ratio }(\%)=\{1-(\text{luminescence efficiency (at 8,000 nit)/maximum luminescence efficiency})\}\times 100 \quad \text{Equation 20}$$

TABLE 5

| | External quantum efficiency (EQE) (%) | Driving voltage (V) | Roll-off ratio (%) |
|---|---|---|---|
| OLED 1 | 18.4 | 4.29 | 18 |
| OLED A | 15.1 | 4.02 | 29 |
| OLED B | 17.0 | 4.36 | 27 |
| OLED C | 15.6 | 4.88 | 33 |
| OLED D | 5.78 | 6.11 | 9 |

From Table 5, it could be confirmed that 1) the external quantum efficiency of OLED 1 was greater than the external quantum efficiency of OLED D by a factor of 3, and thus, OLED 1 had far superior external quantum efficiency characteristics to those of OLED D, and 2) OLED 1 had better characteristics in terms of the external quantum efficiency, and the roll-off ratio than those of OLEDs A to C, and OLED 1 had better characteristics in terms of the driving voltage than those of OLEDs B and C.

Manufacture of OLED 2

OLED 2 was manufactured in the same manner as used to manufacture OLED 1, except that, in forming the emission layer, hosts (HTH2 and ETH2), a sensitizer (S-2), and a fluorescent emitter (FE1) were co-deposited on the electron blocking layer in a weight ratio of 89.4:10:0.6 to form an emission layer having a thickness of 40 nm. In this regard, a weight ratio of HTH2 to ETH2 was adjusted to 65:35, and PDM(H) was calculated as "(0.6285 debye×0.65)+(2.3079 debye×0.35)=0.408525 debye+0.807765 debye=1.21629 debye".

Manufacture of OLED 3

OLED 3 was manufactured in the same manner as used to manufacture OLED 2, except that, in forming the emission layer, a weight ratio of the host, the sensitizer, and the fluorescent emitter was changed to 89:10:1.

TABLE 6

| | Host | | Sensitizer | | | |
|---|---|---|---|---|---|---|
| Device No. | Composition | PDM(H) (debye) | Compound | PDM(S) (debye) | \|PDM(S) − PDM(H)\| | Fluorescent emitter |
| OLED 2 | HTH2:ETH2 (89.4 wt %) | 1.21629 | S-2 (10 wt %) | 1.76 | 0.54371 | FE1 (0.6 wt %) |
| OLED 3 | HTH2:ETH2 (89 wt %) | 1.21629 | S-2 (10 wt %) | 1.76 | 0.54371 | FE1 (1 wt %) |

Evaluation Example 5

The External quantum efficiency (%), driving voltage (V), and roll-off ratio (%) of each of OLEDs 2 and 3 were evaluated by using the same method as that used in Evaluation Example 4, and results are shown in Table 7. EL spectra of OLEDs 2 and 3 are as shown in FIG. 4.

TABLE 7

| | External quantum efficiency (EQE) (%) | Driving voltage (V) | Roll-off ratio (%) |
|---|---|---|---|
| OLED 2 | 21.0 | 3.6 | 17 |
| OLED 3 | 19.3 | 3.63 | 22 |

Figure 4:
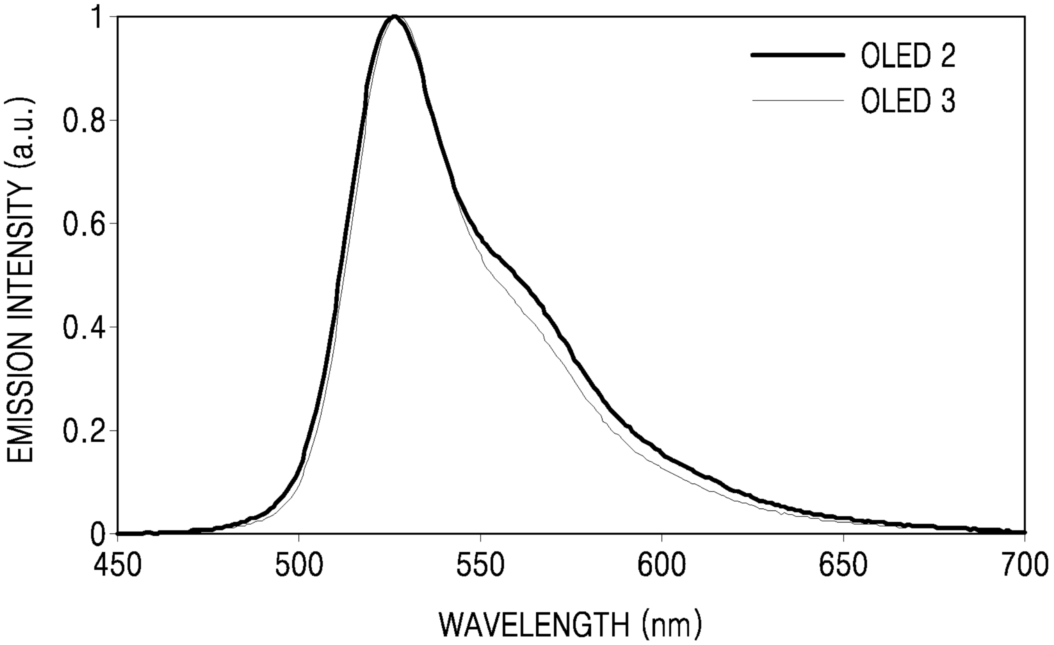
FIG. 4 shows an electroluminescence (EL) spectrum of each of OLEDs 2 and 3.

From Table 7 and FIG. 4, it could be confirmed that OLEDs 2 and 3 had excellent characteristics in terms of external quantum efficiency, driving voltage, and roll-off ratio.

The light emitting device may have improved light emitting efficiency, lifespan, and roll-off ratio characteristics, and a high-quality electronic apparatus may be manufactured by using the light emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:

a first electrode;

a second electrode; and an interlayer arranged between the first electrode and the second electrode, wherein the interlayer comprises an emission layer, the emission layer comprises m1 hosts, a sensitizer, and a fluorescent emitter, where m1 is an integer of 1 or more, and when m1 is 2 or more, the two or more hosts are each different from the other, the m1 hosts, the sensitizer, and the fluorescent emitter are each different from the other, and Expression 1 is satisfied:

$$0\text{ debye}\leq|PDM(S)-PDM(H)|\leq 3\text{ debye} \quad \text{Expression 1}$$

wherein, in Expression 1,

PDM(S) is a permanent dipole moment of the sensitizer and has a unit of debye,

PDM(H) is $$\sum_{x=1}^{m1} PDM(Hx) \cdot W(Hx)$$

which is an average value of permanent dipole moments of the m1 hosts included in the emission layer, and has a unit of debye, wherein i) x is a variable of 1 to m1, ii) PDM(Hx) is a permanent dipole moment of an $x^{th}$ host in the emission layer and has a unit of debye, and iii) W(Hx) is a weight fraction of the $x^{th}$ host relative to a total weight of the host in the emission layer, and is calculated as (a weight of the $x^{th}$ host in the emission layer/a total weight of the host in the emission layer), and each of PDM(S) and PDM(H) is calculated based on density functional theory (DFT).

2. The light-emitting device of claim 1, wherein PDM(S) is about 0.1 debye to about 3.0 debye.

3. The light-emitting device of claim 1, wherein PDM(H) is about 0.01 debye to about 4.00 debye.

4. The light-emitting device of claim 1, wherein Expression 2 is further satisfied:

$$0 \text{ eV} \leq |S_1(S) - T_1(S)| \leq 0.4 \text{ eV} \qquad \text{Expression 2}$$

wherein, in Expression 2, $S_1(S)$ is singlet energy of the sensitizer and has a unit of eV, $T_1(S)$ is triplet energy of the sensitizer and has a unit of eV, and each of $S_1(S)$ and $T_1(S)$ is calculated based on DFT.

5. The light-emitting device of claim 4, wherein $S_1(S)$ is about 2.25 eV to about 2.65 eV.

6. The light-emitting device of claim 4, wherein $T_1(S)$ is about 2.2 eV to about 2.6 eV.

7. The light-emitting device of claim 1, wherein Expression 3 is further satisfied:

$$0 \text{ eV} \leq |S_1(FE) - T_1(FE)| \leq 1.5 \text{ eV} \qquad \text{Expression 3}$$

wherein, in Expression 3, $S_1(FE)$ is singlet energy of the fluorescent emitter and has a unit of eV, $T_1(FE)$ is triplet energy of the fluorescent emitter and has a unit of eV, and each of $S_1(FE)$ and $T_1(FE)$ is calculated based on DFT.

8. The light-emitting device of claim 1, wherein $T_1(FE)$ is about 1.0 eV to about 2.5 eV, $T_1(FE)$ is triplet energy of the fluorescent emitter and has a unit of eV, and $T_1(FE)$ is calculated based on DFT.

9. The light-emitting device of claim 1, wherein FWHM (FE) is about 5 nanometers to about 50 nanometers, FWHM(FE) is a full width at half maximum of a photoluminescence spectrum of the fluorescent emitter and has a unit of nm, and the photoluminescence spectrum is evaluated relative to a film including the fluorescent emitter.

10. The light-emitting device of claim 1, wherein λmax (FE) is about 500 nm to about 550 nm, λmax(FE) is a maximum emission peak wavelength of a photoluminescence spectrum of the fluorescent emitter and has a unit of nm, and the photoluminescence spectrum is evaluated with respect to a film including the fluorescent emitter.

11. The light-emitting device of claim 1, wherein the m1 hosts independently comprise a hole-transporting compound, an electron-transporting compound, a bipolar compound, or any combination thereof.

12. The light-emitting device of claim 1, wherein the sensitizer comprises a platinum-containing organometallic compound, the platinum-containing organometallic compound comprises platinum and a tetradentate ligand bonded to the platinum, and at least one of chemical bonds between the platinum and the tetradentate ligand is a platinum-carbon chemical bond.

13. The light-emitting device of claim 12, wherein one of the chemical bonds between the platinum and the tetradentate ligand is a platinum-oxygen chemical bond.

14. The light-emitting device of claim 12, wherein the tetradentate ligand comprises one benzimidazole group.

15. The light-emitting device of claim 1, wherein the fluorescent emitter does not comprise a transition metal.

16. The light-emitting device of claim 1, wherein the fluorescent emitter is a thermally activated delayed fluorescence emitter comprising at least one 6-membered ring comprising at least one nitrogen (N) and at least one boron (B).

17. The light-emitting device of claim 1, wherein the fluorescent emitter is a prompt fluorescence emitter comprising at least one 5-membered ring or 6-membered ring comprising at least one boron (B).

18. The light-emitting device of claim 1, wherein the interlayer comprises:

m light-emitting units comprising at least one emission layer; and m−1 charge generation layers arranged between two adjacent light-emitting units among the m light-emitting units, m is an integer of 2 or more, and at least one light-emitting unit among the m light-emitting units comprises the emission layer comprising the m1 hosts, the sensitizer, and the fluorescent emitter, and the Expression 1 is satisfied.

19. The light-emitting device of claim 18, wherein the at least one light-emitting unit among the m light-emitting units emits blue light.

20. An electronic apparatus comprising the light-emitting device of claim 1.

* * * * *